US012072628B2

(12) United States Patent
Hatakeyama et al.

(10) Patent No.: US 12,072,628 B2
(45) Date of Patent: *Aug. 27, 2024

(54) RESIST COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Tomomi Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 369 days.

This patent is subject to a terminal disclaimer.

(21) Appl. No.: 17/197,466

(22) Filed: Mar. 10, 2021

(65) Prior Publication Data

US 2021/0302838 A1 Sep. 30, 2021

(30) Foreign Application Priority Data

Mar. 18, 2020 (JP) ................................ 2020-047897

(51) Int. Cl.

*G03F 7/039* (2006.01)
*G03F 7/004* (2006.01)
*G03F 7/038* (2006.01)
*G03F 7/20* (2006.01)

(52) U.S. Cl.

CPC .......... *G03F 7/0392* (2013.01); *G03F 7/0045* (2013.01); *G03F 7/0382* (2013.01); *G03F 7/2004* (2013.01)

(58) Field of Classification Search

CPC .................................................... G03F 7/0045
See application file for complete search history.

(56) References Cited

U.S. PATENT DOCUMENTS

| | | | | |
|---|---|---|---|---|
| 10,698,314 | B2 * | 6/2020 | Hatakeyama | C08K 5/19 |
| 11,415,887 | B2 * | 8/2022 | Hatakeyama | G03F 7/0045 |
| 11,435,665 | B2 * | 9/2022 | Hatakeyama | C07D 307/93 |
| 2018/0039173 | A1 * | 2/2018 | Hatakeyama | C07C 309/17 |
| 2018/0143532 | A1 * | 5/2018 | Hatakeyama | G03F 7/425 |
| 2018/0364574 | A1 * | 12/2018 | Hatakeyama | G03F 7/0045 |
| 2019/0369491 | A1 * | 12/2019 | Hatakeyama | C07D 307/93 |

FOREIGN PATENT DOCUMENTS

| | | | |
|---|---|---|---|
| JP | 2001-194776 | A | 7/2001 |
| JP | 2002-226470 | A | 8/2002 |
| JP | 2002-363148 | A | 12/2002 |
| JP | 2018-97356 | A | 6/2018 |

* cited by examiner

*Primary Examiner* — Chanceity N Robinson
*Assistant Examiner* — Anna Malloy
(74) *Attorney, Agent, or Firm* — WHDA, LLP

(57) ABSTRACT

A resist composition includes a base polymer and a quencher containing a salt compound having the formula (A):

(A)

$$\left[(R^3)_{(4-n)}-N^+\left[R^1\left(O-\overset{O}{\overset{\|}{C}}-R^2\left(X^1-R^{ah}\left(X^{BI}\right)_j\right)_{m^2}\right)_{m^1}\right]_n\right]_k \quad A^{k-}$$

wherein $m^1$ is an integer of 1 or 2, $m^2$ is an integer of 1 to 3, n is an integer of 1 to 3, j is an integer of 1 to 3, k is an integer of 1 or 2, $X^{BI}$ is iodine or bromine, and $A^{k-}$ is a carboxylic acid anion, a sulfonimide anion free of fluorine, or a sulfonamide anion.

14 Claims, No Drawings

RESIST COMPOSITION AND PATTERN FORMING PROCESS

CROSS-REFERENCE TO RELATED APPLICATION

This non-provisional application claims priority under 35 U.S.C. § 119(a) on Patent Application No. 2020-047897 filed in Japan on Mar. 20, 2020, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smartphones drives forward the miniaturization technology. As the advanced miniaturization technology. manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is extreme ultraviolet (EUV) lithography.

As the pattern feature size is reduced, approaching to the diffraction limit of light, light contrast lowers. In the case of positive resist film, a lowering of light contrast leads to reductions of resolution and focus margin of hole and trench patterns. For preventing the effect of the reduction of resolution of resist pattern due to a lowering of light contrast, an attempt has been made to enhance the dissolution contrast of resist film.

Chemically amplified resist compositions comprising an acid generator capable of generating an acid upon exposure to light or an electron beam (EB) include chemically amplified positive resist compositions wherein deprotection reaction takes place under the action of acid and chemically amplified negative resist compositions wherein polarity switch reaction or crosslinking reaction takes place under the action of acid. Quenchers are often added to these resist compositions for the purpose of controlling the diffusion of the acid to unexposed region to improve the contrast. The addition of quenchers is fully effective to this purpose. A number of amine quenchers were proposed as disclosed in Patent Documents 1 to 3.

Patent Document 4 discloses a resist composition comprising an iodized aniline as a quencher. However, the aniline has a low basicity which is insufficient to suppress acid diffusion.

Citation List

Patent Document 1: JP-A 2001-194776
Patent Document 2: JP-A 2002-226470
Patent Document 3: JP-A 2002-363148
Patent Document 4: JP-A 2018-97356

SUMMARY OF THE INVENTION

For chemically amplified resist compositions in which an acid catalyst is used, it is desired to develop a quencher capable of reducing the edge roughness (LWR) of line patterns, improving the critical dimension uniformity (CDU) of hole patterns, and achieving a high sensitivity.

The invention has been made in view of the above-described problems, and an object of the invention is to provide a resist composition that achieves a high sensitivity, minimal LWR, and improved CDU independent of whether it is of positive or negative tone, and a pattern forming process using the resist composition.

As a result of intensive studies, the inventors have achieved the present invention by finding that a resist composition having minimal LWR, improved CDU, high contrast, high resolution, and wide process margin is obtained using, as a quencher, a salt compound including a nitrogen-containing cation having an iodized or brominated hydrocarbyl group (other than an iodized or brominated aromatic ring).

The invention provides a resist composition and a pattern forming process described below.

1. A resist composition comprising a base polymer and a quencher containing a salt compound having the formula (A):

$$\left[(R^3)_{(4-n)}\text{—}N^+\text{—}\left[R^1\left(O\text{—}\overset{O}{\overset{\|}{C}}\text{—}R^2\left(X^1\text{—}R^{ah}\left(X^{BI}\right)_j\right)_{m^2}\right)_{m^1}\right]_n\right]_k A^{k-} \tag{A}$$

wherein $m^1$ is an integer of 1 or 2, $m^2$ is an integer of 1 to 3, n is an integer of 1 to 3, j is an integer of 1 to 3, k is an integer of 1 or 2, $X^{BI}$ is iodine or bromine, $R^{ah}$ is a $C_1$-$C_{20}$ (j+1)-valent aliphatic hydrocarbon group which may contain at least one selected from an ether bond, a carbonyl moiety, an ester bond, an amide bond, a sultone ring, a lactam ring, a carbonate moiety, a halogen other than iodine, a $C_6$-$C_{12}$ aryl moiety, a hydroxyl moiety, or a carboxyl moiety, $X^1$ is a single bond, an ether bond, an ester bond, an amide bond, a carbonyl group, or a carbonate group, $R^1$ is a single bond or a $C_1$-$C_{20}$ ($m^1$+1)-valent hydrocarbon group which may contain an ether bond, an ester bond, or a hydroxyl moiety, $R^2$ is a single bond or a $C_1$-$C_{20}$ ($m^2$+1)-valent hydrocarbon group which may contain at least one selected from an ether bond, a carbonyl moiety, an ester bond, an amide bond, a sultone ring, a lactam ring, a carbonate moiety, a halogen other than iodine, a hydroxyl moiety, or a carboxyl moiety, $R^3$ is hydrogen, a nitro group, a $C_1$-$C_{20}$ hydrocarbyl group, or a $C_2$-$C_{20}$ hydrocarbyloxycarbonyl group, the $C_1$-$C_{20}$ hydrocarbyl group or a hydrocarbyl moiety in the $C_2$-$C_{20}$ hydrocarbyloxycarbonyl group may contain at least one selected from a hydroxyl moiety, a carboxyl moiety, a thiol moiety, an ether bond, an ester bond, a sulfonyl moiety, a nitro moiety, a cyano moiety, a halogen, or an amino moiety, two $R^3$s in a case where n is 1, or $R^3$ and $R^1$ may bond together to form a ring with a nitrogen atom to which two $R^3$s or $R^3$ and $R^1$ are attached, the ring which may contain a double bond, oxygen, sulfur, or nitrogen, and $A^{k-}$ is a carboxylic acid anion, a sulfonimide anion free of fluorine, a sulfonamide anion, or a halide ion.

2. The resist composition of the item 1, further comprising an acid generator capable of generating a sulfonic acid, an imide acid, or a methide acid.

3. The resist composition of the item 1 or 2, further comprising an organic solvent.

4. The resist composition of any one of the items 1 to 3, wherein the base polymer comprises recurring units having the formula (a1) or recurring units having the formula (a2):

(a1)

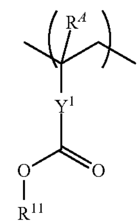

(a2)

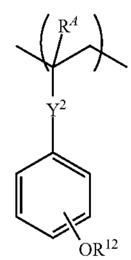

wherein $R^A$ is each independently hydrogen or a methyl group, $R^{11}$ and $R^{12}$ are each independently an acid labile group, $Y^1$ is a single bond, a phenylene group, a naphthylene group, or a $C_1$-$C_{12}$ linking group containing at least one selected from an ester bond or a lactone ring, and $Y^2$ is a single bond or an ester bond.

5. The resist composition of the item 4 which is a chemically amplified positive resist composition.

6. The resist composition of any one of the items 1 to 3, wherein the base polymer is free of an acid labile group.

7. The resist composition of the item 6, wherein the resist composition is a chemically amplified negative resist composition.

8. The resist composition of any one of the items 1 to 7, further comprising a surfactant.

9. The resist composition of any one of the items 1 to 8, wherein the base polymer further comprises at least one type selected from recurring units having the formulae (f1) to (f3):

(f1)

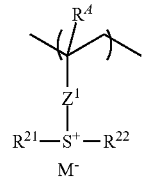

-continued (f2)

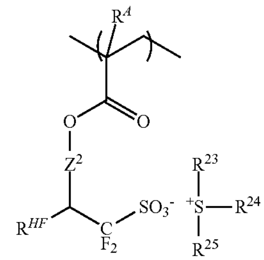

(f3)

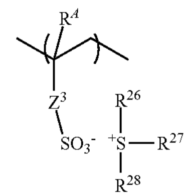

wherein $R^A$ is each independently hydrogen or a methyl group, $Z^1$ is a single bond, a $C_1$-$C_6$ aliphatic hydrocarbylene group, a phenylene group, a naphthylene group, a $C_7$-$C_{18}$ combination thereof, —O—$Z^{11}$—, —C(═O)—O—$Z^{11}$—, or —C(═O)—NH—$Z^{11}$—, $Z^{11}$ is a $C_1$-$C_6$ aliphatic hydrocarbylene group, a phenylene group, a naphthylene group, or a $C_7$-$C_{18}$ combination thereof, which may contain a carbonyl moiety, an ester bond, an ether bond, or a hydroxyl moiety, $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ saturated hydrocarbylene group which may contain a carbonyl moiety, an ester bond, or an ether bond, $Z^3$ is a single bond, a methylene group, an ethylene group, a phenylene group, a fluorinated phenylene group. —O—$Z^{31}$—, —C(═O)—O—$Z^{31}$—, or —C(═O)—NH—$Z^{31}$—, $Z^{31}$ is a $C_1$-$C_6$ aliphatic hydrocarbylene group, a phenylene group, a fluorinated phenylene group, or a trifluoromethyl-substituted phenylene group, which may contain a carbonyl moiety, an ester bond, an ether bond, or a hydroxyl moiety.

$R^{21}$ to $R^{28}$ are each independently a halogen or a $C_1$-$C_{20}$ hydrocarbyl group which may contain a heteroatom, a pair of $R^{23}$ and $R^4$ or $R^{26}$ and $R^{27}$ may bond together to form a ring with a sulfur atom to which the pair is attached, $R^{HF}$ is hydrogen or a trifluoromethyl group, and $M^-$ is a non-nucleophilic counter ion.

10. A pattern forming process comprising the steps of applying the resist composition of any one of the items 1 to 9 onto a substrate to form a resist film thereon, exposing the resist film to high-energy radiation, and developing the exposed resist film in a developer.

11. The pattern forming process of the item 10, wherein the high-energy radiation is ArF excimer laser radiation of wavelength 193 nm or KrF excimer laser radiation of wavelength 248 nm.

12. The pattern forming process of the item 10, wherein the high-energy radiation is an EB or EUV of wavelength 3 to 15 nm.

Advantageous Effects of Invention

Because the salt compound having the formula (A) comprises iodine or bromine, the salt compound absorbs a large amount of EUV and has a sensitizing effect due to the absorption. In addition, the salt compound has a high acid diffusion suppressing effect due to the iodine or bromine, which has a large atomic weight. Because the salt compound is not photosensitive and thus not photo-decomposable even in the exposed portion, the salt compound has a high acid diffusion control ability in the exposed region, and film thickness loss of pattern can be suppressed in an alkaline developer. This makes it possible to enhance the sensitivity, reduce the LWR, and improve the CDU. Thus a resist composition having a high sensitivity, minimal LWR, and improved CDU is designed.

DESCRIPTION OF EMBODIMENTS

As used herein, the singular forms “a,” “an” and “the” include plural referents unless the context clearly dictates otherwise. The notation ($C_n$-$C_m$) means a group containing from n to m carbon atoms per group. As used herein, the term “iodized” or “brominated” compound means an iodine or bromine-substituted compound.

Salt Compound Including Nitrogen-Containing Cation

The resist composition of the invention contains a salt compound having the formula (A).

$$\left[(R^3)_{(4-n)}-N^+\left[R^1\left(O-\overset{O}{\overset{\|}{C}}-R^2\left(X^1-R^{ah}\left(X^{BI}\right)_j\right)_{m^2}\right)_{m^1}\right]_n\right]_k A^{k-} \qquad (A)$$

In the formula (A), $m^1$ is an integer of 1 or 2. $m^2$ is an integer of 1 to 3. n is an integer of 1 to 3. j is an integer of 1 to 3. k is an integer of 1 or 2.

$X^{BI}$ is iodine or bromine. When $m^1$, $m^2$, n, and/or j is 2 or 3, a plurality of $X^{BI}$s may be the same or different from each other.

In the formula (A), $R^{ah}$ is a $C_1$-$C_{20}$ (j+1)-valent aliphatic hydrocarbon group which may contain at least one selected from an ether bond, a carbonyl moiety, an ester bond, an amide bond, a sultone ring, a lactam ring, a carbonate moiety, a halogen other than iodine, a $C_6$-$C_{12}$ aryl group, a hydroxyl moiety, or a carboxyl moiety.

The aliphatic hydrocarbon group may be saturated or unsaturated and straight, branched or cyclic. Specific examples thereof include alkanediyl groups such as methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7-diyl, octane-1,8-diyl, nonane-1,9-diyl, decane-1,10-diyl, undecane-1,11-diyl, and dodecane-1,12-diyl, cycloalkanediyl groups such as cyclopropane-1,1-diyl, cyclopropane-1,2-diyl, cyclobutane-1,1-diyl, cyclobutane-1,2-diyl, cyclobutane-1,3-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, and cyclohexane-1,4-diyl; polycyclic saturated hydrocarbylene groups such as norbornane-2,3-diyl and norbornane-2,6-diyl; alkenediyl groups such as 2-propene-1,1-diyl; alkynediyl groups such as 2-propyne-1,1-diyl; cycloalkenediyl groups such as 2-cyclohexene-1,2-diyl, 2-cyclohexene-1,3-diyl, and 3-cyclohexene-1,2-diyl; polycyclic unsaturated aliphatic hydrocarbylene groups such as 5-norbornene-2,3-diyl; cyclic aliphatic hydrocarbylene group-substituted alkanediyl groups such as cyclopentylmethanediyl, cyclohexyhnethanediyl, 2-cyclopentenylmethanediyl, 3-cyclopentenylmethanediyl, 2-cyclohexenylmethanediyl, and 3-cyclohexenylmethanediyl; aliphatic hydrocarbylene groups such as a combination of the above-described groups; and trivalent or tetravalent groups obtained by removing one or two hydrogen atoms from the above-described aliphatic hydrocarbylene groups.

Examples of the $C_6$-$C_{12}$ aryl group include phenyl, tolyl, xylyl, 1-naphthyl, and 2-naphthyl.

$X^1$ is a single bond, ether bond, ester bond, amide bond, carbonyl group or carbonate group.

In the formula (A), $R^1$ is a single bond or a $C_1$-$C_{20}$ ($m^1$+1)-valent hydrocarbon group which may contain an ether bond, an ester bond, or a hydroxyl moiety. $R^2$ is a single bond or a $C_1$-$C_{20}$ ($m^2$+1)-valent hydrocarbon group which may contain at least one selected from an ether bond, a carbonyl moiety, an ester bond, an amide bond, a sultone ring, a lactam ring, a carbonate moiety, a halogen other than iodine, a hydroxyl moiety, or a carboxyl moiety.

The ($m^1$+1)-valent hydrocarbon group of $R^1$ is a group obtained by removing ($m^1$+1)hydrogen atoms from a hydrocarbon, and the ($m^2$+1)-valent hydrocarbon group of $R^2$ is a group obtained by removing ($m^2$+1) hydrogen atoms from a hydrocarbon. The hydrocarbon may be saturated or unsaturated, and may be straight, branched, or cyclic. Specific examples thereof include alkanes such as methane, ethane, propane, butane, 2-methylpropane, pentane, 2-methylbutane, hexane, heptane, octane, nonane, decane, undecane, and dodecane; cyclic saturated hydrocarbons such as cyclopropane, cyclobutane, cyclopentane, cyclohexane, norbornane, and adamantane; alkenes such as ethylene, propene, 1-butene, 2-butene, and 2-methylpropene; cyclic unsaturated hydrocarbons such as cyclohexene and norbornene; aromatic hydrocarbons such as benzene, naphthalene, toluene, xylene, and anthracene; and compounds obtained by replacing some or all of the hydrogen atoms in the above-described groups with a hydrocarbyl group.

In the formula (A), $R^3$ is hydrogen, a nitro group, a $C_1$-$C_{20}$ hydrocarbyl group, or a $C_2$-$C_{20}$ hydrocarbyloxycarbonyl group. The hydrocarbyl group and the hydrocarbyl moiety in the hydrocarbyloxycarbonyl group may be saturated or unsaturated, and may be straight, branched, or cyclic. Specific examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, and icosyl; $C_3$-$C_{20}$ saturated cyclic hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl, and hexenyl; $C_2$-$C_{20}$ unsaturated cyclic aliphatic hydrocarbyl groups such as cyclohexenyl and norbornenyl; $C_2$-$C_{20}$ alkynyl groups such as ethynyl, propynyl, and butynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as benzyl and phenethyl; and groups obtained from combination of the above-described groups, such as 2-cyclohexylethynyl and 2-phenylethynyl. The hydrocarbyl group may contain at least one selected from a hydroxyl moiety, a carboxyl moiety, a thiol moiety, an ether bond, an ester bond, a sulfonyl moiety, a nitro moiety, a cyano moiety, a halogen, or an amino moiety.

In a case where n is 1, two $R^3$s may bond together to form a ring with the nitrogen atom to which two $R^3$s are attached, and the ring may contain a double bond, oxygen, sulfur, or nitrogen. Alternatively. $R^3$ and $R^1$ may bond together to form a ring with the nitrogen atom to which $R^3$ and $R^1$ are attached, and the ring may contain a double bond, oxygen, sulfur, or nitrogen.

Examples of the cation in the salt compound having the formula (A) are shown below, but not limited thereto.

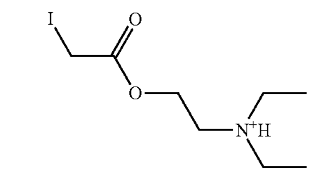
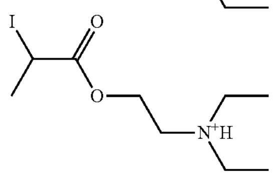
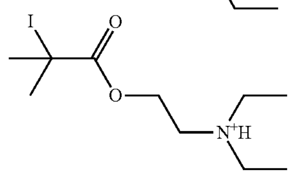
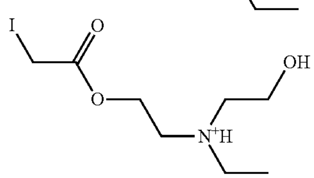
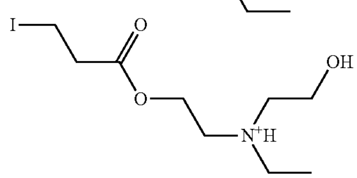
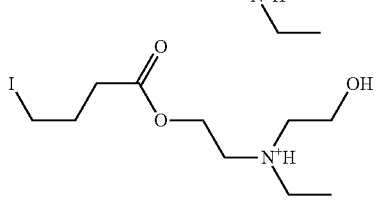
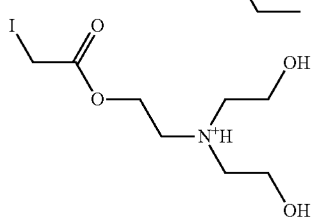
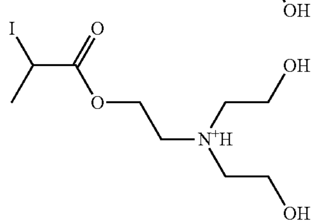

-continued

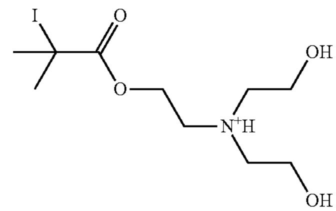
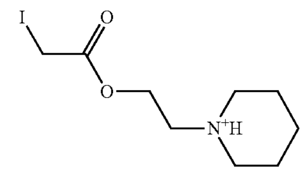
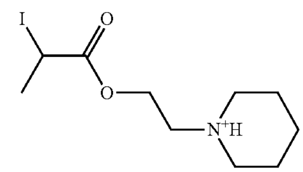
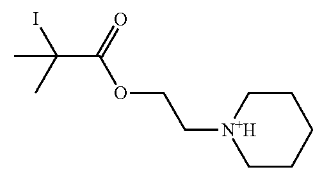
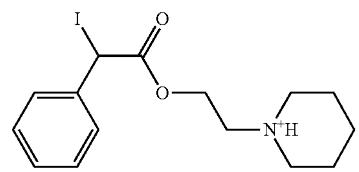
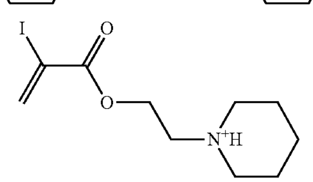
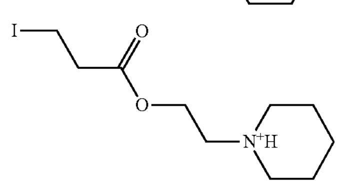
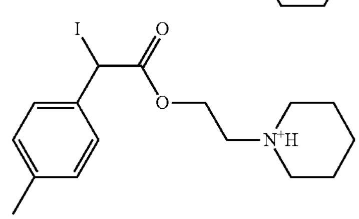
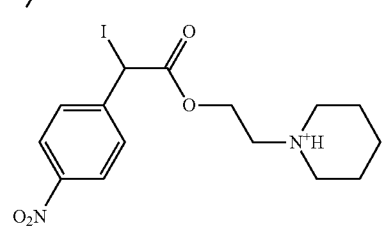

-continued
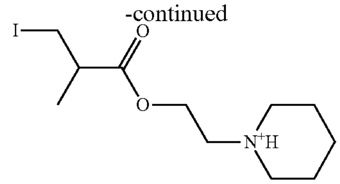
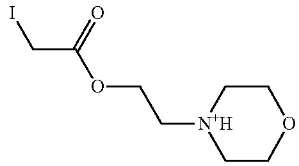
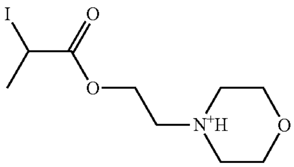
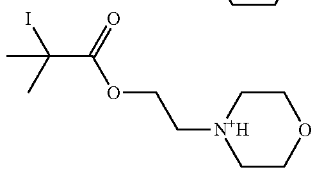
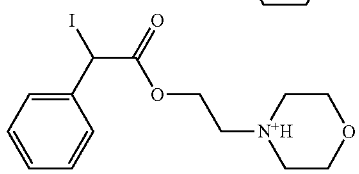
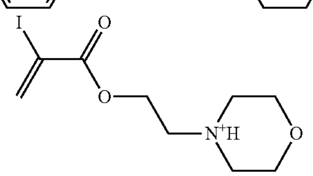
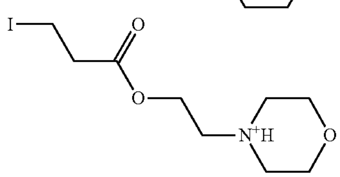
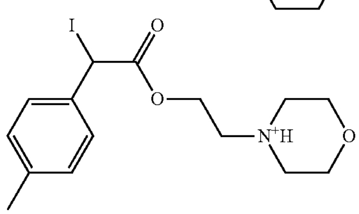
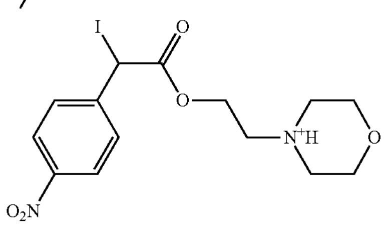
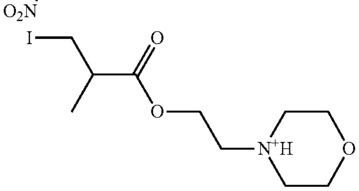
-continued
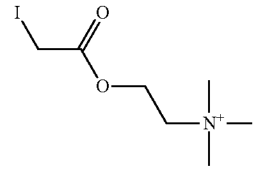
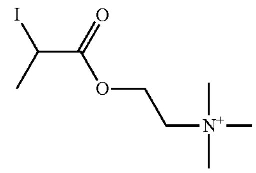
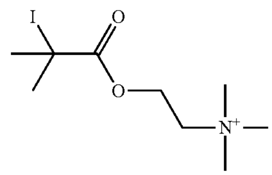
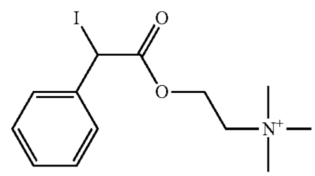
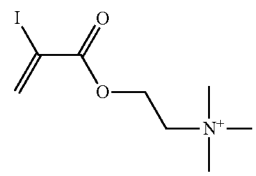
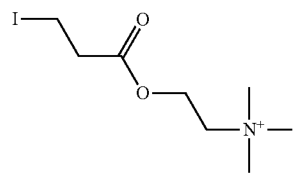
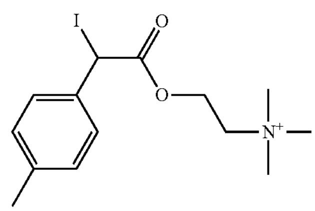
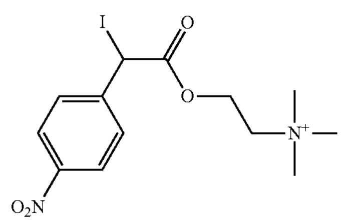
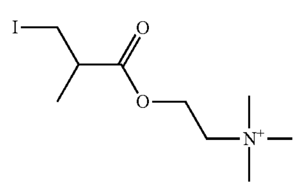

-continued
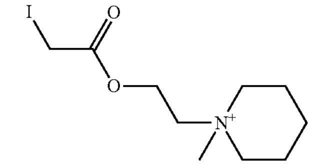
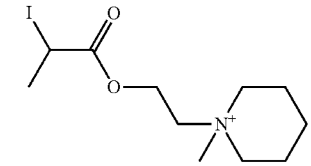
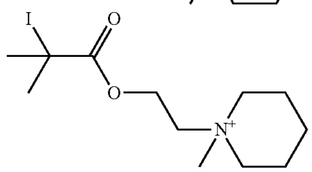
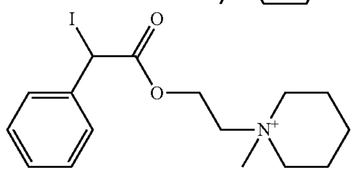
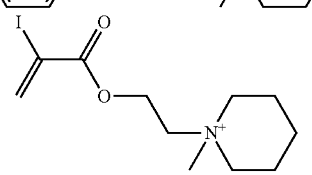
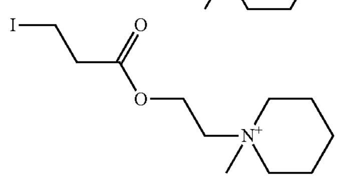
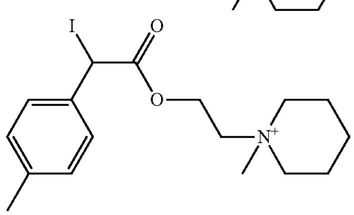
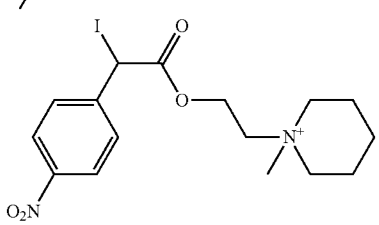
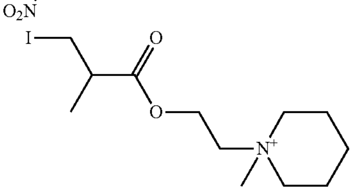
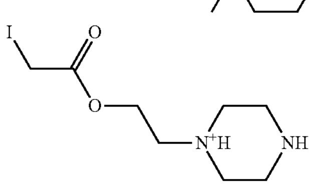
-continued
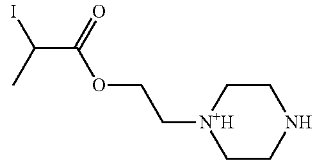
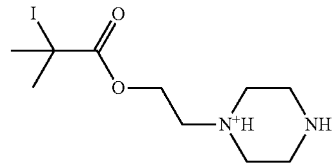
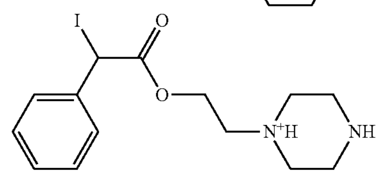
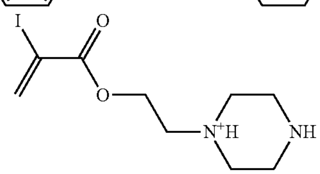
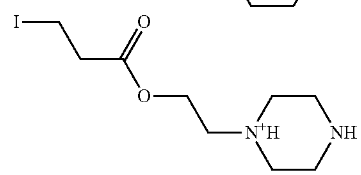
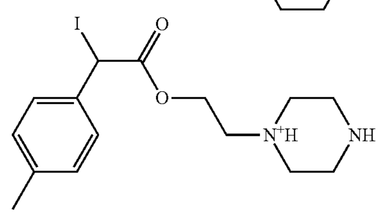
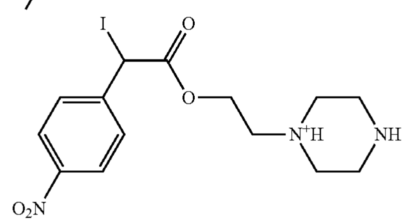
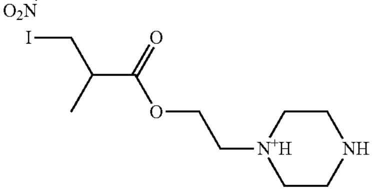
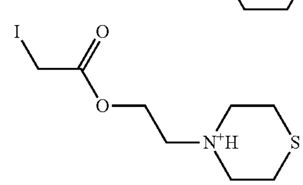
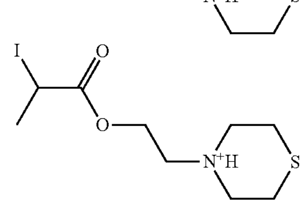

-continued
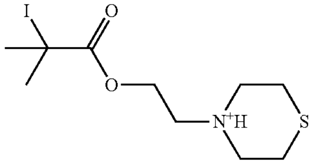
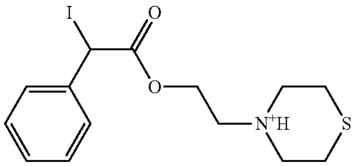
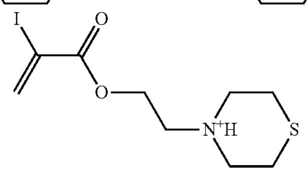
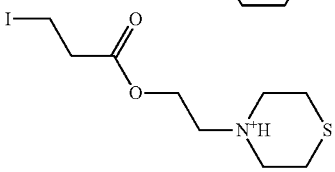
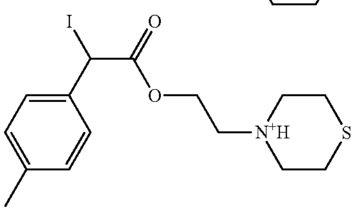
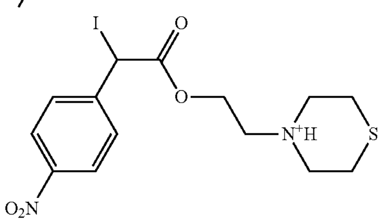
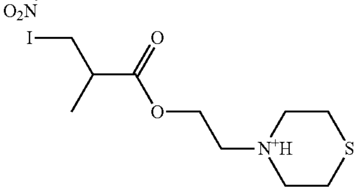
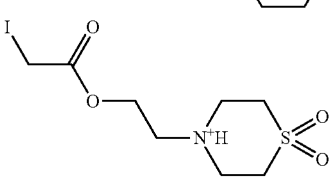
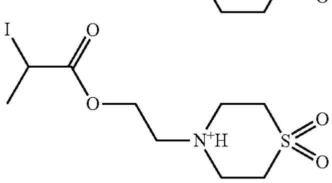
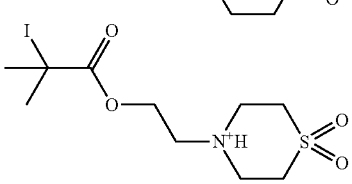
-continued
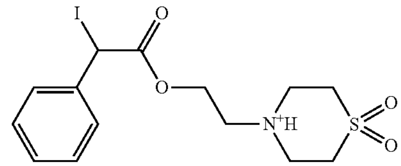
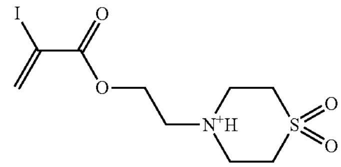
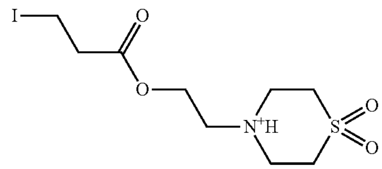
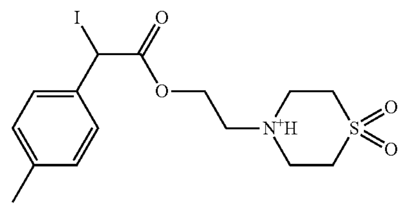
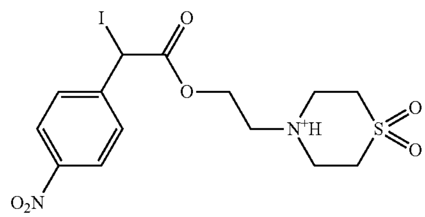
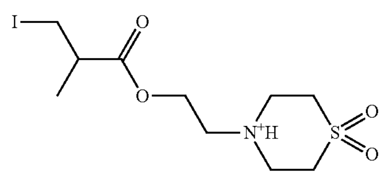
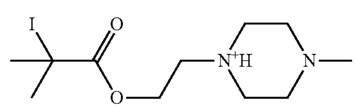
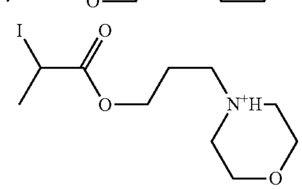
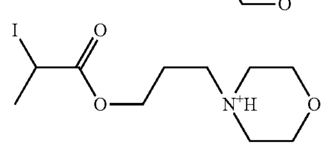
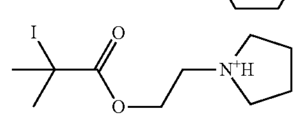
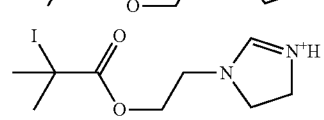

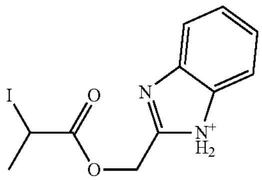
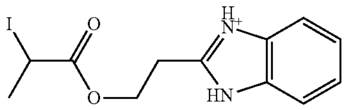
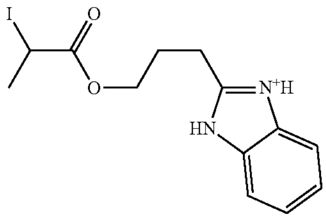
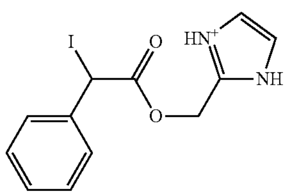
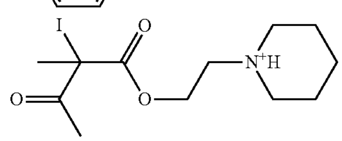
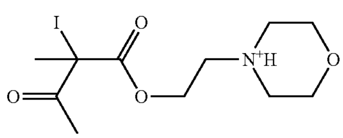
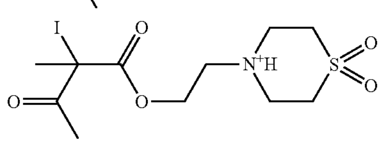
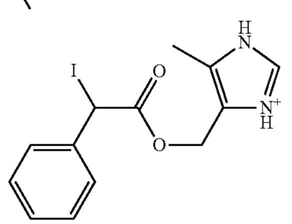
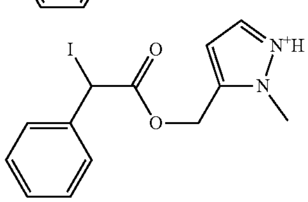
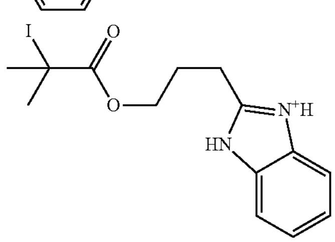
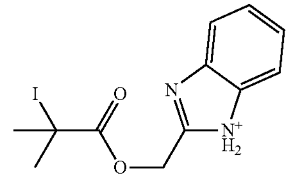
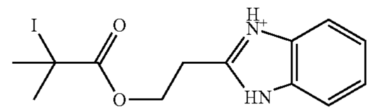
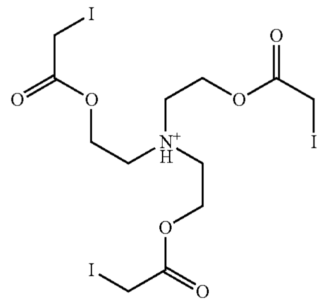
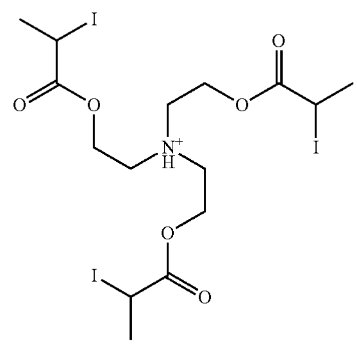
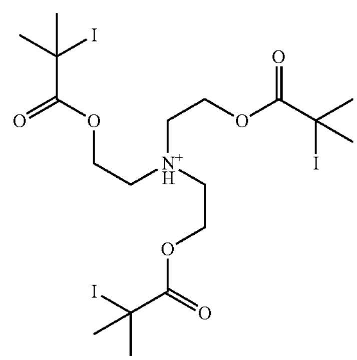
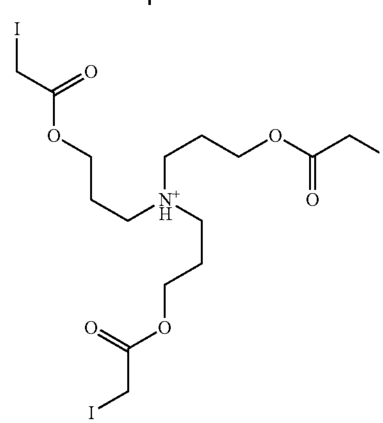

-continued
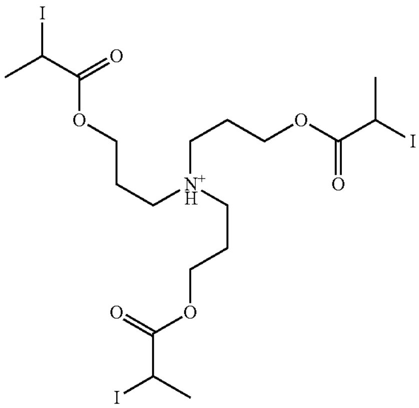
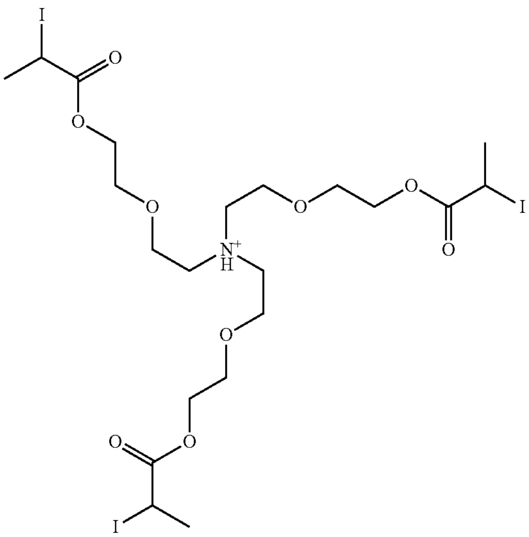
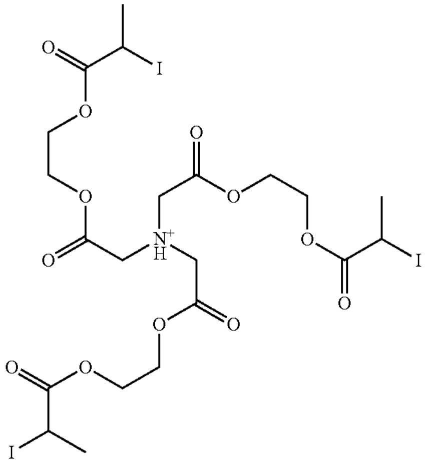
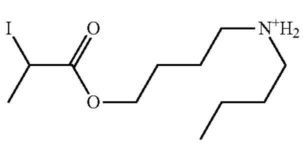
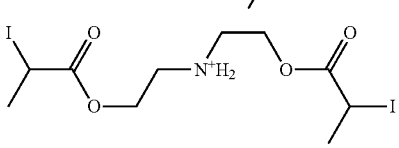
-continued
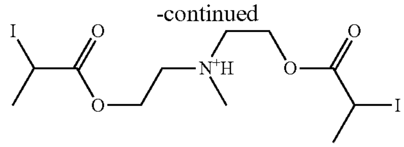
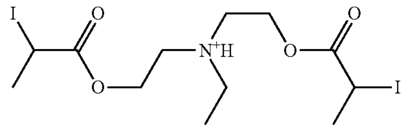
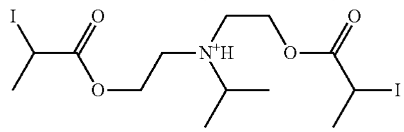
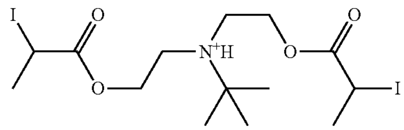
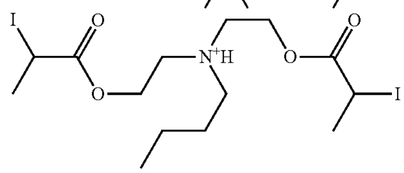
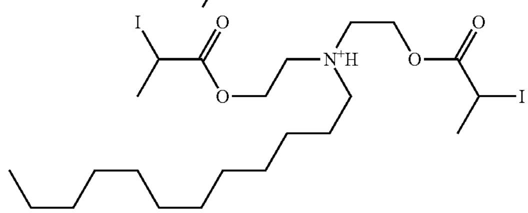
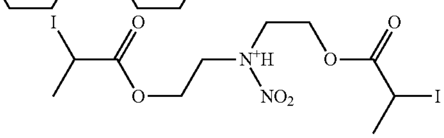
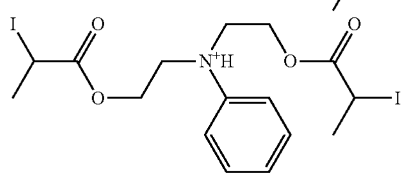
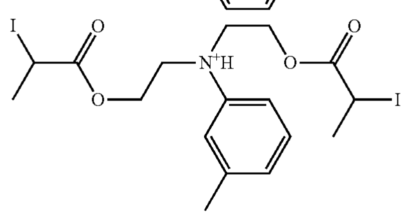
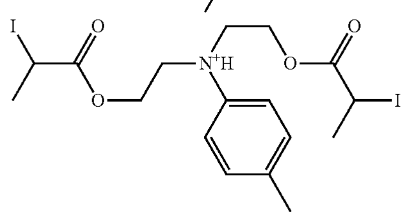
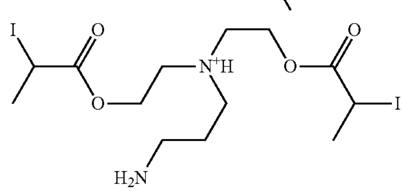

-continued
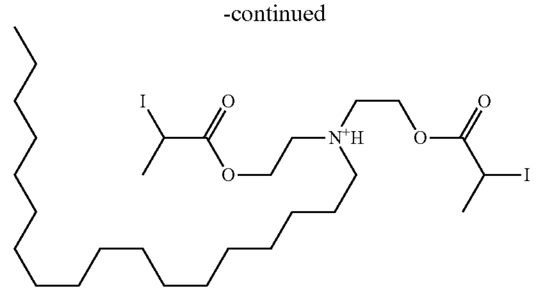
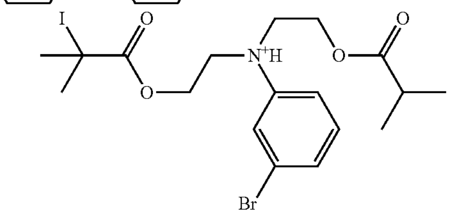
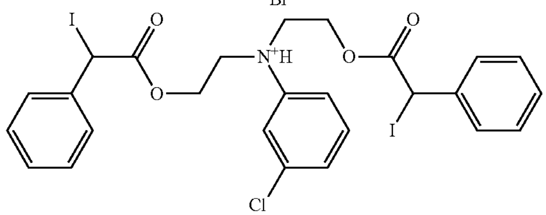
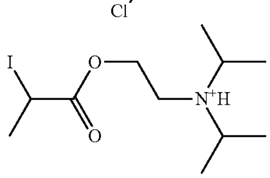
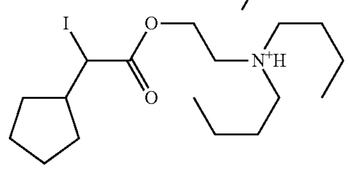
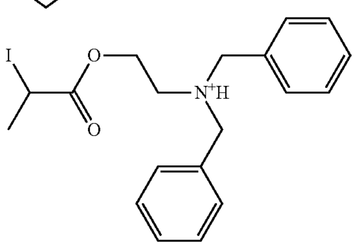
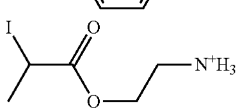
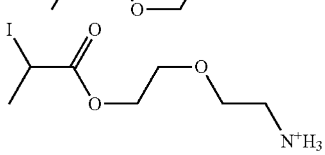
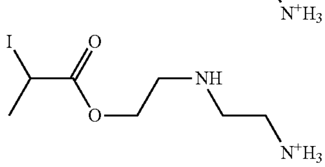
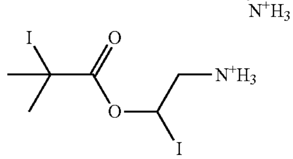
-continued
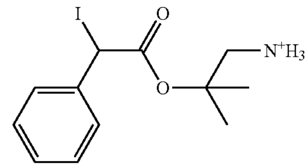
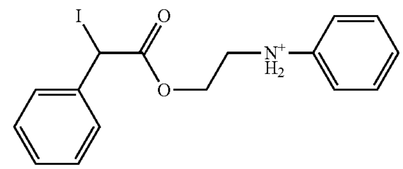
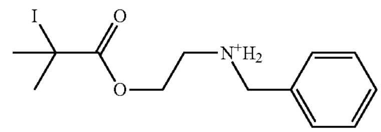
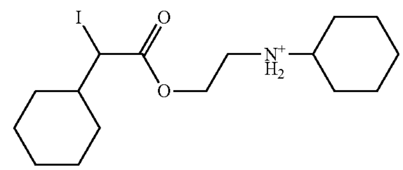
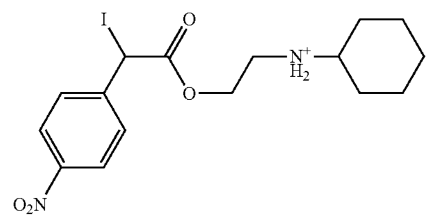
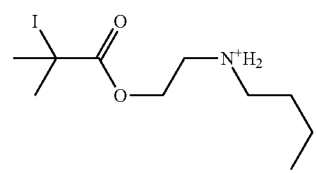
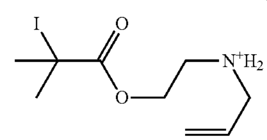
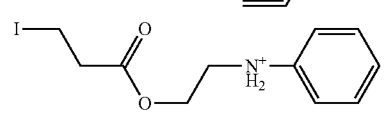
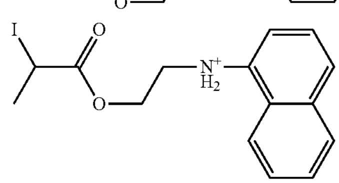
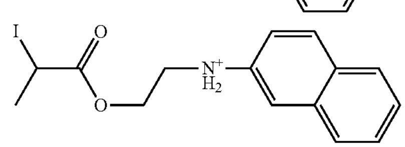
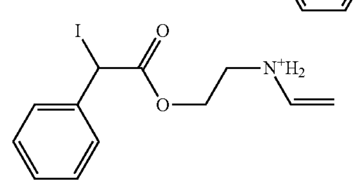

-continued
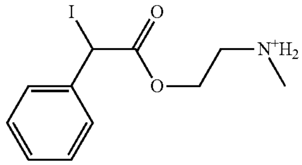
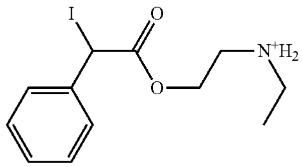
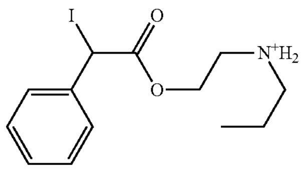
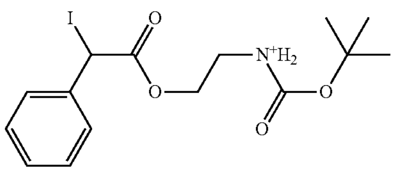
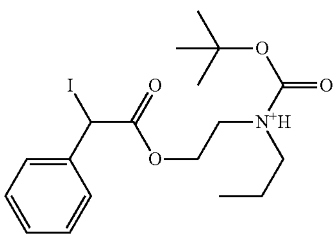
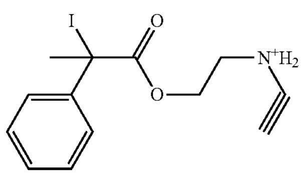
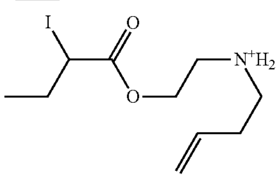
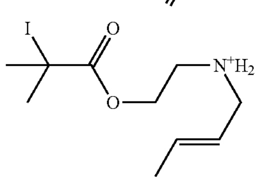
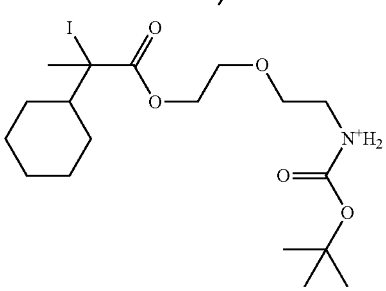
-continued
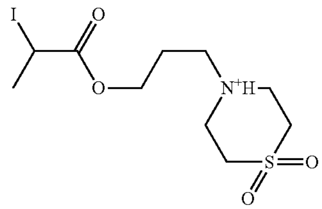
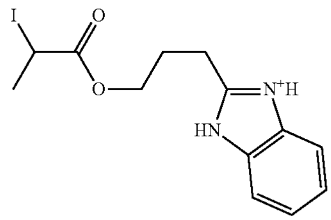
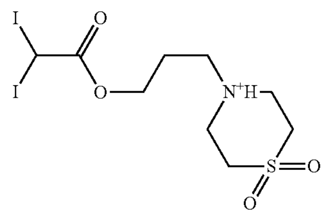
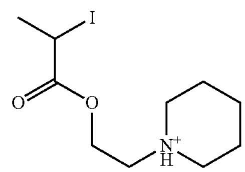
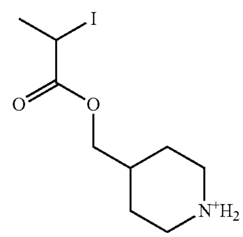
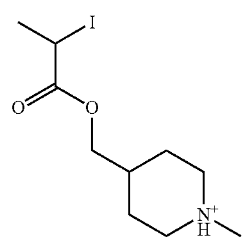
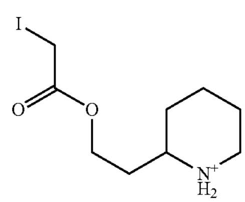
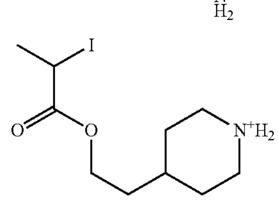

-continued
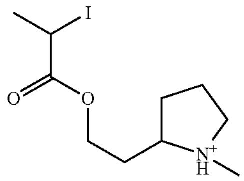
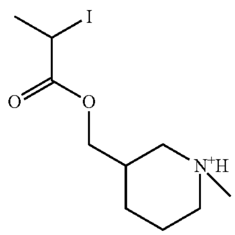
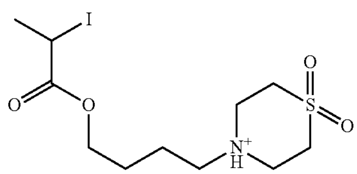
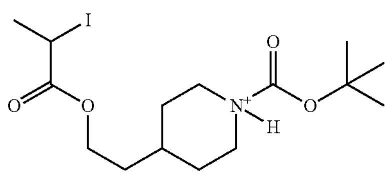
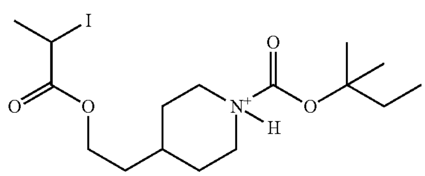
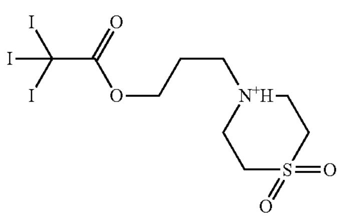
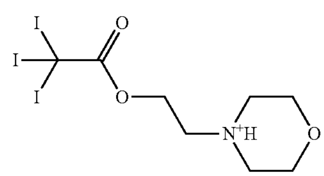
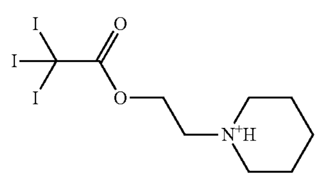
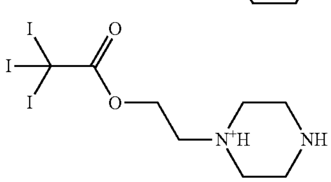
-continued
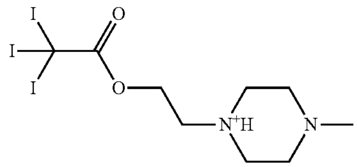
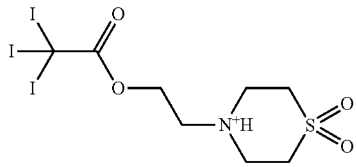
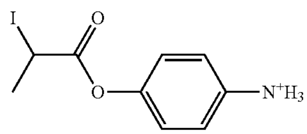
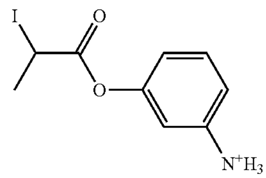
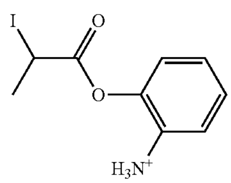
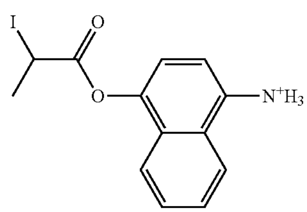
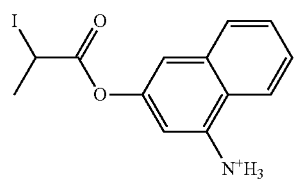
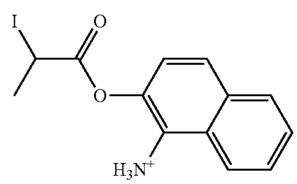
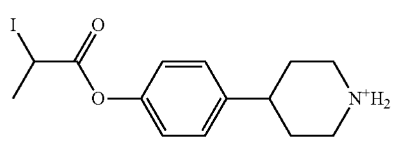
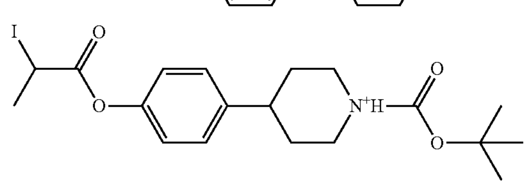

-continued
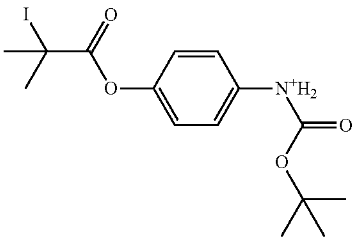
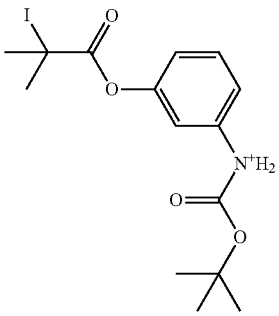
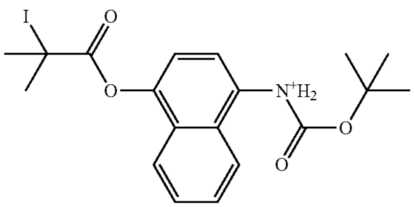
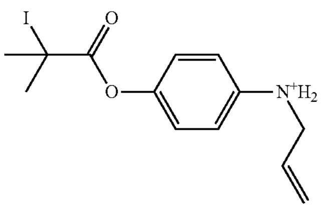
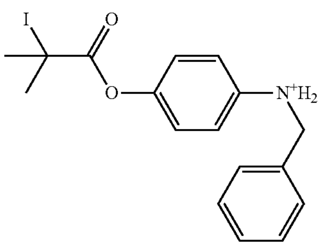
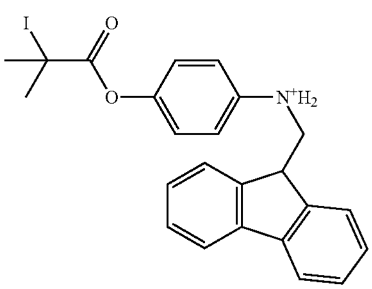
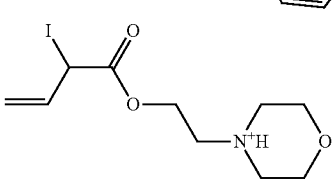
-continued
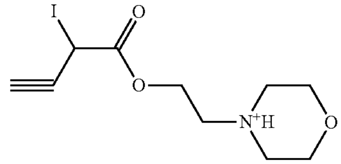
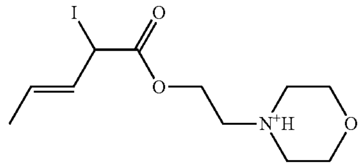
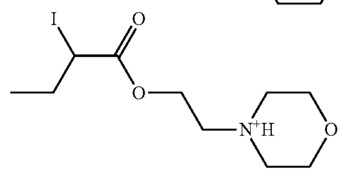
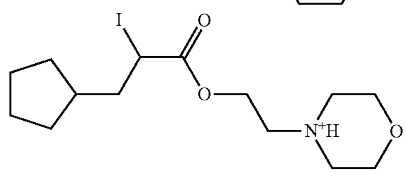
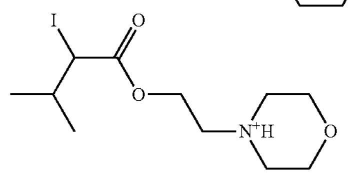
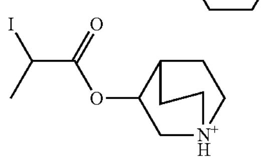
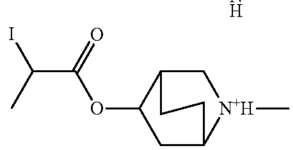
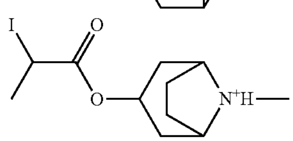
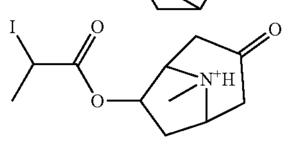
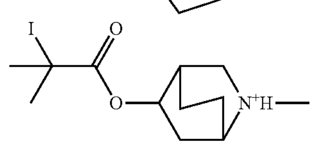
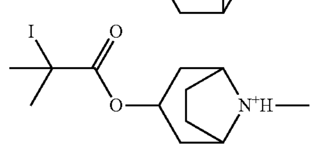
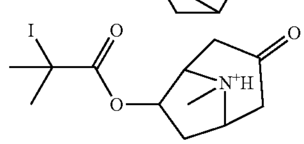

-continued
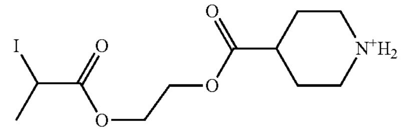
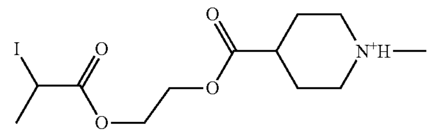
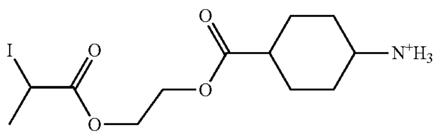
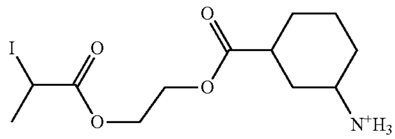
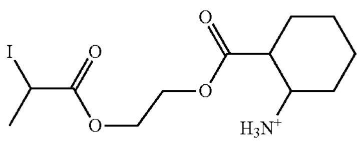
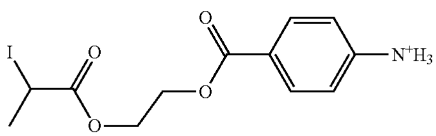
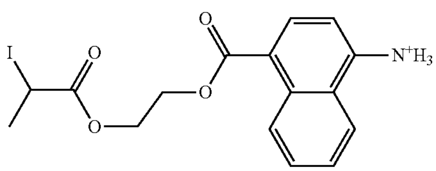
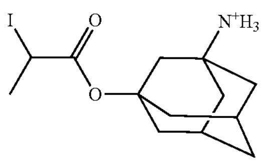
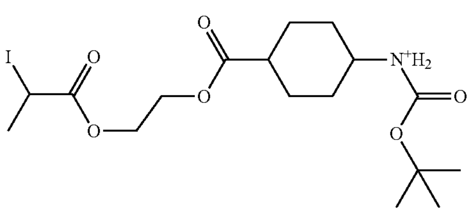
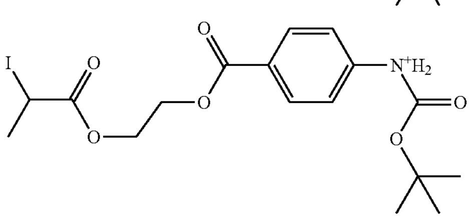
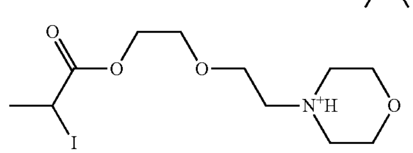
-continued
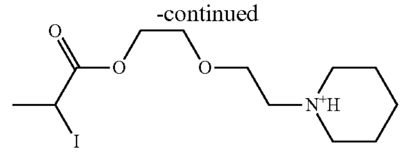
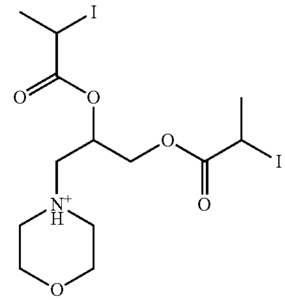
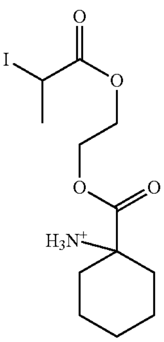
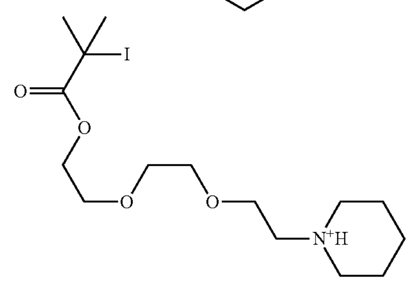
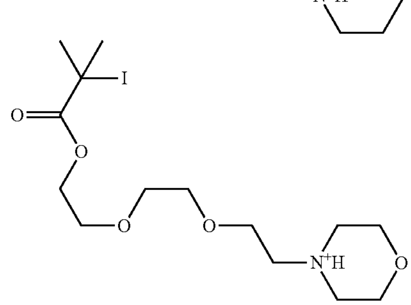
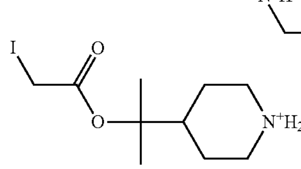
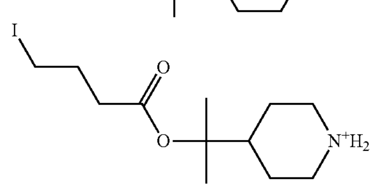
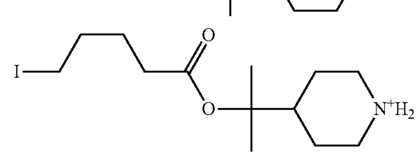

-continued
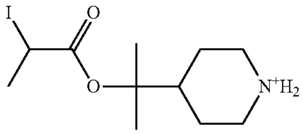
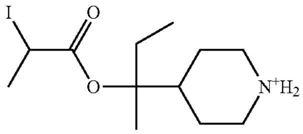
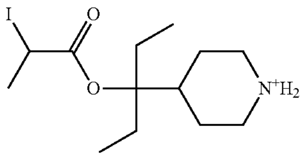
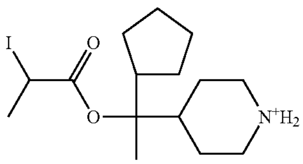
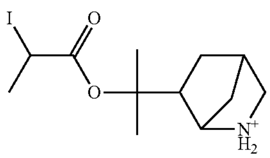
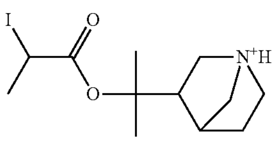
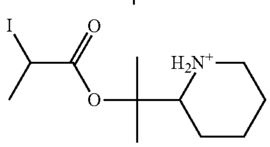
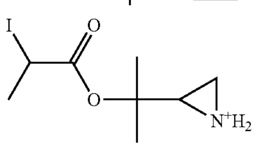
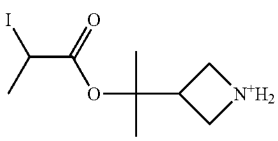
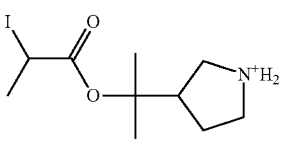
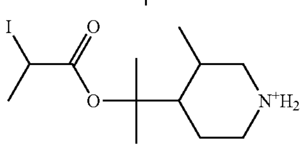
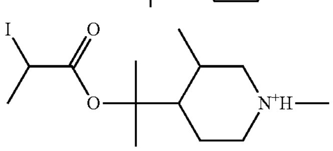
-continued
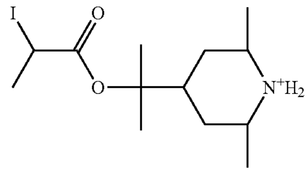
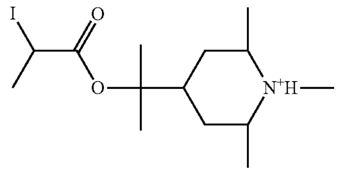
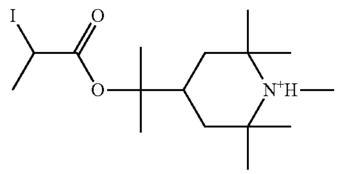
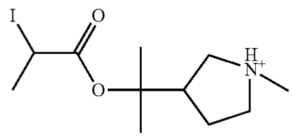
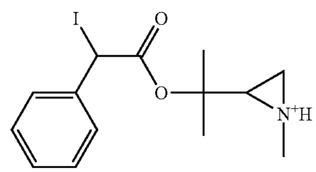
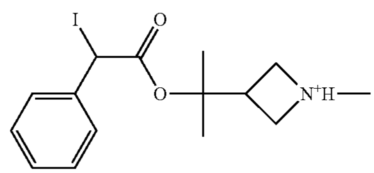
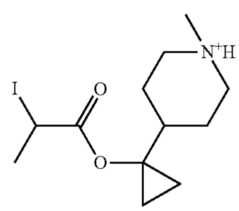
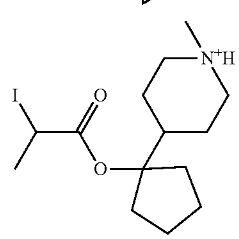
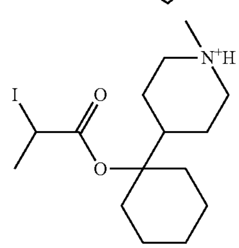

-continued
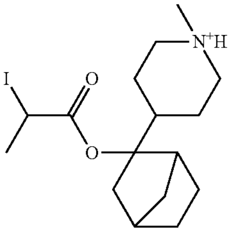
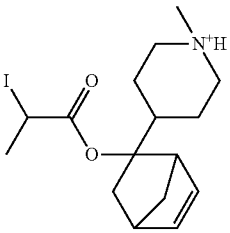
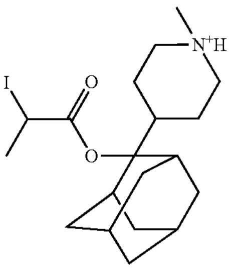
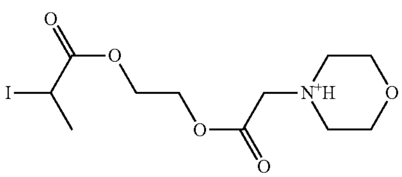
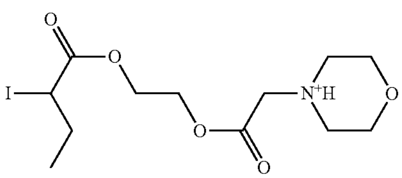
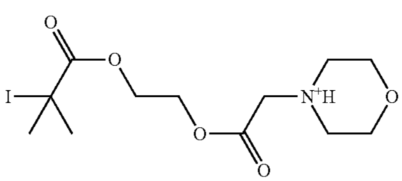
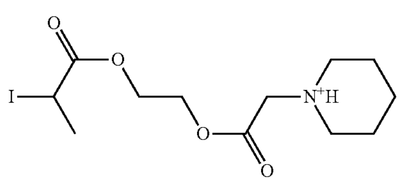
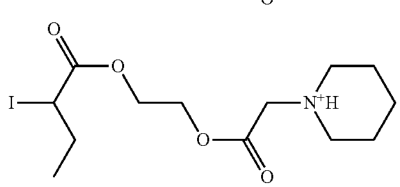
-continued
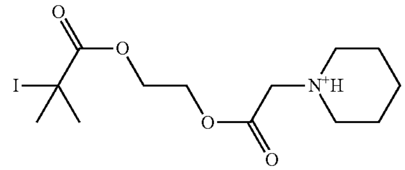
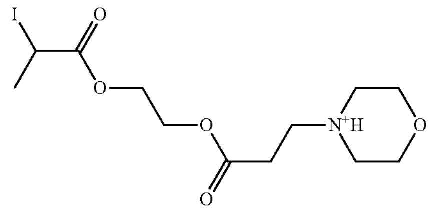
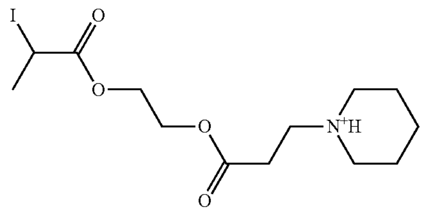
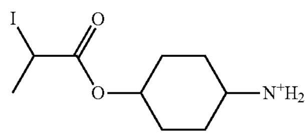
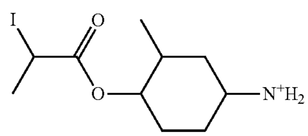
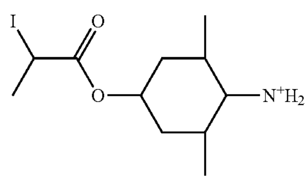
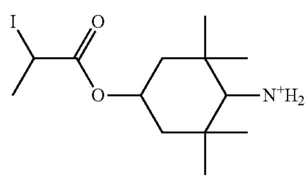
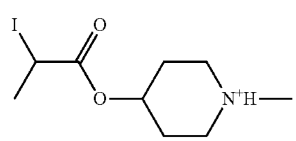
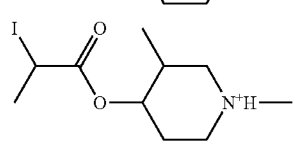
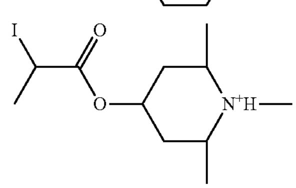

-continued
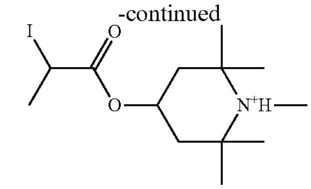
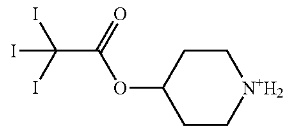
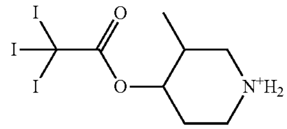
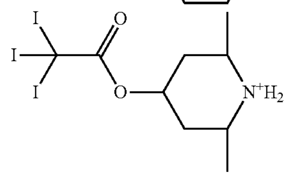
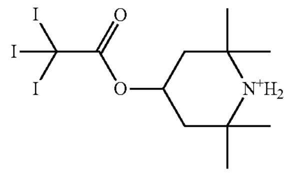
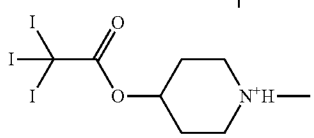
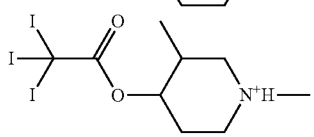
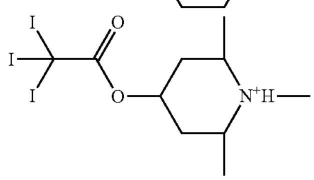
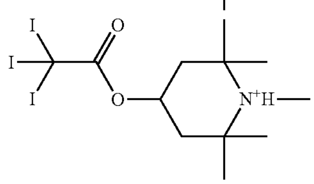
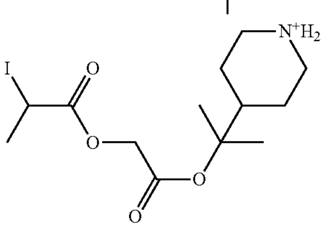
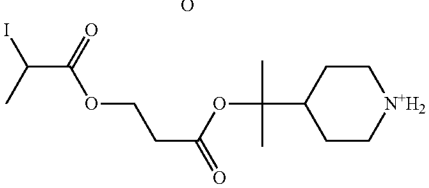
-continued
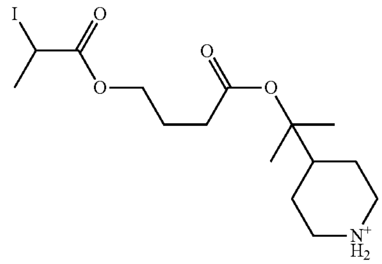
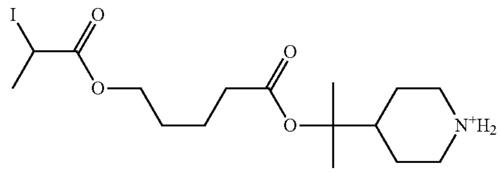
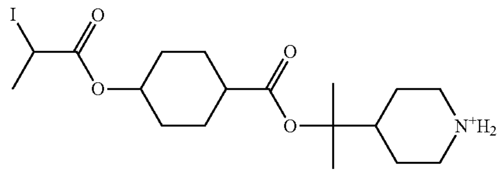
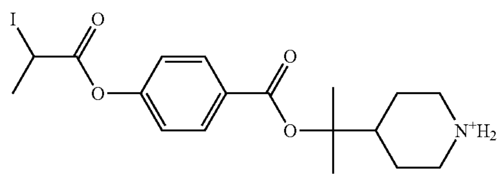
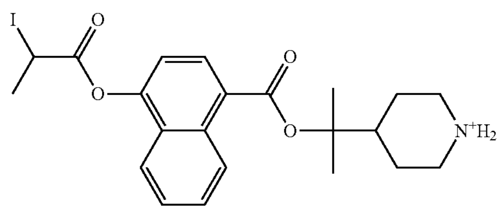
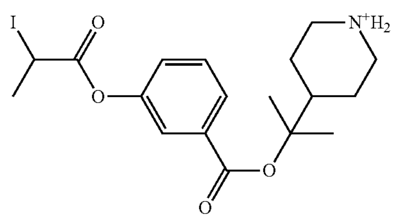
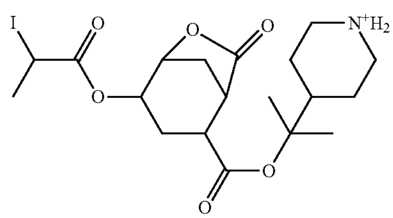
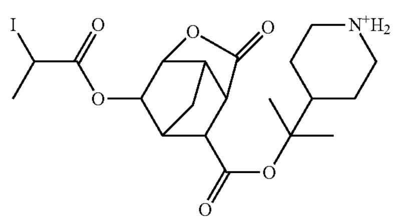

-continued
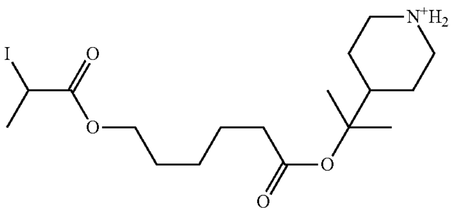
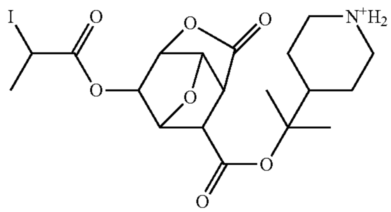
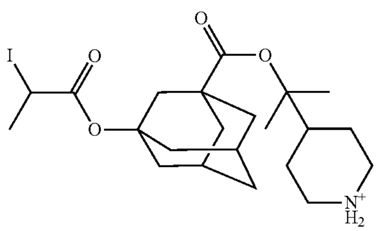
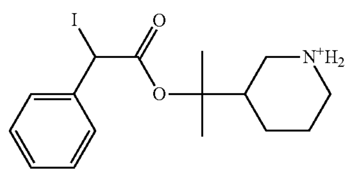
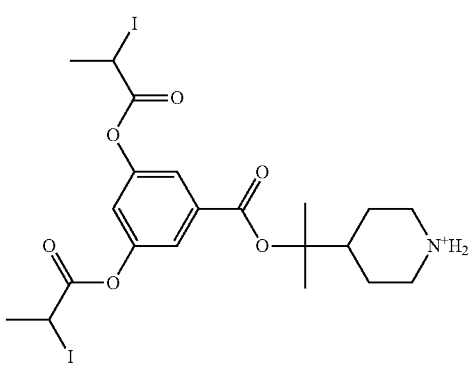
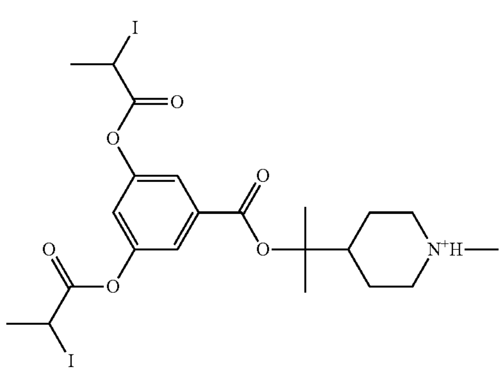
-continued
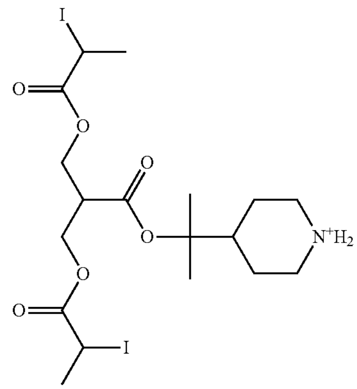
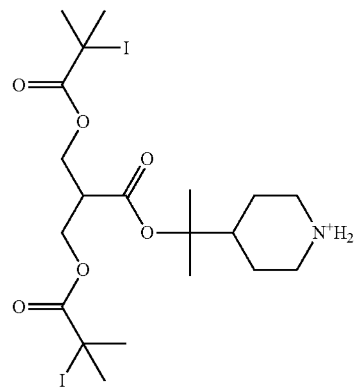
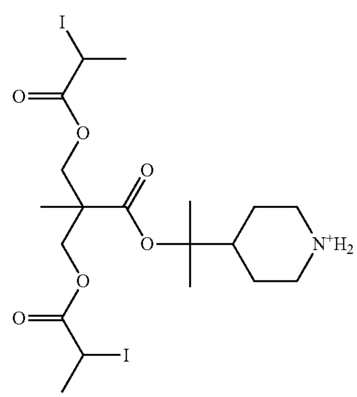
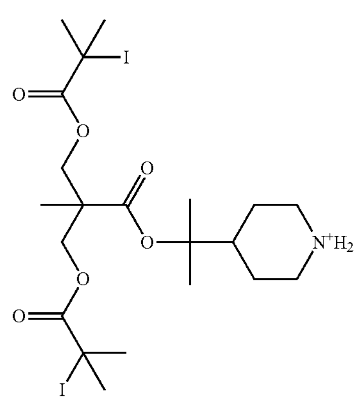

-continued
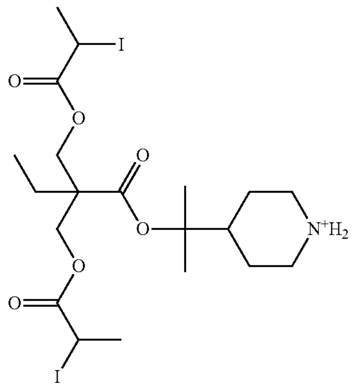
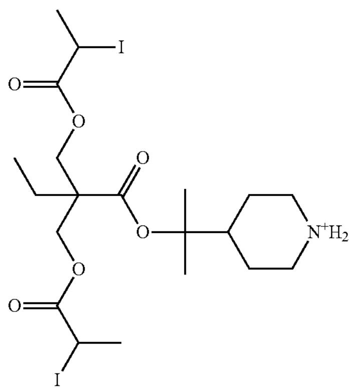
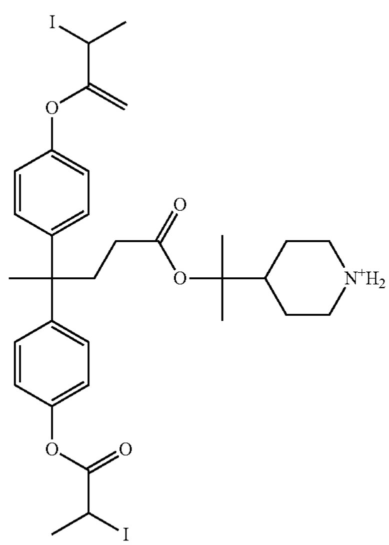
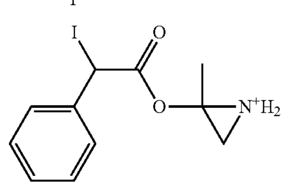
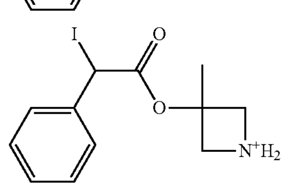
-continued
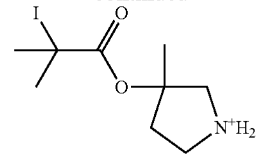
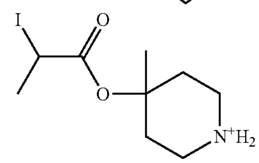
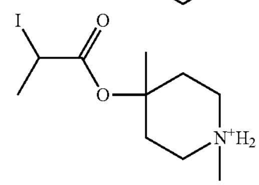
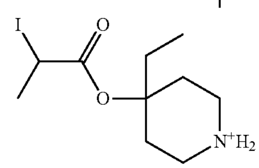
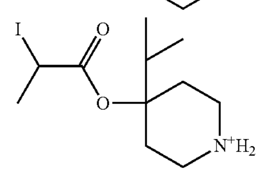
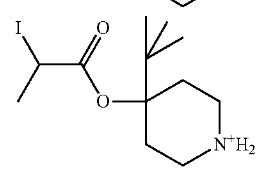
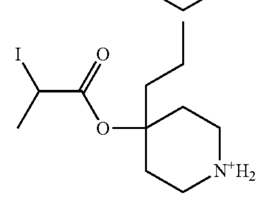
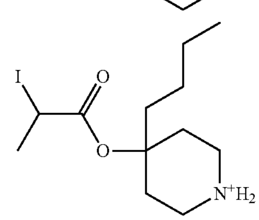
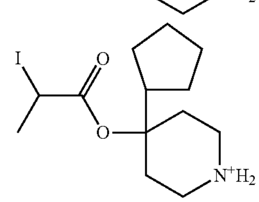
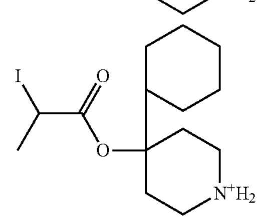

-continued
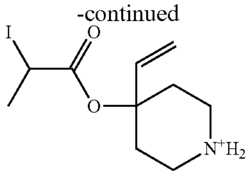
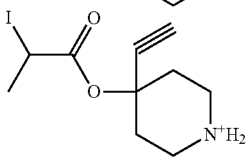
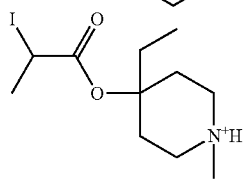
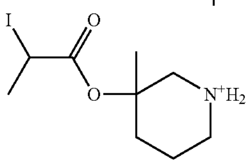
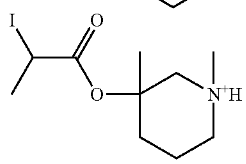
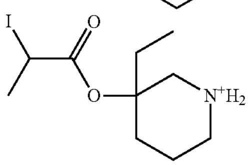
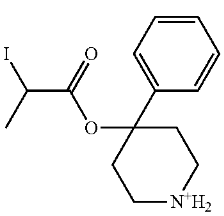
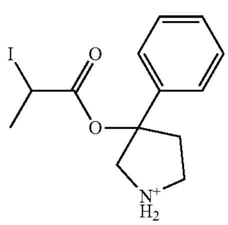
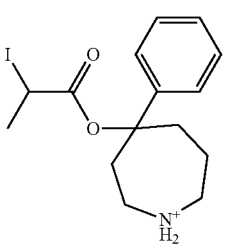
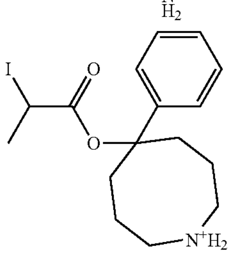
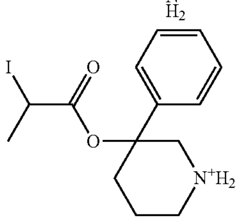
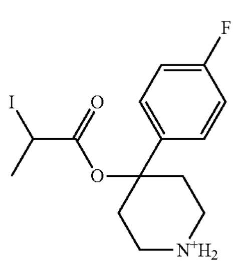
-continued
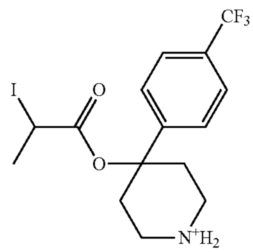
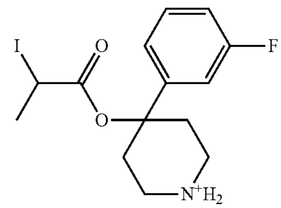
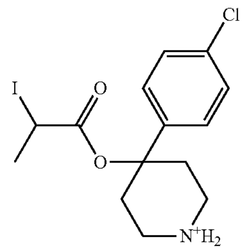
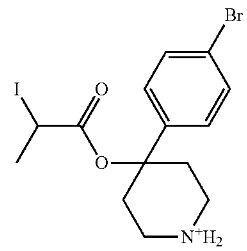
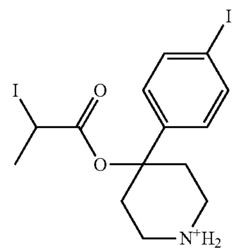
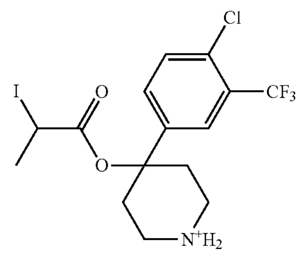
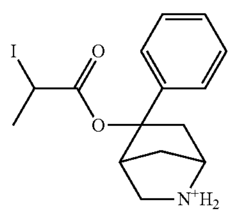
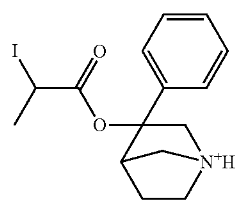
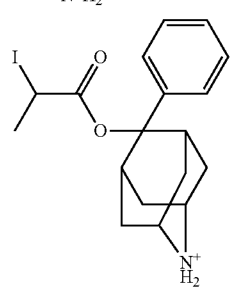
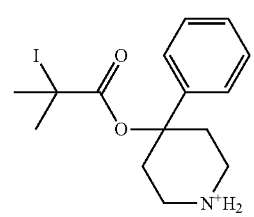
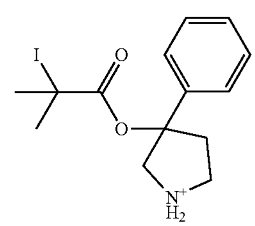
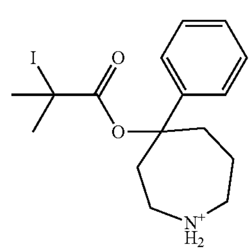
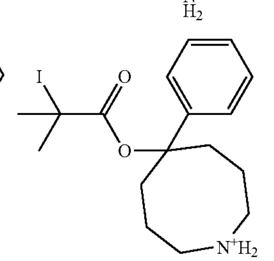

-continued
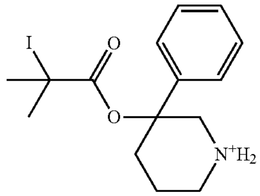
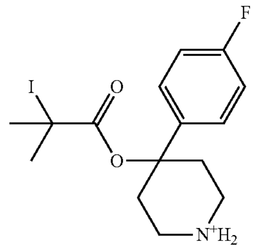
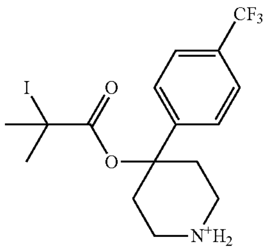
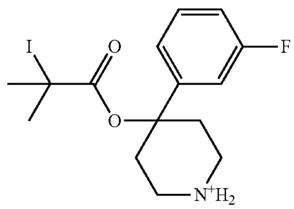
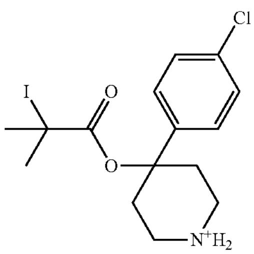
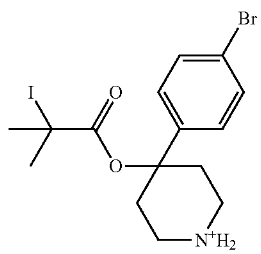
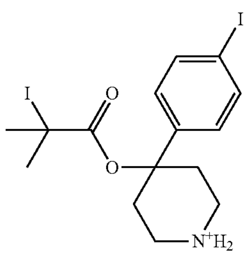
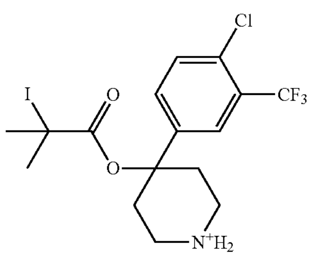
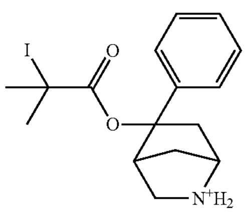
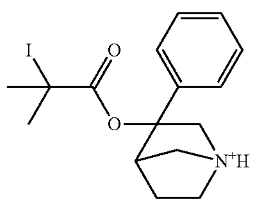
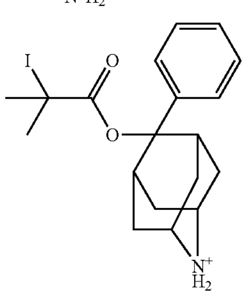
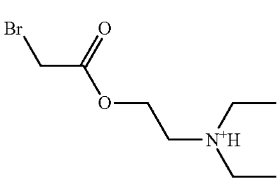
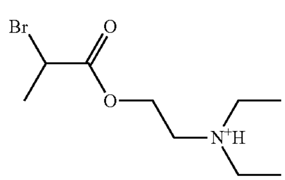
-continued
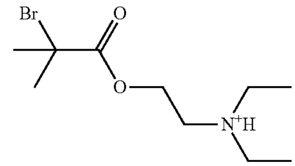
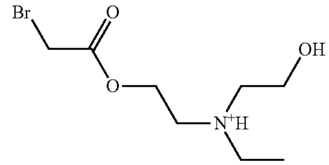
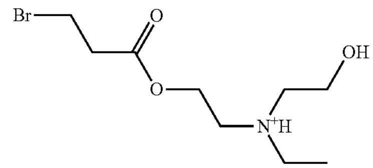
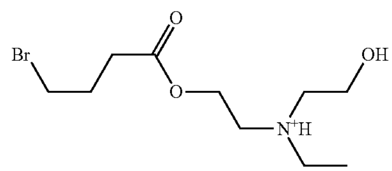
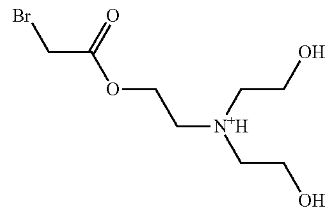
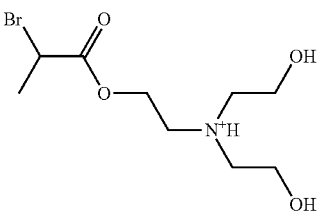
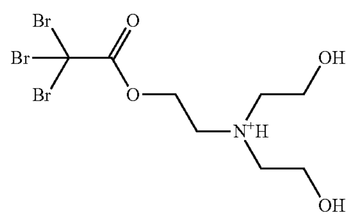
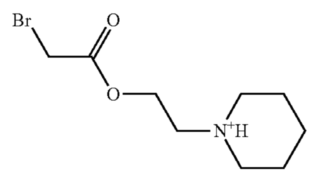
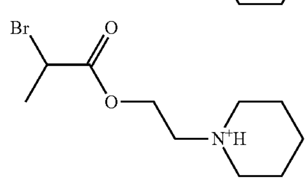

-continued
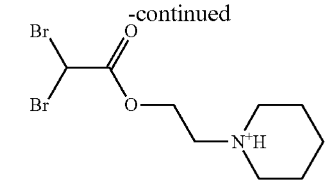
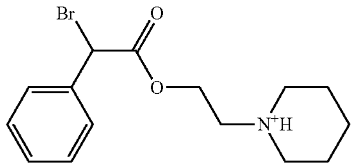
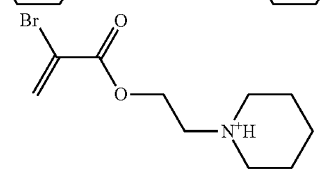
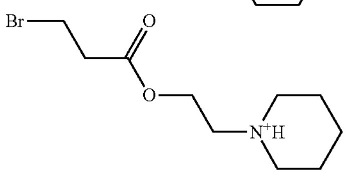
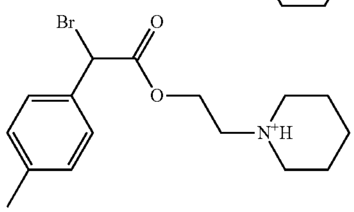
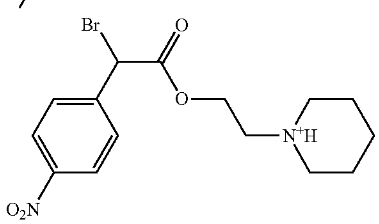
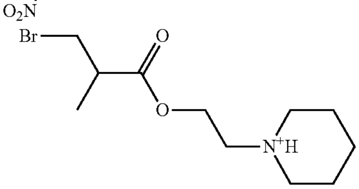
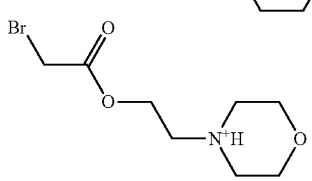
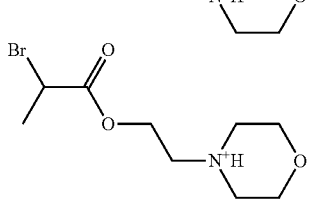
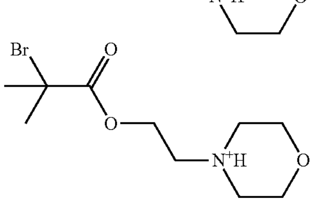
-continued
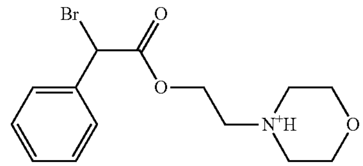
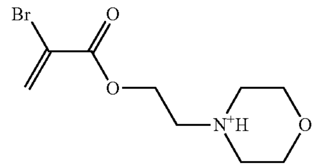
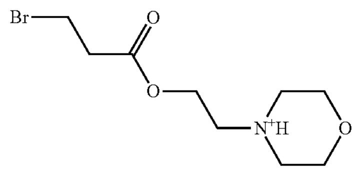
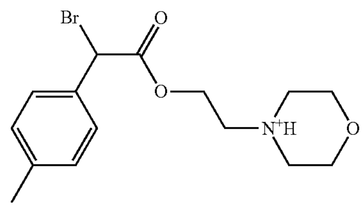
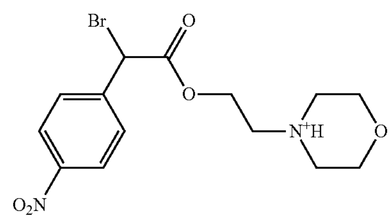
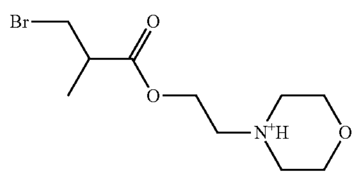
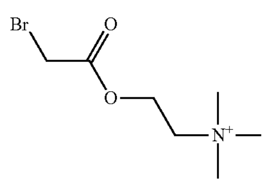
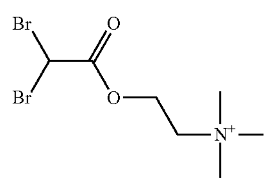
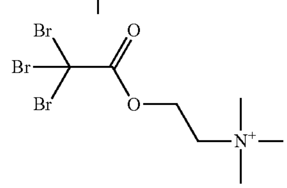
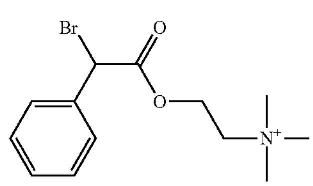
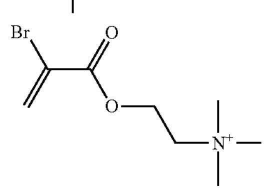

-continued
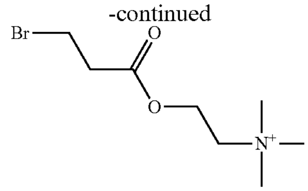
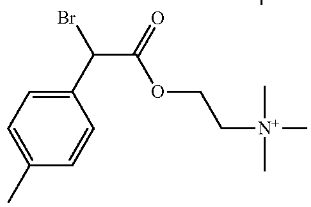
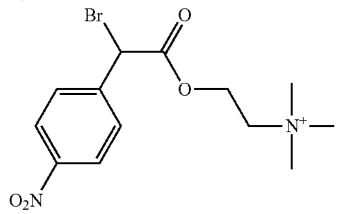
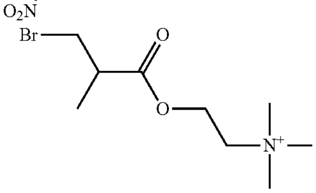
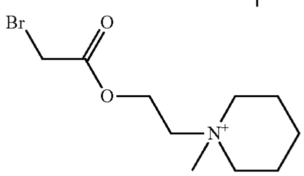
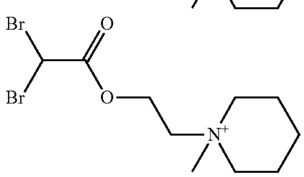
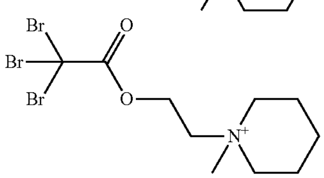
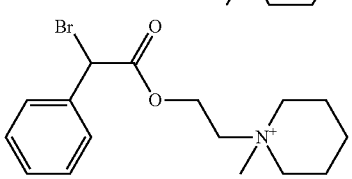
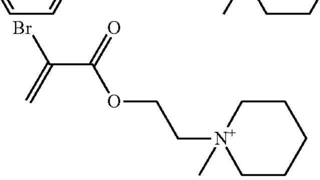
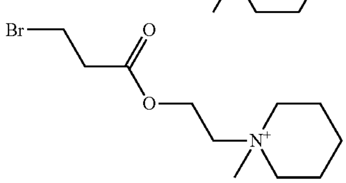
-continued
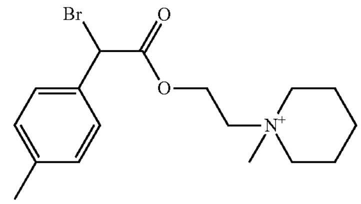
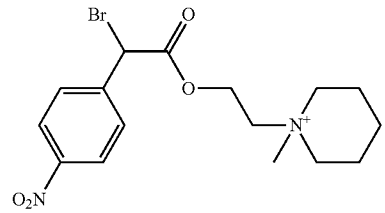
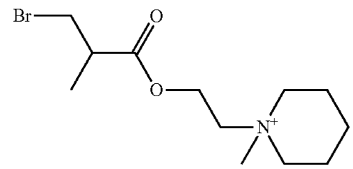
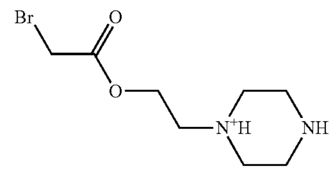
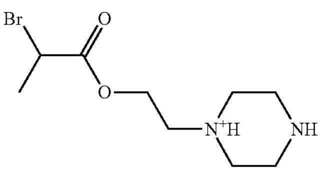
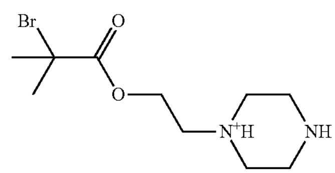
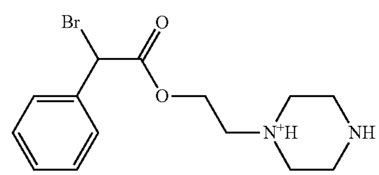
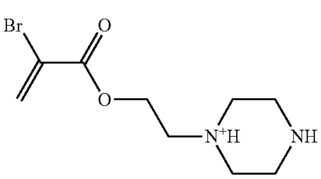
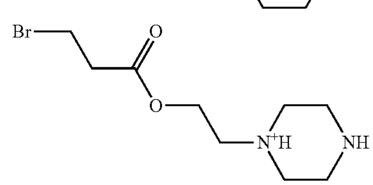

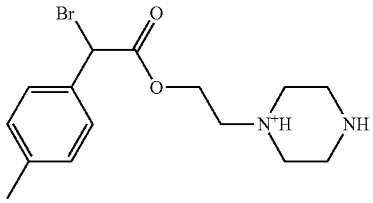
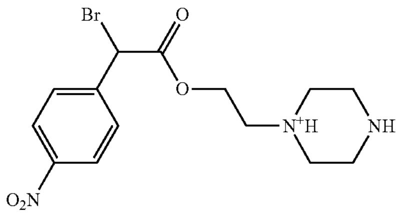
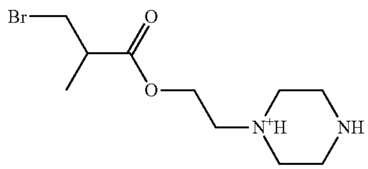
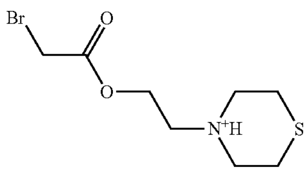
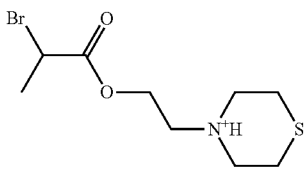
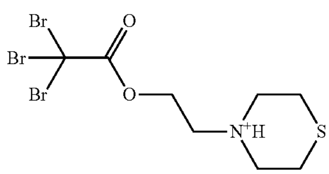
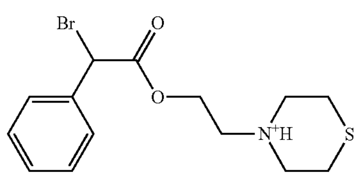
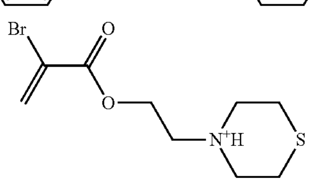
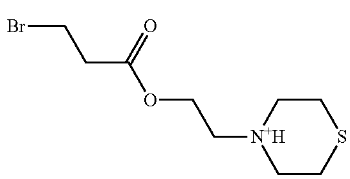
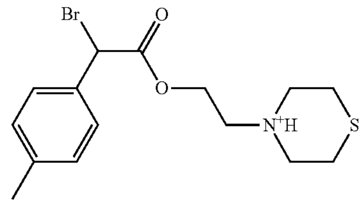
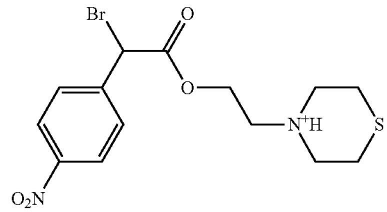
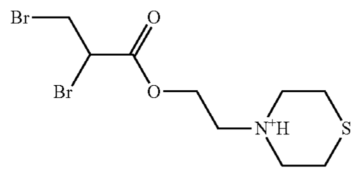
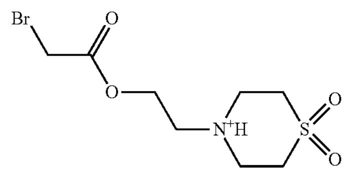
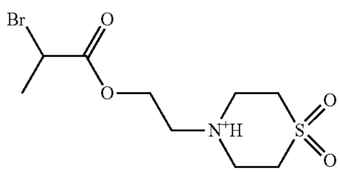
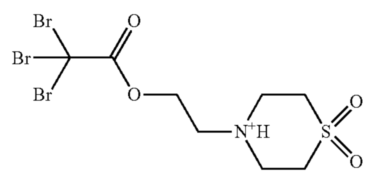
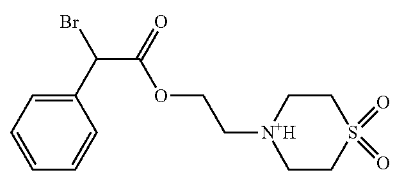
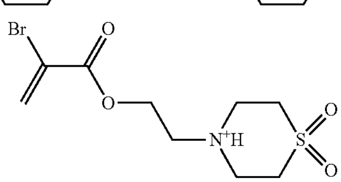
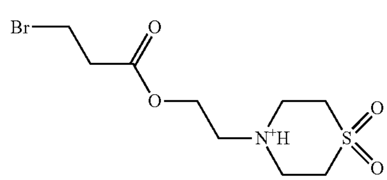

-continued
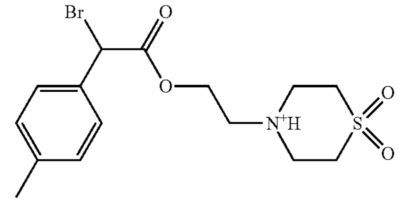
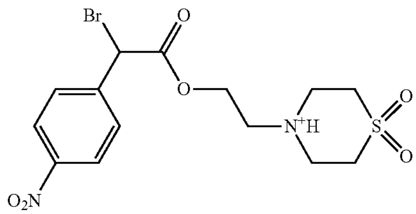
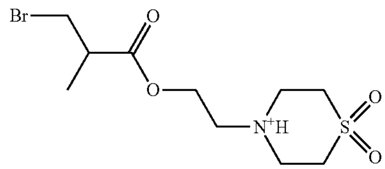
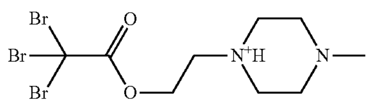
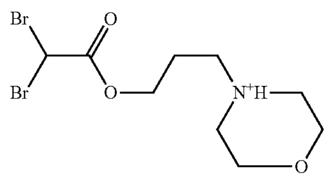
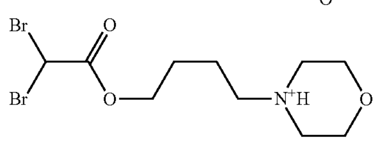
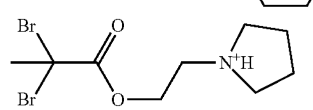
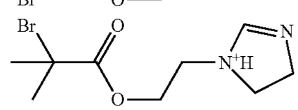
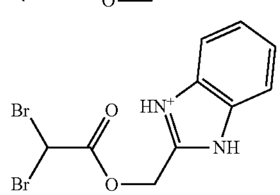
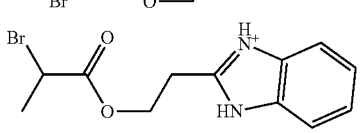
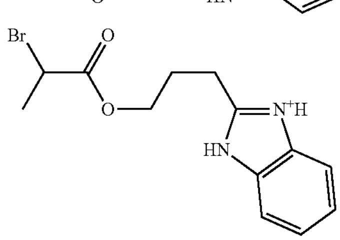
-continued
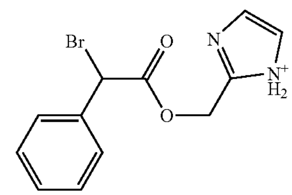
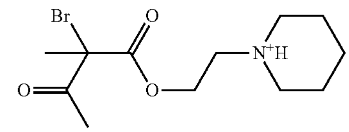
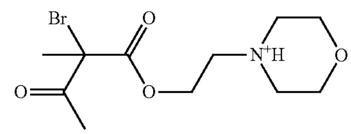
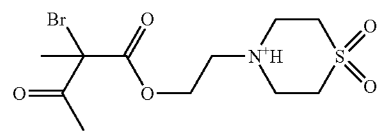
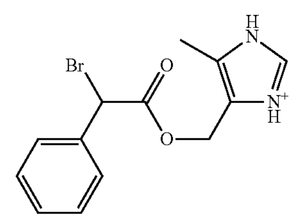
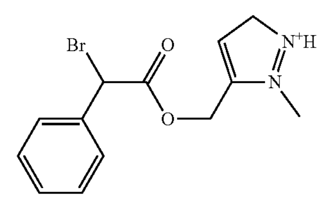
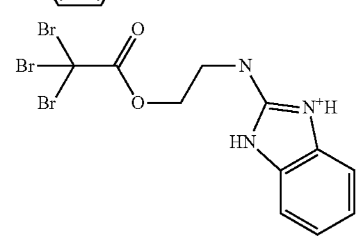
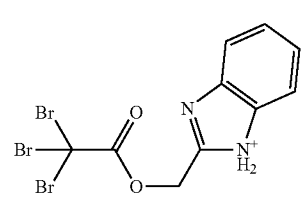
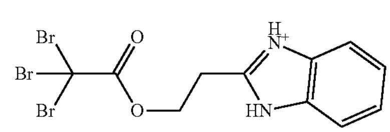

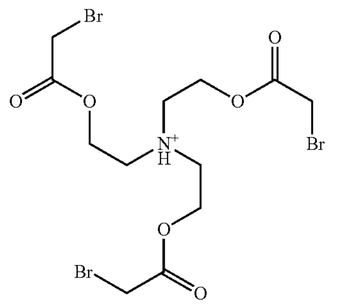
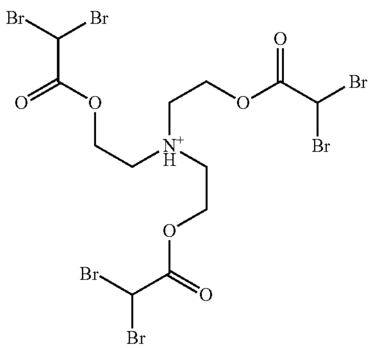
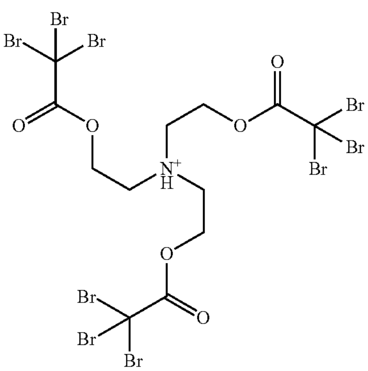
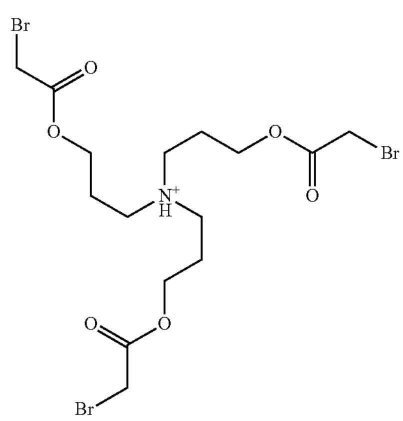
-continued
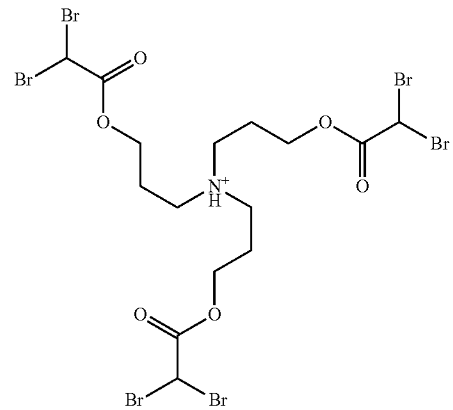
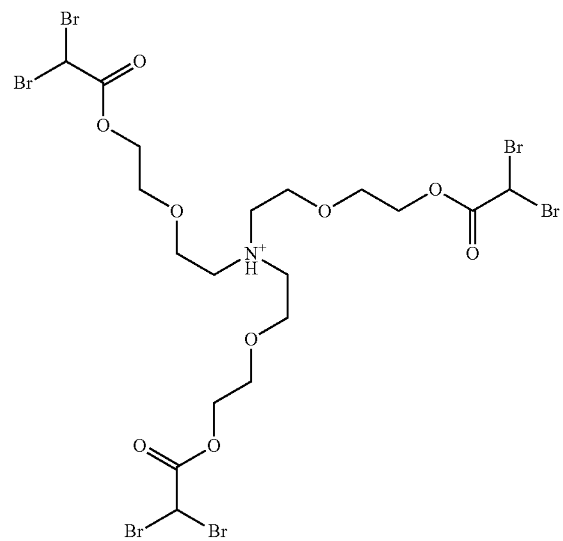
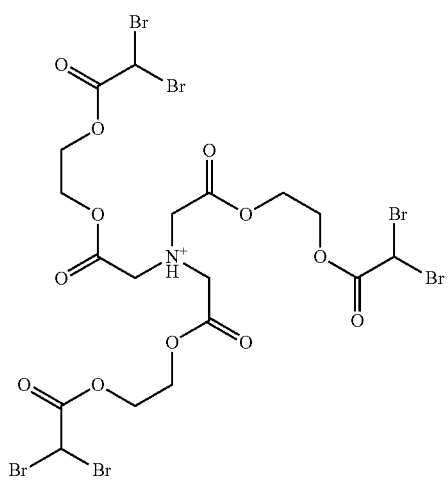
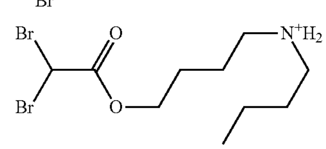
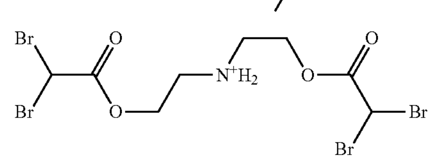

-continued
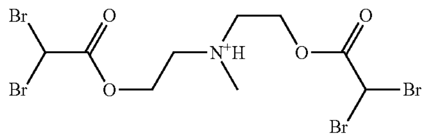
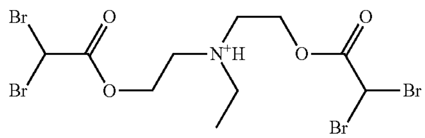
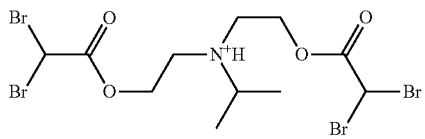
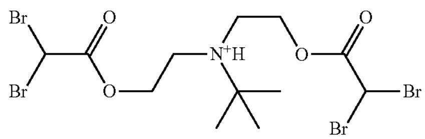
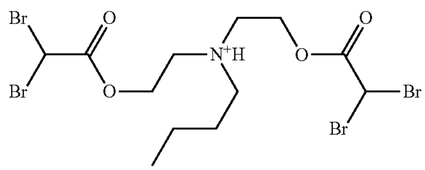
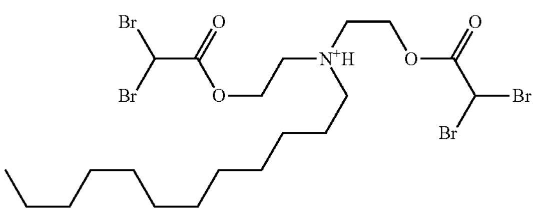
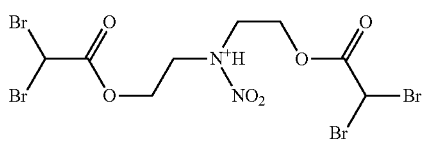
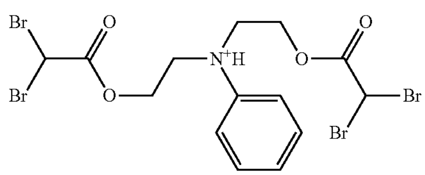
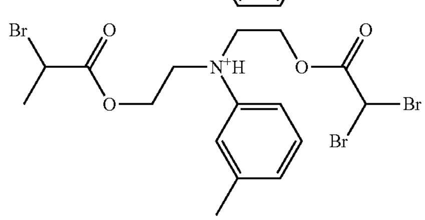
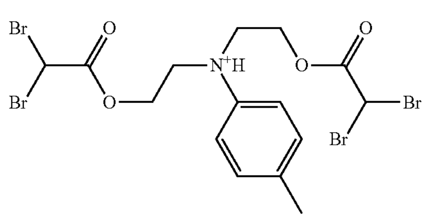
-continued
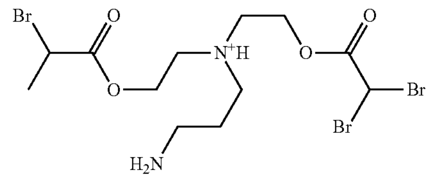
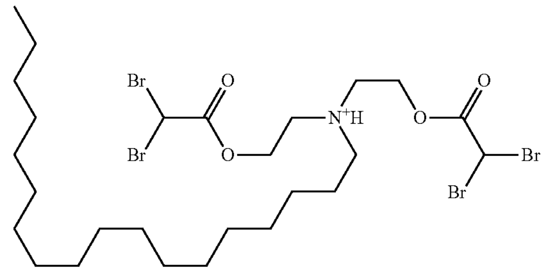
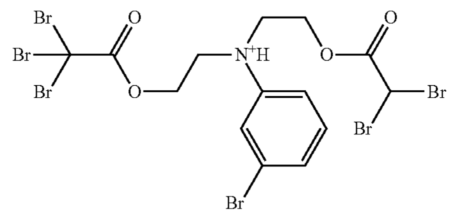
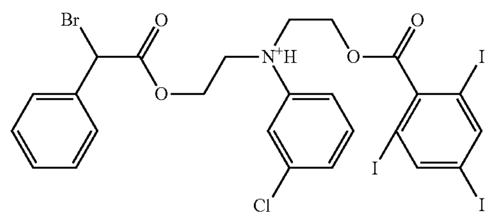
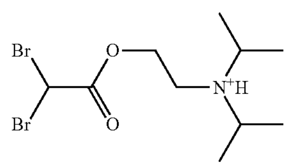
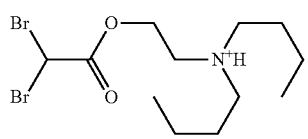
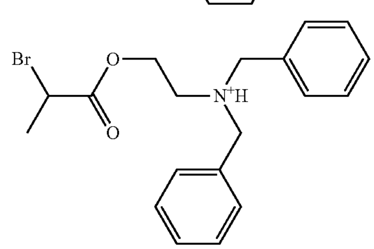
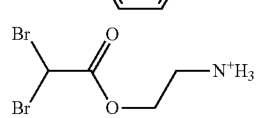
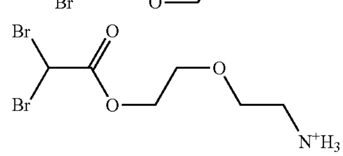

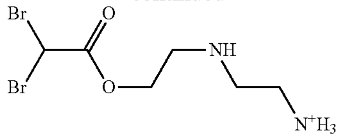
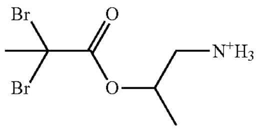
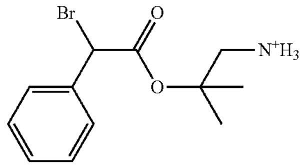
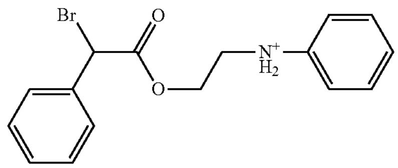
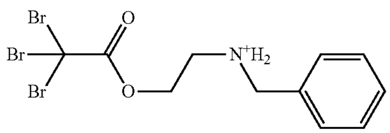
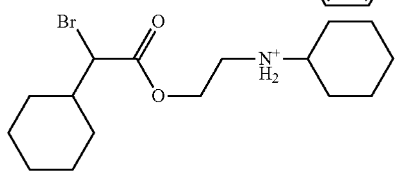
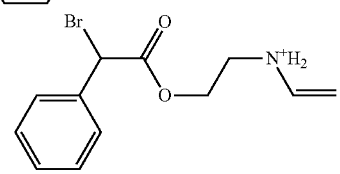
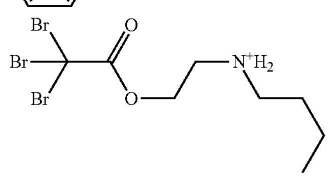
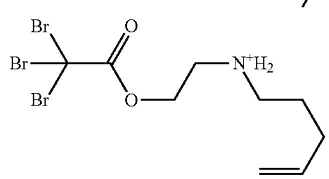
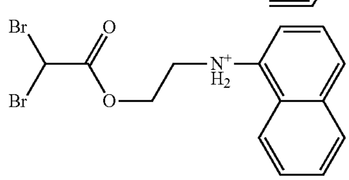
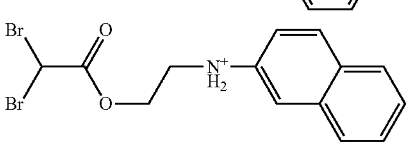
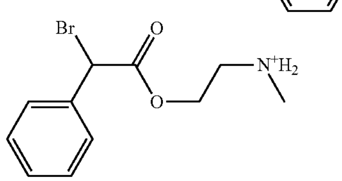
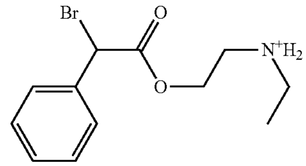
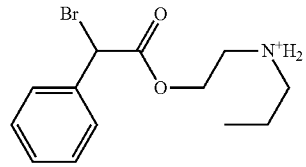
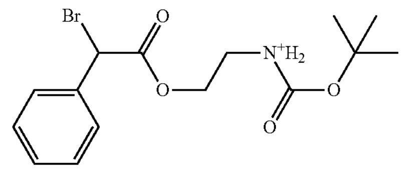
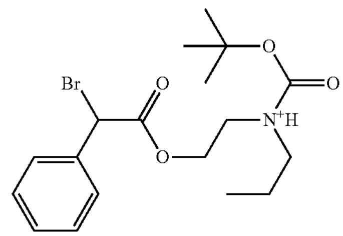
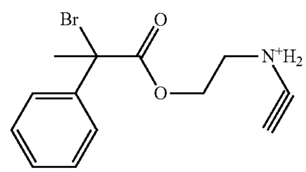
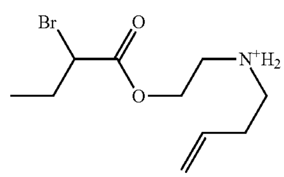
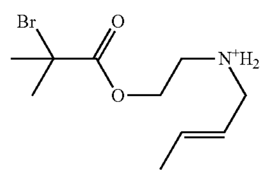
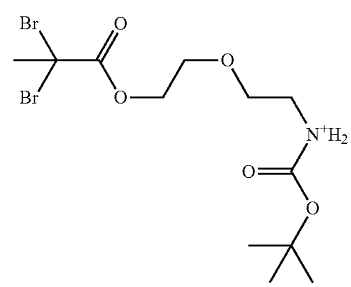
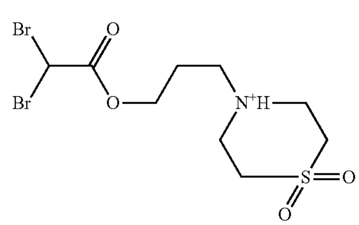

-continued
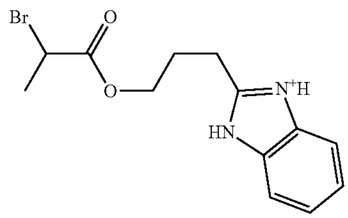
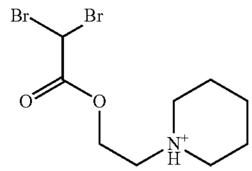
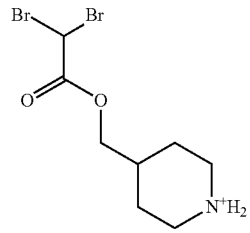
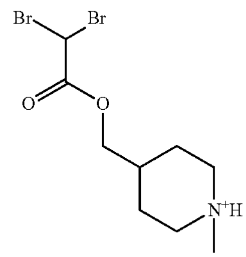
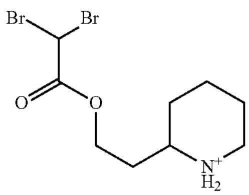
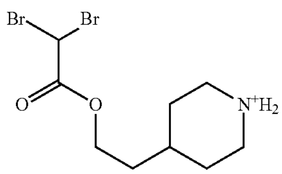
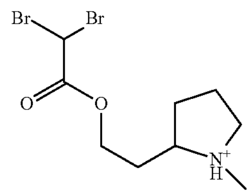
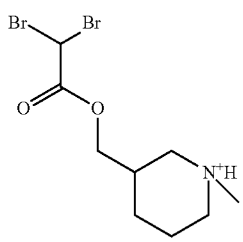
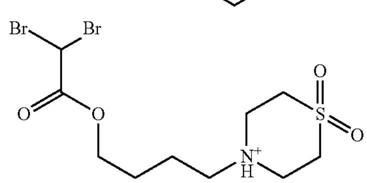
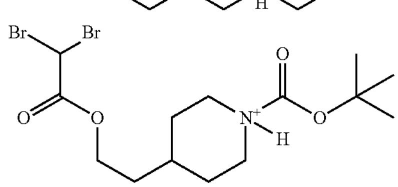
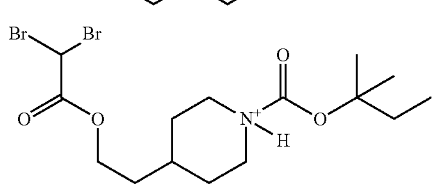
-continued
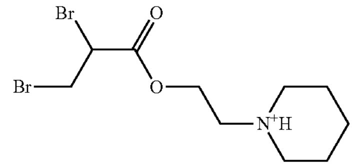
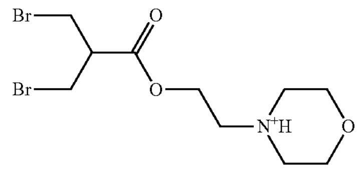
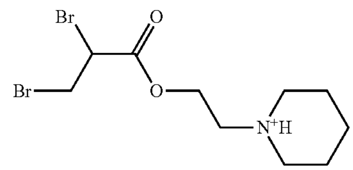
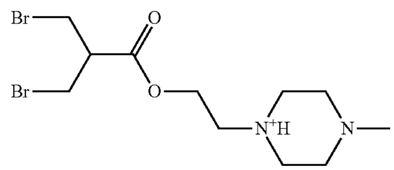
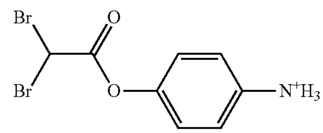
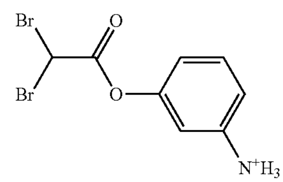
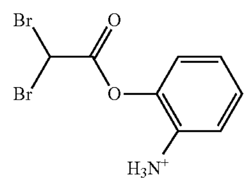
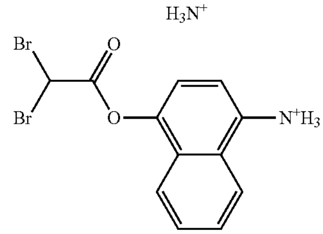
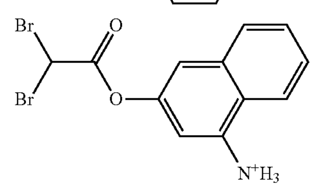
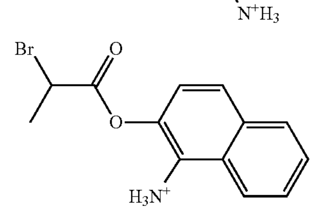

-continued
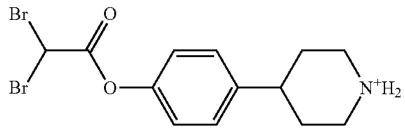
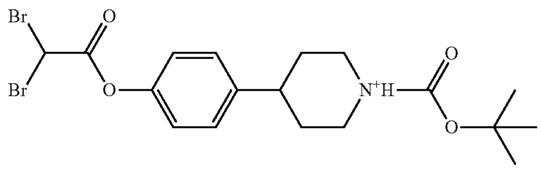
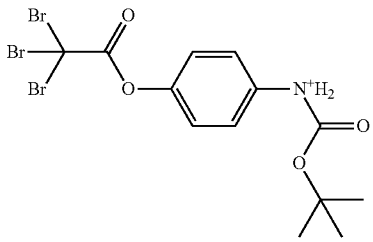
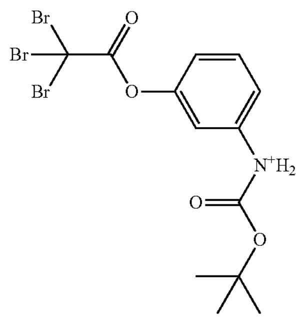
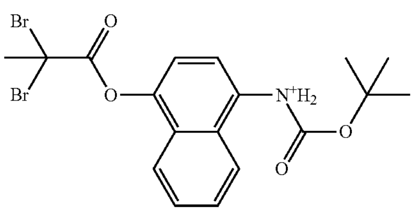
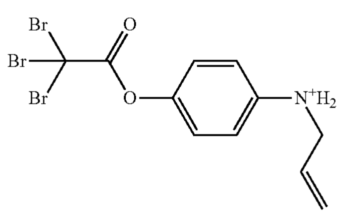
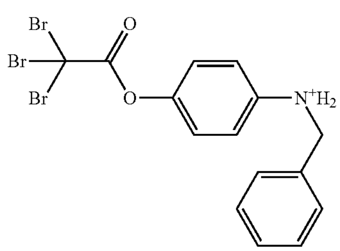
-continued
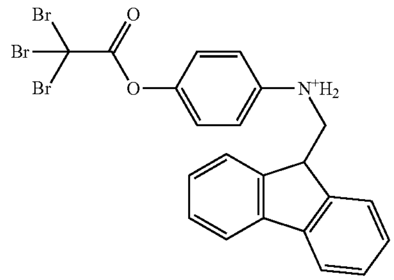
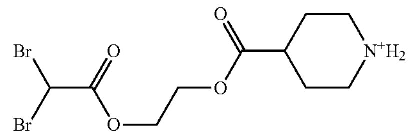
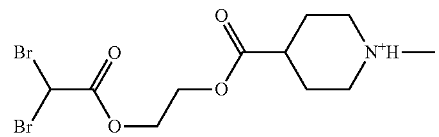
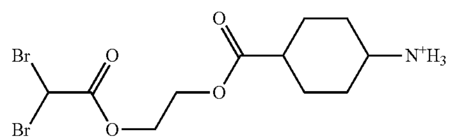
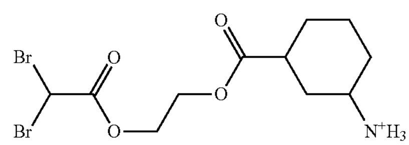
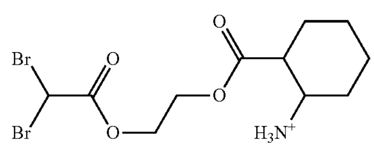
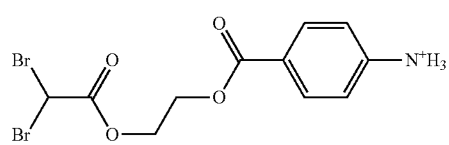
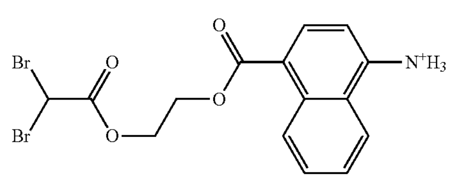
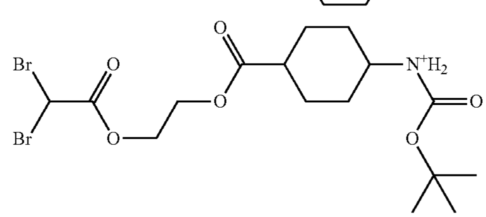
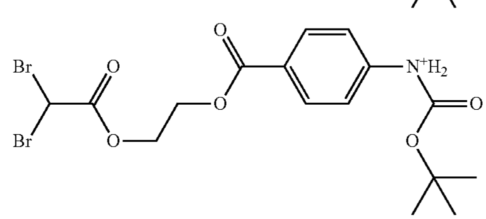

-continued
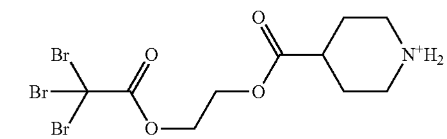
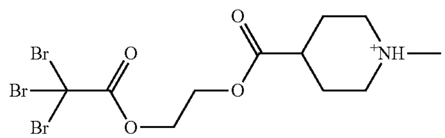
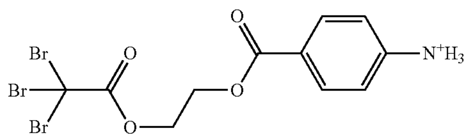
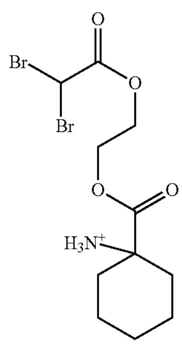
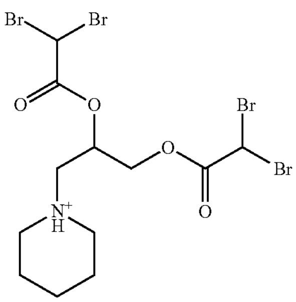
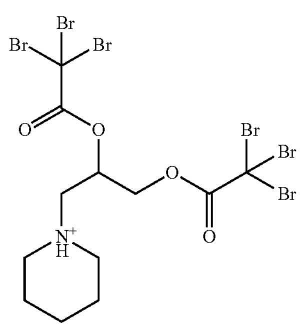
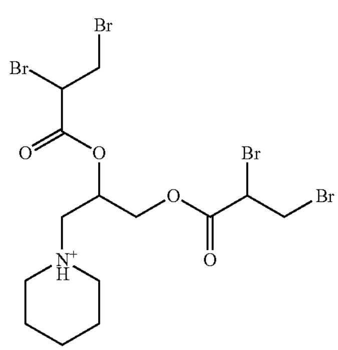
-continued
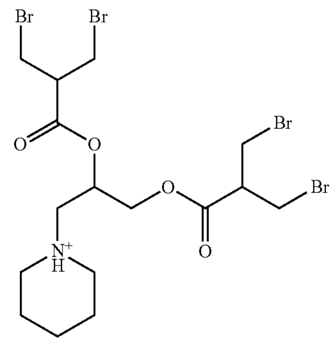
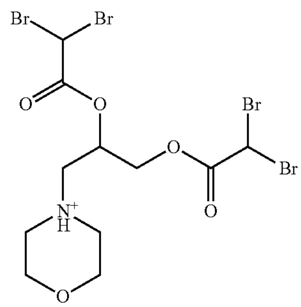
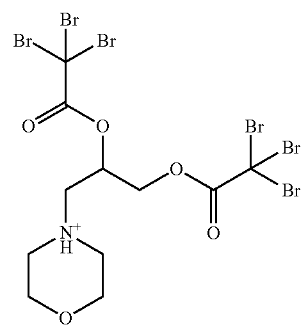
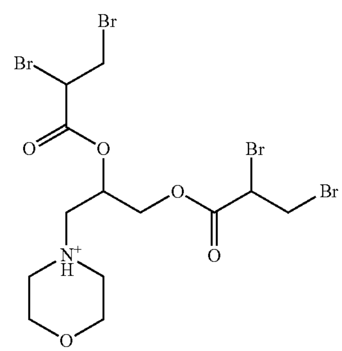
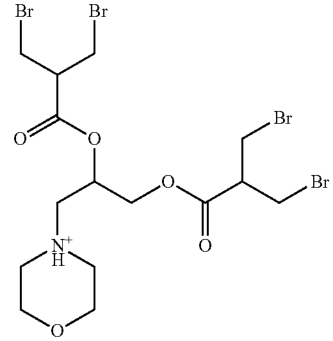

-continued
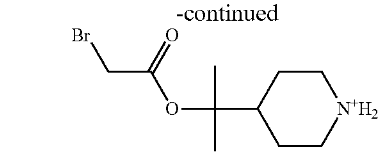
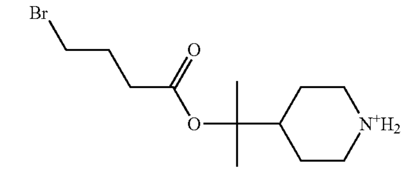
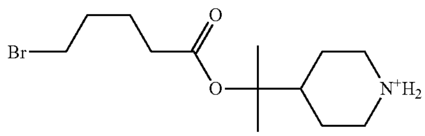
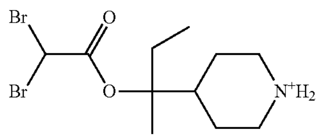
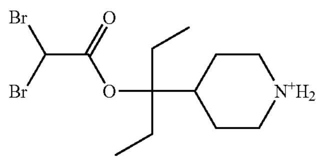
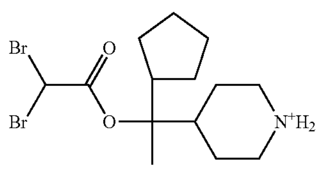
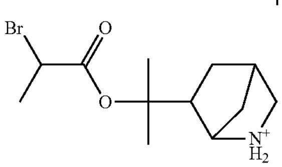
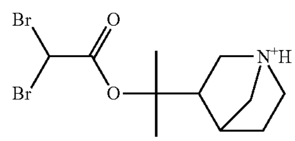
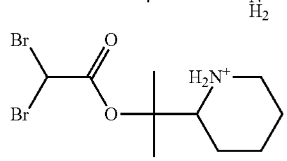
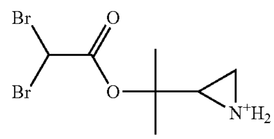
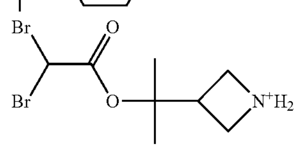
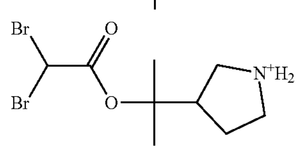
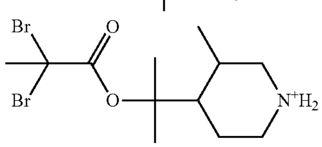
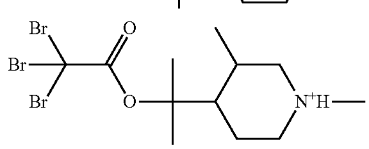
-continued
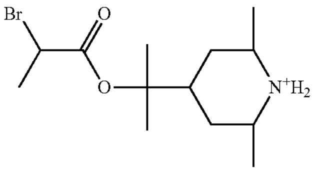
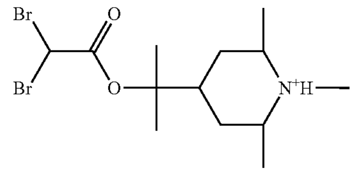
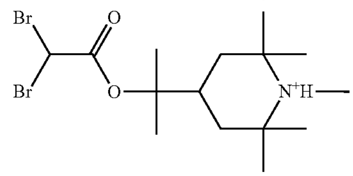
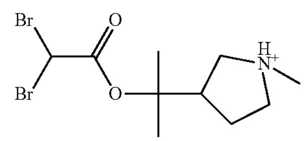
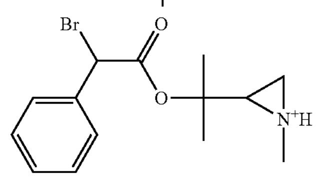
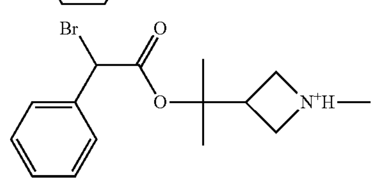
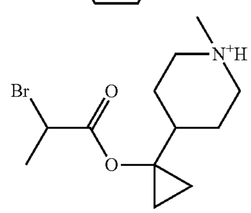
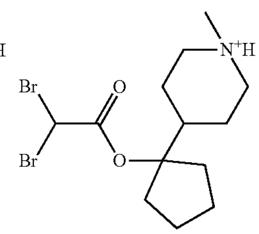
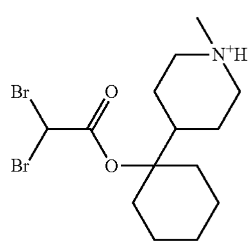
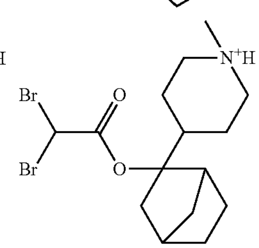
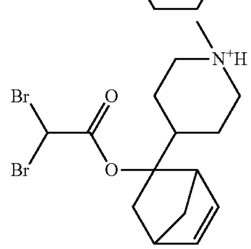
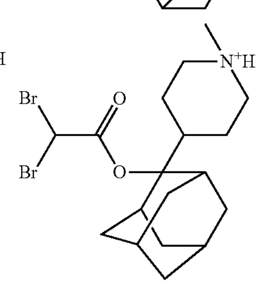

-continued
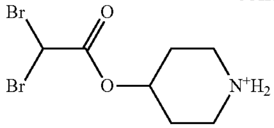
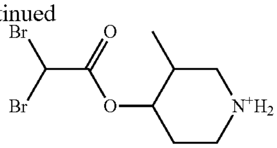
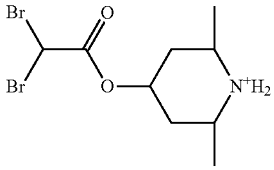
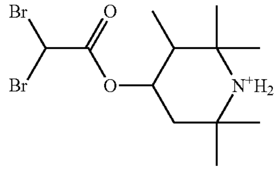
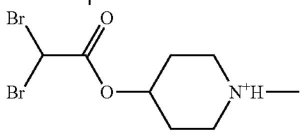
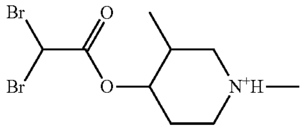
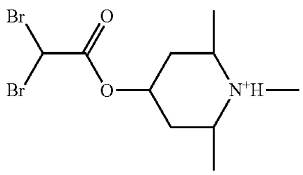
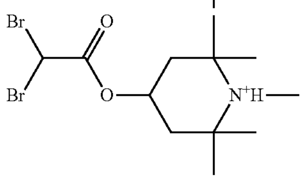
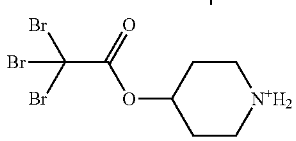
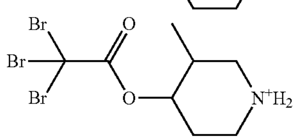
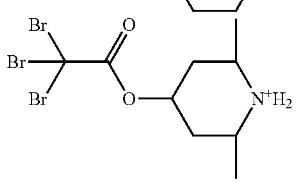
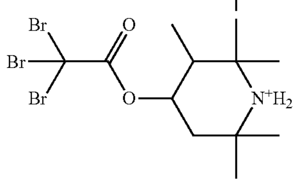
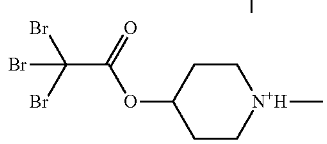
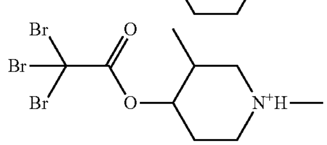
-continued
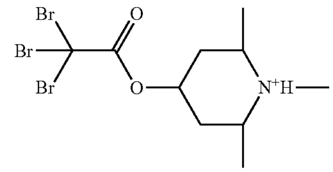
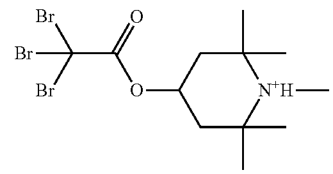
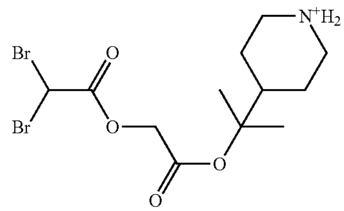
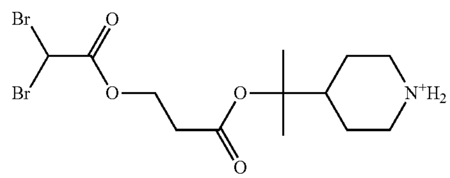
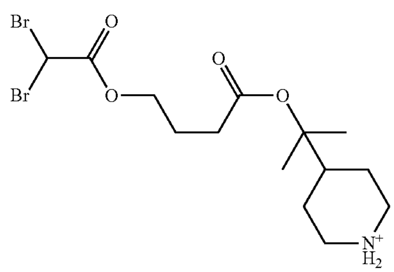
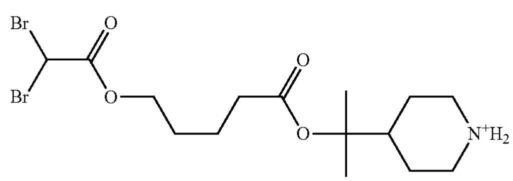
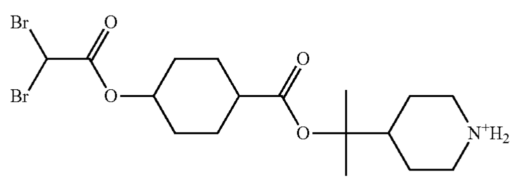
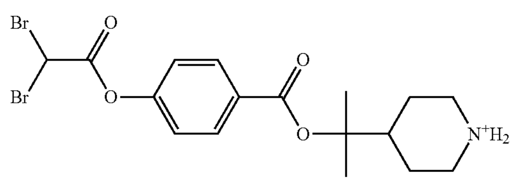

-continued
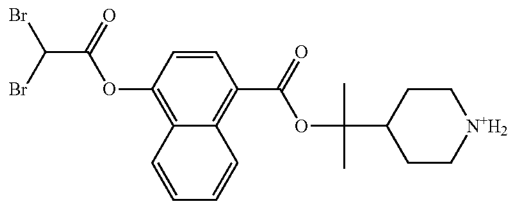
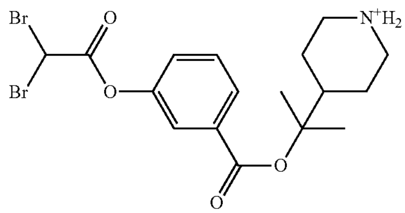
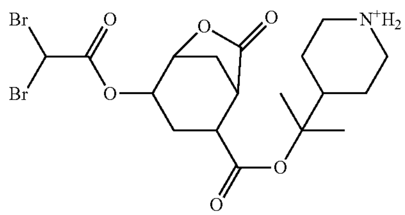
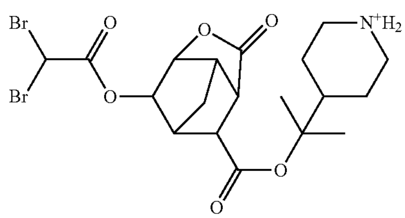
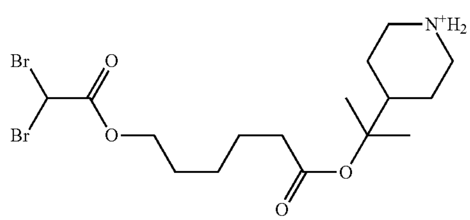
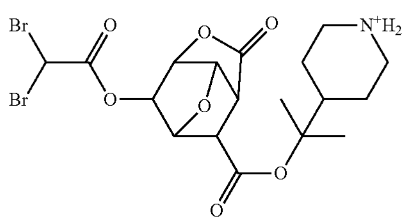
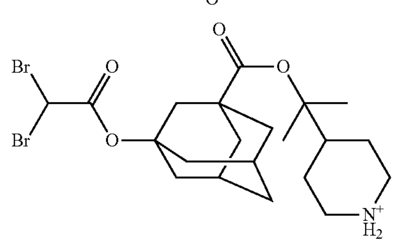
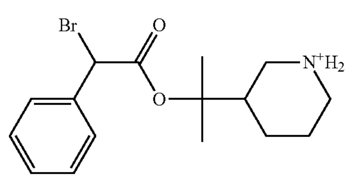
-continued
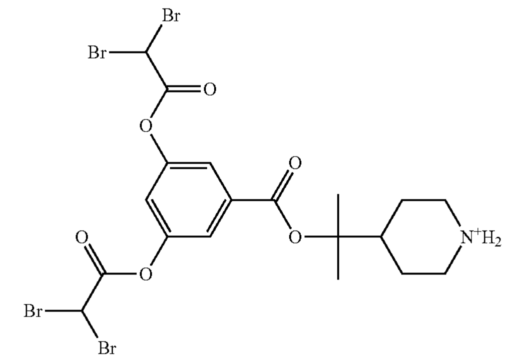
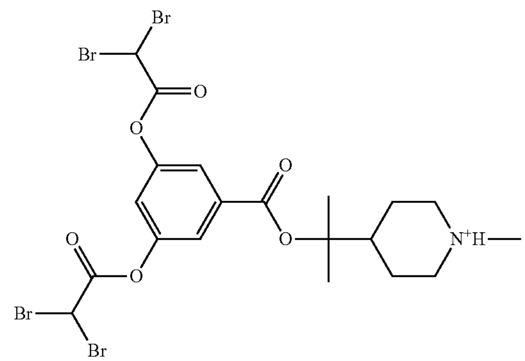
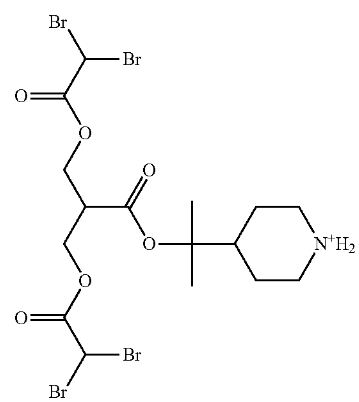
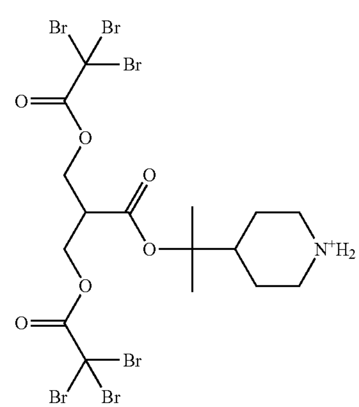

-continued
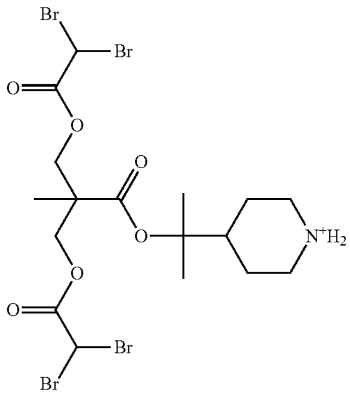
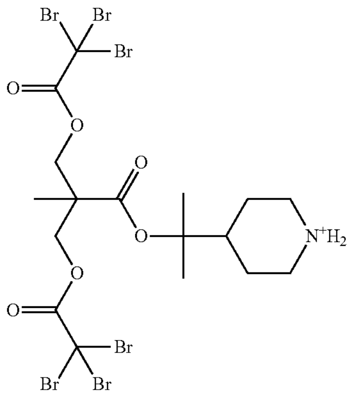
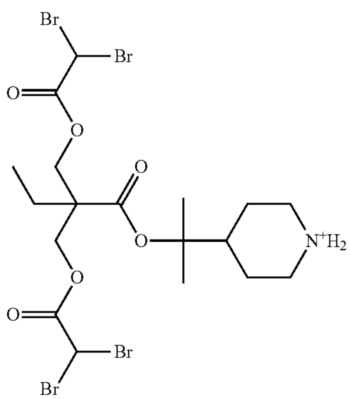
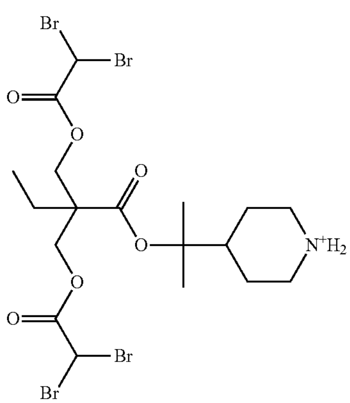
-continued
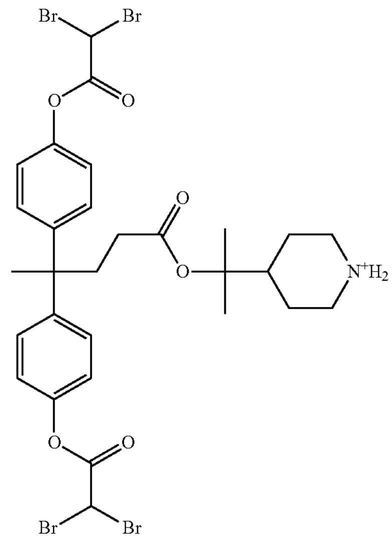
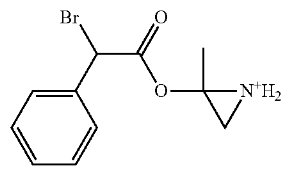
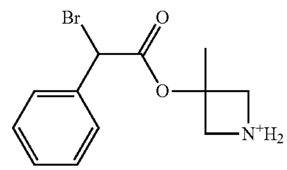
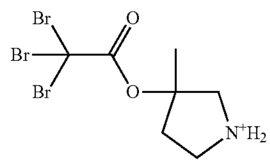
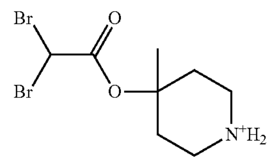
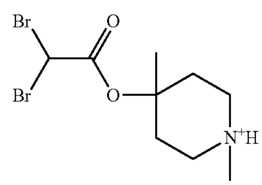
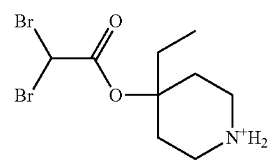
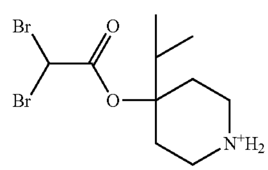
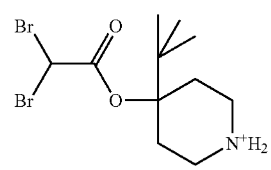
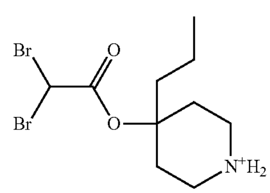
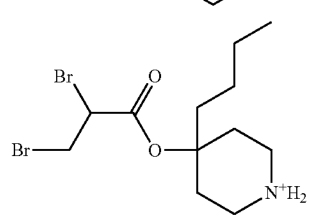

-continued

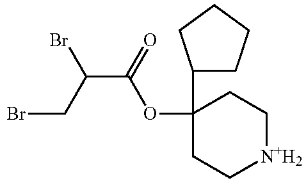
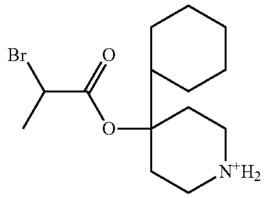
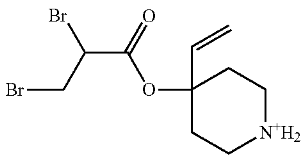
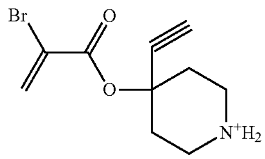
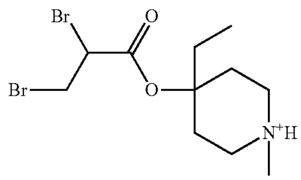
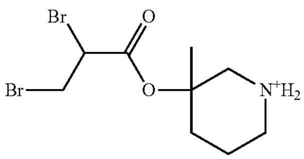
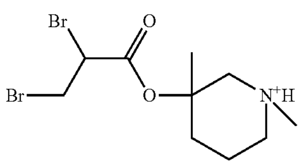
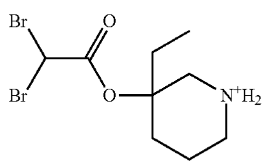
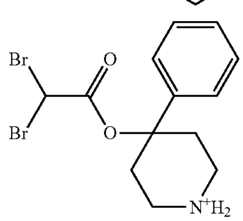
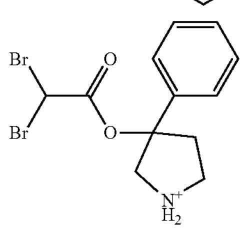
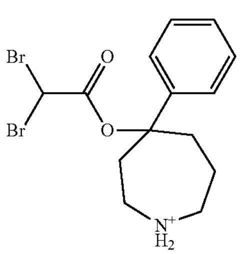
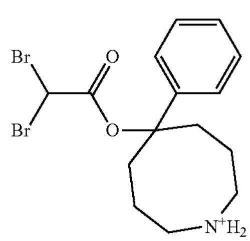
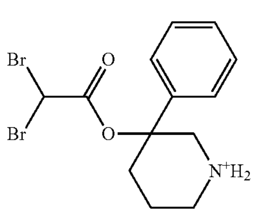
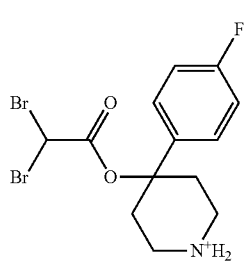

-continued

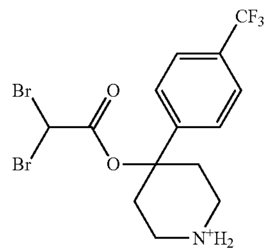
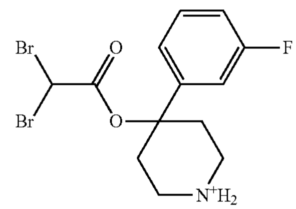
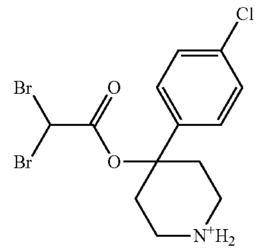
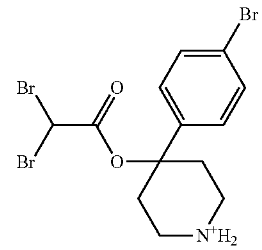
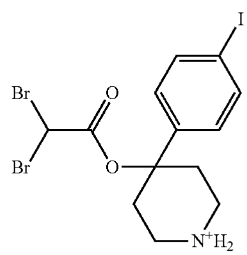
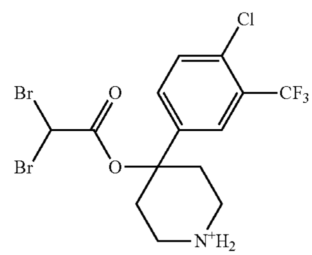
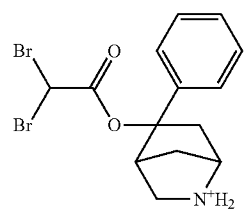
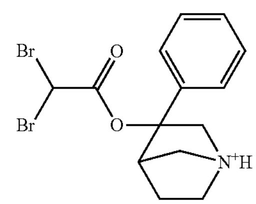
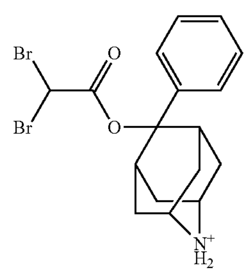

In the formula (A), $A^{k-}$ is a carboxylic acid anion, a sulfonimide anion free of fluorine, a sulfonamide anion, or a halide ion.

The carboxylic acid anion preferably has the formula (Aa-1) or (Aa-2). The sulfonimide anion free of fluorine preferably has the formula (Ab). The sulfonamide anion preferably has the formula (Ac).

$$R^{a1}-\overset{O}{\overset{\|}{C}}-O^{-} \tag{Aa-1}$$

$$^{-}O-\overset{O}{\overset{\|}{C}}-R^{a2}-\overset{O}{\overset{\|}{C}}-O^{-} \tag{Aa-2}$$

-continued (Ab)

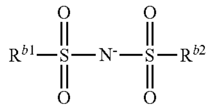

(Ac)

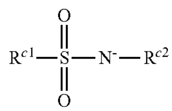

In the formula (Aa-1), $R^{a1}$ is hydrogen or a $C_1$-$C_{30}$ hydrocarbyl group which may contain a heteroatom. The hydrocarbyl group may be saturated or unsaturated and straight, branched or cyclic. Examples thereof include $C_1$-$C_{30}$ alkyl, $C_3$-$C_{30}$ cyclic saturated hydrocarbyl, $C_2$-$C_{30}$ alkenyl, $C_2$-$C_{30}$ alkynyl, $C_3$-$C_{30}$ cyclic unsaturated aliphatic hydrocarbyl, $C_6$-$C_{30}$ aryl, $C_7$-$C_{30}$ aralkyl, and groups obtained from combination of the above-described groups. In the foregoing groups, some hydrogen atoms may be substituted by a moiety containing a heteroatom such as oxygen, sulfur, nitrogen, or a halogen, and some carbon may be replaced by a moiety containing a heteroatom such as oxygen, sulfur, or nitrogen, so that the group may contain an ester bond, ether bond, sulfide bond, sulfoxide, carbonate, carbamate, sulfone, amino, amide bond, hydroxyl, thiol, nitro, or a halogen.

In the formula (Aa-2), $R^{a2}$ is a single bond or a $C_1$-$C_{30}$ hydrocarbylene group which may contain a heteroatom. The hydrocarbylene group may be straight, branched, or cyclic. Examples thereof include $C_1$-$C_{30}$ alkanediyl, $C_3$-$C_{30}$ cyclic saturated hydrocarbylene, $C_2$-$C_{30}$ alkenediyl, $C_2$-$C_{30}$alkynediyl, $C_3$-$C_{30}$ cyclic unsaturated aliphatic hydrocarbylene, $C_6$-$C_{20}$ arylene, and groups obtained from combination of the above-described groups. In the foregoing groups, some hydrogen atoms may be substituted by a moiety containing a heteroatom such as oxygen, sulfur, nitrogen, or a halogen, and some carbon may be replaced by a moiety containing a heteroatom such as oxygen, sulfur, or nitrogen, so that the group may contain an ester bond, ether bond, sulfide bond, sulfoxide, carbonate, carbamate, sulfone, amino, amide bond, hydroxyl, thiol, nitro, or a halogen.

In the formula (Ab), $R^{b1}$ and $R^{b2}$ are each independently a $C_1$-$C_{20}$ hydrocarbyl group which may contain a hydroxyl moiety, an ether bond, or an ester bond. $R^{b1}$ and $R^{b2}$ may bond together to form a ring. The hydrocarbyl group may be saturated or unsaturated and straight, branched or cyclic. Examples thereof include $C_1$-$C_{20}$ alkyl, $C_3$-$C_{20}$ cyclic saturated hydrocarbyl, $C_2$-$C_{20}$ alkenyl, $C_2$-$C_{20}$ alkynyl, $C_3$-$C_{20}$ cyclic unsaturated aliphatic hydrocarbyl, $C_6$-$C_{20}$ aryl, $C_7$-$C_{30}$ aralkyl, and groups obtained from combination of the above-described groups.

In the formula (Ac), $R^{c1}$ is fluorine, or a $C_1$-$C_{10}$ hydrocarbyl or $C_1$-$C_{10}$ fluorinated hydrocarbyl group which may contain a hydroxyl moiety, an ether bond, or an ester bond. $R^{c2}$ is hydrogen or a $C_1$-$C_{10}$ hydrocarbyl group which may contain a hydroxyl moiety, an ether bond, or an ester bond. $R^{c1}$ and $R^{c2}$ may bond together to form a ring with the atom to which they are attached. The hydrocarbyl group may be saturated or unsaturated and straight, branched or cyclic. Examples thereof include $C_1$-$C_{10}$ alkyl, $C_3$-$C_{10}$ cyclic saturated hydrocarbyl, $C_2$-$C_{10}$ alkenyl, $C_2$-$C_{10}$ alkynyl, $C_3$-$C_{10}$ cyclic unsaturated aliphatic hydrocarbyl, $C_6$-$C_{10}$ aryl, $C_7$-$C_{10}$ aralkyl, and groups obtained from combination of the above-described groups. Examples of the fluorinated hydrocarbyl group include groups obtained by replacing some or all of the hydrogen atoms in the hydrocarbyl group with fluorine.

Examples of the carboxylic acid anion am shown below, but not limited thereto.

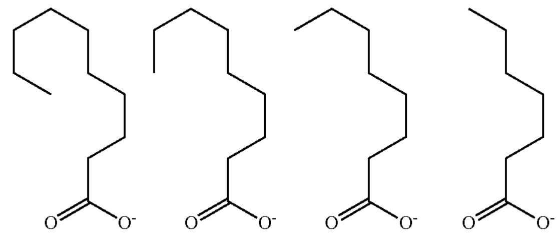

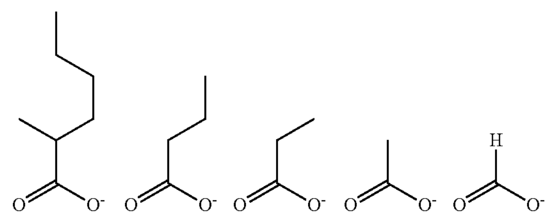

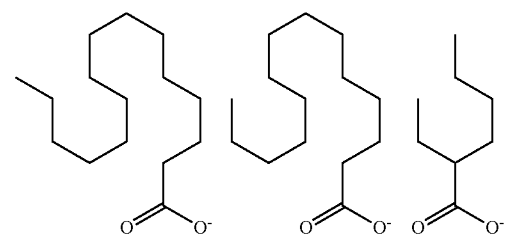

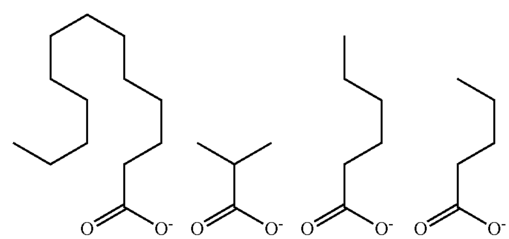

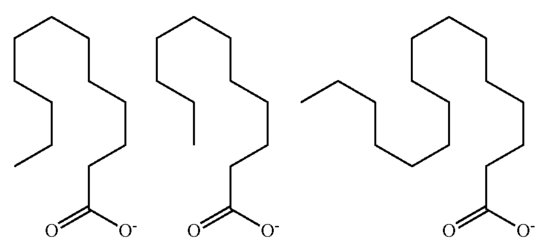

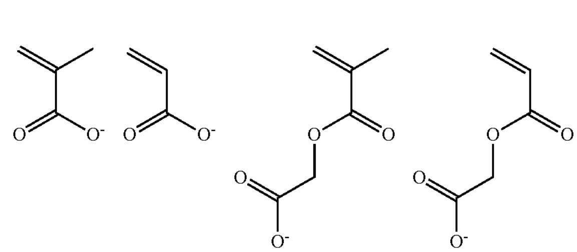

-continued
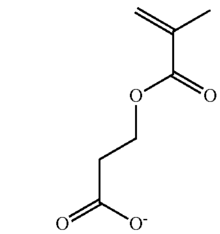
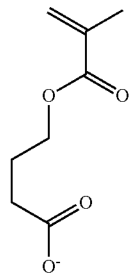
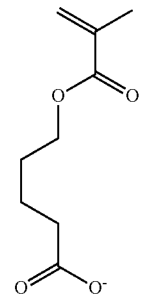
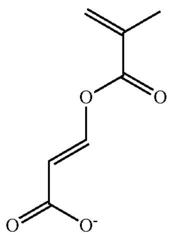
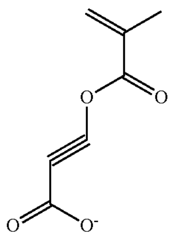
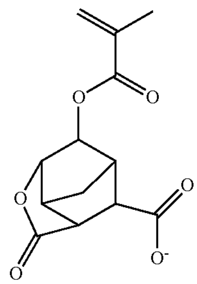
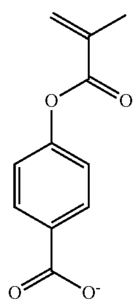
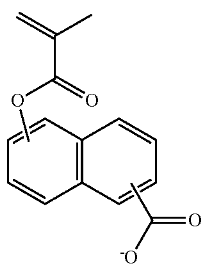
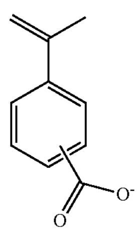
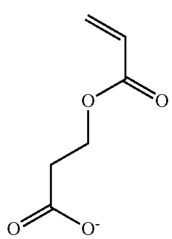
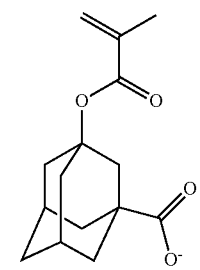
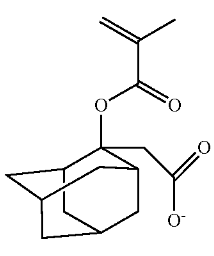
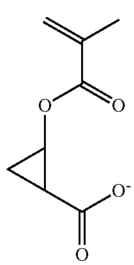
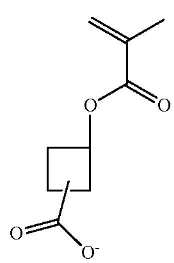
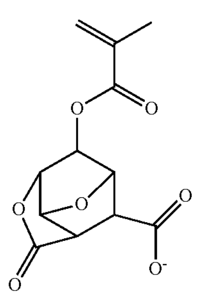
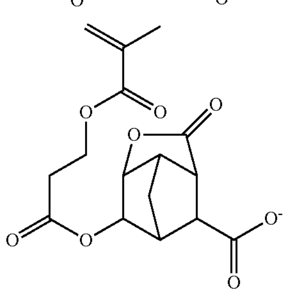
-continued
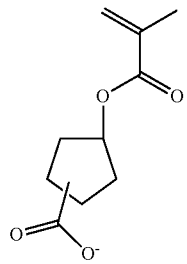
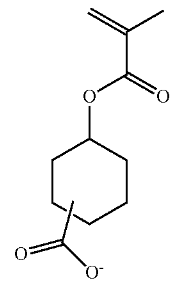
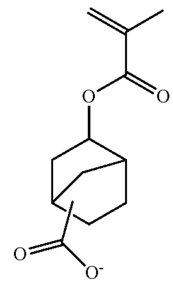
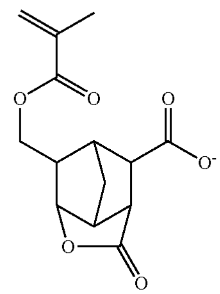
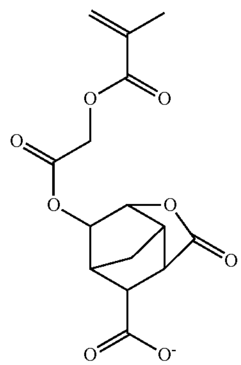
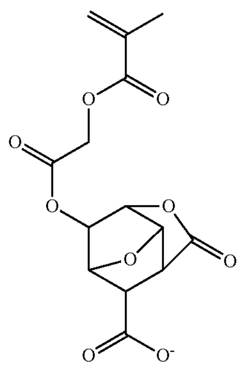
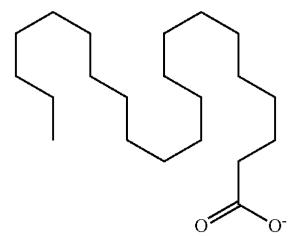
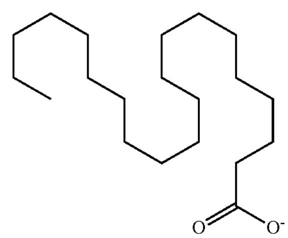
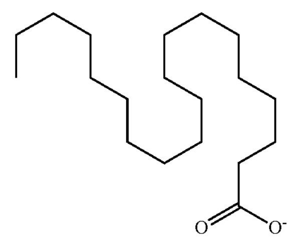
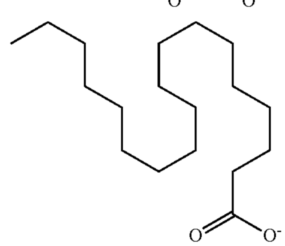
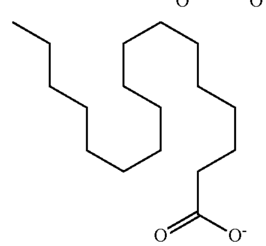
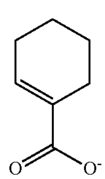
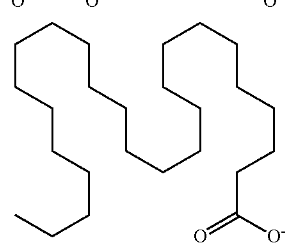

-continued
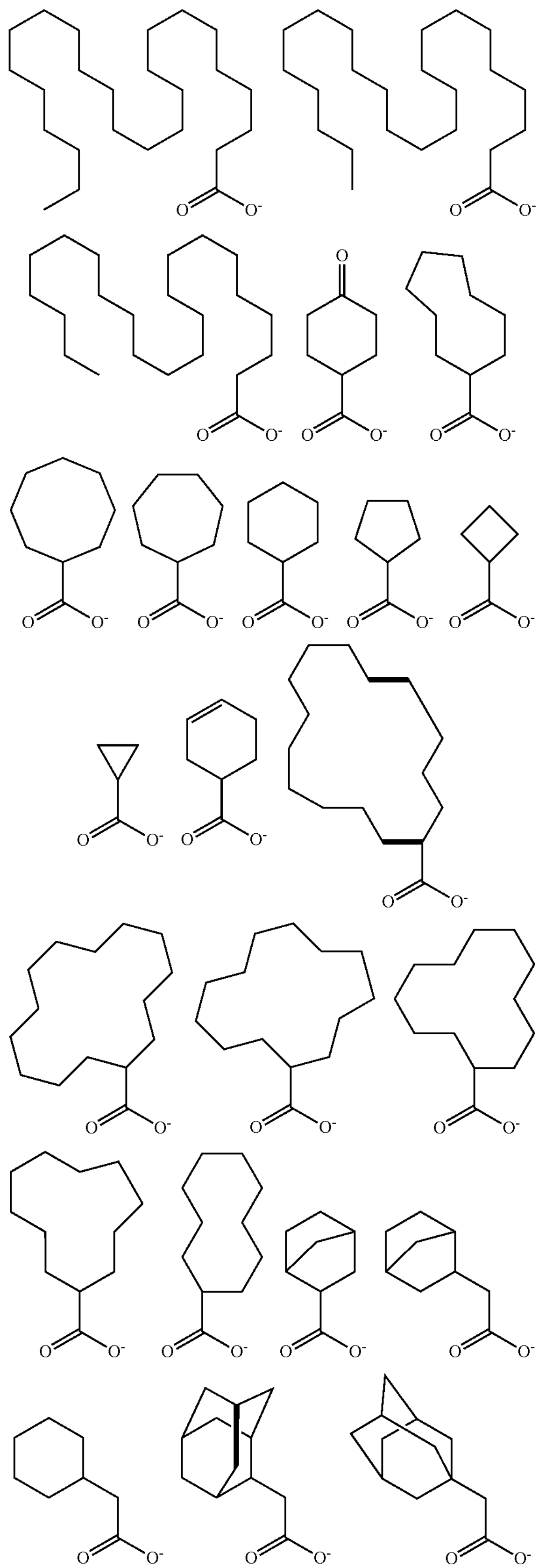
-continued
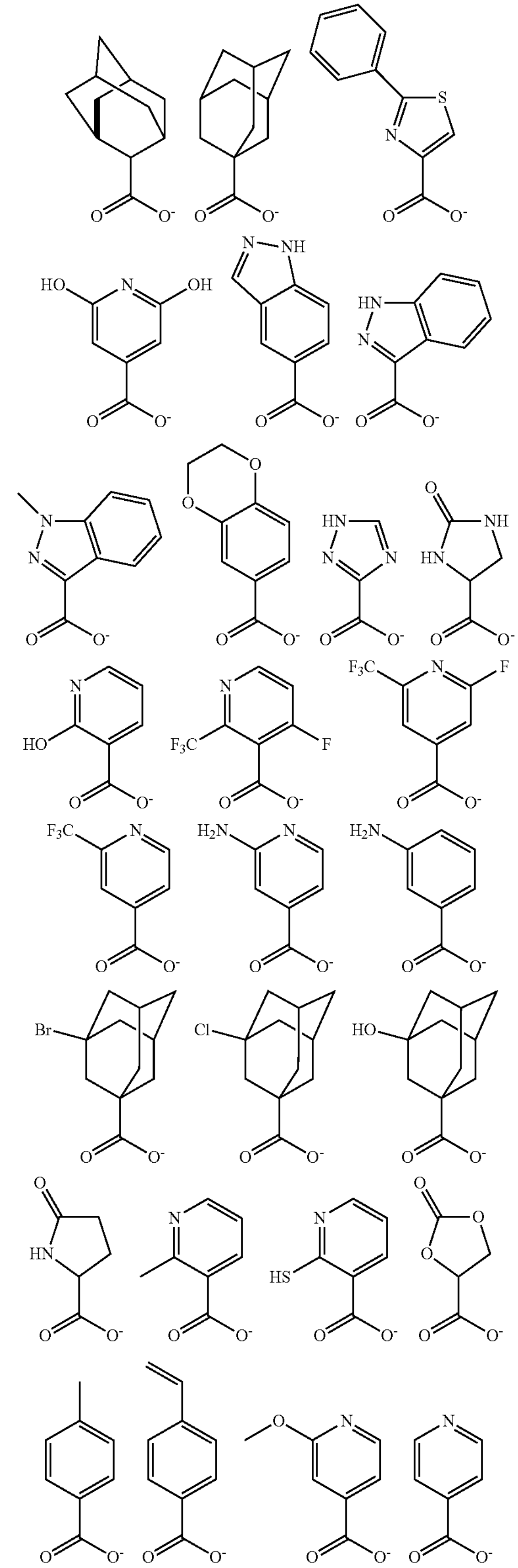

-continued
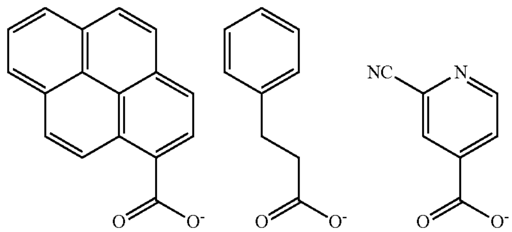
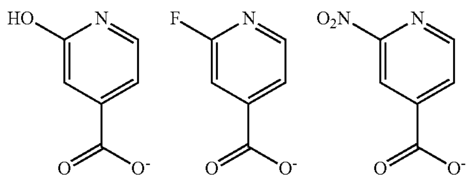
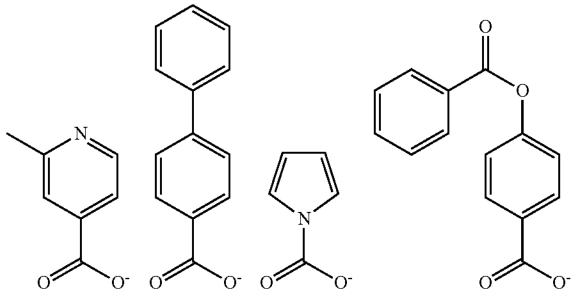
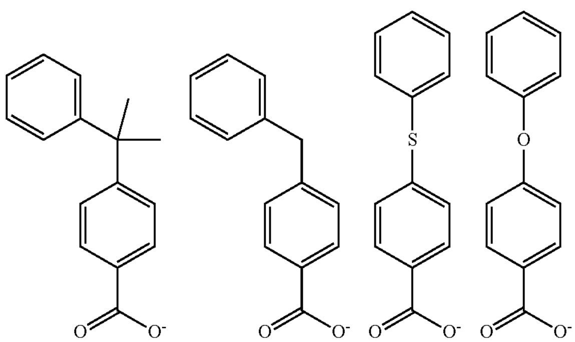
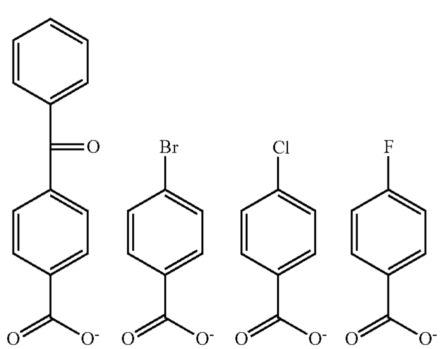
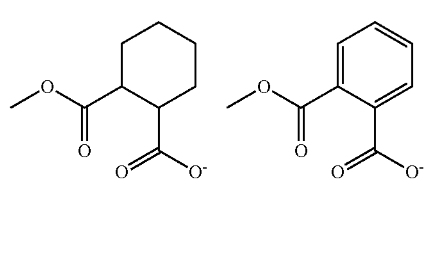
-continued
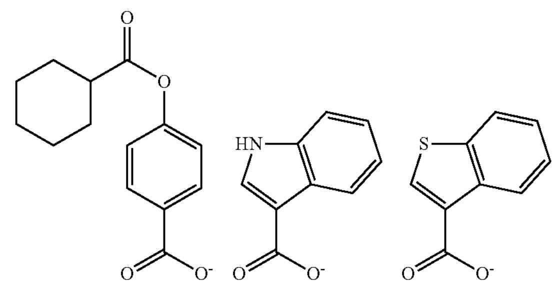
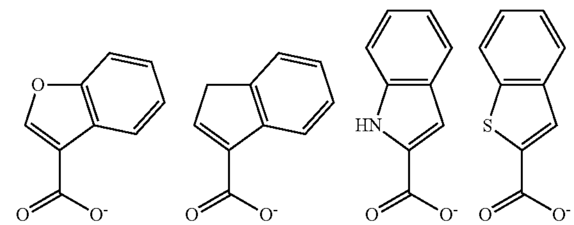
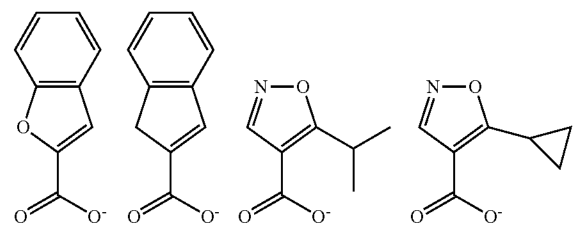
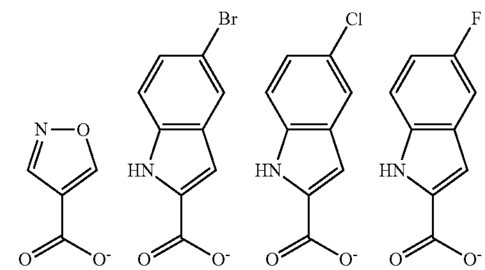
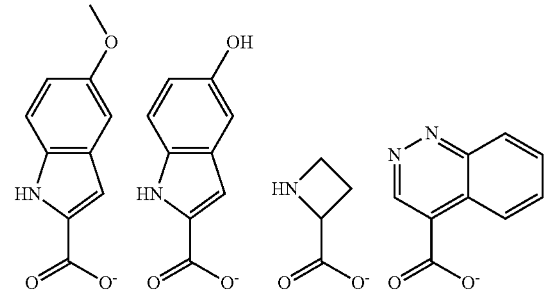
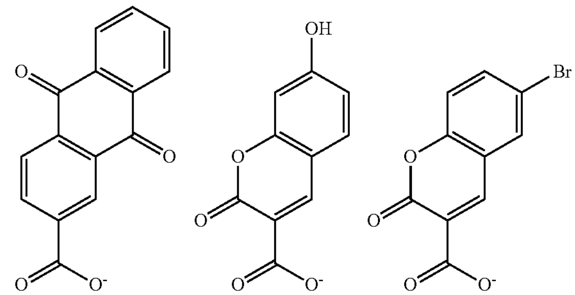

-continued
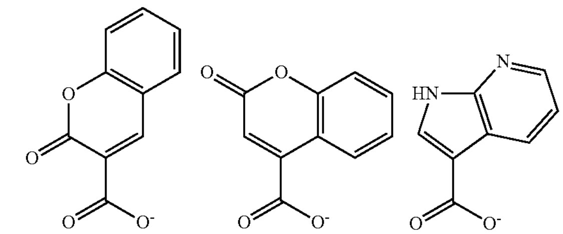
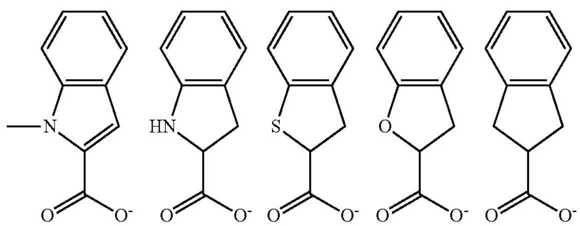
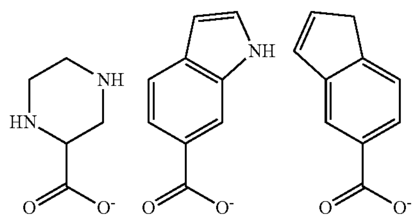
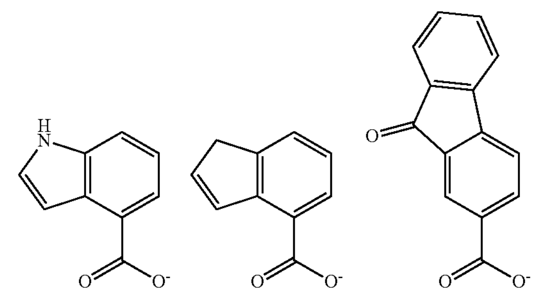
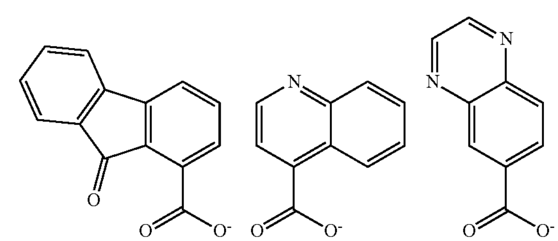
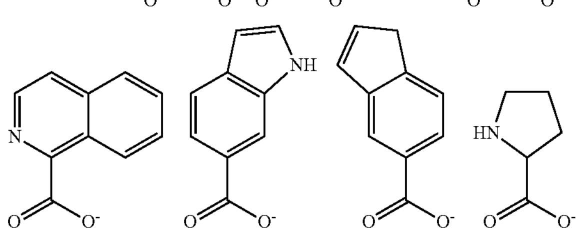
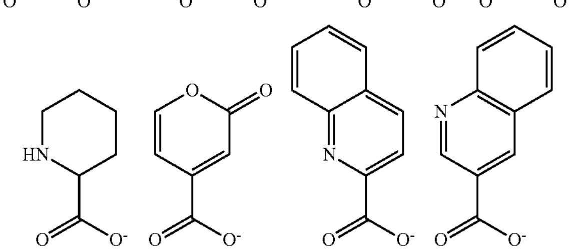
-continued
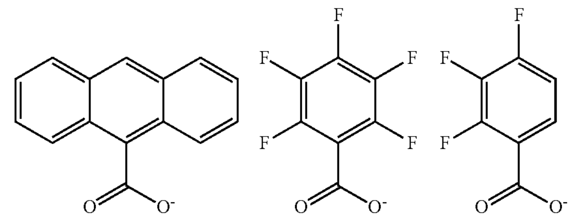
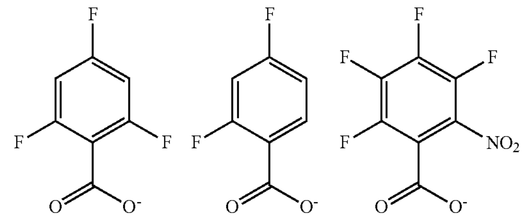
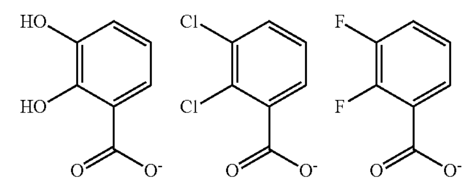
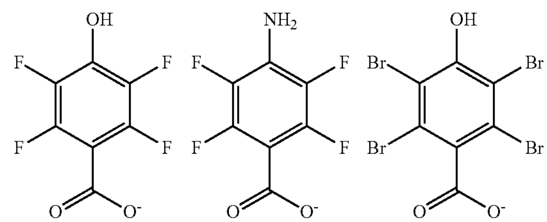
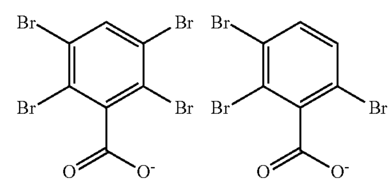
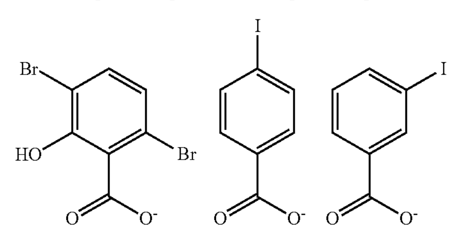
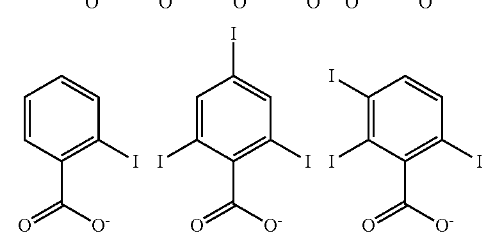
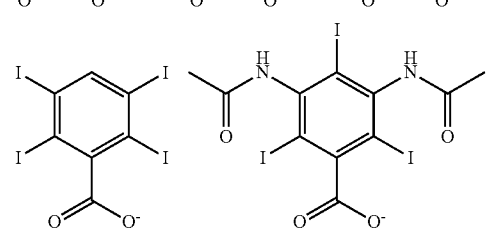

-continued
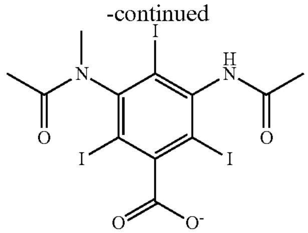
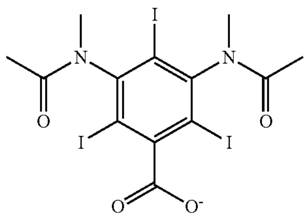
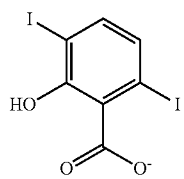
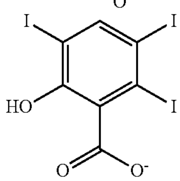
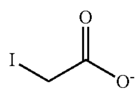
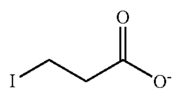
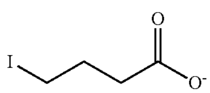
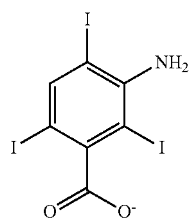
-continued
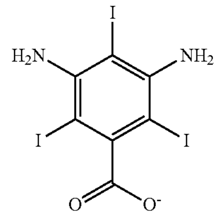
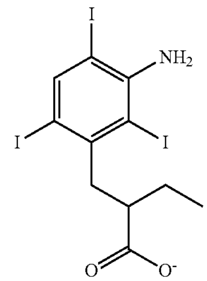
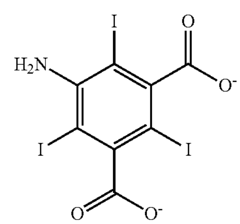
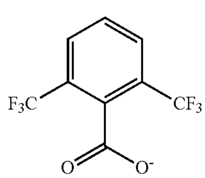
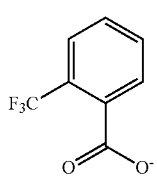
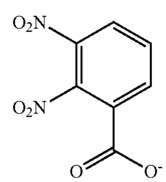
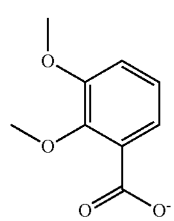
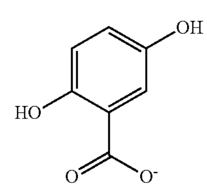
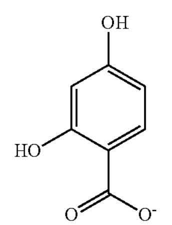
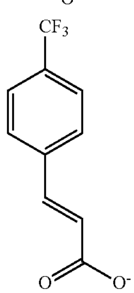
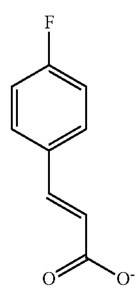
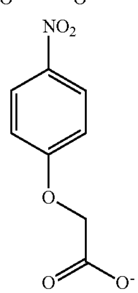
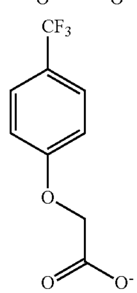
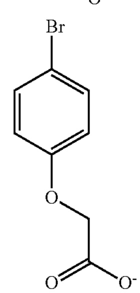
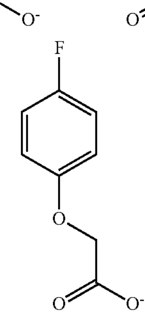
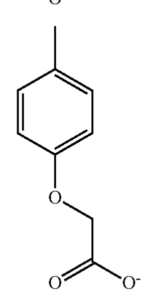
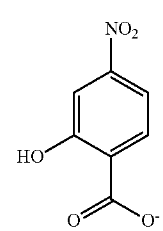
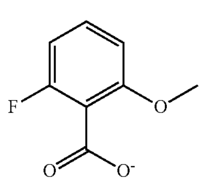
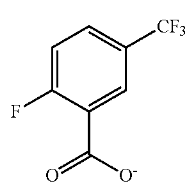
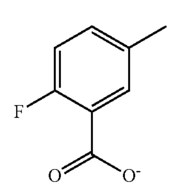
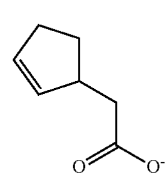
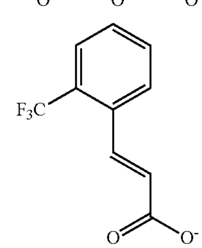
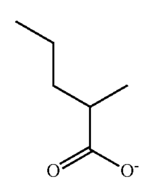

-continued
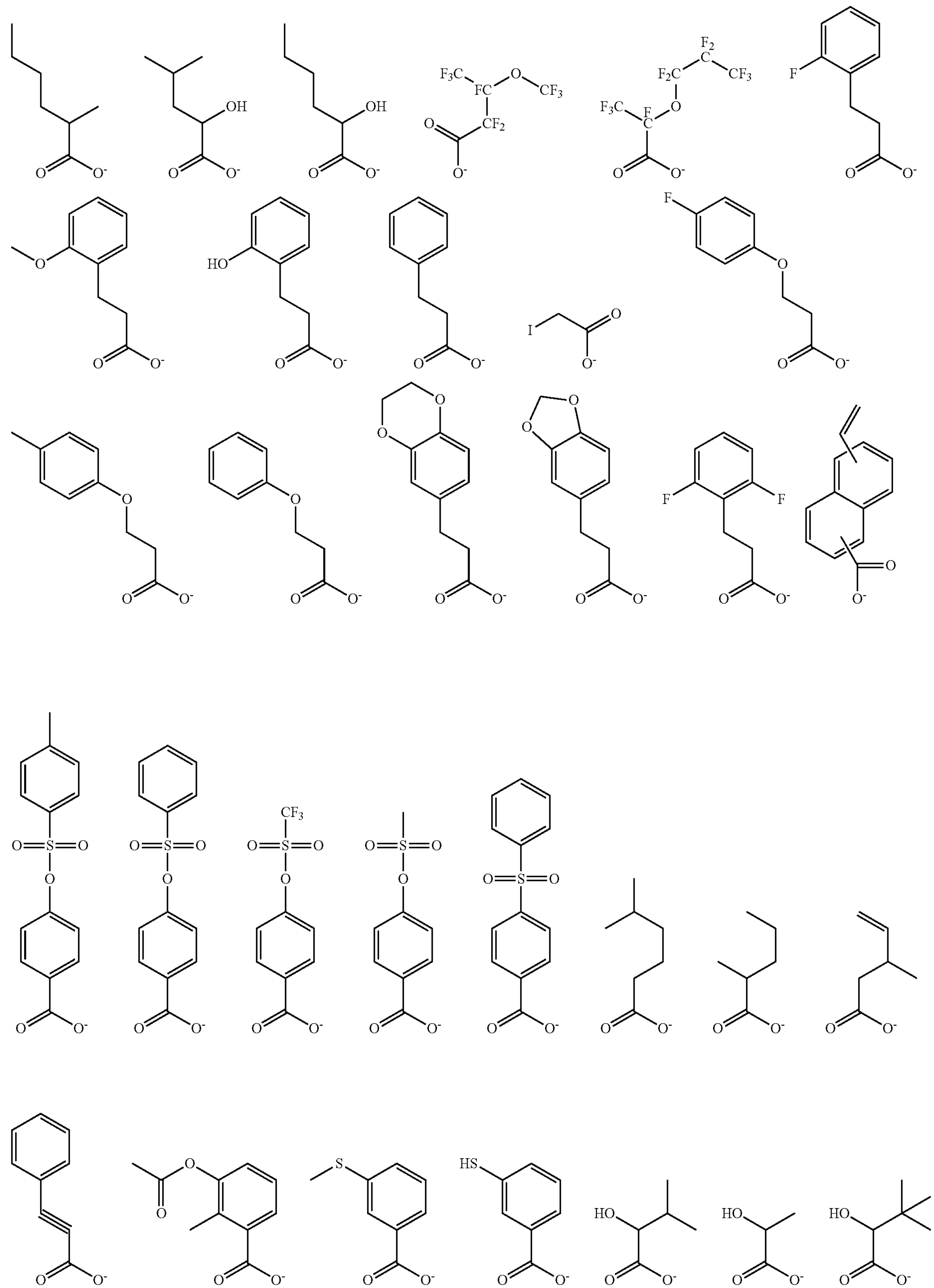

-continued
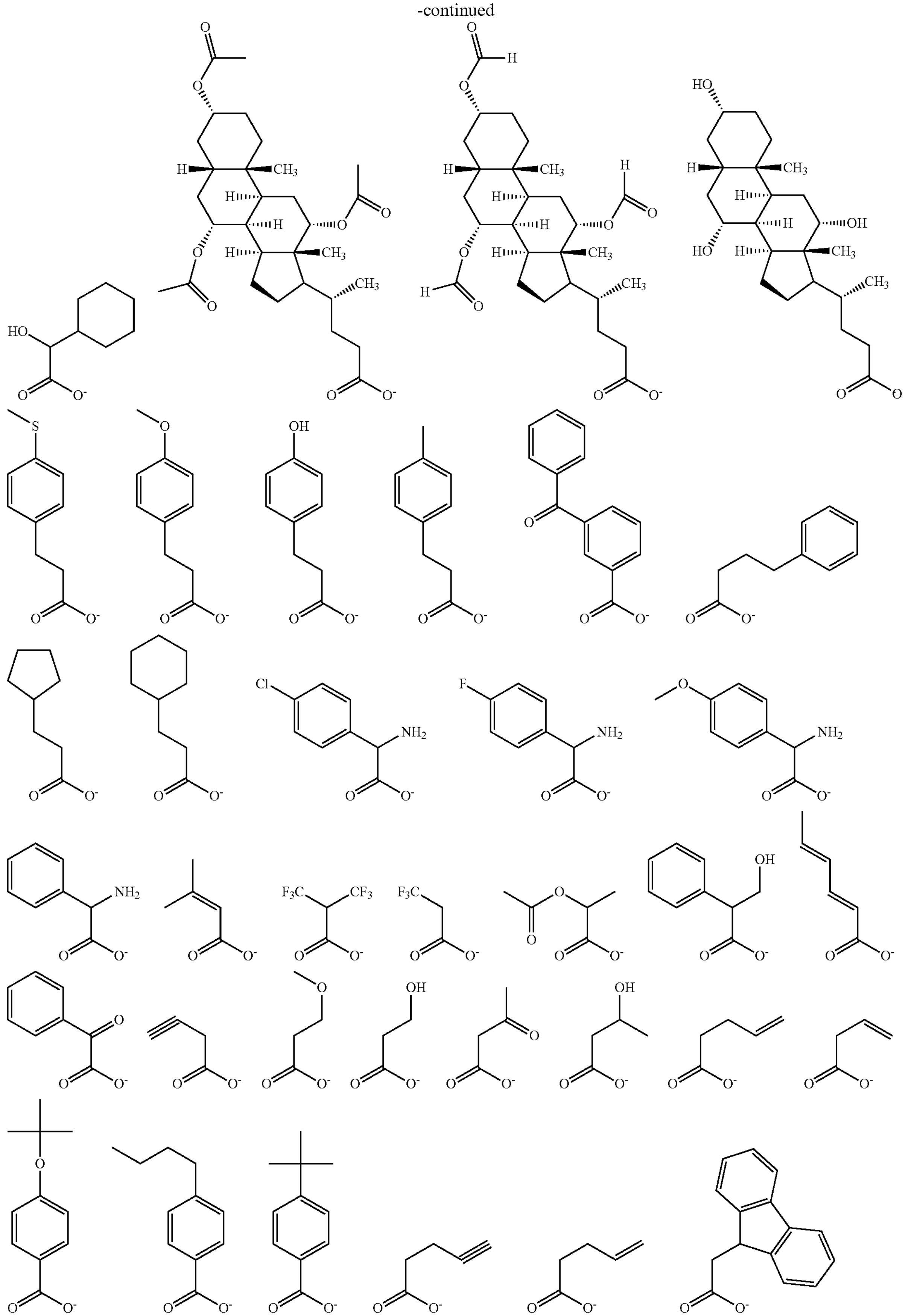

-continued
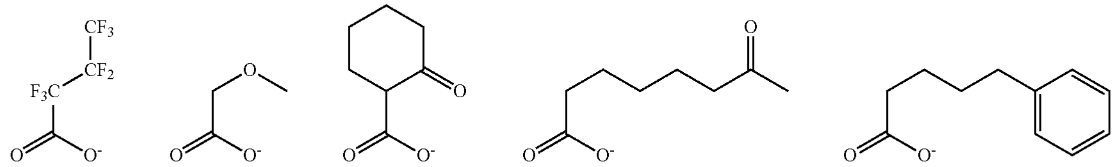
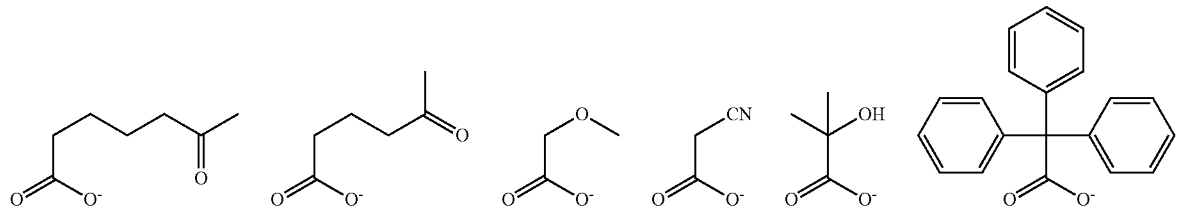
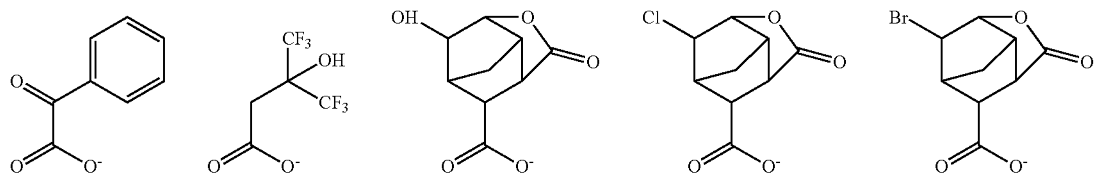
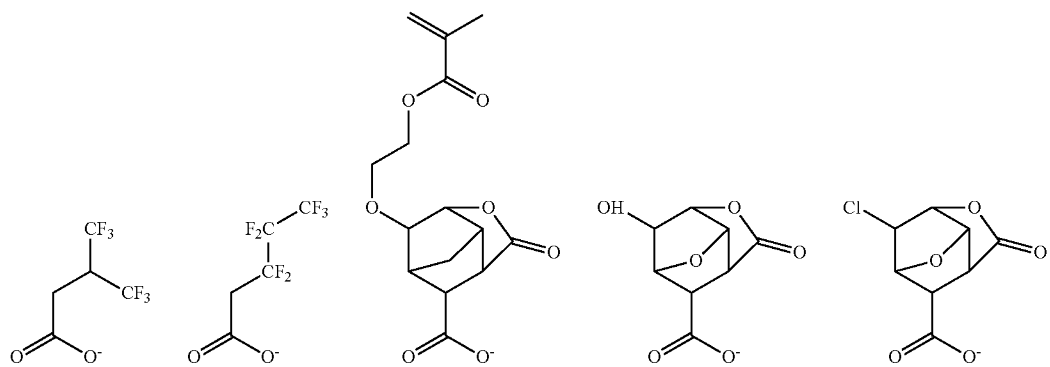
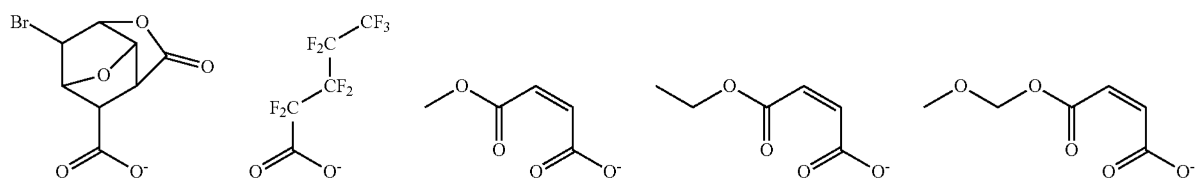
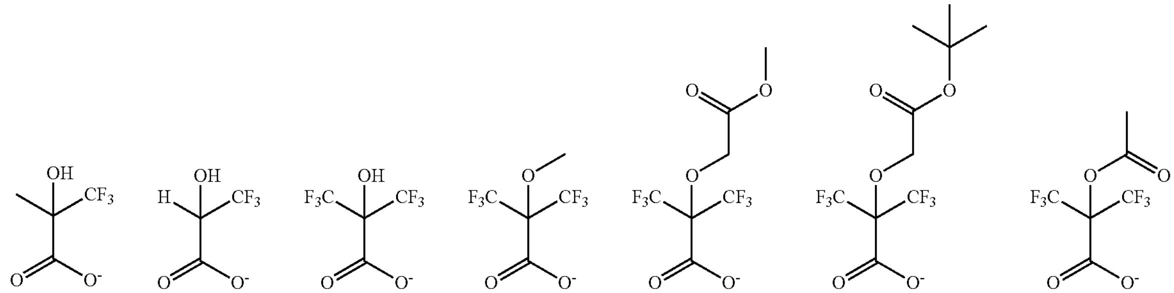
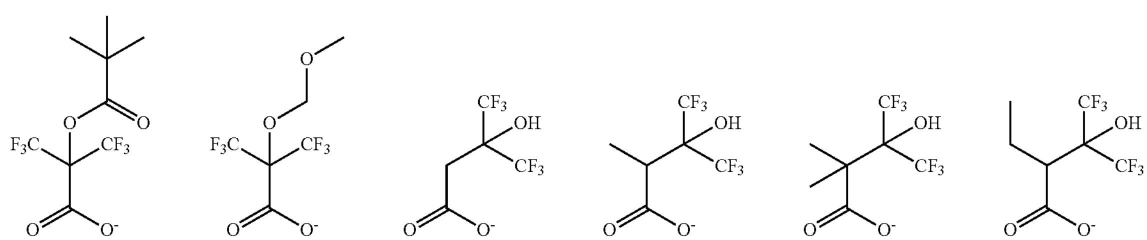

-continued
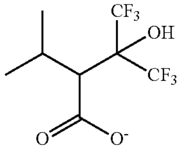
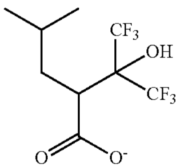
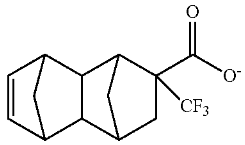
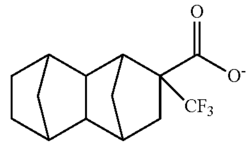
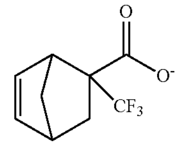
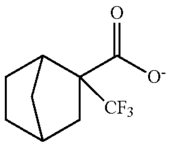
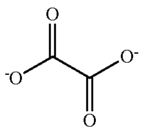
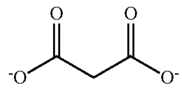
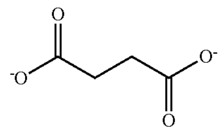
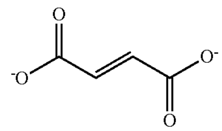
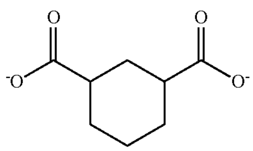
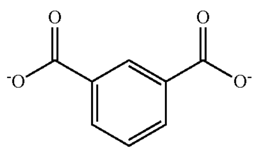
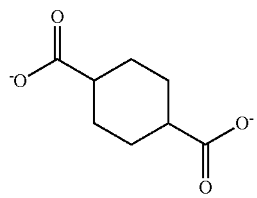
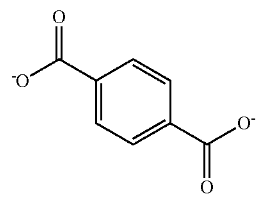
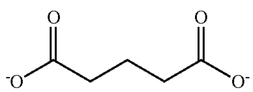
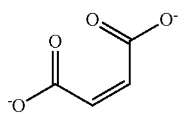
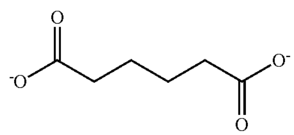
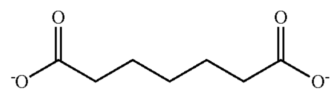
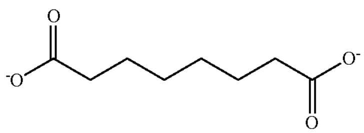
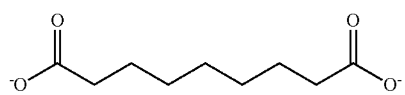
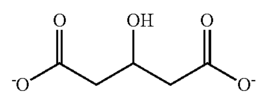
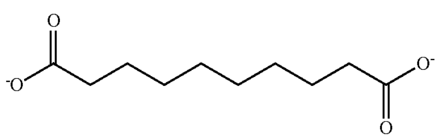
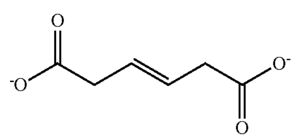
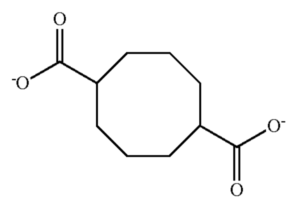
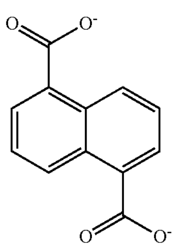
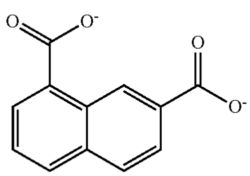
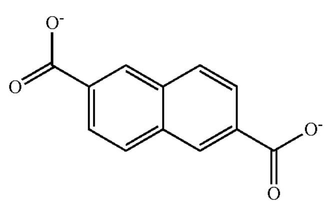
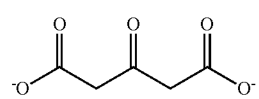
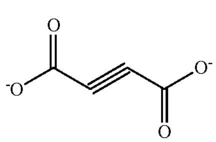
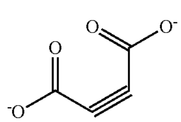
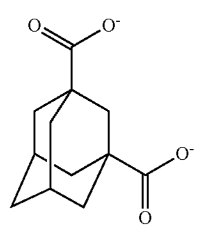
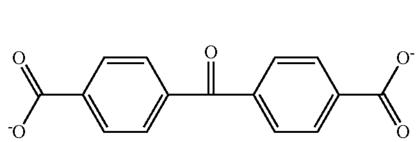
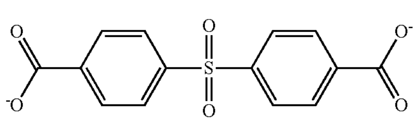
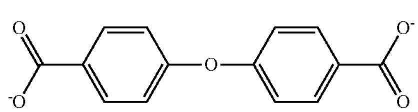
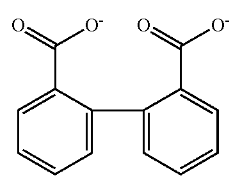

-continued
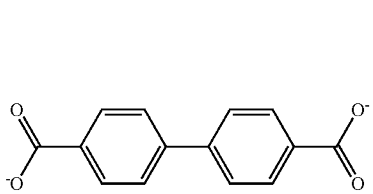
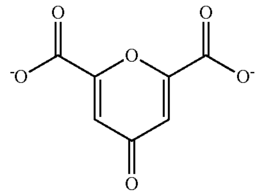
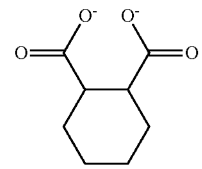
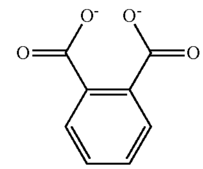
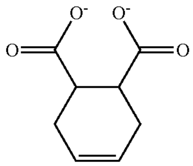
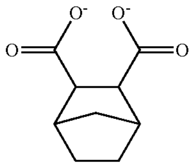
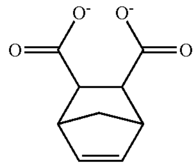
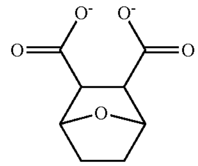
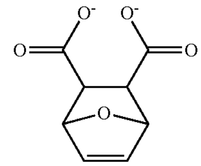
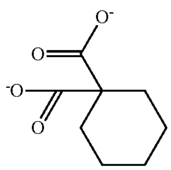
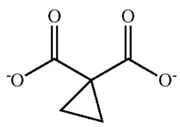
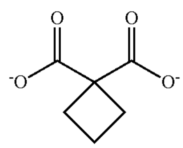
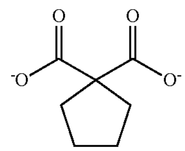
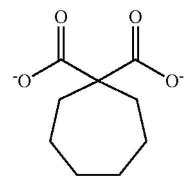
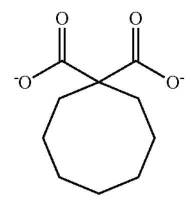
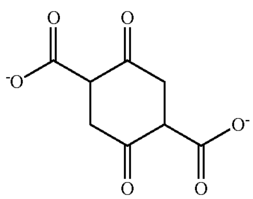
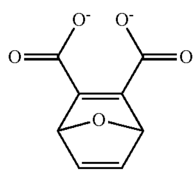
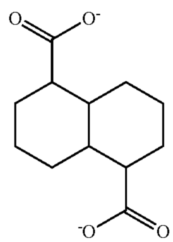
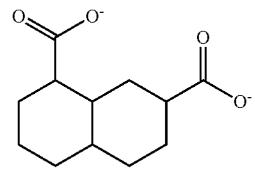
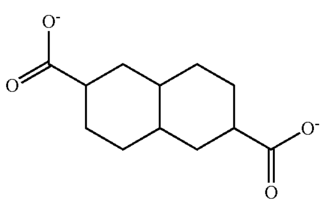
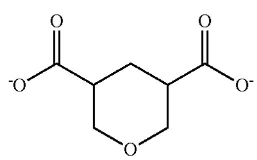
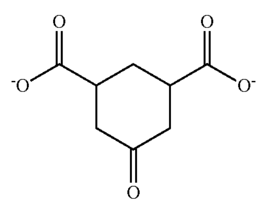
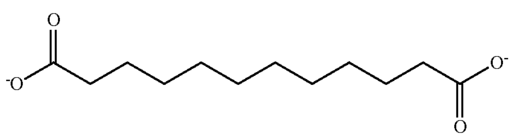
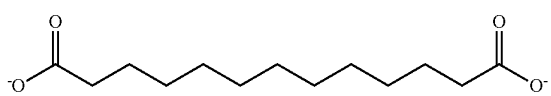
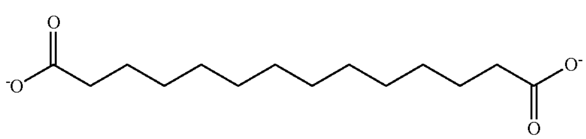
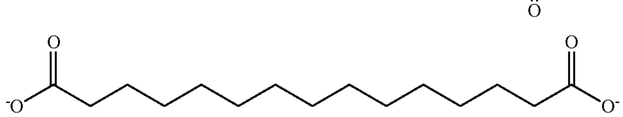
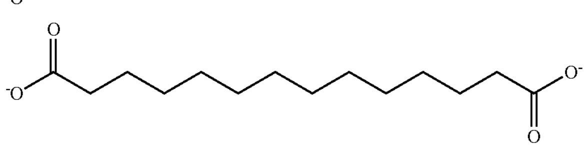
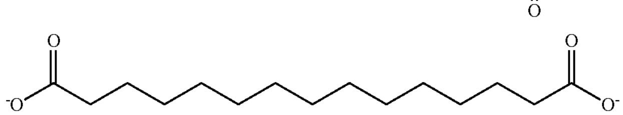
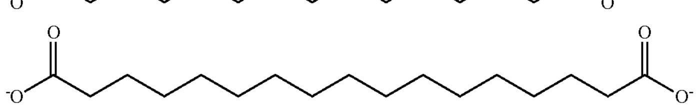

-continued
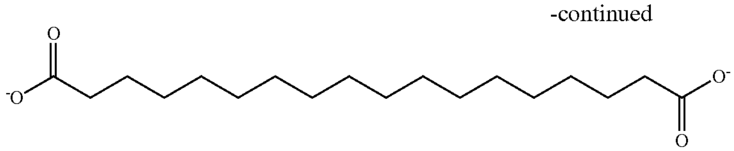
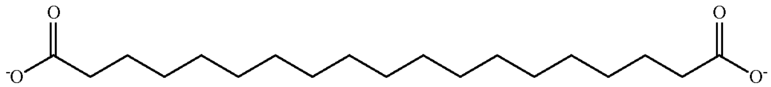
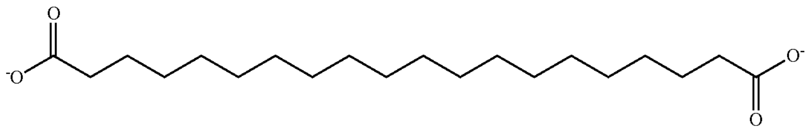
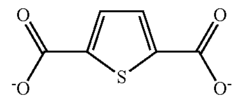
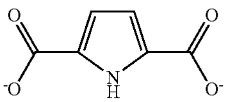
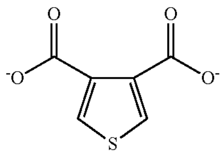
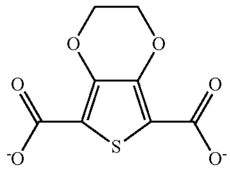
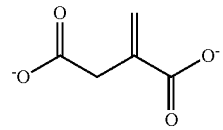
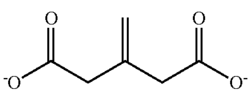
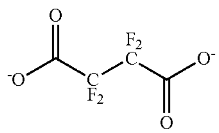
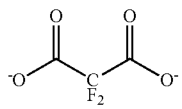
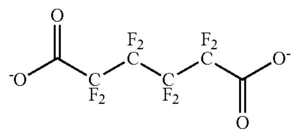
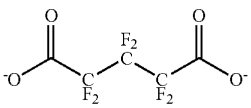
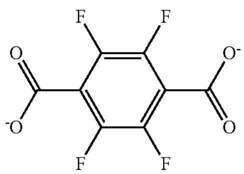
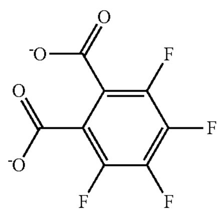
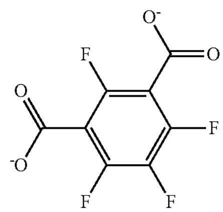
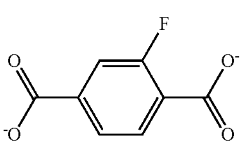
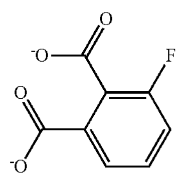
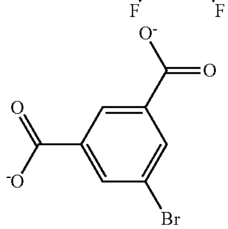
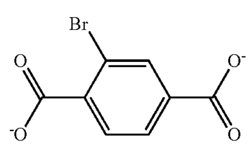
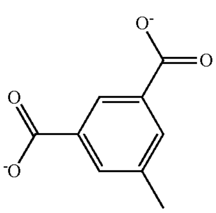
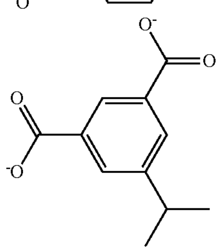
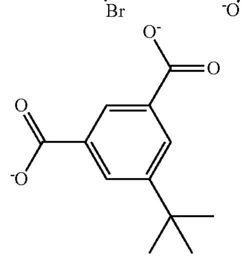
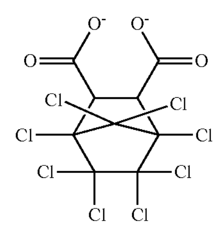
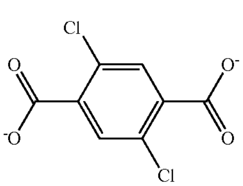
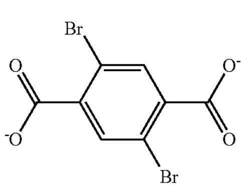
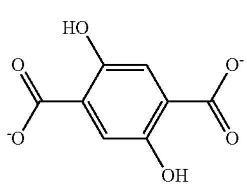
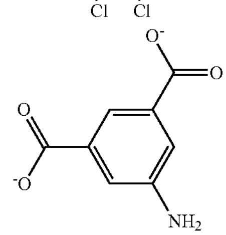
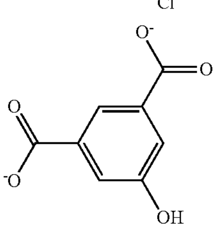
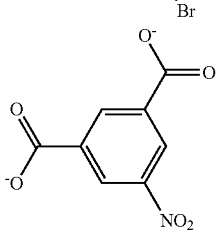
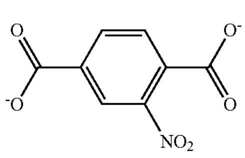
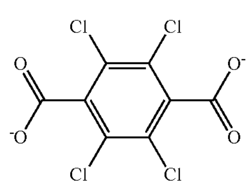

-continued
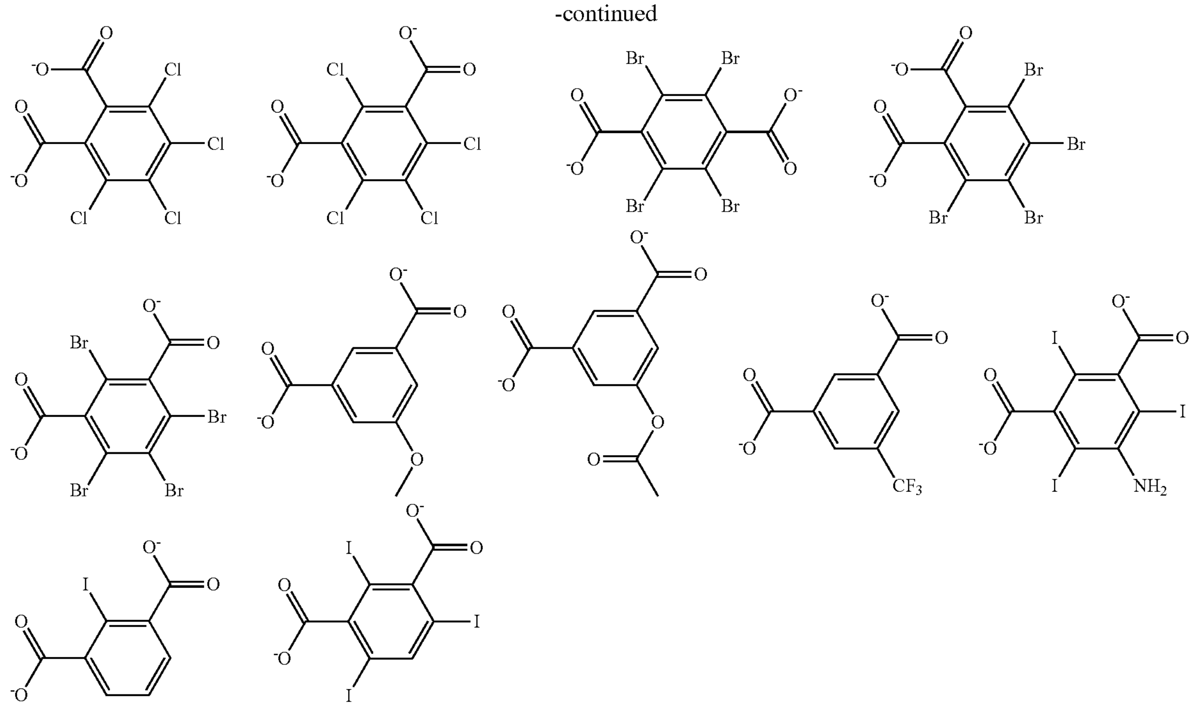
Examples of the sulfonimide anion free of fluorine are shown below, but not limited thereto.
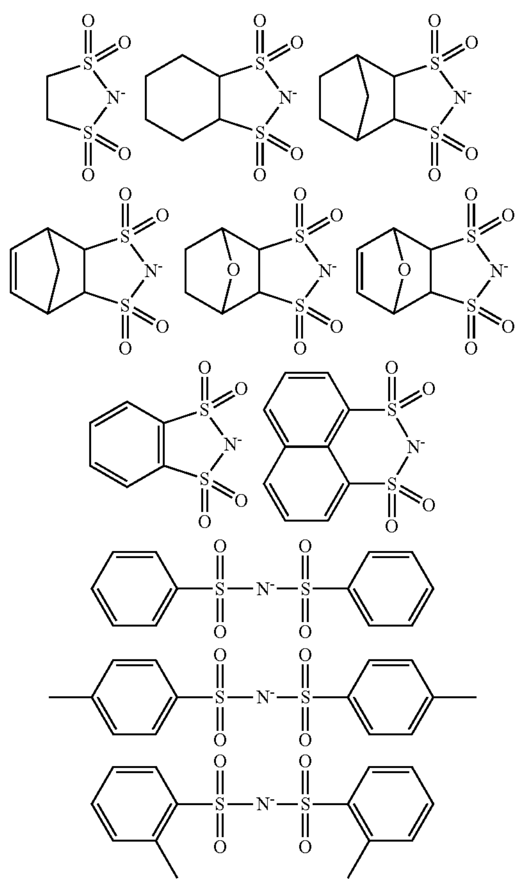
-continued
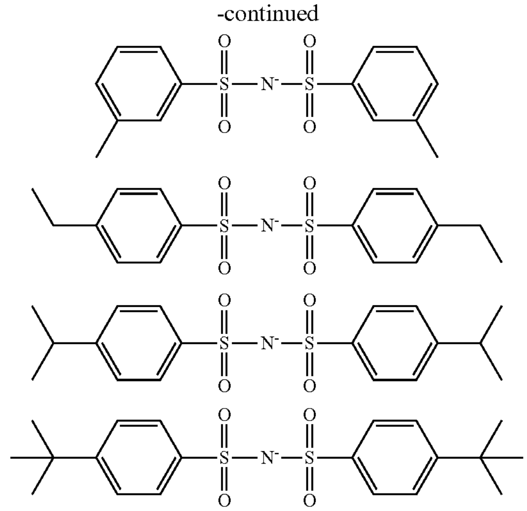
Examples of the sulfonamide anion are shown below, but not limited thereto.
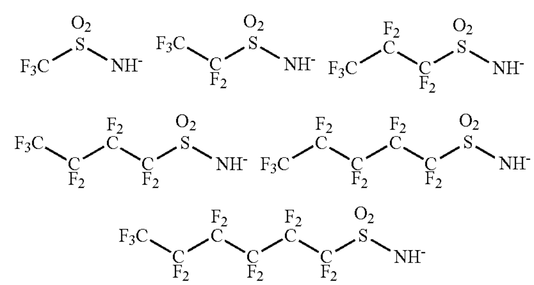

-continued
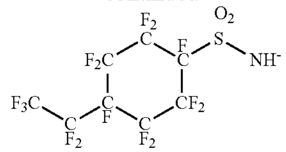
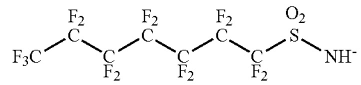
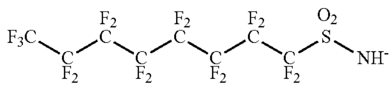
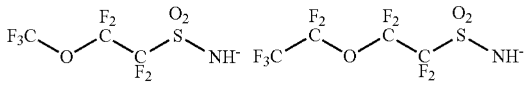
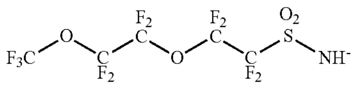
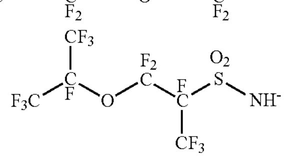
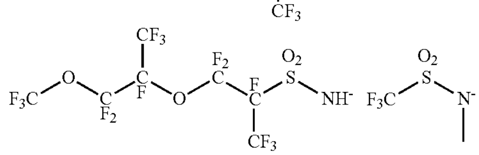
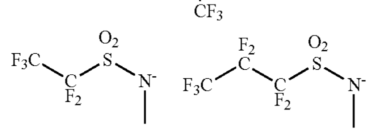
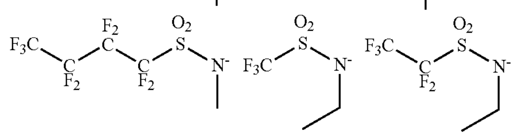
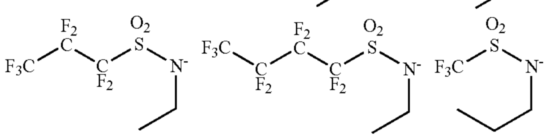
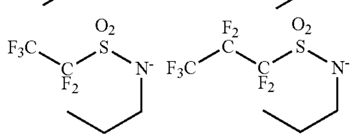
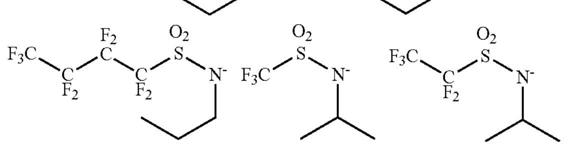
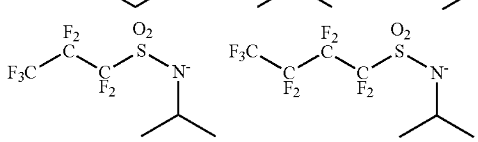
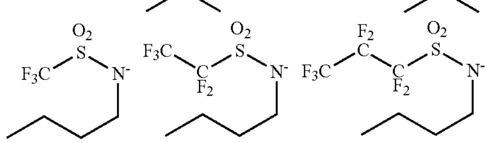
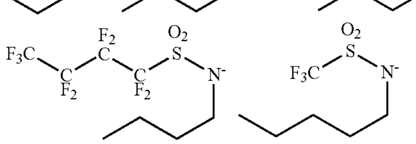
-continued
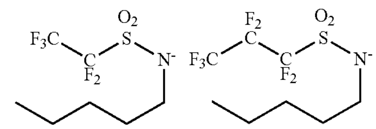
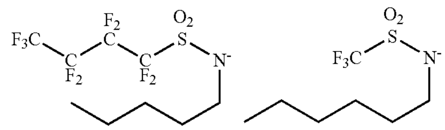
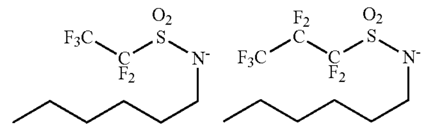
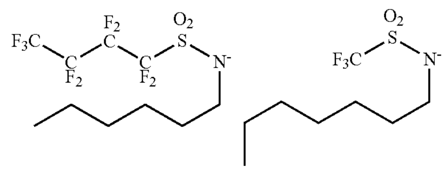
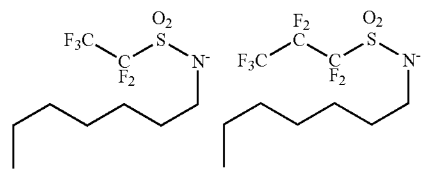
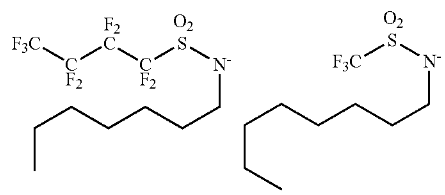
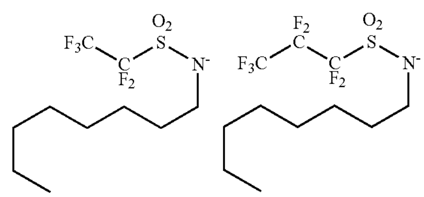
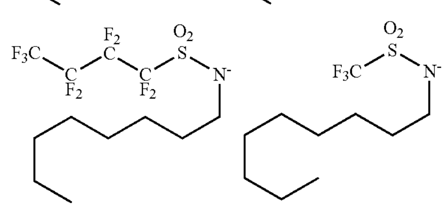
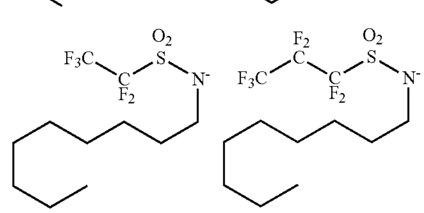
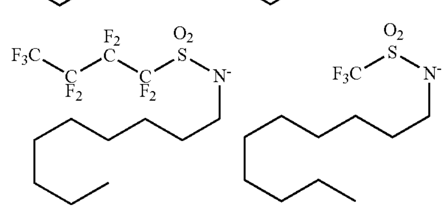

-continued
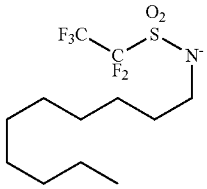
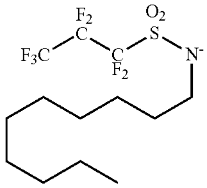
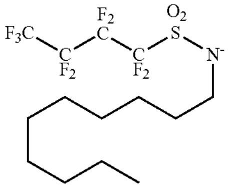
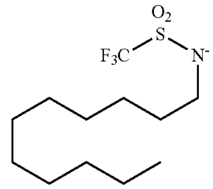
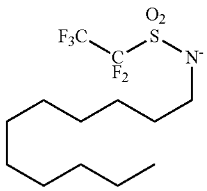
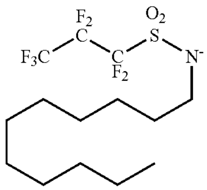
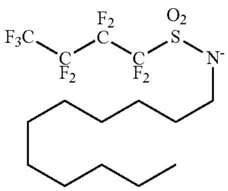
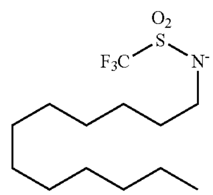
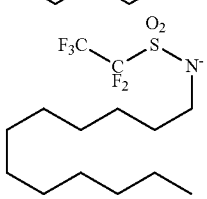
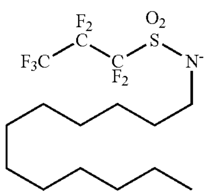
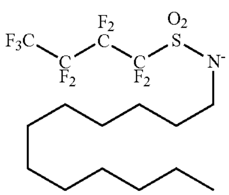
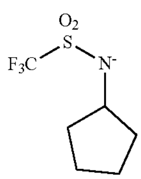
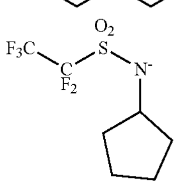
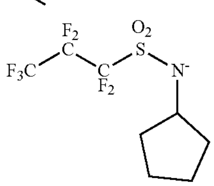
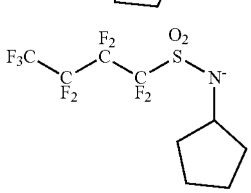
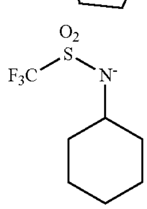
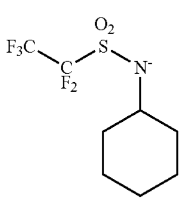
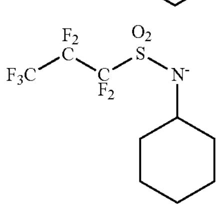
-continued
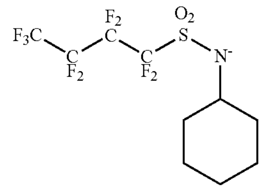
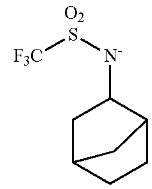
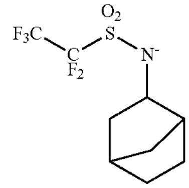
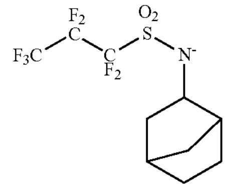
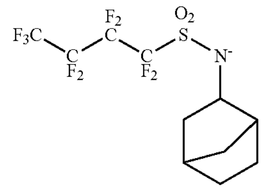
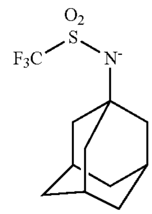
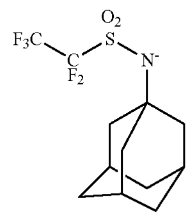
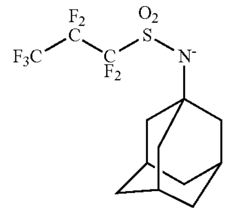
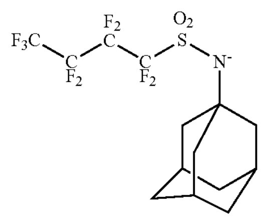
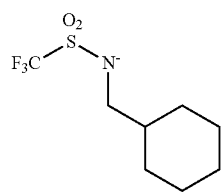
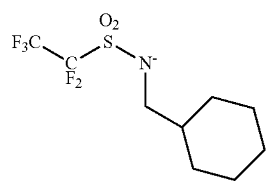
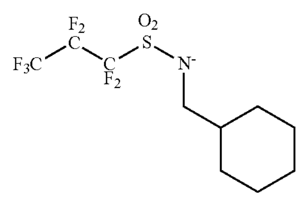
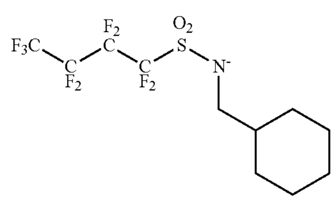
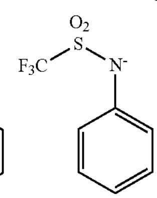
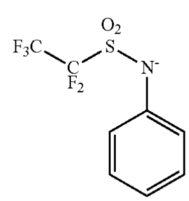
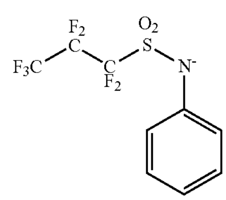

-continued
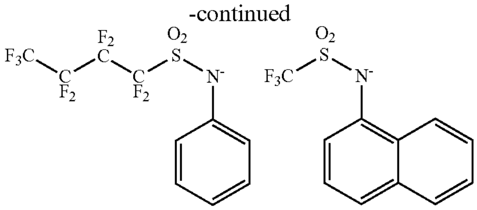
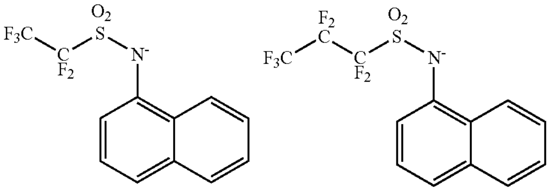
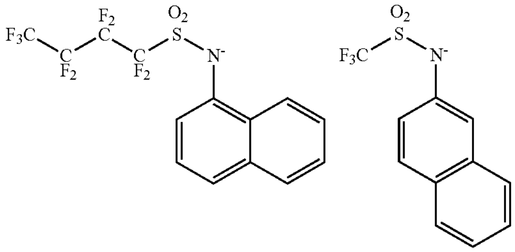
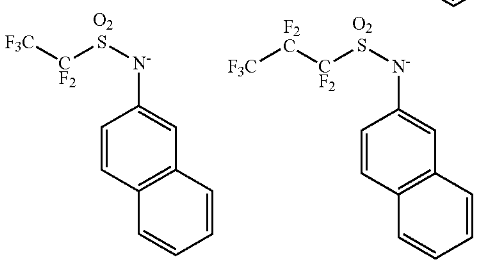
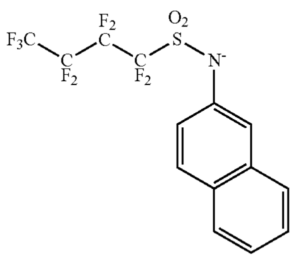
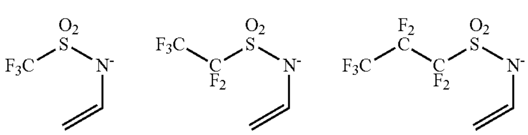
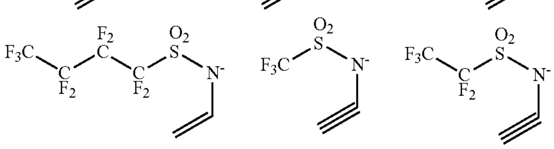
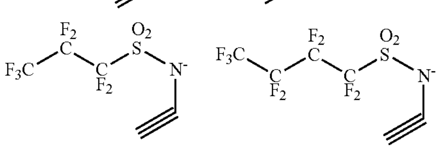
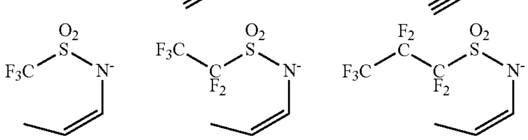
-continued
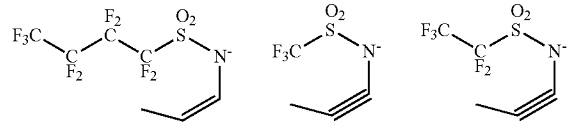
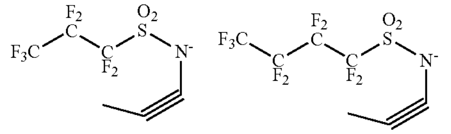
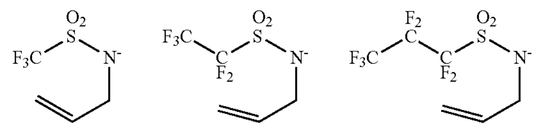
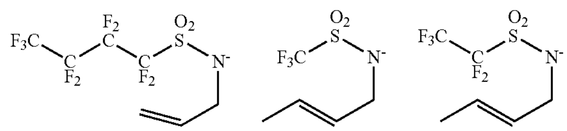
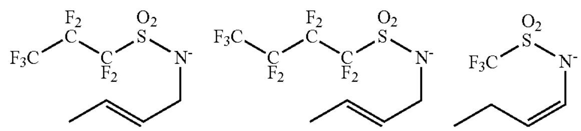
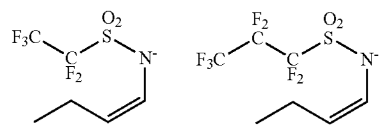
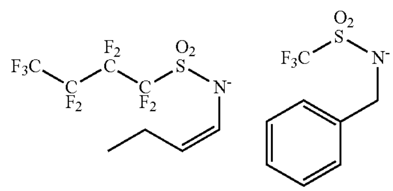
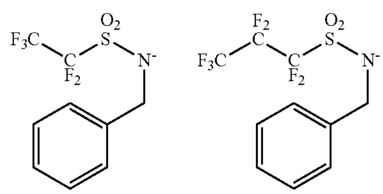
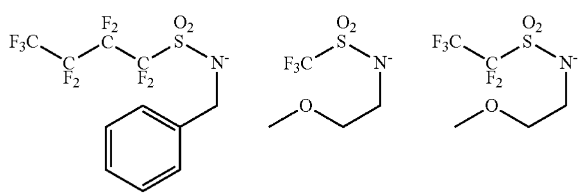
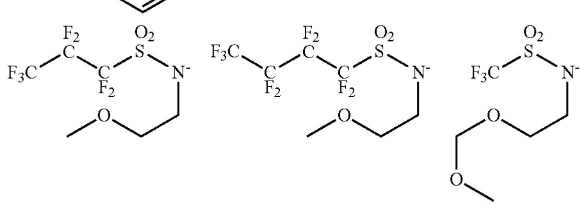
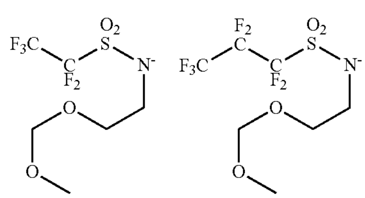

105
-continued
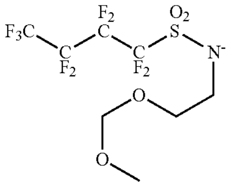
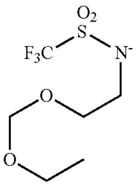
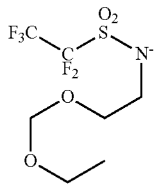
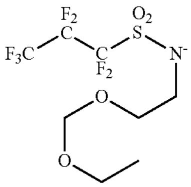
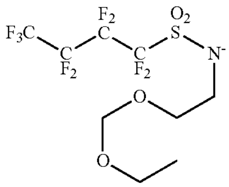
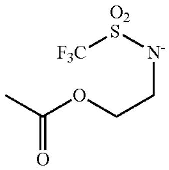
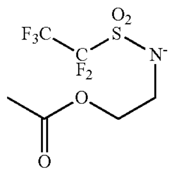
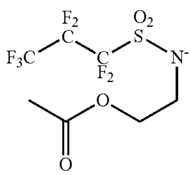
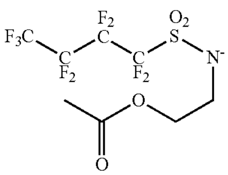
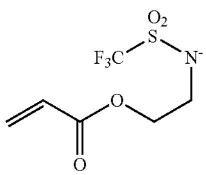
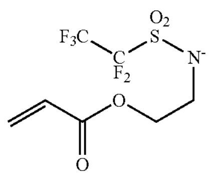
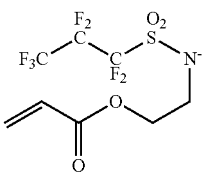
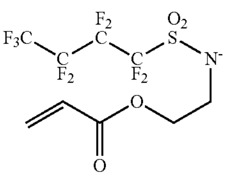
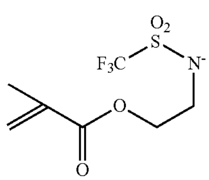
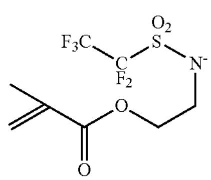
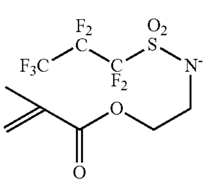
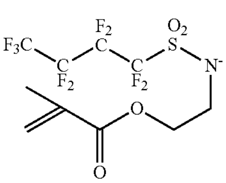
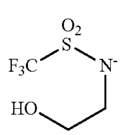
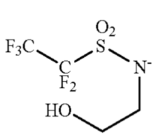
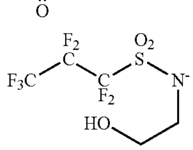
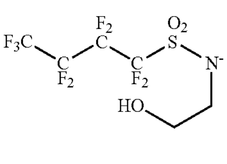
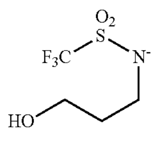
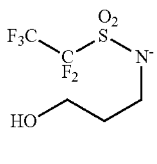
106
-continued
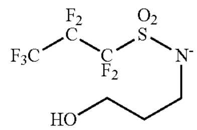
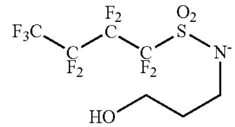
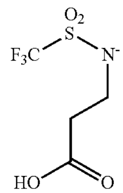
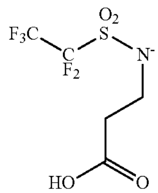
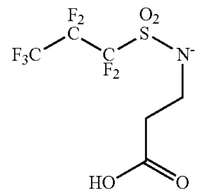
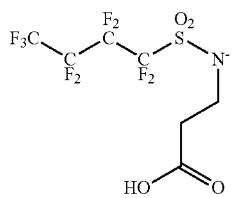
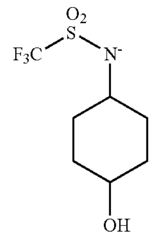
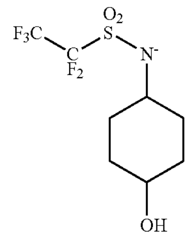
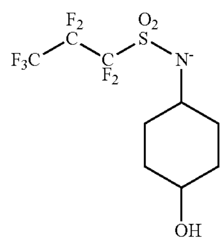
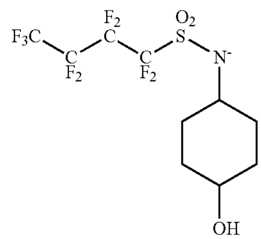
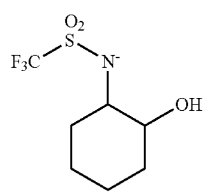
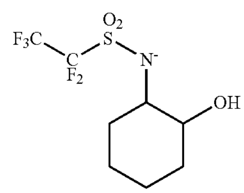
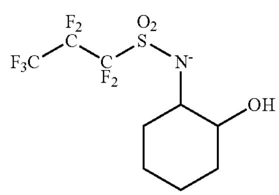
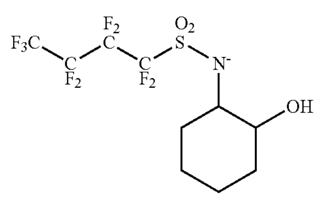
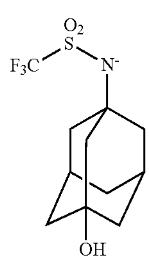
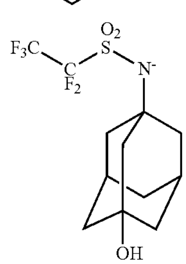

-continued
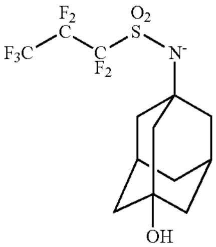
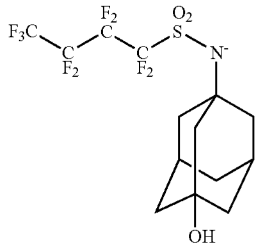
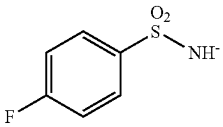
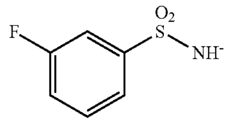
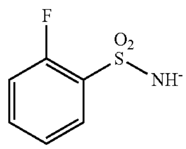
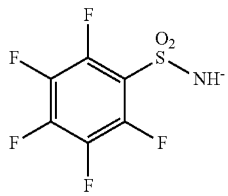
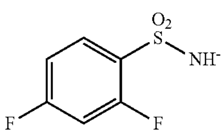
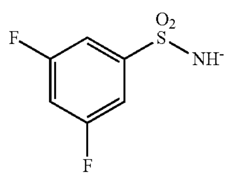
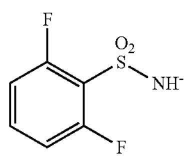
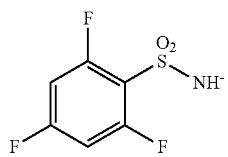
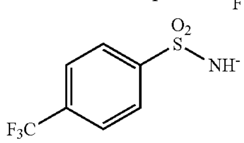
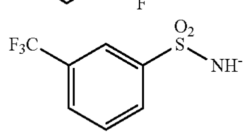
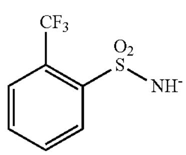
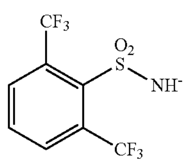
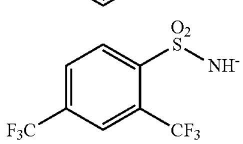
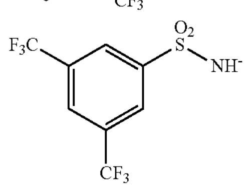
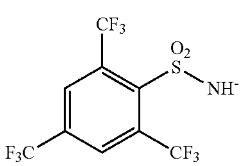
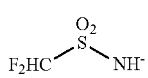
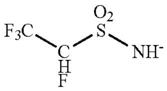
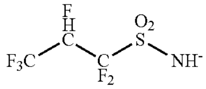
-continued
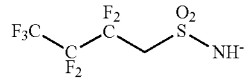
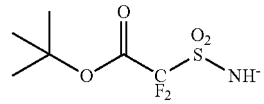
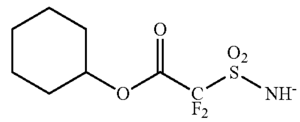
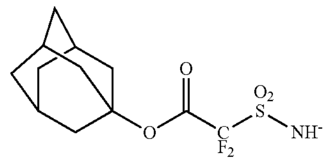
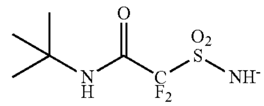
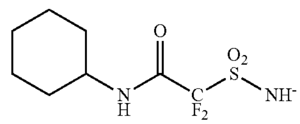
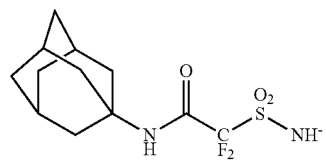
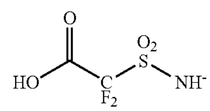
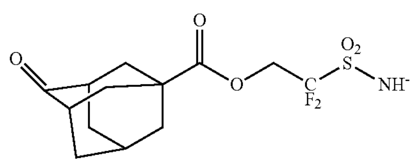
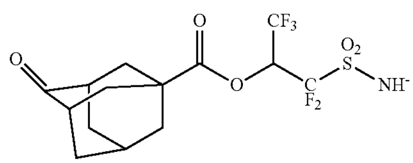
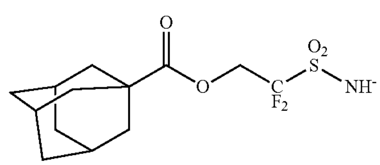
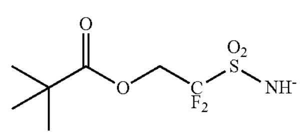
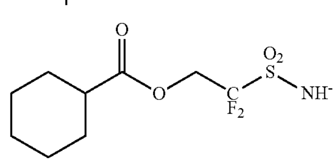

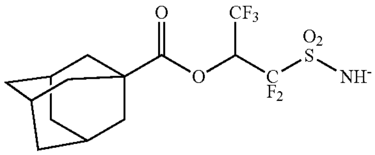
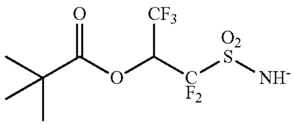
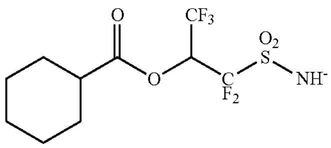
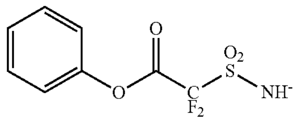
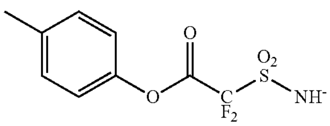
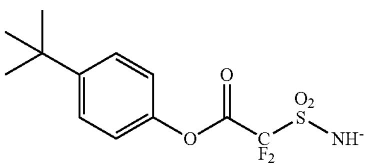
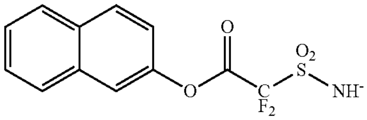
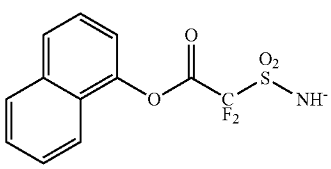
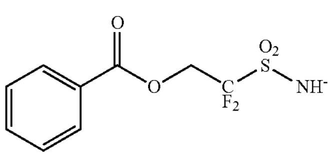
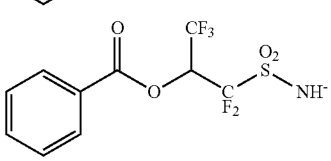
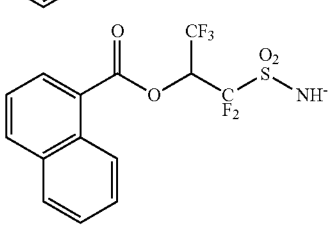
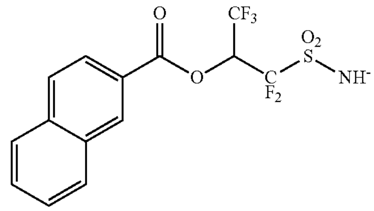
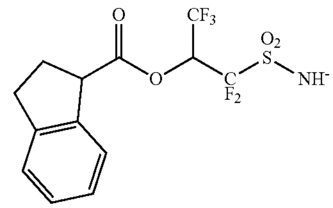
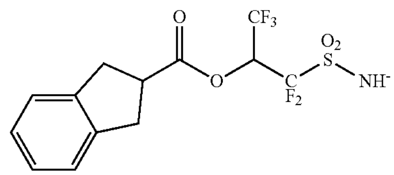
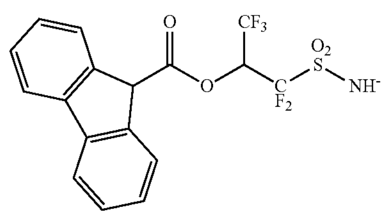
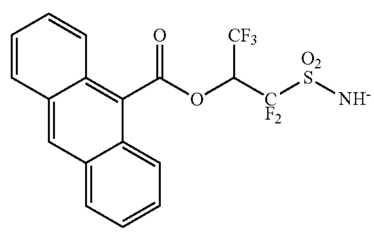
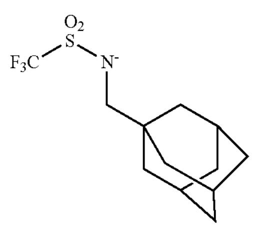
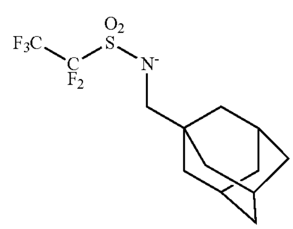
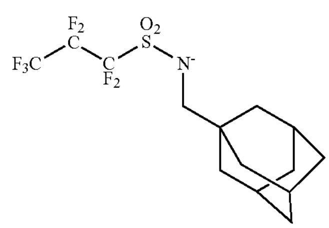
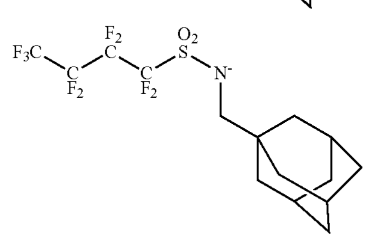

-continued
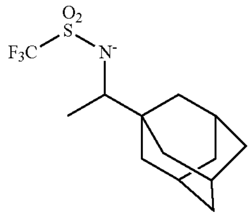
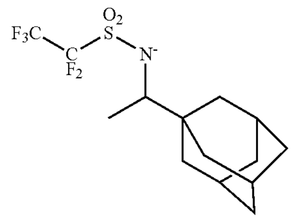
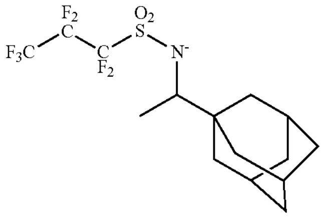
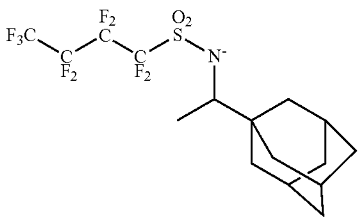
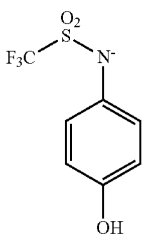
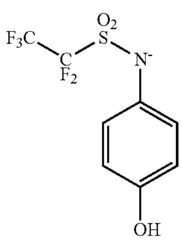
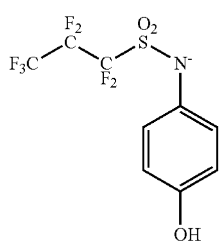
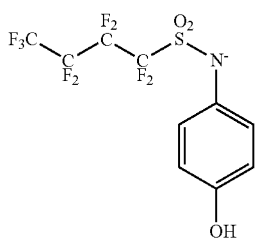
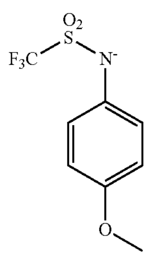
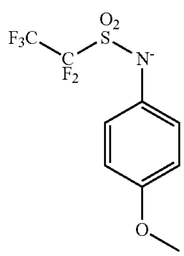
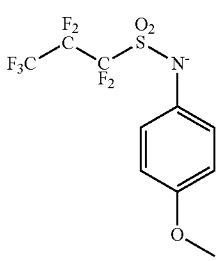
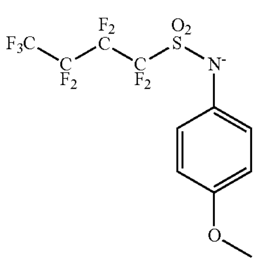
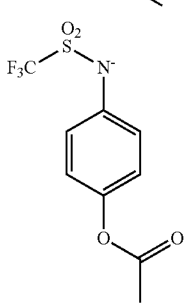
-continued
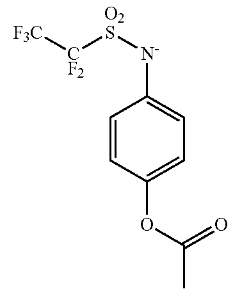
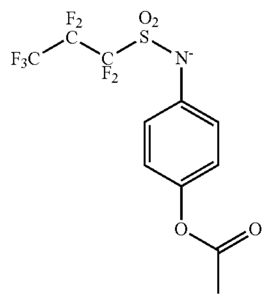
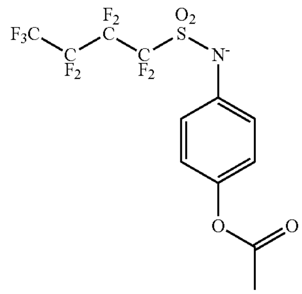
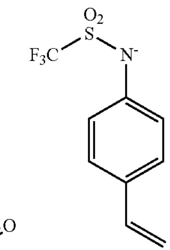
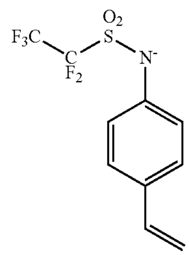
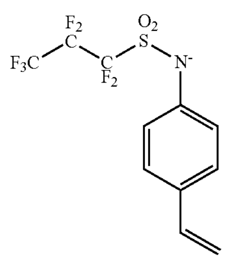
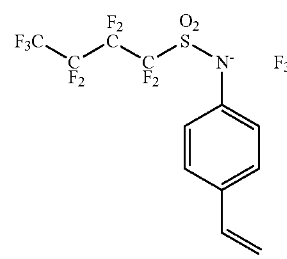
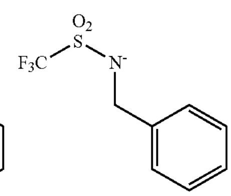
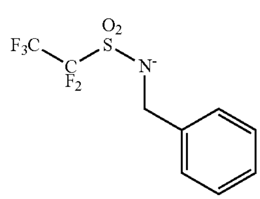
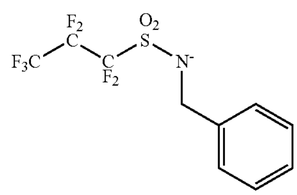
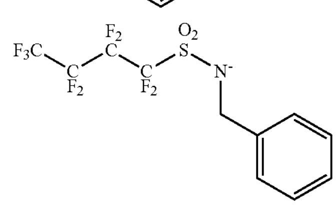
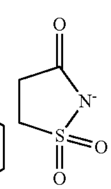
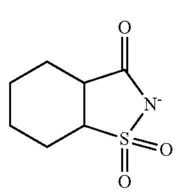
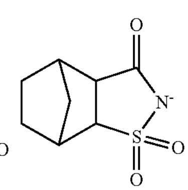
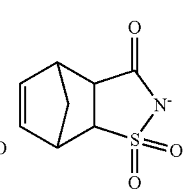

-continued

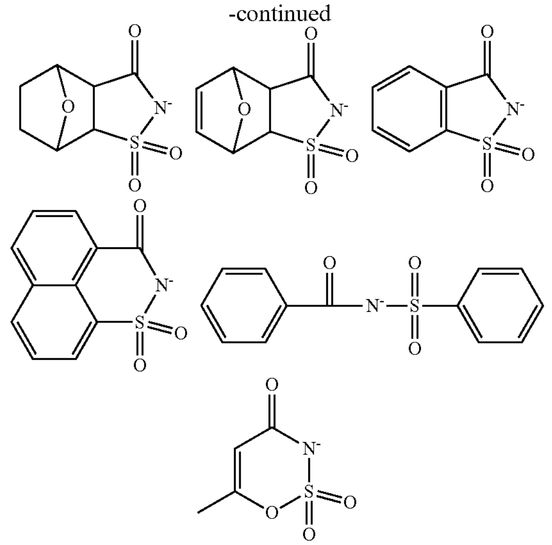

Examples of the halide ion include a fluoride ion, a chloride ion, a bromide ion, and an iodide ion.

The salt compound having the formula (A) is synthesized by, for example, a neutralization reaction between a nitrogen-containing compound having an iodized or brominated hydrocarbyl group (other than an iodized or brominated aromatic ring) and a carboxylic acid, sulfonimide free of fluorine, sulfonamide, or hydrogen halide.

The salt compound having the formula (A) functions as a quencher having a sensitizing effect in the resist composition. A normal quencher is capable of reducing LWR and improving CDU by controlling acid diffusion and reducing the sensitivity. The salt compound having the formula (A) has also a function to improve the sensitivity by the sensitizing effect due to the acid diffusion suppressing effect of the amino group and the iodine or bromine, which has a large atomic weight, and due to the absorption of a large amount of EUV by the iodine and bromine. It is considered that during exposure to an EB or EUV, the iodine attached to the hydrocarbyl group generates radicals and the bromine generates secondary electrons to promote the decomposition of the acid generator, contributing a high sensitivity.

In the resist composition, the salt compound having the formula (A) is preferably used in an amount of 0.001 to 50 parts by weight, more preferably 0.01 to 40 parts by weight per 100 parts by weight of the base polymer (described below), as viewed from sensitivity and acid diffusion suppressing effect.

Because the salt compound having the formula (A) is not photosensitive and thus not photo-decomposable, the acid diffusion in the exposed portion can be suppressed. In addition, because the salt compound is not a base, the salt compound does not have an effect of promoting solubility in an alkaline developer, and thus has an effect of suppressing film thickness loss of pattern.

Base Polymer

Where the resist composition is of positive tone, the base polymer contained in the resist composition includes recurring units containing an acid labile group, preferably recurring units having the formula (a1) or recurring units having the formula (a2). These units are simply referred to as recurring units (a1) and (a2).

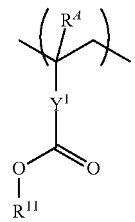

(a1)

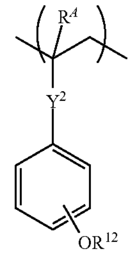

(a2)

Herein $R^A$ is each independently hydrogen or methyl. $R^{11}$ and $R^{12}$ are each independently an acid labile group. $R^{11}$ and $R^{12}$ may be the same or different when the base polymer contains both recurring units (a1) and (a2). $Y^1$ is a single bond, phenylene, naphthylene, or a $C_1$-$C_{12}$ linking group containing at least one of ester bond and lactone ring. $Y^2$ is a single bond or ester bond.

Examples of the monomer from which recurring units (a1) are derived are shown below, but not limited thereto. $R^A$ and $R^{11}$ are as defined above.

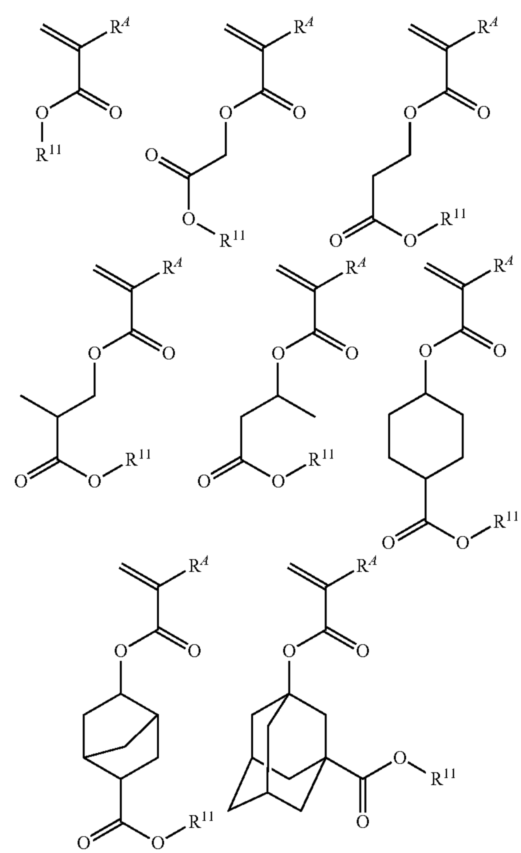

-continued

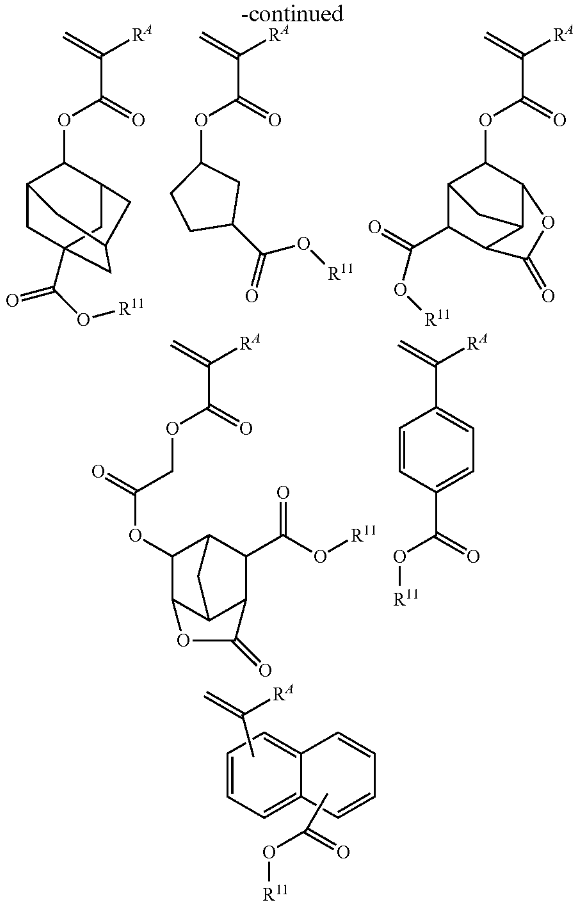

Examples of the monomer form which recurring units (a2) are derived are shown below, but not limited thereto. $R^A$ and $R^{12}$ are defined above.

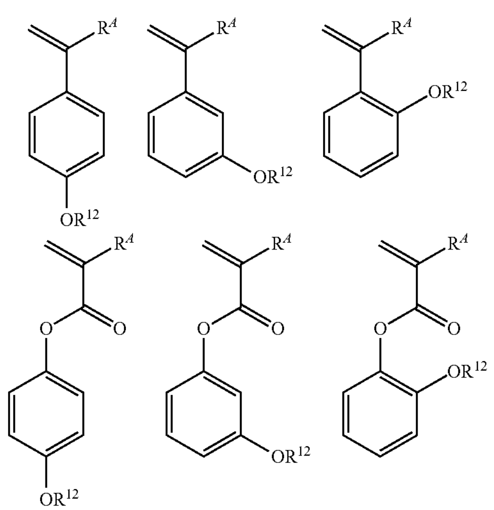

The acid labile groups represented by $R^{11}$ and $R^{12}$ in the formulae (a1) and (a2) may be selected from a variety of such groups, for example, those described in JP-A 2013-80033 and JP-A 2013-83821.

Typical of the acid labile group are groups of the following formulae (AL-1) to (AL-3).

(AL-1)

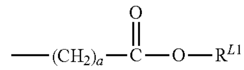

(AL-2)

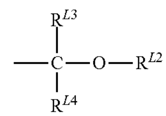

(AL-3)

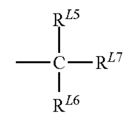

Herein the broken line designates a point of attachment.

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{40}$, especially $C_1$-$C_{20}$ saturated hydrocarbyl groups.

In formula (AL-1), "a" is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L2}$, $R^{L3}$, and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may comprise recurring units (b) having a phenolic hydroxyl group as an adhesive group. Examples of suitable monomers from which recurring units (b) are derived are given below, but not limited thereto. $R^A$ is as defined above.

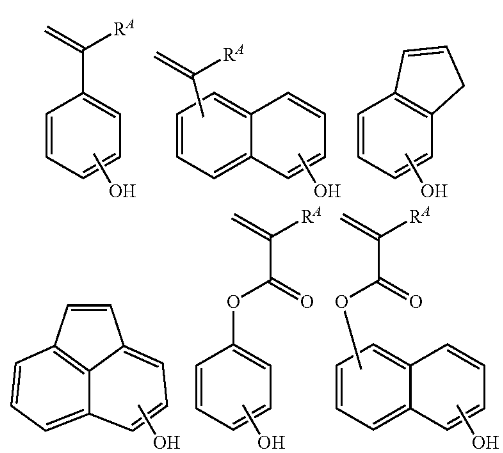

-continued

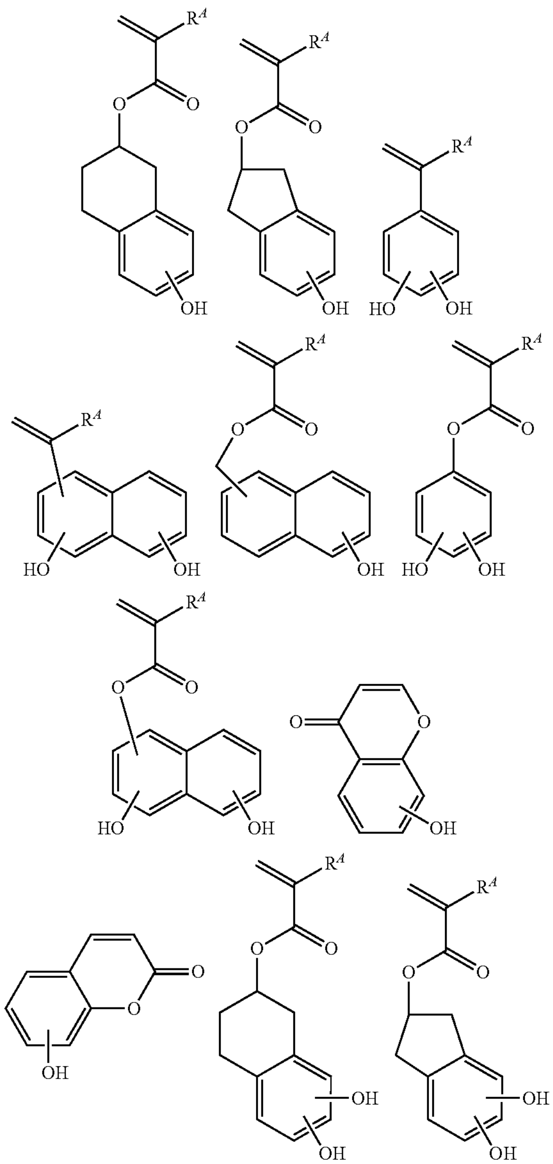

Further, recurring units (c) having another adhesive group selected from a hydroxyl group (other than the foregoing phenolic hydroxyl group), a lactone ring, an ether bond, an ester bond, a carbonyl group, a cyano group, or a carboxyl group may also be incorporated in the base polymer. Examples of suitable monomers from which recurring units (c) are derived are given below, but not limited thereto. $R^A$ is as defined above.

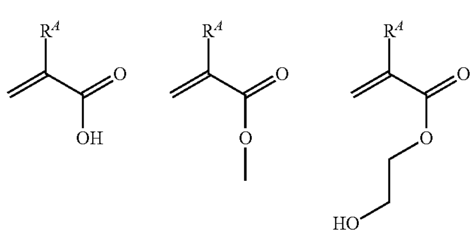

-continued

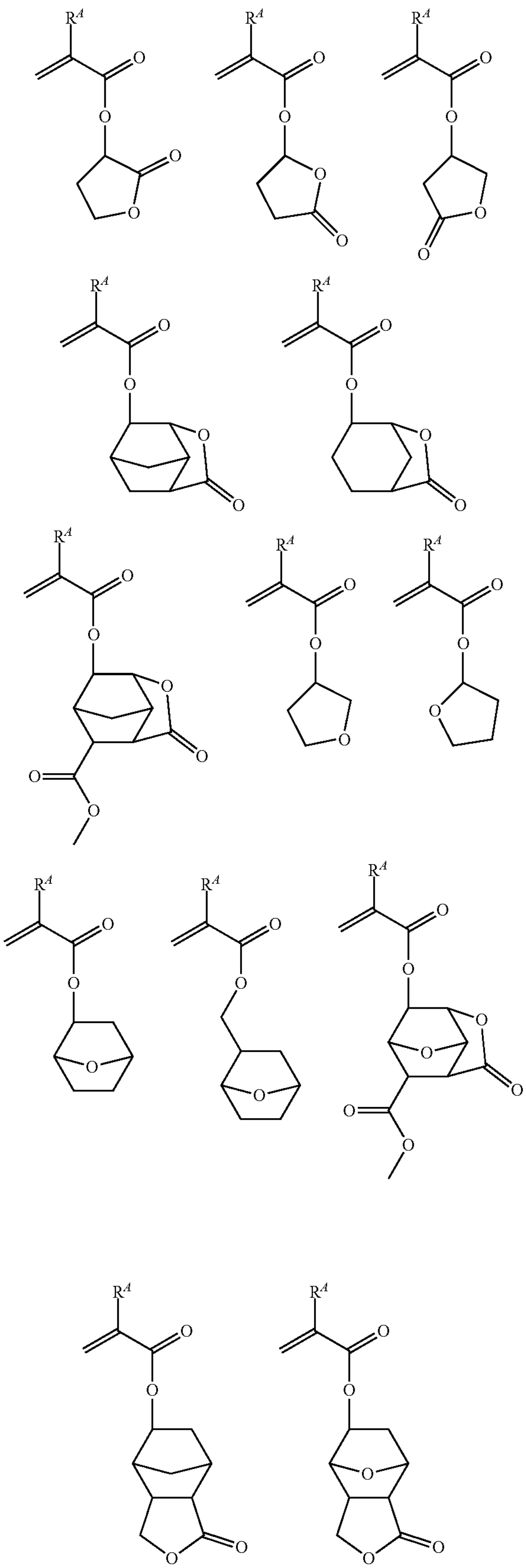

-continued
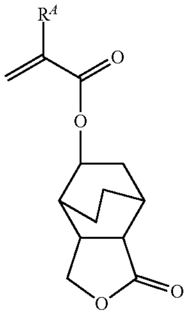
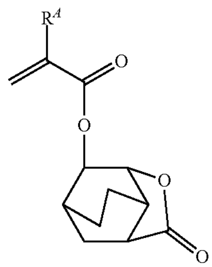
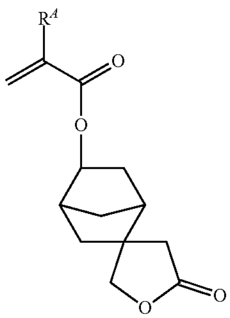
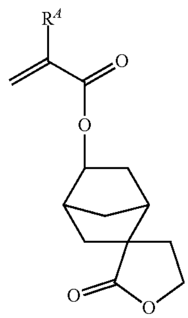
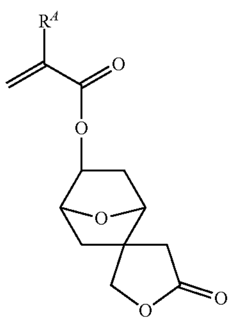
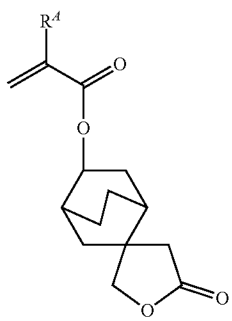
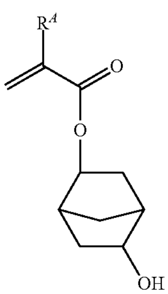
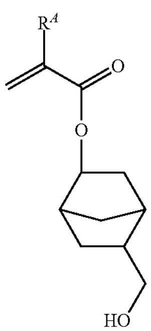
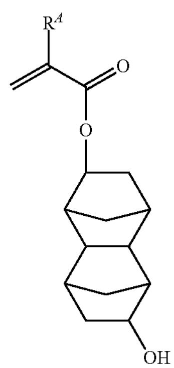
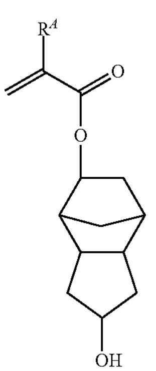
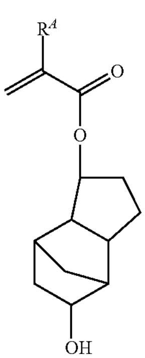
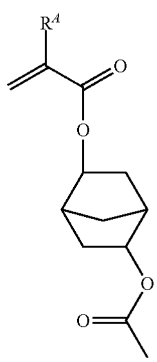
-continued
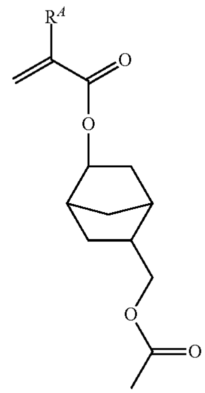
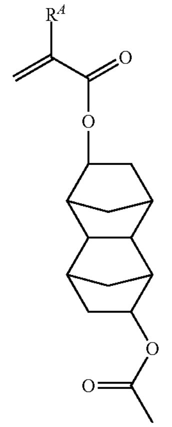
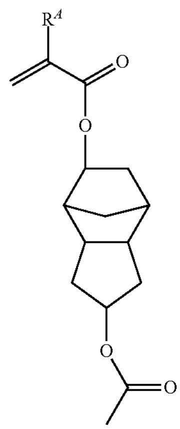
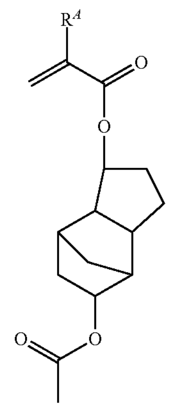
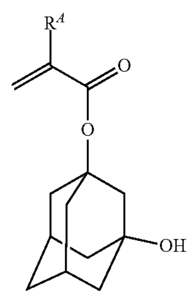
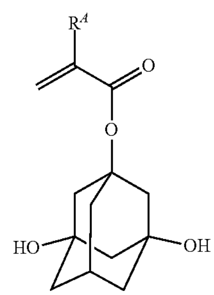
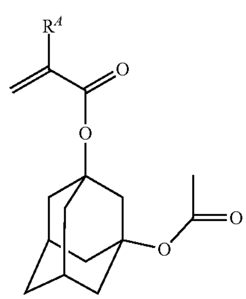
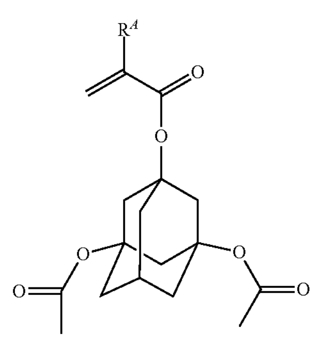

-continued
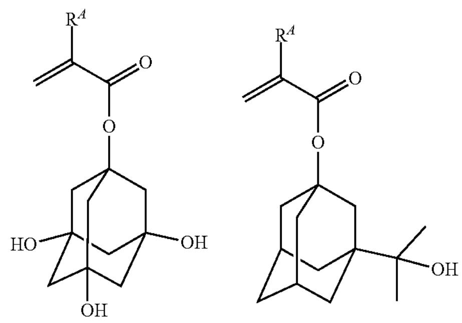
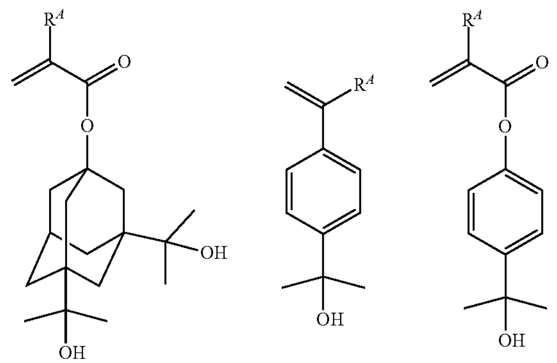
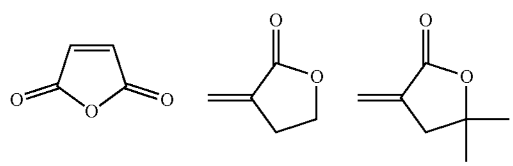
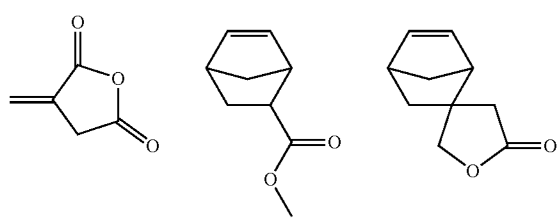
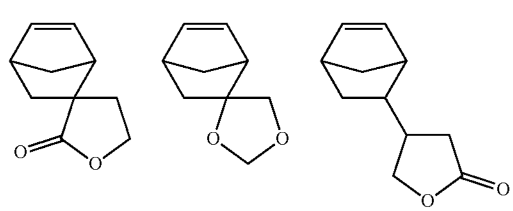
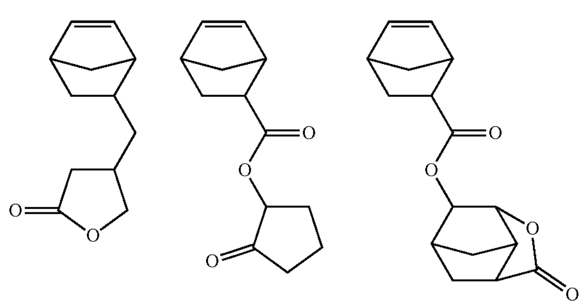
-continued
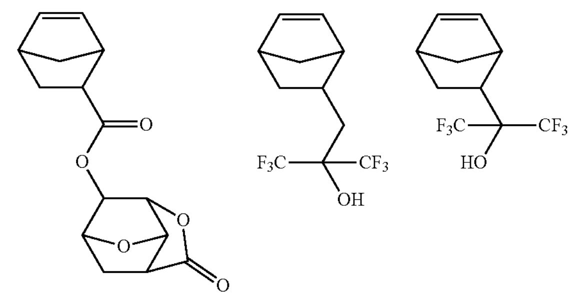
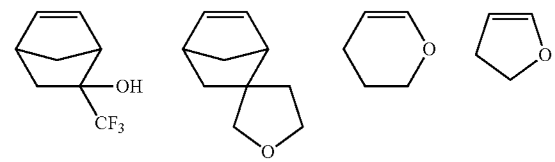
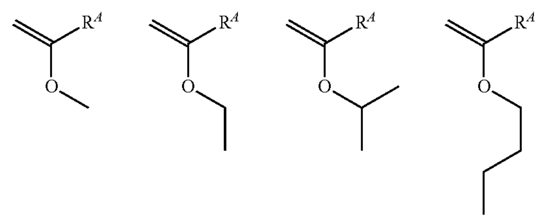
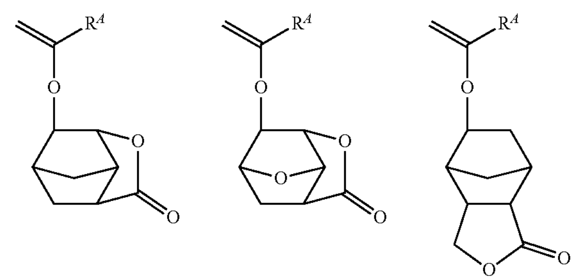
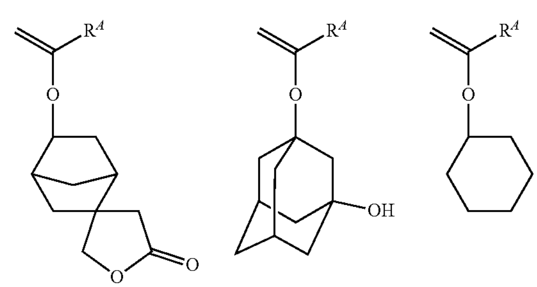
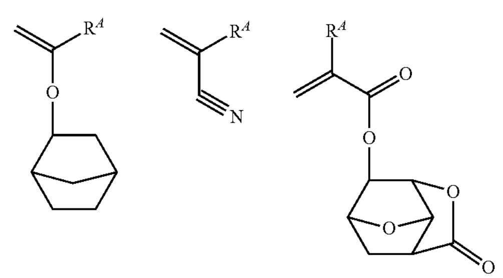

-continued
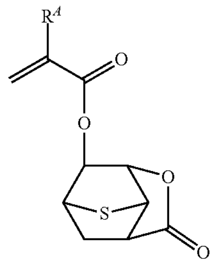
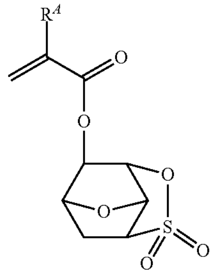
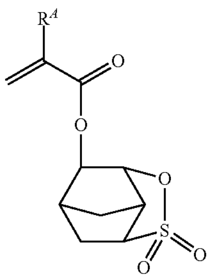
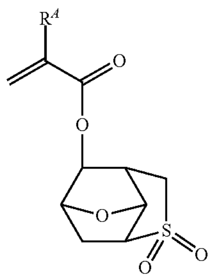
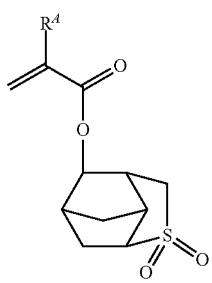
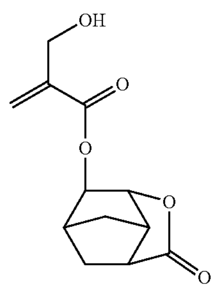
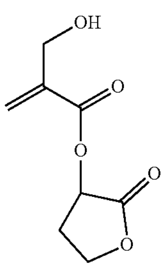
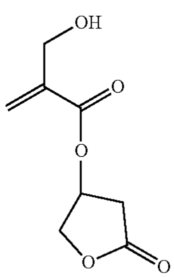
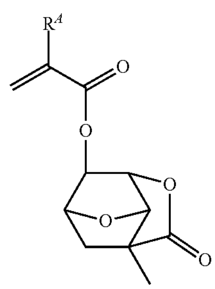
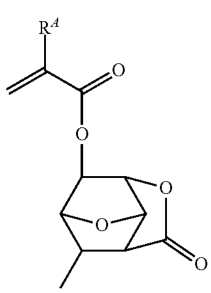
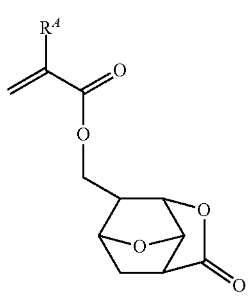
-continued
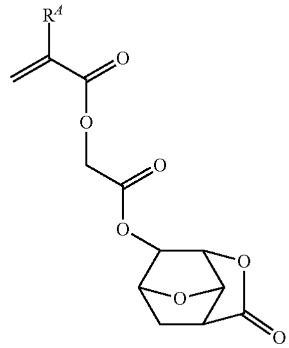
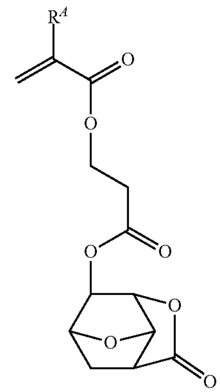
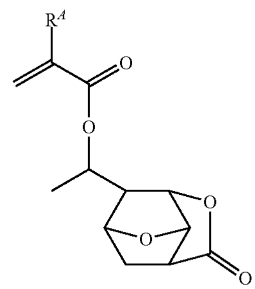
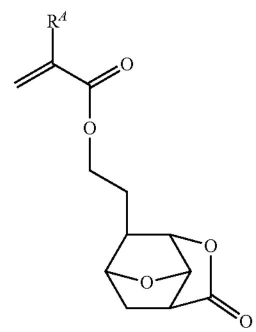
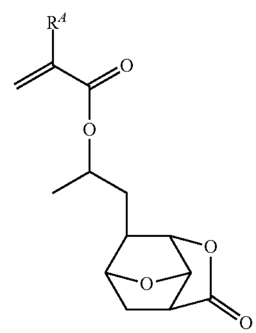
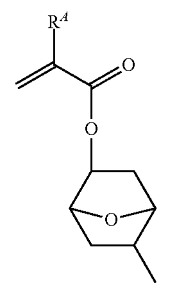
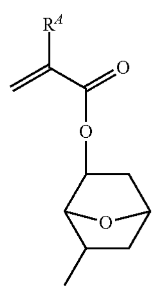
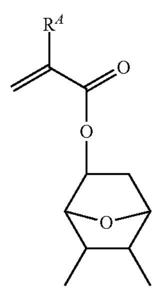
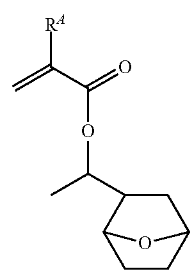
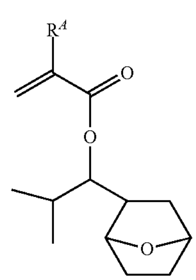
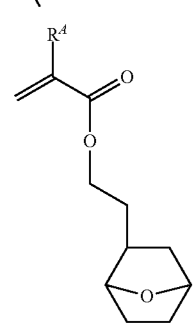

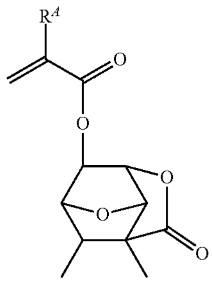
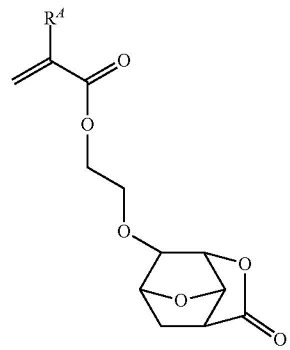
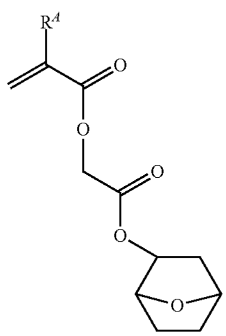
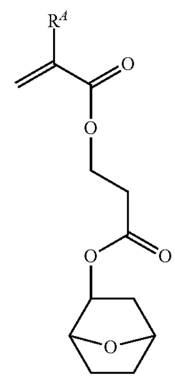
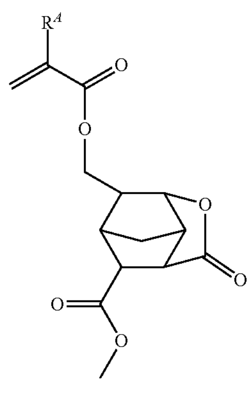
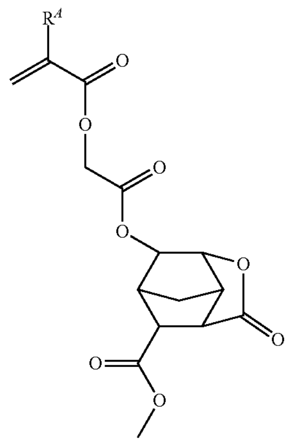
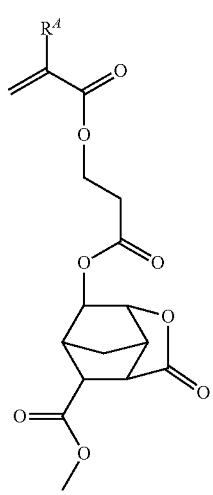
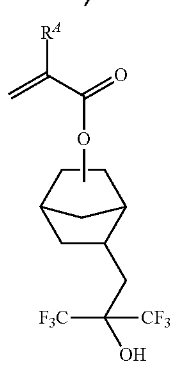
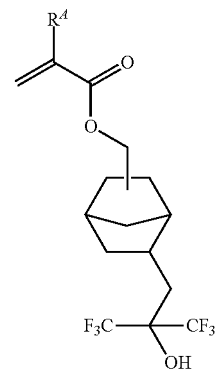
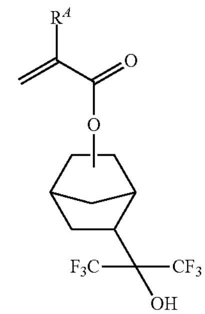
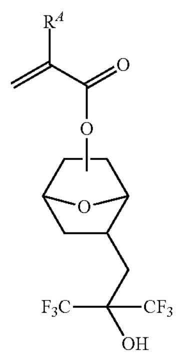
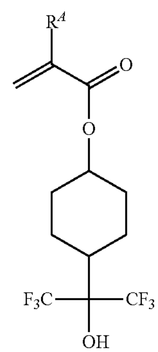
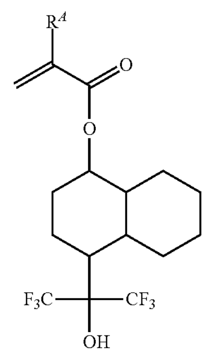
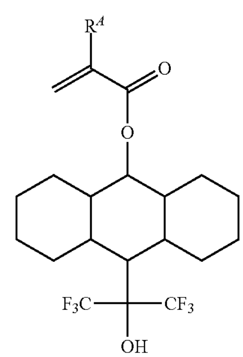
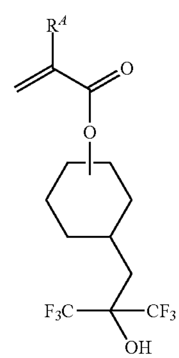
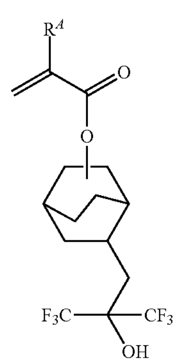
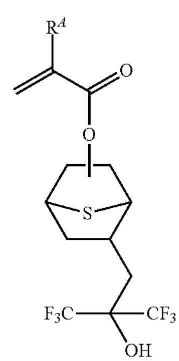
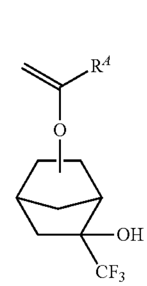

-continued
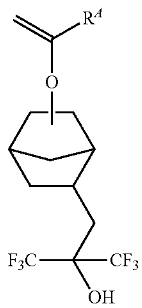
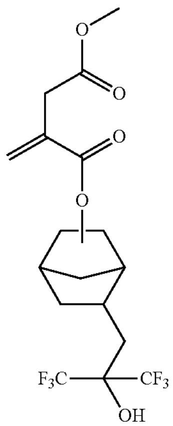
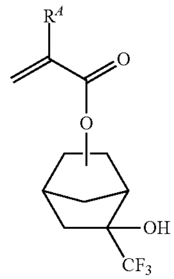
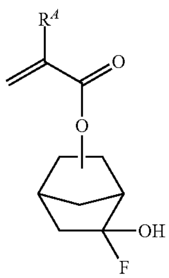
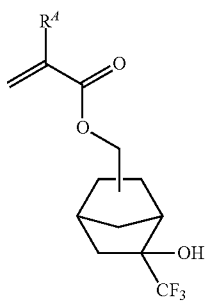
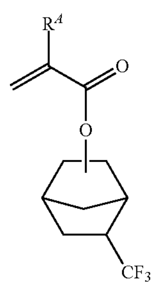
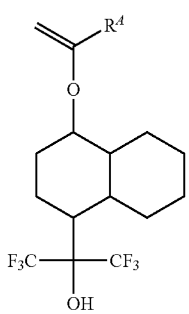
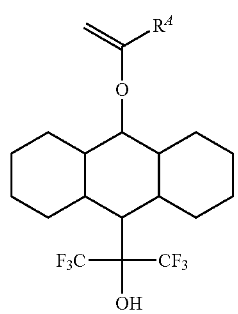
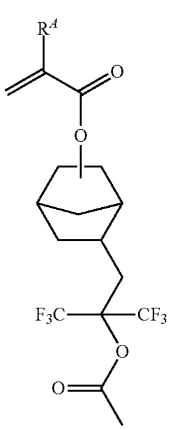
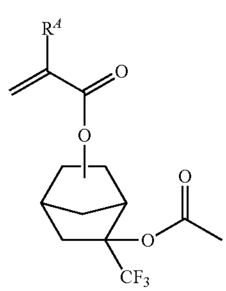
-continued
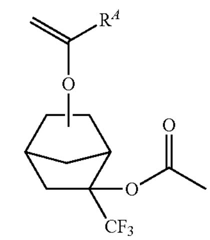
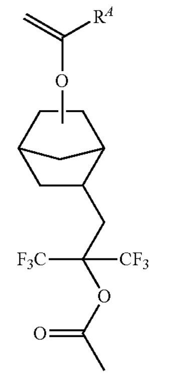
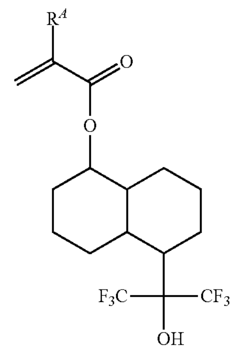
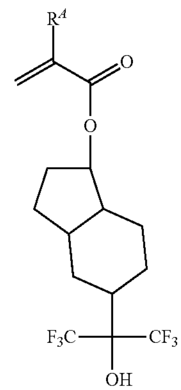
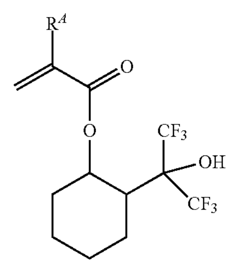
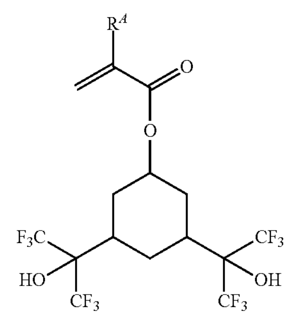
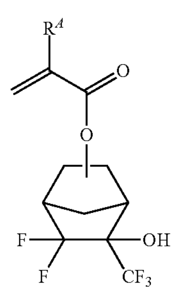
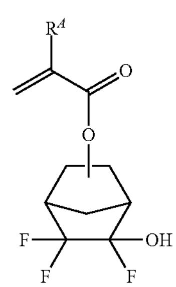
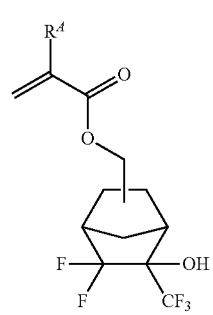
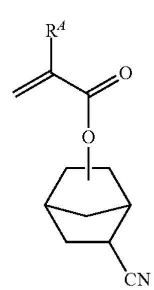
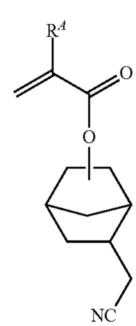

-continued
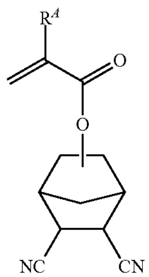
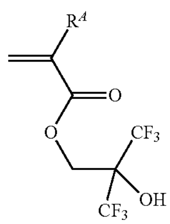
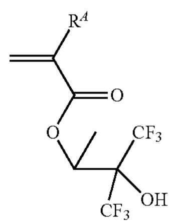
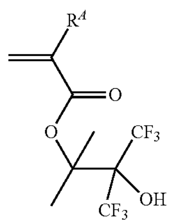
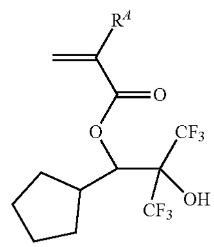
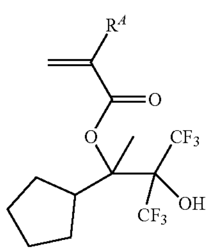
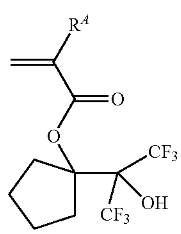
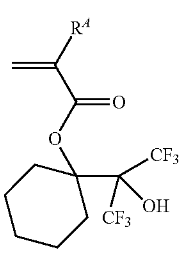
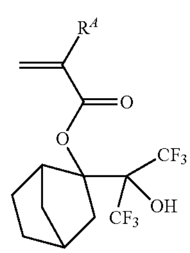
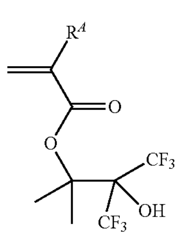
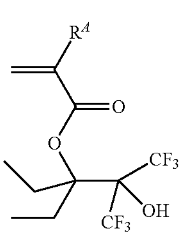
-continued
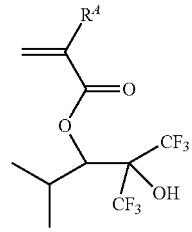
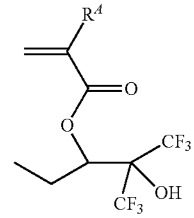
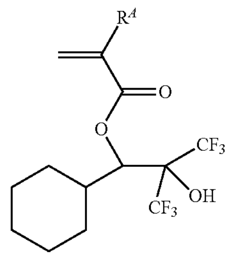
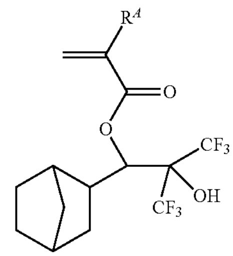
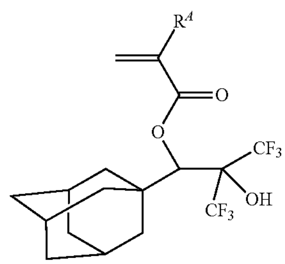
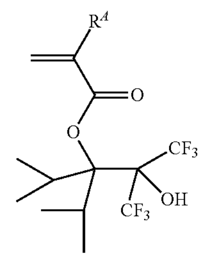
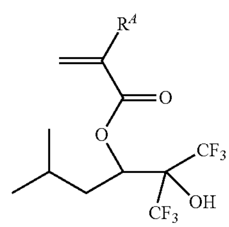
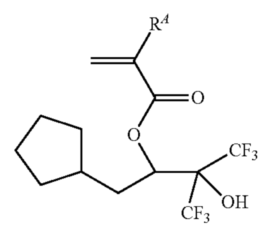
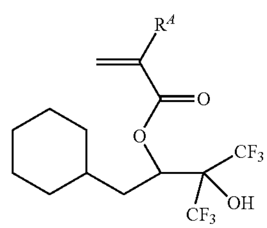
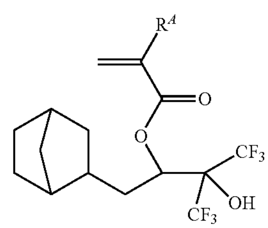
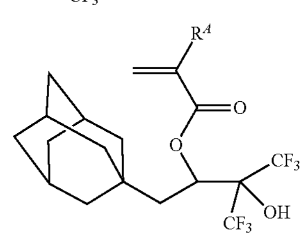
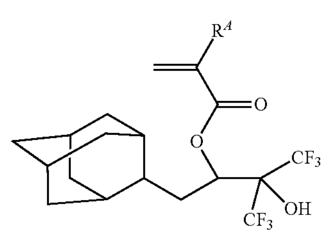
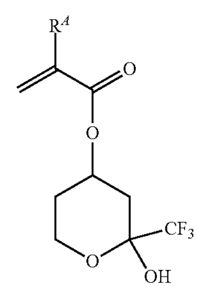

-continued
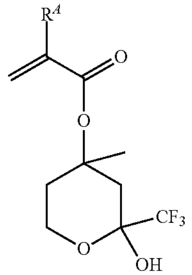
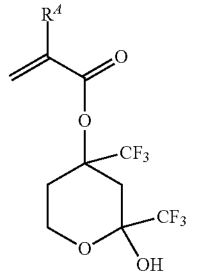
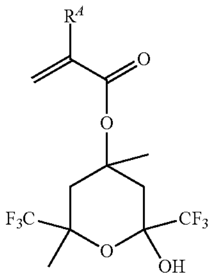
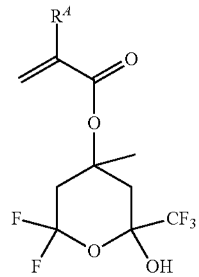
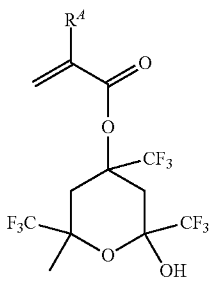
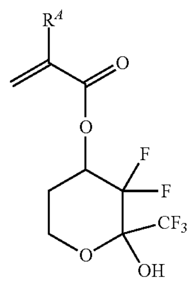
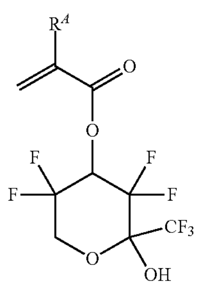
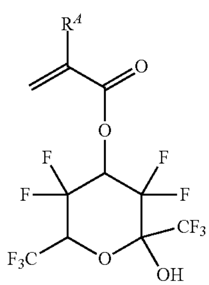
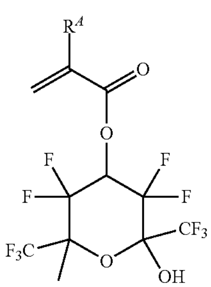
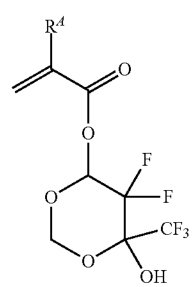
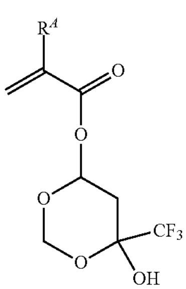
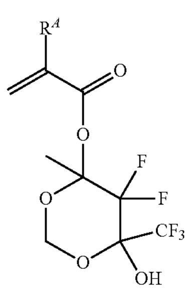
-continued
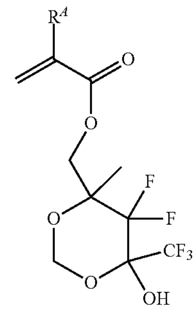
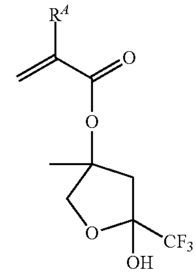
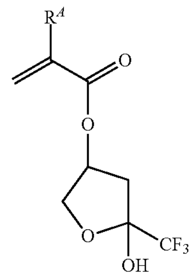
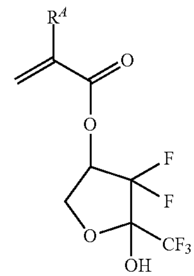
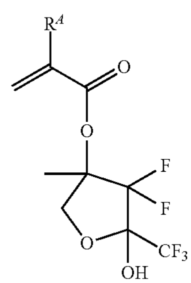
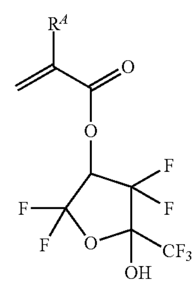
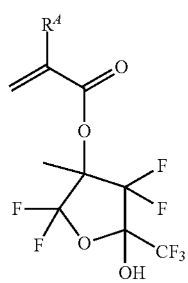
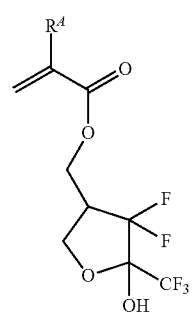
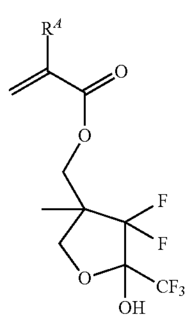
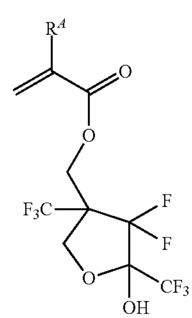

-continued
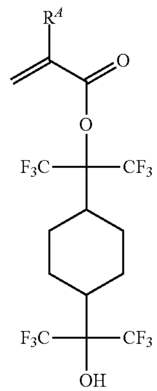
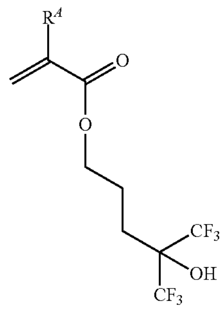
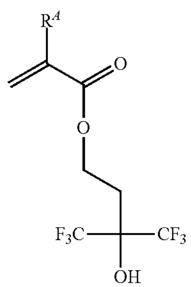
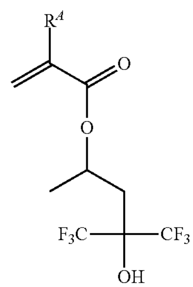
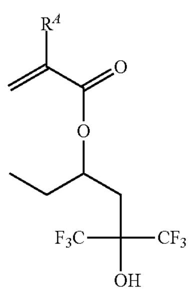
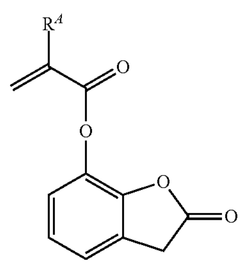
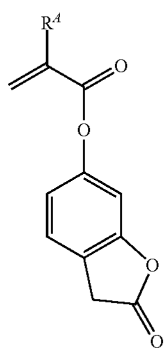
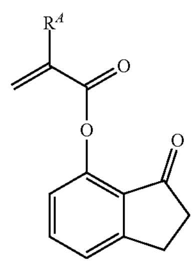
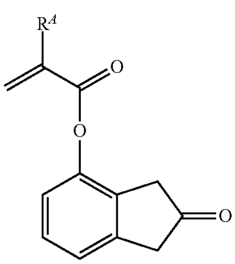
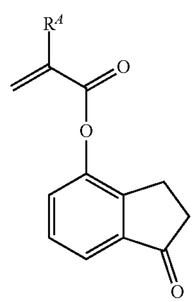
-continued
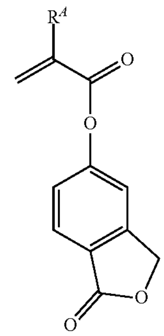
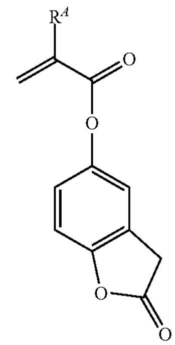
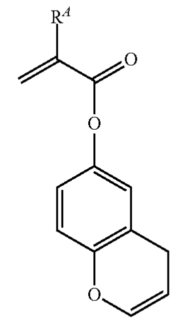
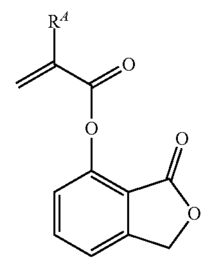
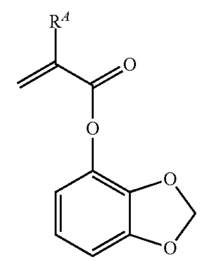
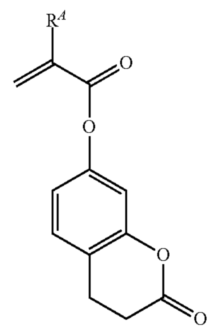
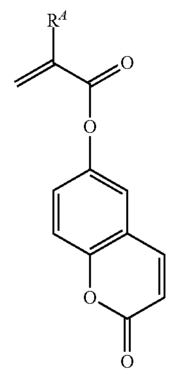
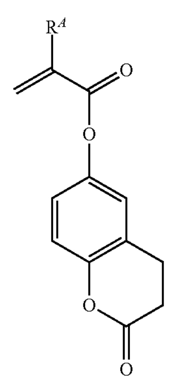
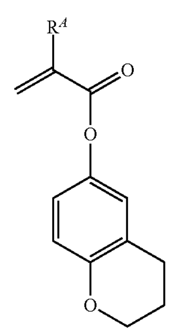
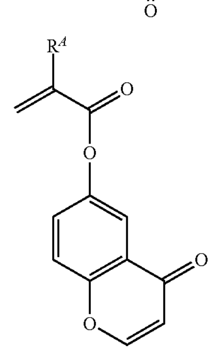
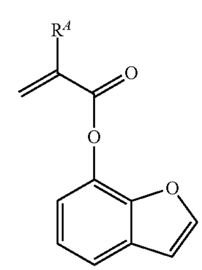

-continued
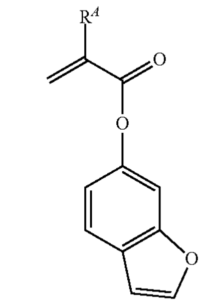
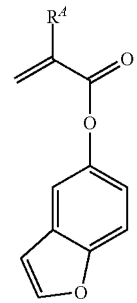
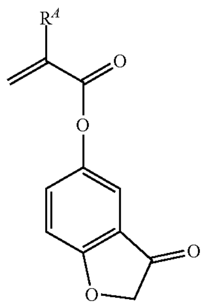
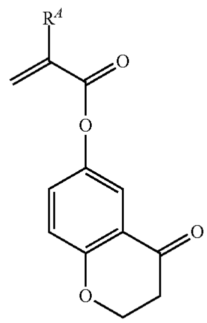
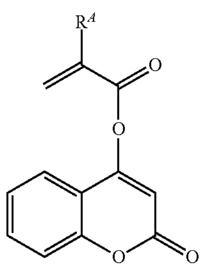
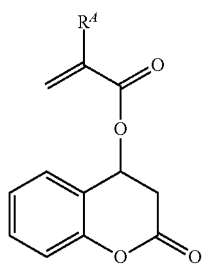
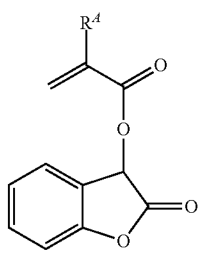
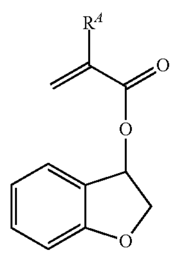
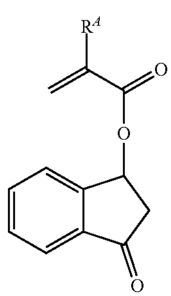
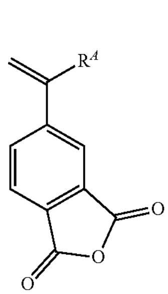
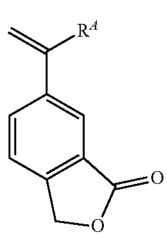
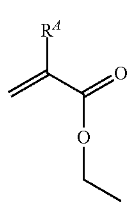
-continued
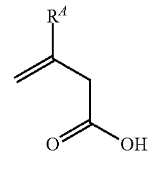
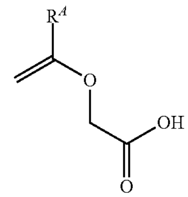
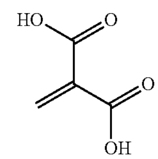
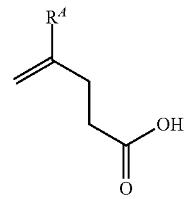
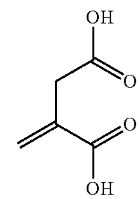
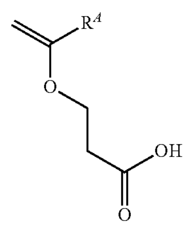
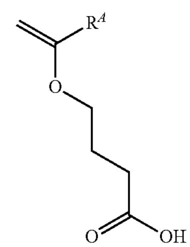
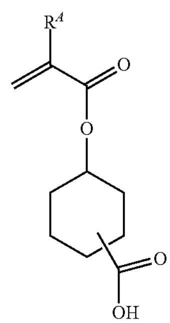
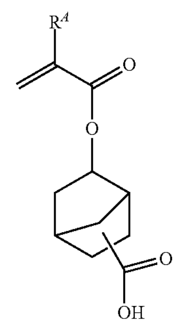
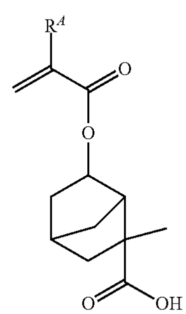
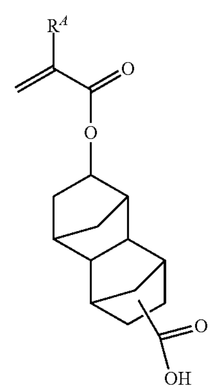
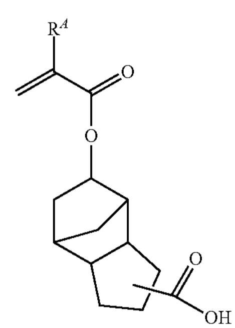
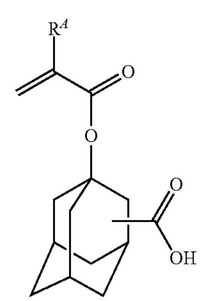

-continued
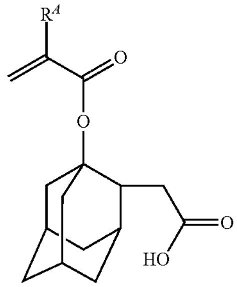
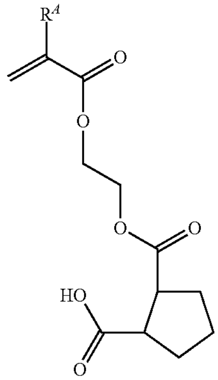
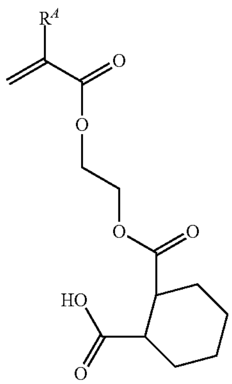
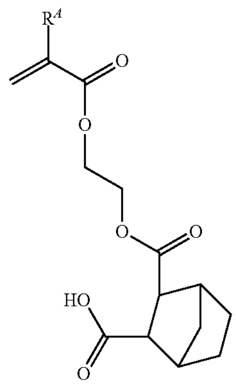
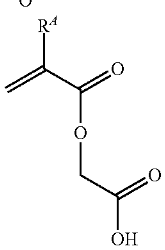
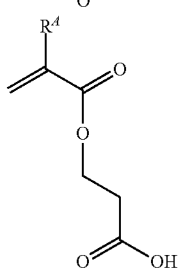
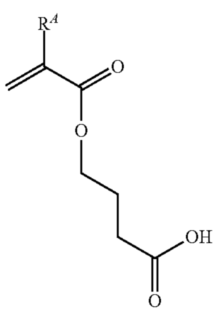
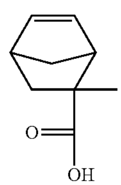
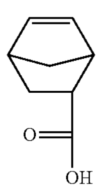
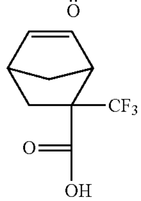
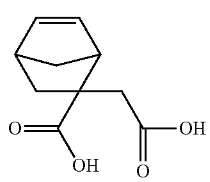
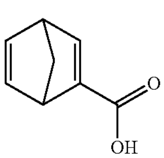
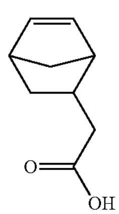
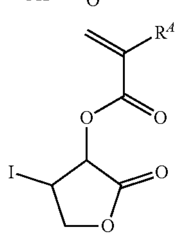
-continued
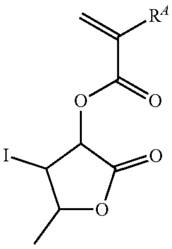
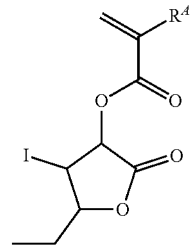
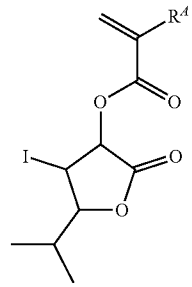
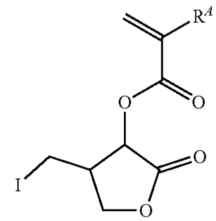
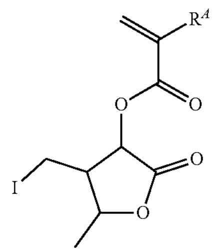
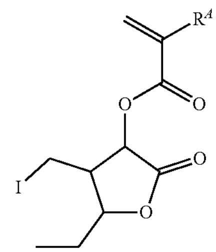
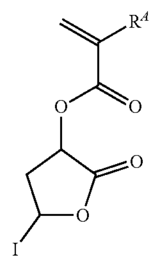
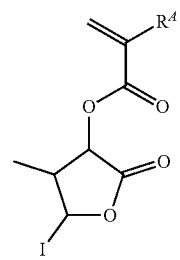
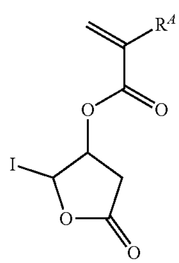
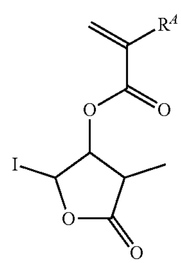
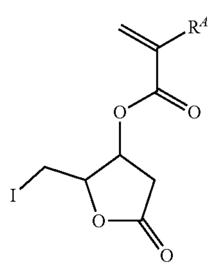
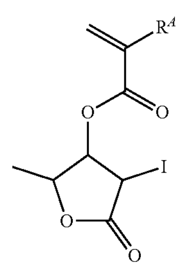

-continued

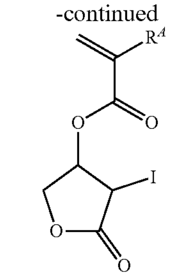

In another preferred embodiment, the base polymer may further comprise recurring units (d) derived from indene, benzofuran, benzothiophene, acenaphthylene, chromone, coumarin, and norbornadiene, or derivatives thereof. Examples of suitable monomers from which recurring units (d) are derived are given below, but not limited thereto.

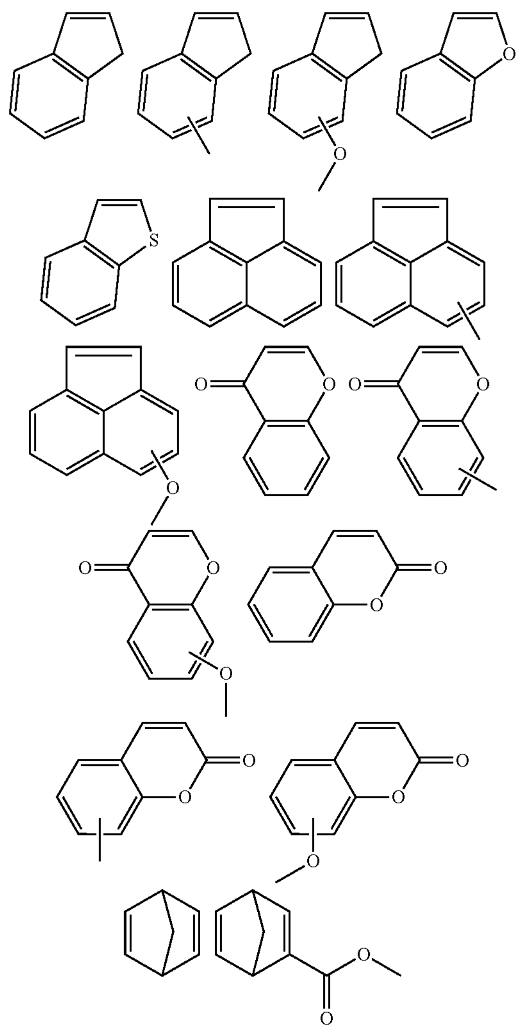

The base polymer may further include recurring units (e) which are derived from styrene, vinylnaphthalene, vinylanthracene, vinylpyrene, methyleneindene, vinylpyridine, or vinylcarbazole.

In a further embodiment, recurring units (f) derived from an onium salt having a polymerizable unsaturated bond may be incorporated in the base polymer. The preferred recurring units (f) include recurring units having the formula (f1), recurring units having the formula (f2), and recurring units having the formula (f3). These units are simply referred to as recurring units (f1), (f2) and (f3), which may be used alone or in combination of two or more types.

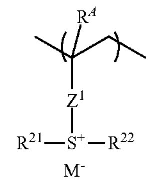

(f1)

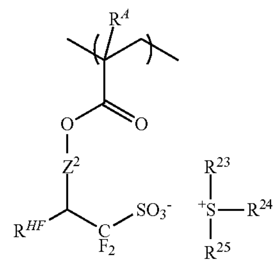

(f2)

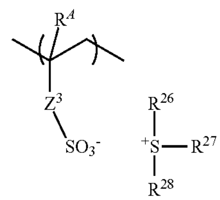

(f3)

In formulae (f1) to (f3), $R^A$ is each independently hydrogen or methyl.

$Z^1$ is a single bond, a $C_1$-$C_6$ aliphatic hydrocarbylene group, a phenylene group, a naphthylene group, or a $C_7$-$C_{18}$ combination thereof, —O—$Z^{11}$—, —C(═O)—O—$Z^{11}$—, or —C═O)—NH—$Z^{11}$—. $Z^{11}$ is a $C_1$-$C_6$ aliphatic hydrocarbylene group, a phenylene group, a naphthylene group, or a $C_7$-$C_{18}$ combination thereof, which may contain a carbonyl moiety, an ester bond, an ether bond, or a hydroxyl moiety. $Z^2$ is a single bond, —$Z^{21}$—C(═O)—O—, —$Z^{21}$—O—, or —$Z^{21}$—O—C(═O)—. $Z^{21}$ is a $C_1$-$C_{12}$ saturated hydrocarbylene group which may contain a carbonyl moiety, an ester bond, or an ether bond. $Z^3$ is a single bond, a methylene group, an ethylene group, a phenylene group, a fluorinated phenylene group, —O—$Z^{31}$—, —C(═O)—O—$Z^{31}$—, or —C(═O)—NH—$Z^{31}$—. $Z^{31}$ is a $C_1$-$C_6$ aliphatic hydrocarbylene group, a phenylene group, a fluorinated phenylene group, or a trifluoromethyl-substituted phenylene group, which may contain a carbonyl moiety, an ester bond, an ether bond, or a hydroxyl moiety. The aliphatic hydrocarbylene groups represented by $Z^{11}$ and $Z^{31}$ may be saturated or unsaturated, and may be straight, branched, or cyclic. The saturated hydrocarbylene group represented by $Z^{21}$ may be straight, branched, or cyclic.

In the formulae (f1) to (f3), $R^{21}$ to $R^{28}$ are each independently a halogen or a $C_1$-$C_{20}$ hydrocarbyl group which may contain a heteroatom. The hydrocarbyl group may be saturated or unsaturated and straight, branched or cyclic. Examples thereof are as will be exemplified for the hydrocarbyl groups represented by $R^{101}$ to $R^{105}$ in the formulae (1-1) and (1-2) described below.

Also, a pair of $R^{23}$ and $R^{24}$ or $R^{26}$ and $R^{27}$ may bond together to form a ring with the sulfur atom to which the pair is attached. Examples of the ring are as will be exemplified for the ring that $R^{101}$ and $R^{102}$, taken together, form with the sulfur atom to which they are attached in the formula (1-1) described below.

In formula (f2), $R^{HF}$ is hydrogen or trifluoromethyl.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide, and bis(perfluorobutylsulfonyl)imide; and methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

$$R^{31}-CF_2-SO_3^- \quad \text{(f1-1)}$$

(f1-2)

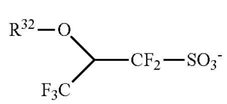

In the formula (f1-1), $R^{31}$ is hydrogen or a $C_1$-$C_{20}$ hydrocarbyl group which may contain an ether bond, an ester bond, a carbonyl moiety, a lactone ring, or a fluorine atom. The hydrocarbyl group may be saturated or unsaturated and straight, branched or cyclic. Examples thereof are as will be exemplified for the hydrocarbyl group represented by $R^{111}$ in the formula (1A') described below.

In the formula (f1-2), $R^{32}$ is hydrogen, or a $C_1$-$C_{30}$ hydrocarbyl or $C_2$-$C_{30}$ hydrocarbylcarbonyl group which may contain an ether bond, an ester bond, a carbonyl moiety, or a lactone ring. The hydrocarbyl group and hydrocarbyl moiety of the hydrocarbylcarbonyl group may be saturated or unsaturated and straight, branched or cyclic. Examples thereof are as will be exemplified for the hydrocarbyl group represented by $R^{111}$ in the formula (1A') described below.

Examples of the cation in the monomer from which recurring unit (f1) is derived are shown below, but not limited thereto. $R^A$ is as defined above.

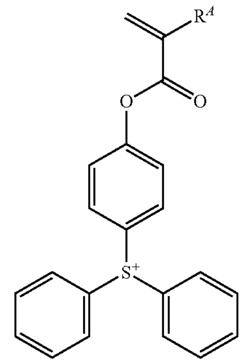

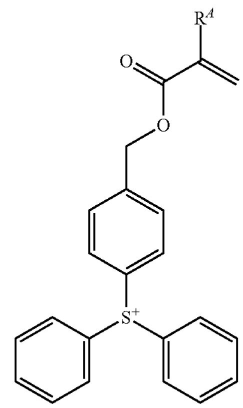

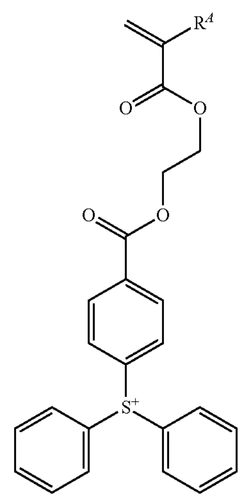

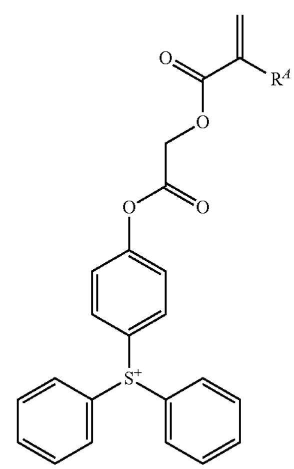

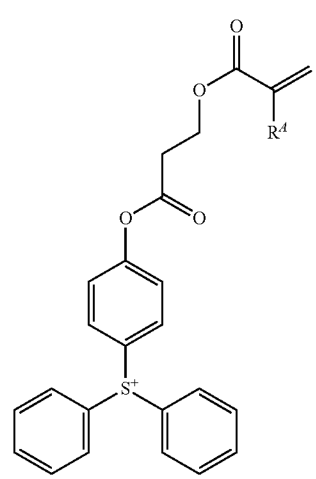

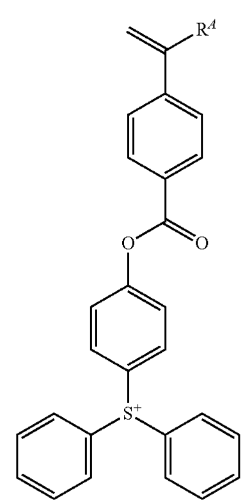

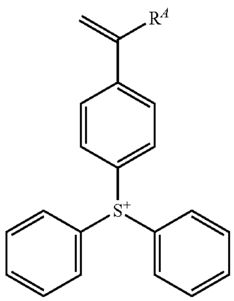
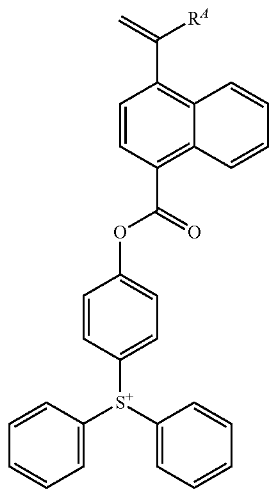
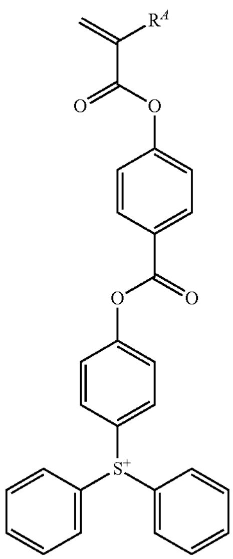
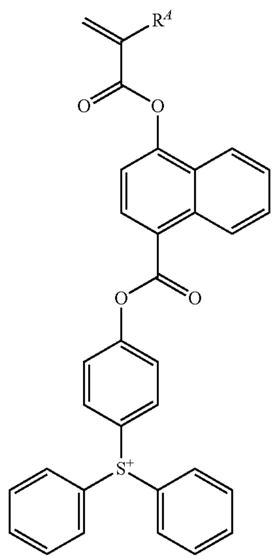
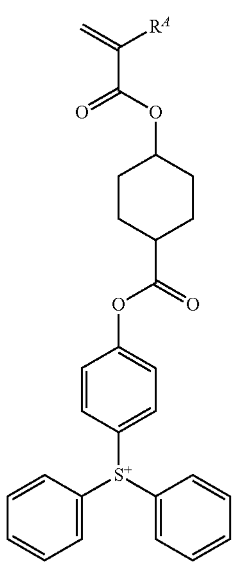
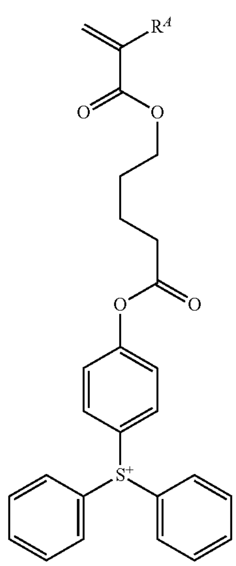
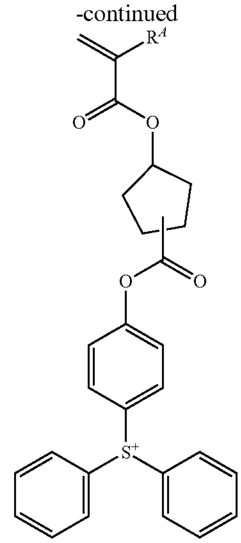
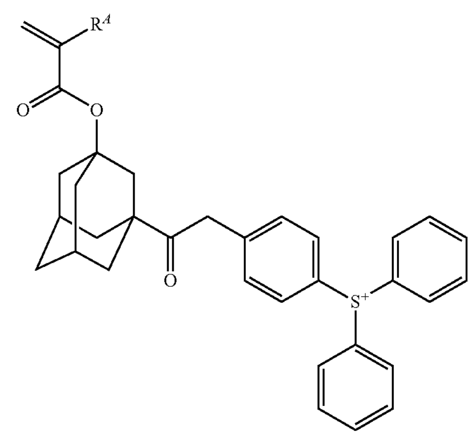
Examples of the cation in the monomer from which recurring unit (f2) or (f3) is derived are as will be exemplified for the cation in the sulfonium salt having the formula (1-1) described below.
Examples of the anion in the monomer from which recurring unit (f2) is derived are shown below, but not limited thereto. $R^A$ is as defined above.
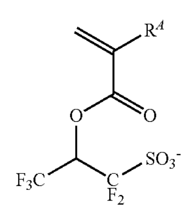
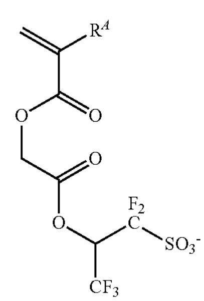
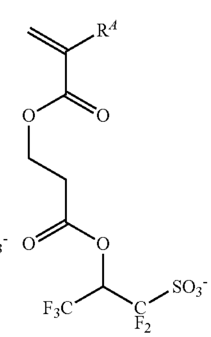

-continued
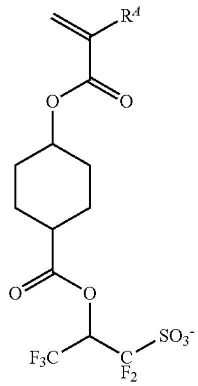
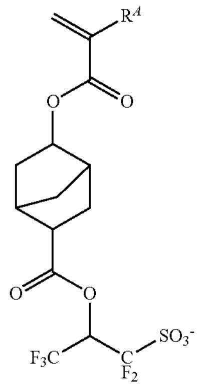
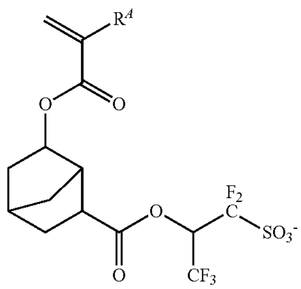
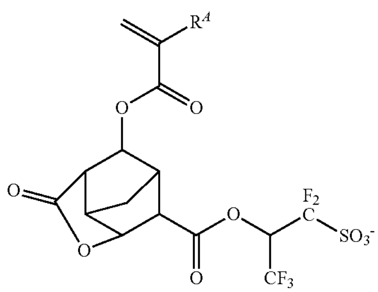
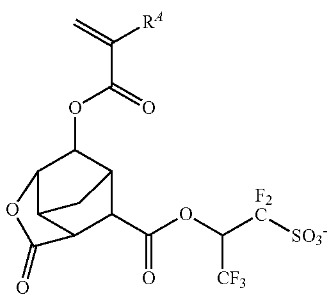
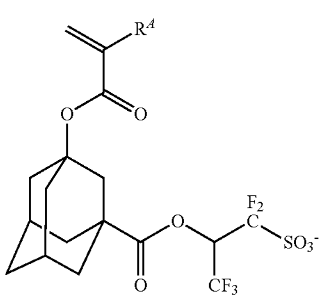
-continued
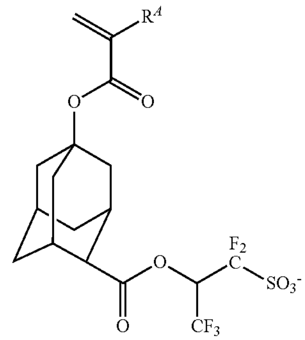
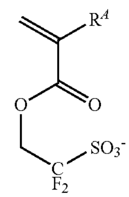
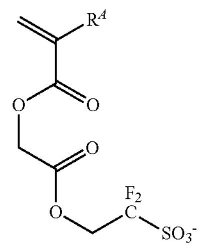
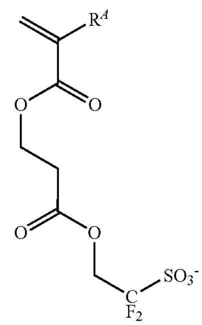
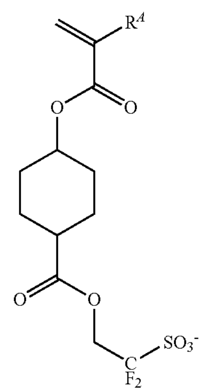
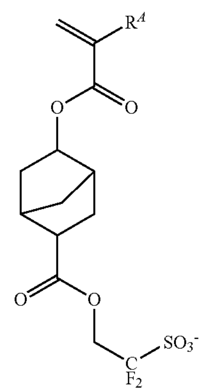
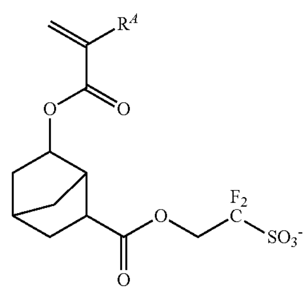
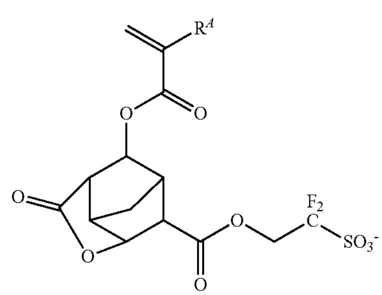

-continued
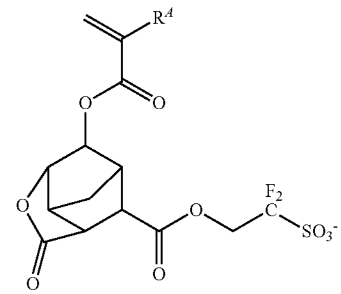
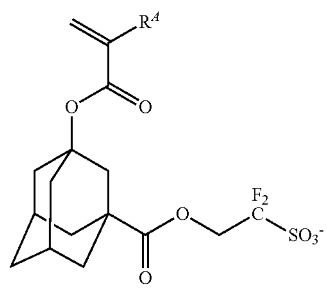
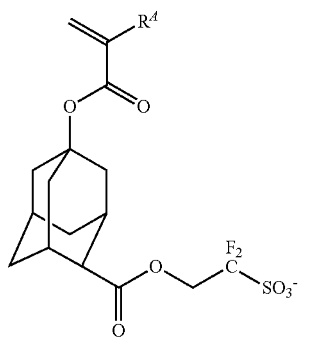
Examples of the anion in the monomer from which recurring unit (f3) is derived are shown below, but not limited thereto. $R^A$ is as defined above.
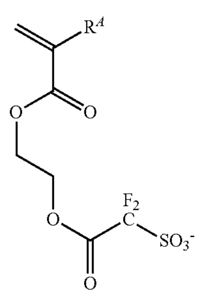
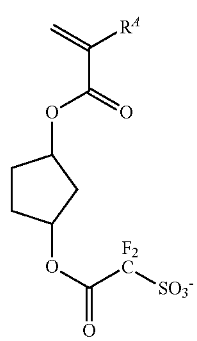
-continued
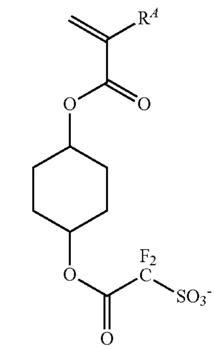
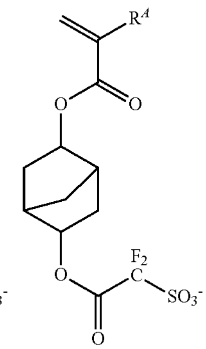
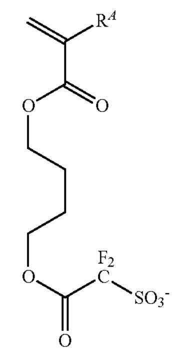
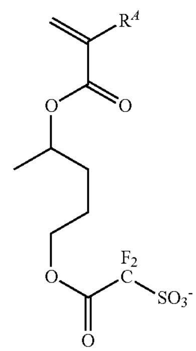
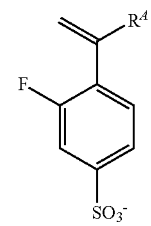
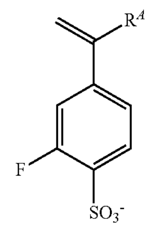
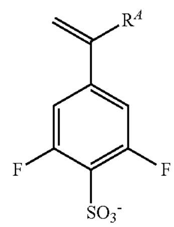
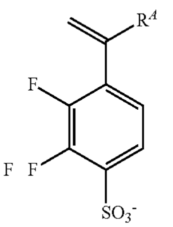
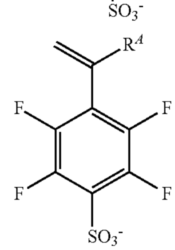
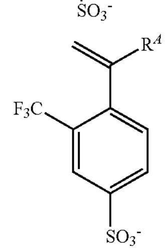
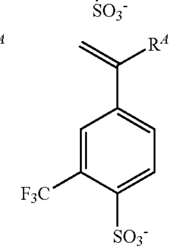
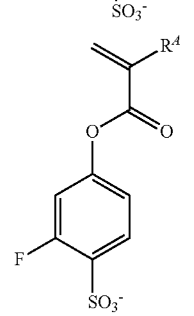
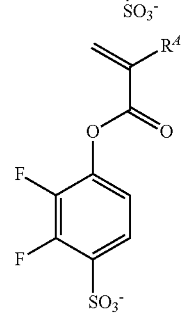
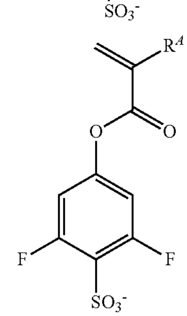
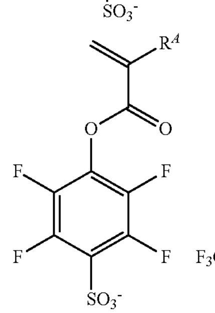
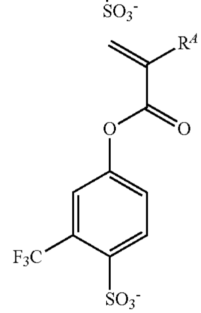
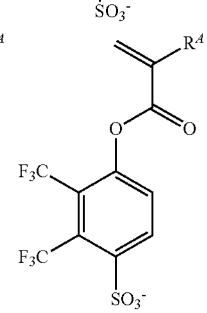

-continued

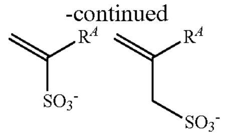

The attachment of an acid generator to the polymer main chain is effective in restraining acid diffusion, thereby preventing a reduction of resolution due to blur by acid diffusion. Also LWR or CDU is improved since the acid generator is uniformly dispersed. Where a base polymer comprising recurring units (f) (that is, a polymer bound acid generator) is used, an acid generator of addition type (to be described below) may be omitted.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d \le 0.7$, $0 \le e \le 0.7$, and $0 \le f \le 0.4$; and even more preferably $0 \le a1 \le 0.8$, $0 = a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably $0 < b \le 1.0$, $0 \le c \le 0.9$, $0 \le d \le 0.8$, $0 \le e \le 0.8$, and $0 \le f \le 0.5$; more preferably $0.2 \le b \le 1.0$, $0 \le c \le 0.8$, $0 \le d \le 0.7$, $0 \le e \le 0.7$, and $0 \le f \le 0.4$; and even more preferably $0.3 \le b \le 1.0$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and heating for polymerization.

Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the polymerization temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene.

For alkaline hydrolysis, a base such as aqueous ammonia or triethylamine may be used. Preferably the reaction temperature is −20 to 100° C., more preferably 0 to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by gel permeation chromatography (GPC) versus polystyrene standards using THF solvent. With too low Mw, the resist composition may become less heat resistant. A polymer with too high Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded after exposure. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Acid Generator

The resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer in the case of a chemically amplified positive resist composition, or a compound having a sufficient acidity to induce acid-catalyzed polarity switch reaction or crosslinking reaction in the case of a chemically amplified negative resist composition. The inclusion of such an acid generator ensures that the salt compound having the formula (A) functions as a quencher and the inventive resist composition functions as a chemically amplified positive or negative resist composition.

The acid generator is typically a compound (PAG) capable of generating an acid upon exposure to actinic ray or radiation. Although the PAG used herein may be any compound capable of generating an acid upon exposure to high-energy radiation, those compounds capable of generating a sulfonic acid, an imide acid, or a methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (USP 7,537.880).

As the PAG used herein, sulfoniumsalts having the formula (1-1) and iodonium salts having the formula (1-2) are also preferred.

(1-1)

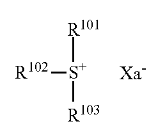

-continued (1-2)

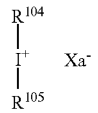

In the formulae (1-1) and (1-2), $R^{101}$ to $R^{105}$ are each independently a halogen or a $C_1$-$C_{20}$ hydrocarbyl group which may contain a heteroatom.

Examples of the halogen include fluorine, chlorine, bromine, and iodine.

The $C_1$-$C_{20}$ hydrocarbyl group represented by $R^{101}$ to $R^{105}$ may be saturated or unsaturated, and may be straight, branched, or cyclic. Specific examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl n-nonyl, n-decyl, undecyl, dodecyl, tridecyl, tetradecyl, pentadecyl, heptadecyl, octadecyl, nonadecyl, and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; alkenyl groups such as vinyl, propenyl, butenyl, and hexenyl; $C_2$-$C_{20}$ alkynyl groups such as ethynyl, propynyl, and butynyl; $C_3$-$C_{20}$ cyclic unsaturated aliphatic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as a benzyl and phenethyl; and groups obtained from combination of the above-described groups.

In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride or haloalkyl moiety.

$R^{101}$ and $R^{102}$ may bond together to form a ring with the sulfur atom to which they are attached. Preferred rings are of the structures shown below.

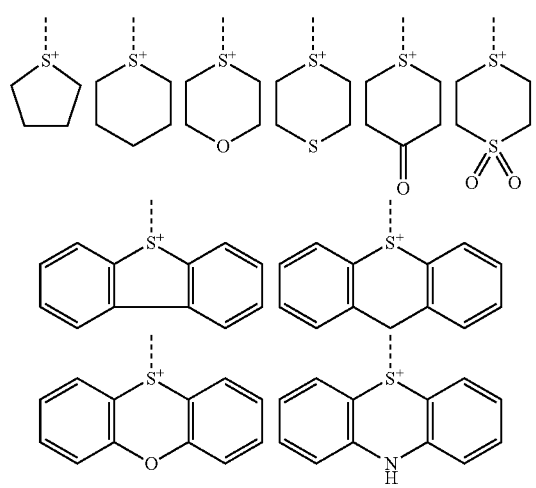

-continued

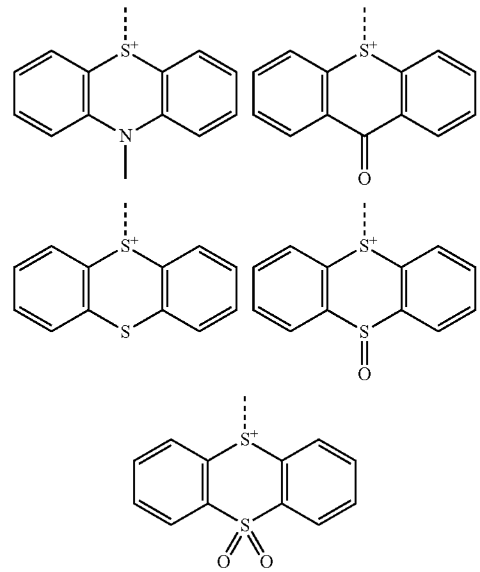

Herein the broken line designates an attachment to $R^{103}$.

Examples of the cation in the sulfonium salt having formula (1-1) are shown below, but not limited thereto.

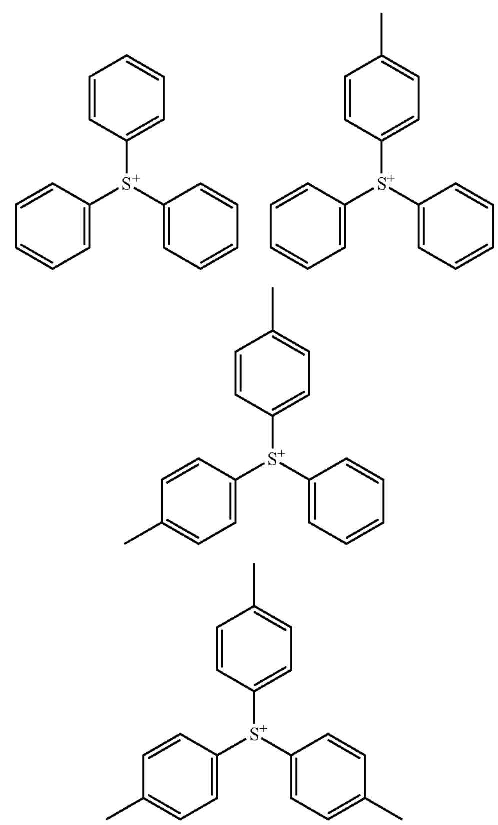

-continued
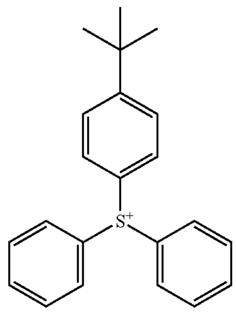
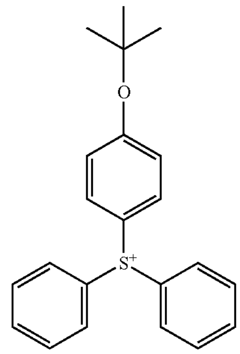
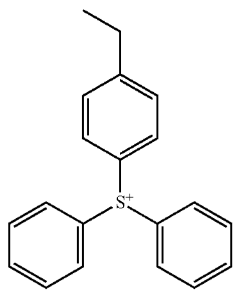
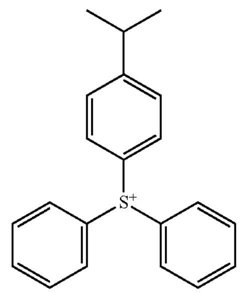
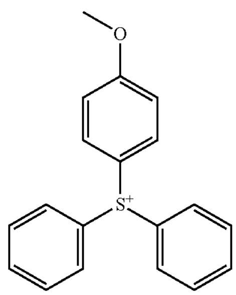
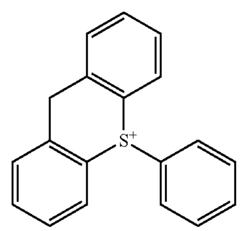
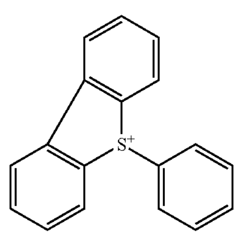
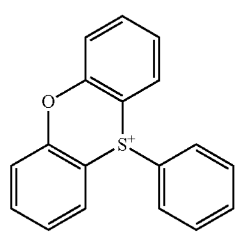
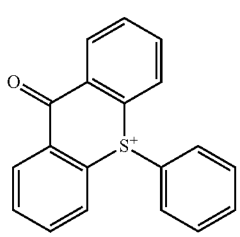
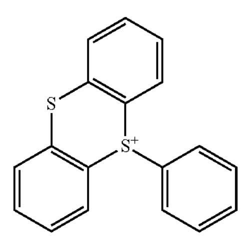
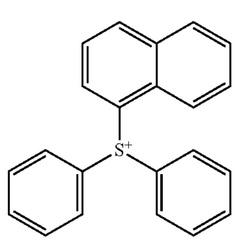
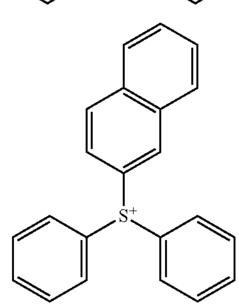
-continued
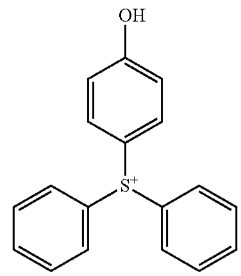
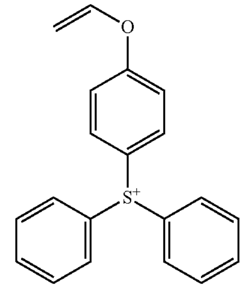
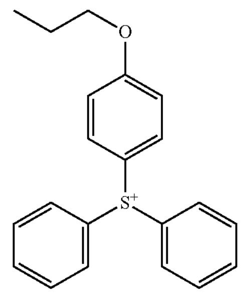
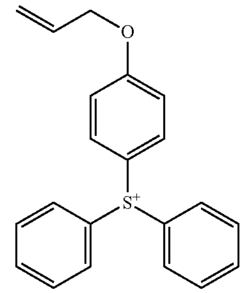
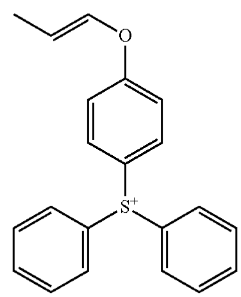
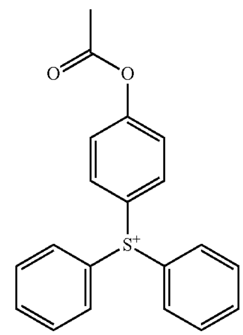
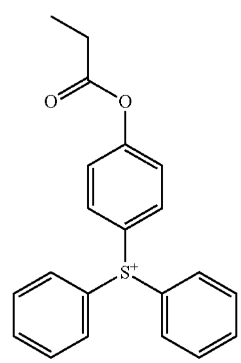
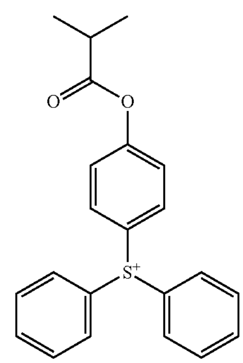
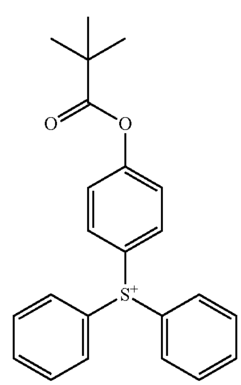
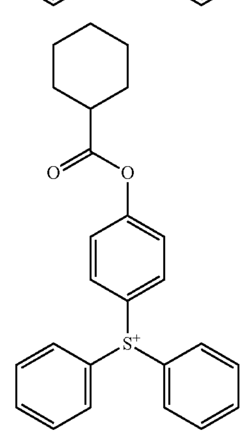

-continued
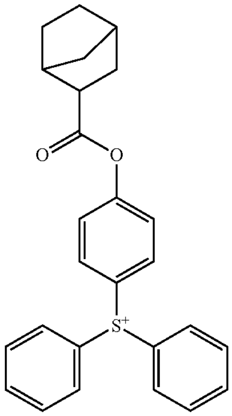
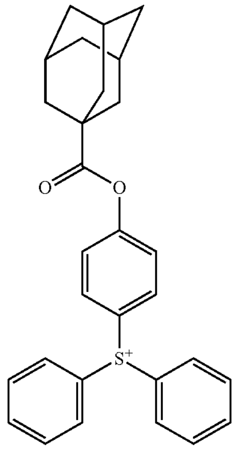
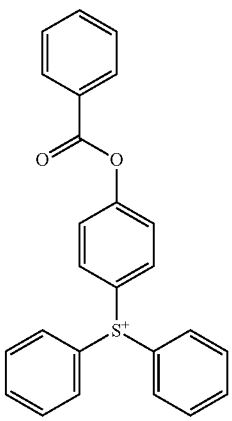
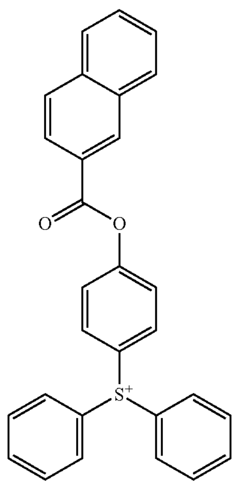
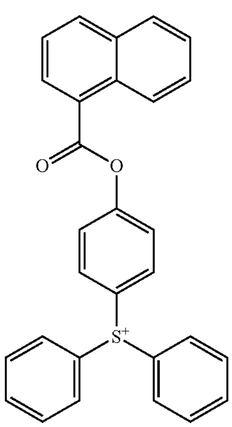
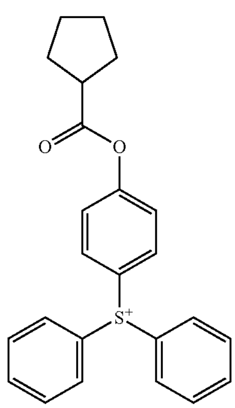
-continued
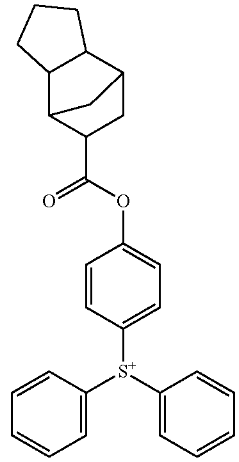
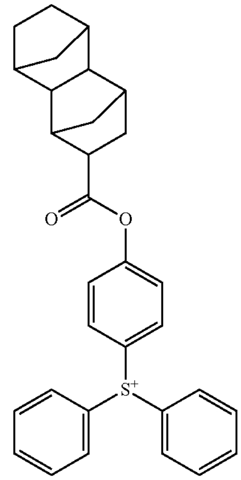
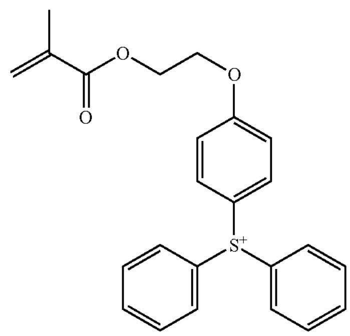
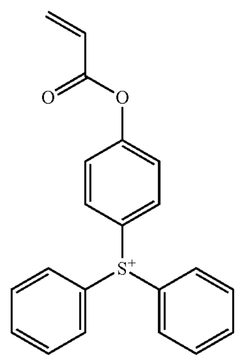
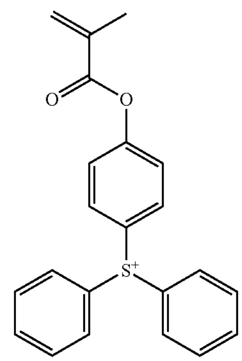
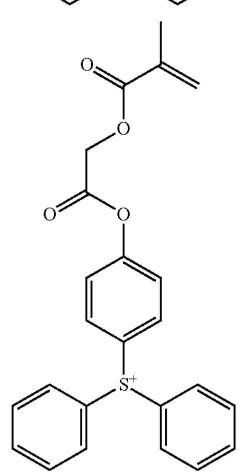

-continued
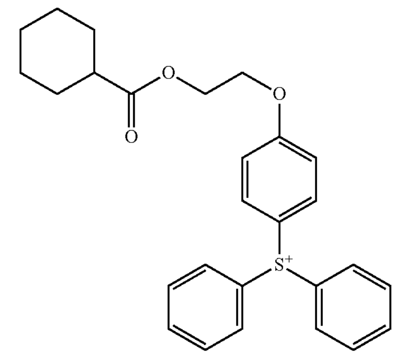
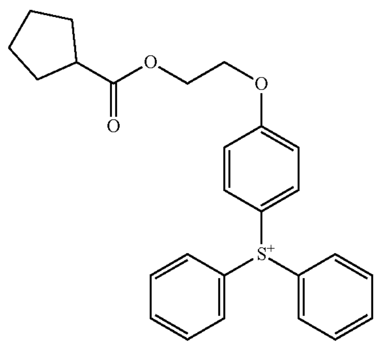
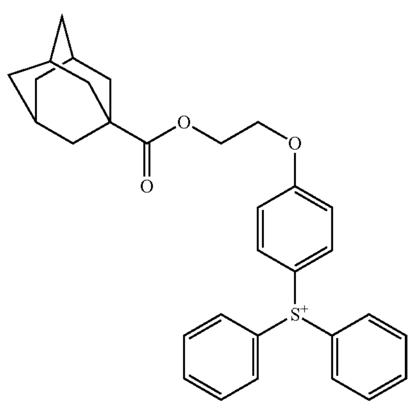
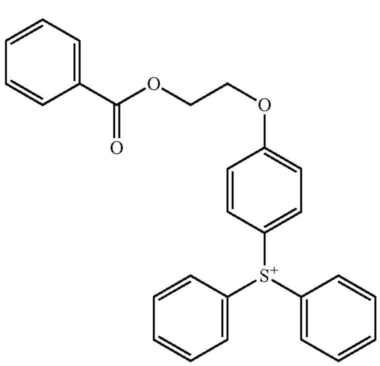
-continued
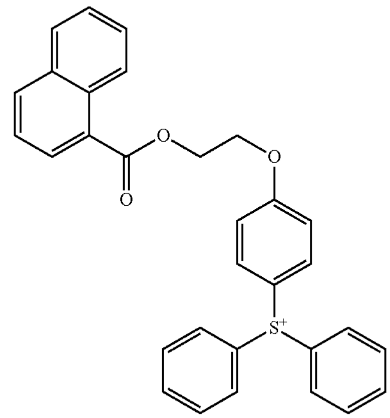
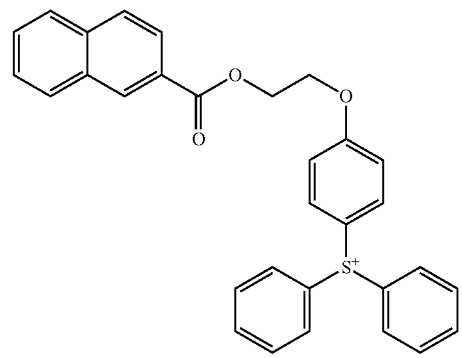
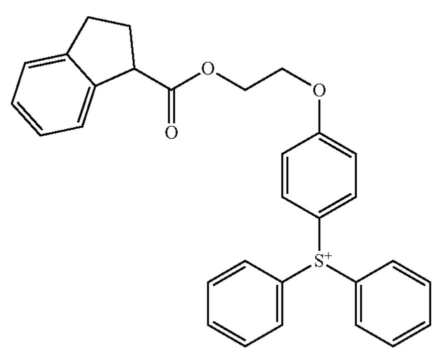
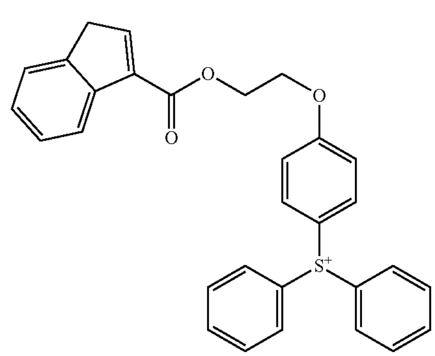

-continued
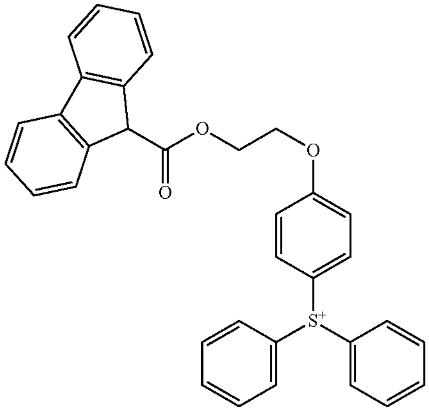
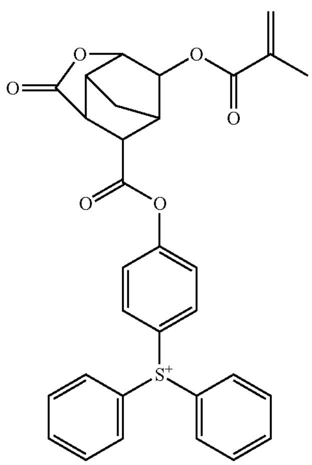
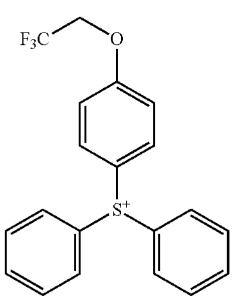
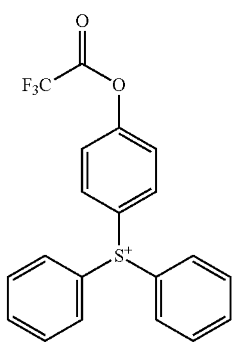
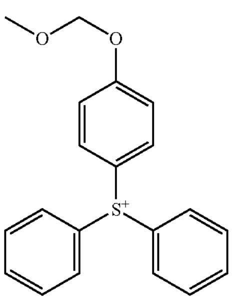
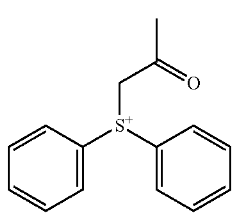
-continued
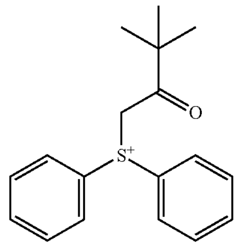
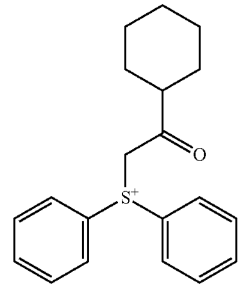
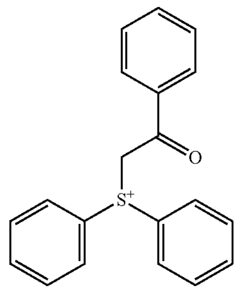
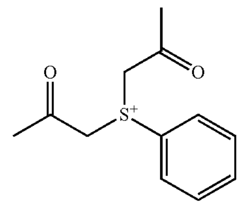
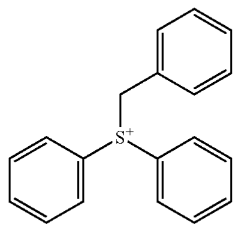
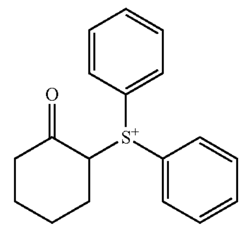
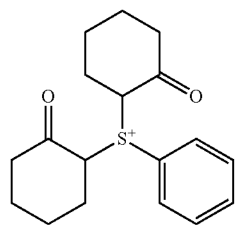
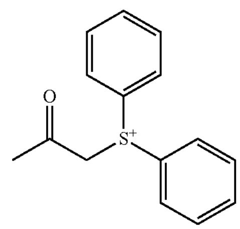
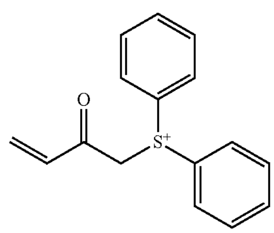
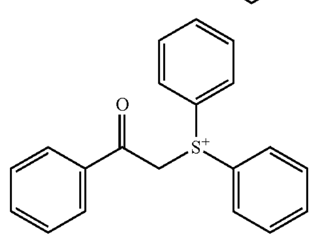
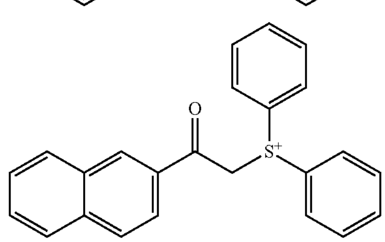

-continued
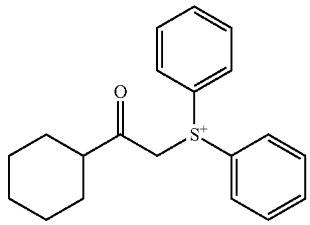
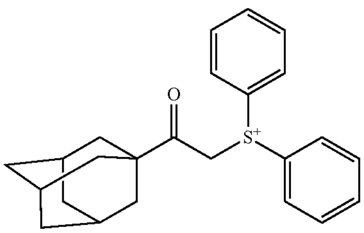
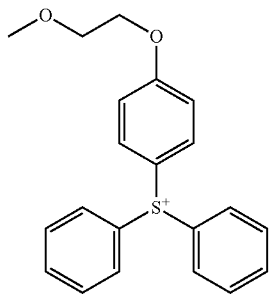
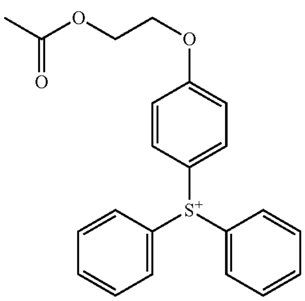
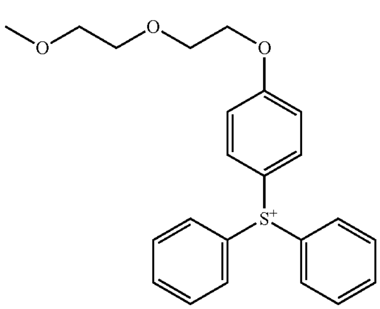
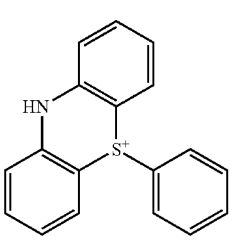
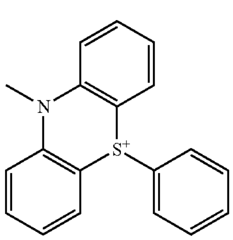
-continued
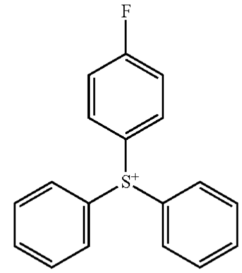
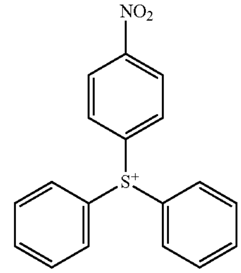
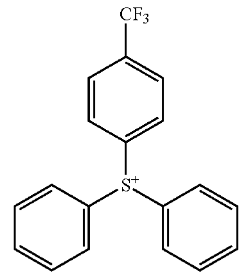
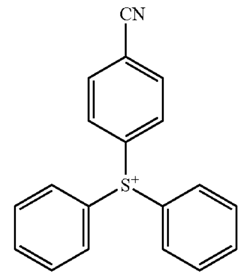
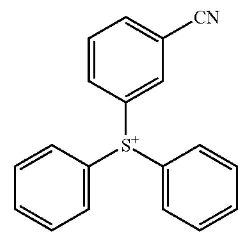
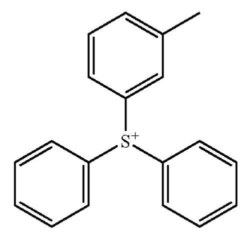
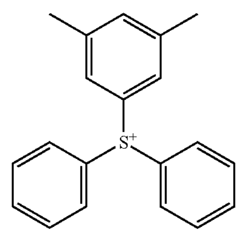
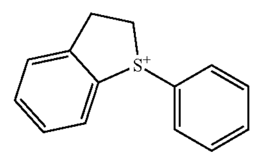
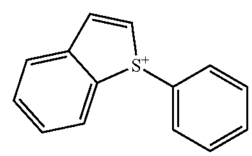
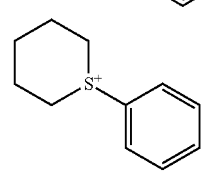
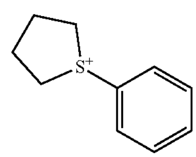
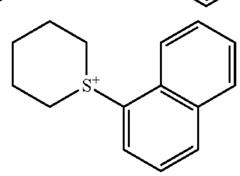
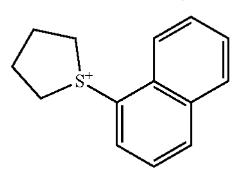
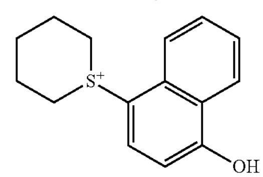
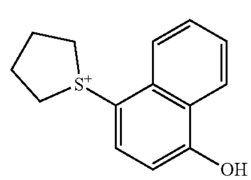
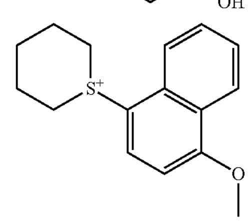

-continued
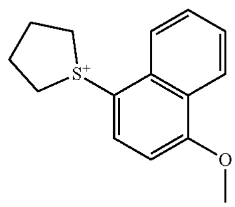
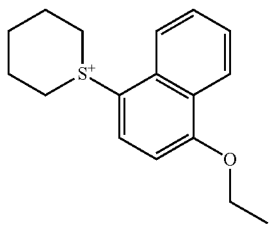
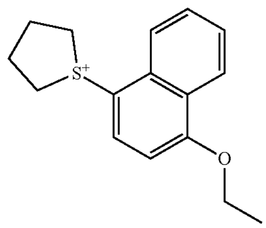
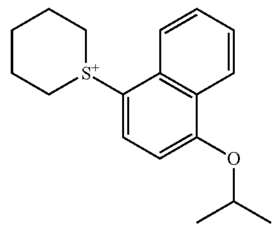
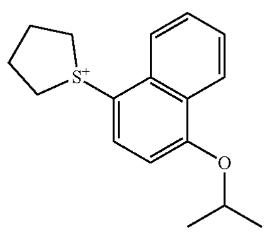
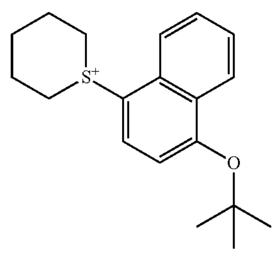
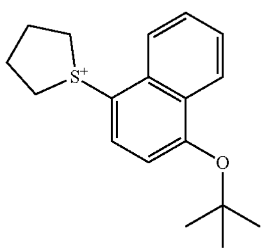
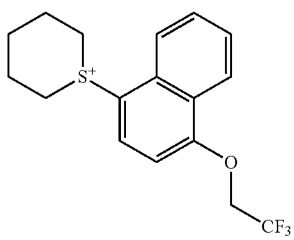
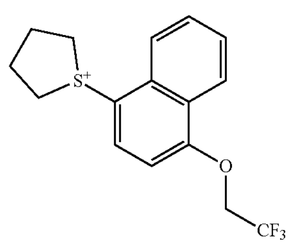
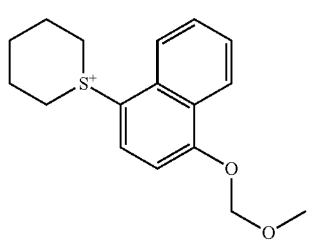
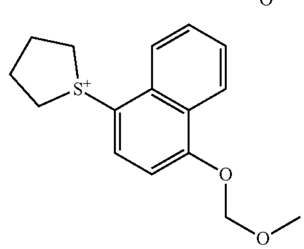
-continued
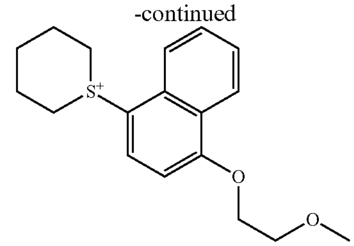
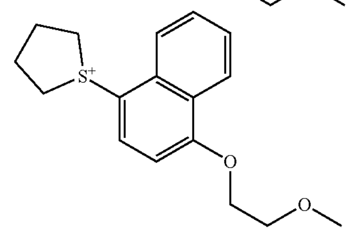
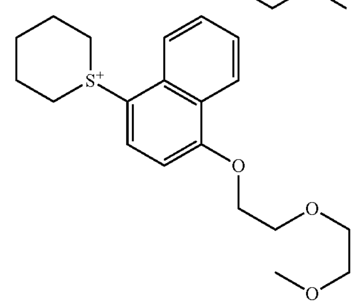
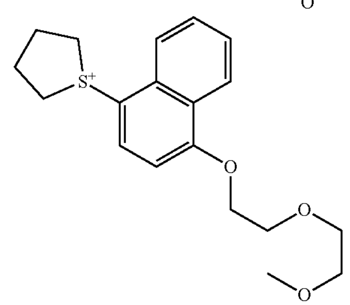
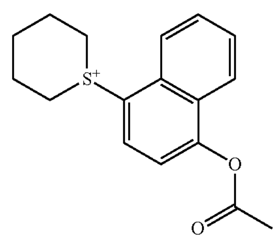
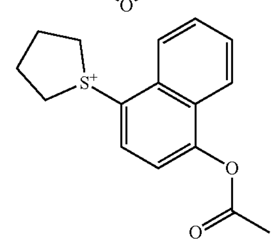
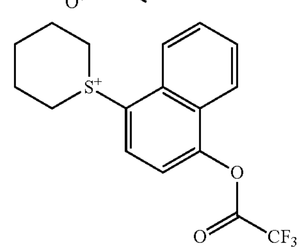
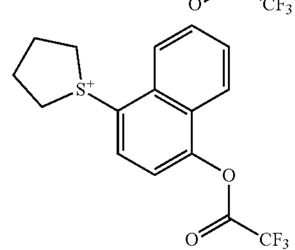

-continued
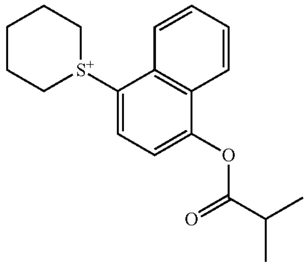
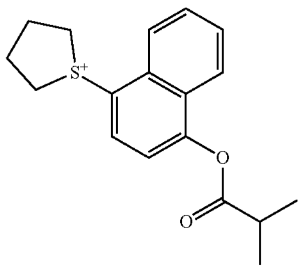
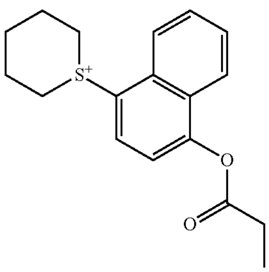
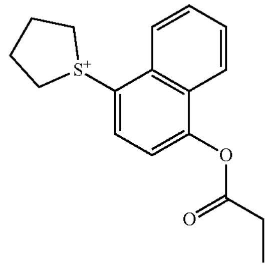
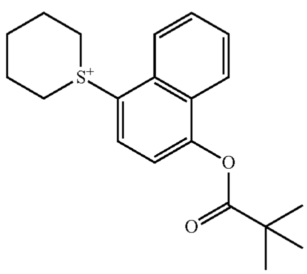
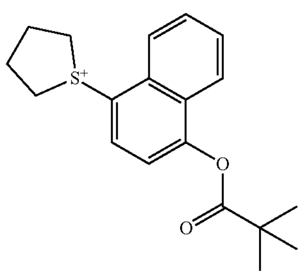
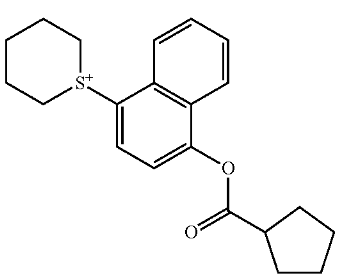
-continued
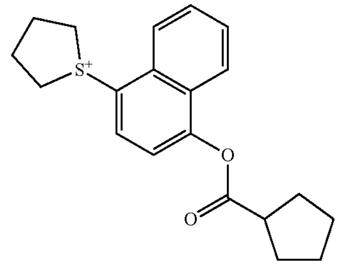
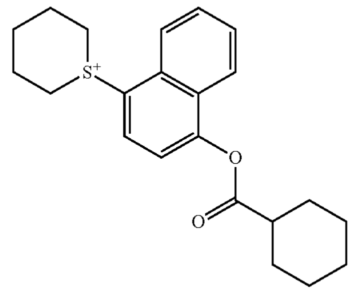
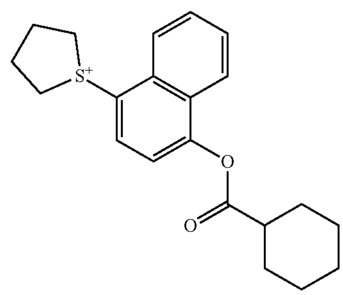
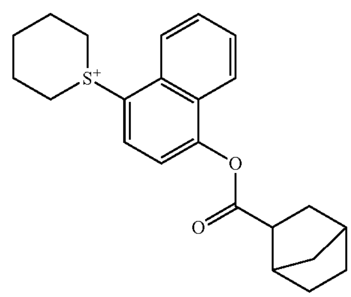
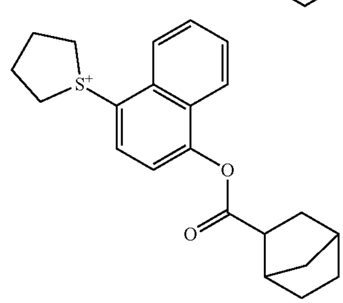
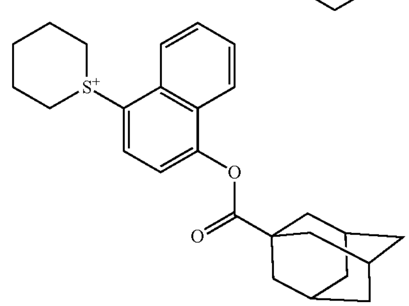

-continued
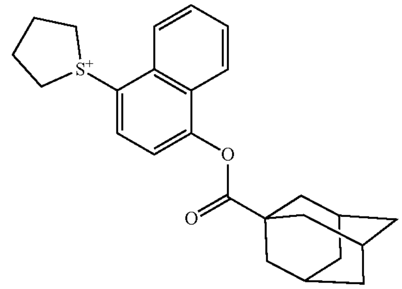
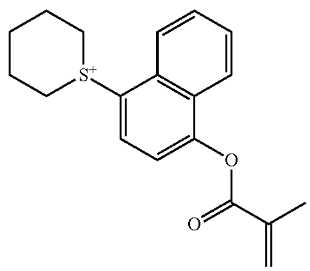
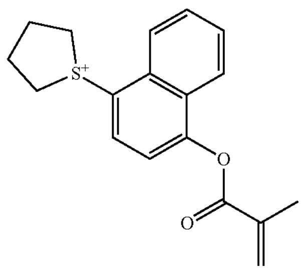
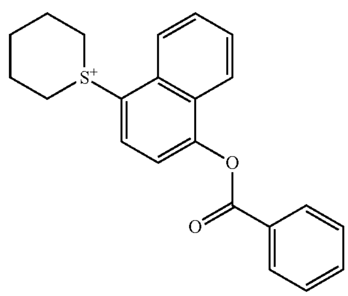
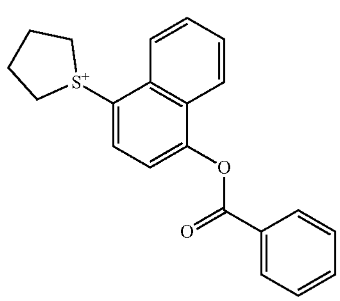
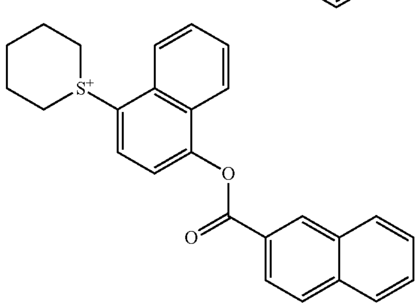
-continued
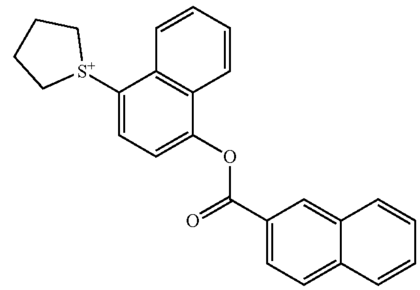
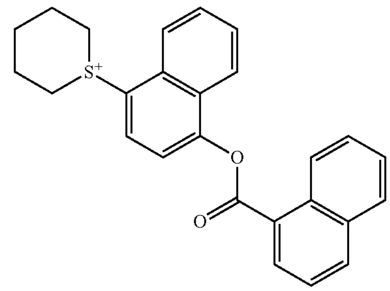
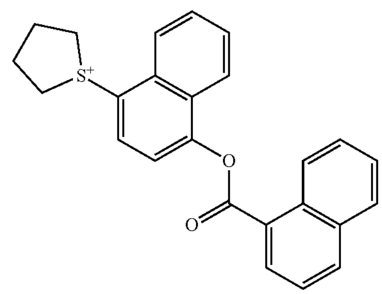
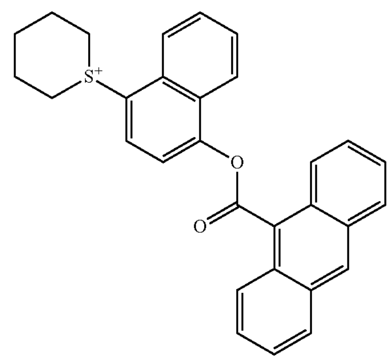
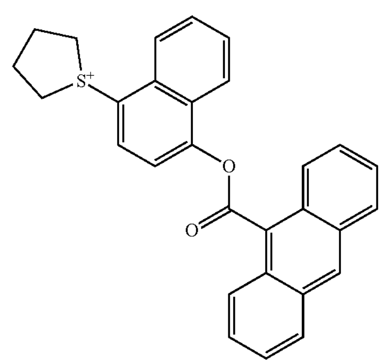

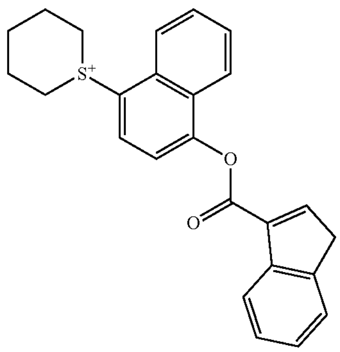
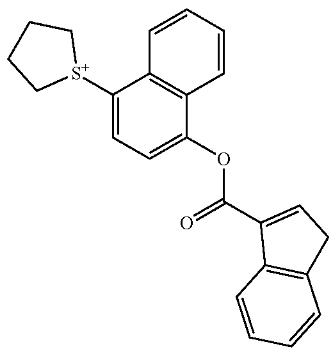
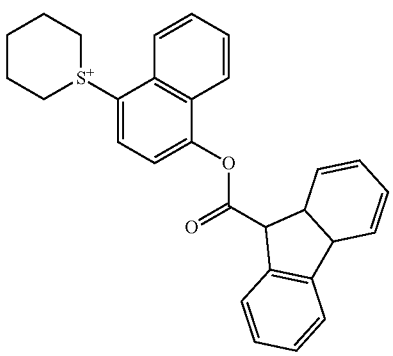
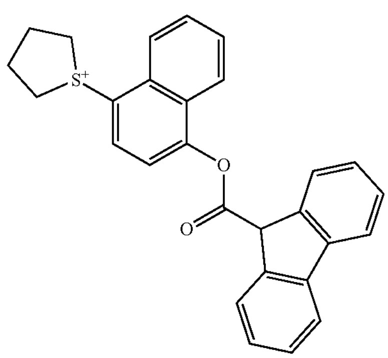
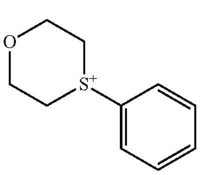
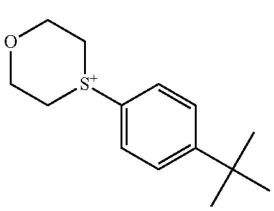
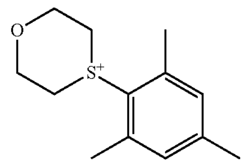
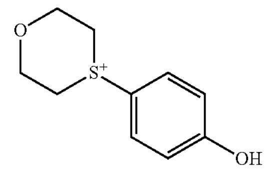
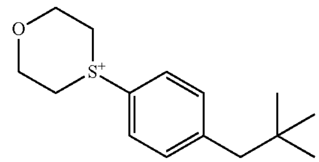
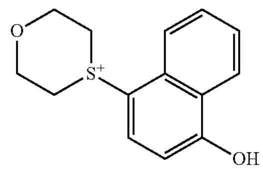
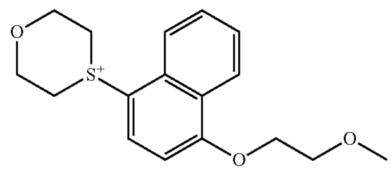
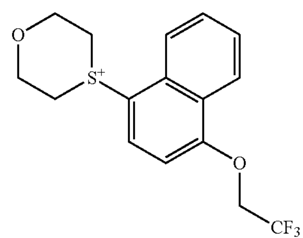
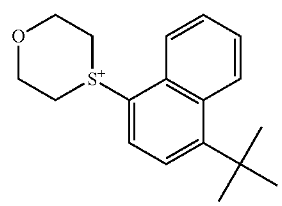
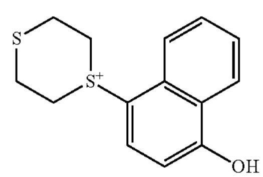
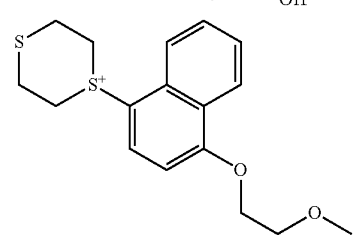
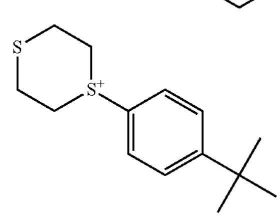

-continued
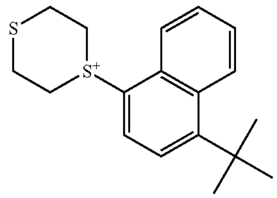
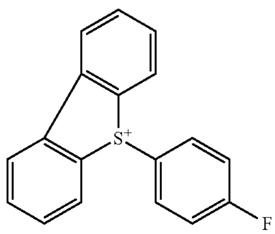
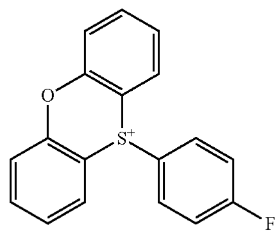
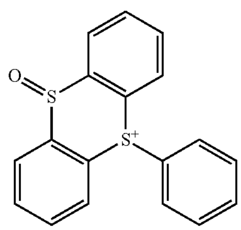
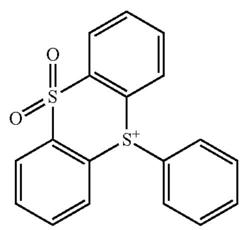
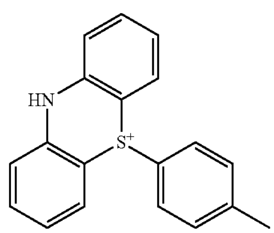
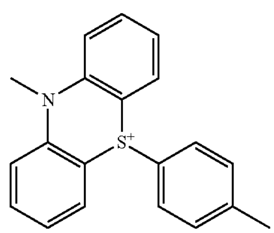
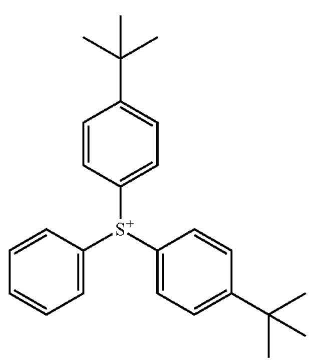
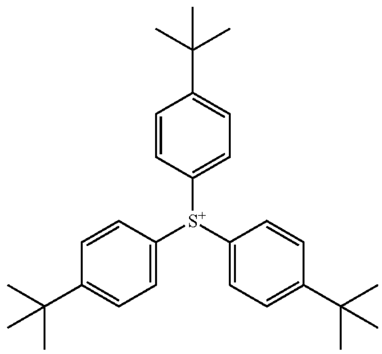
-continued
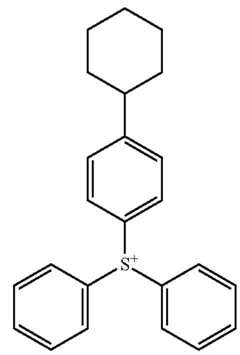
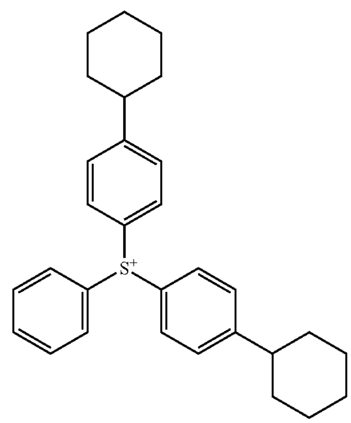
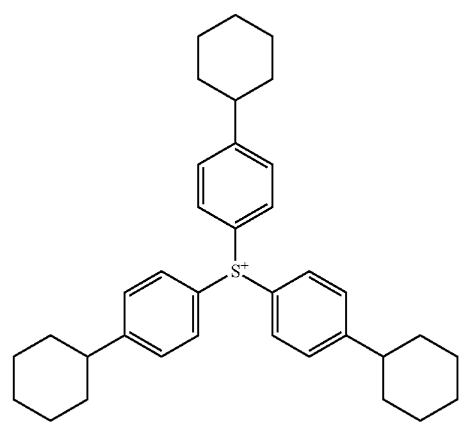
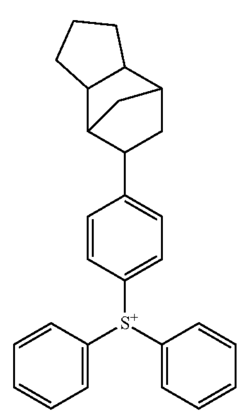

-continued
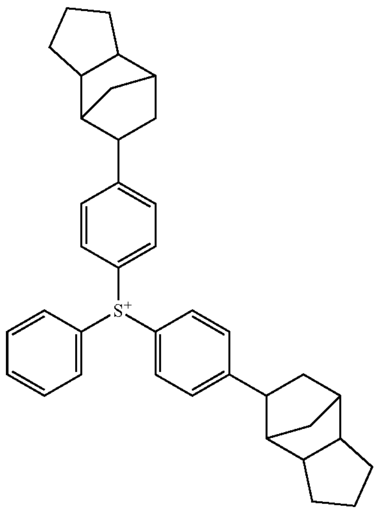
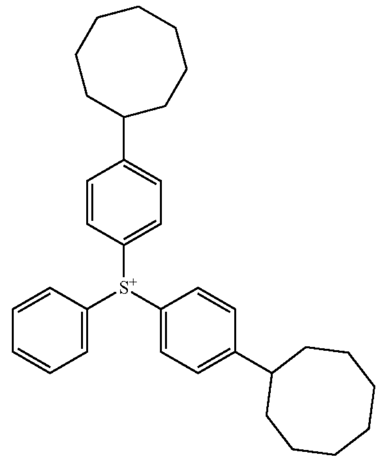
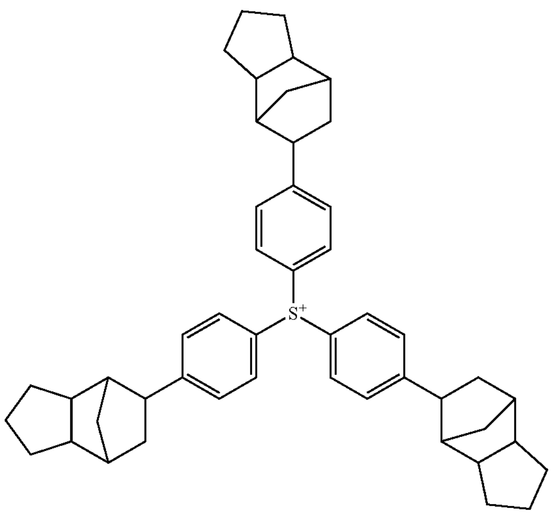
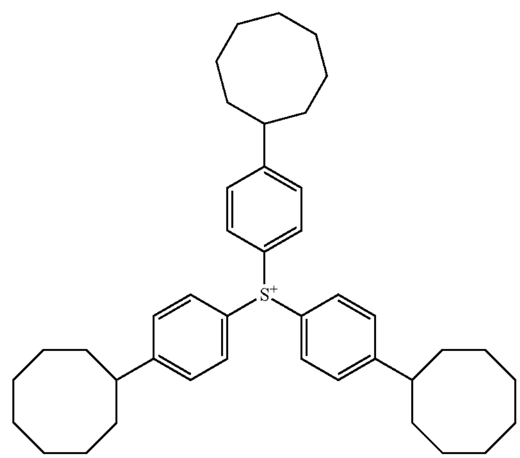
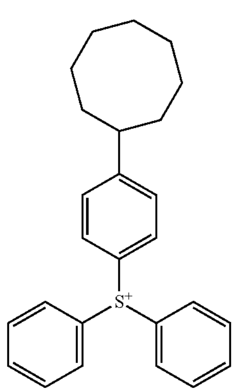
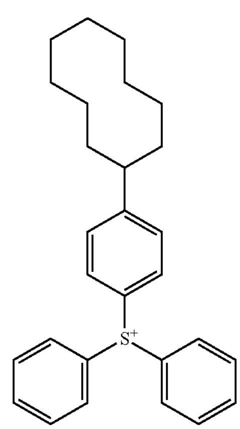
-continued -continued
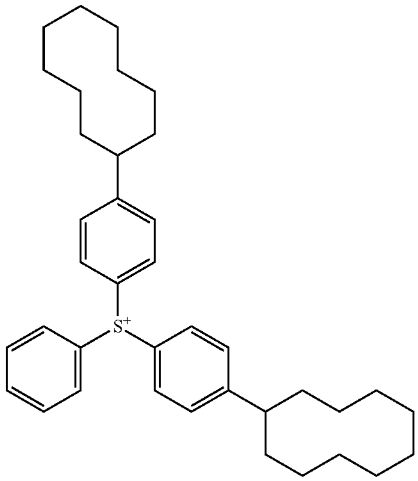
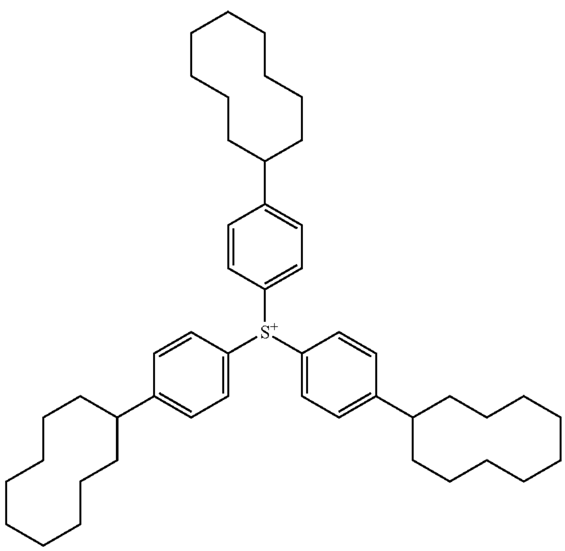
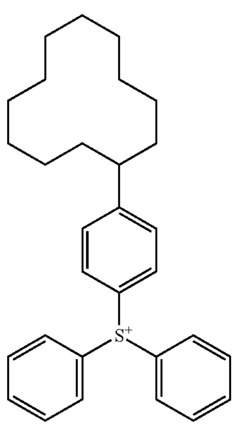
-continued
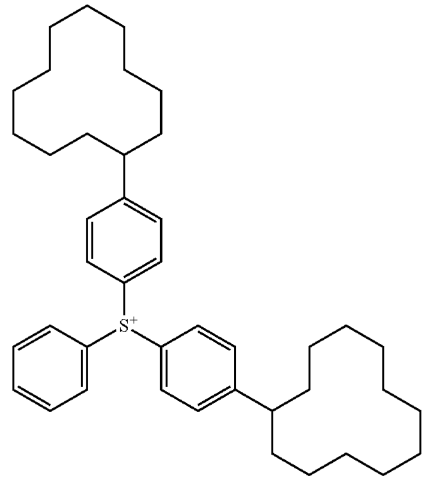
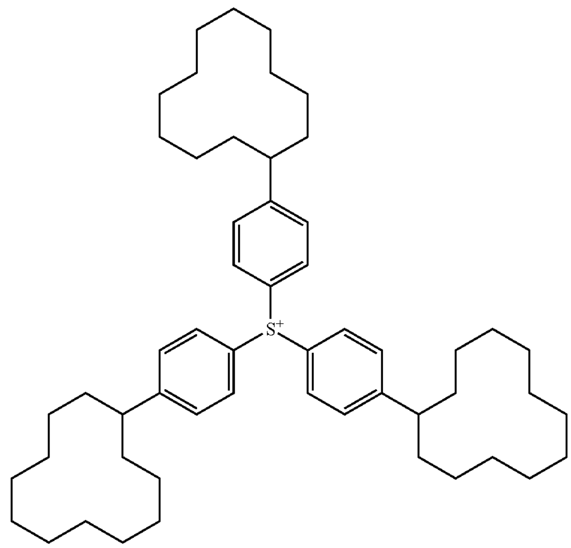
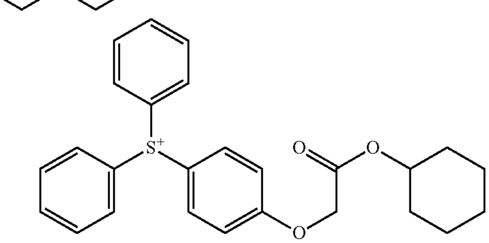
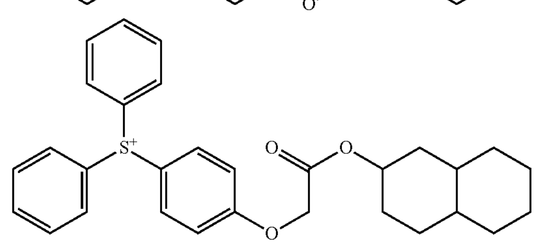
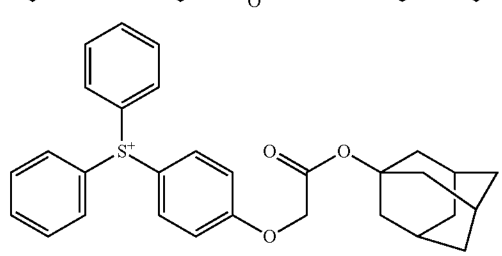

-continued
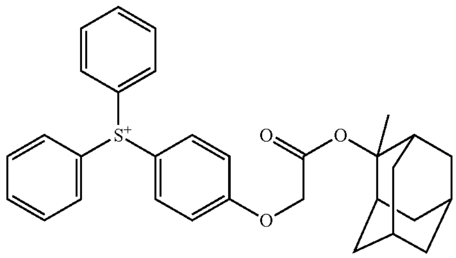
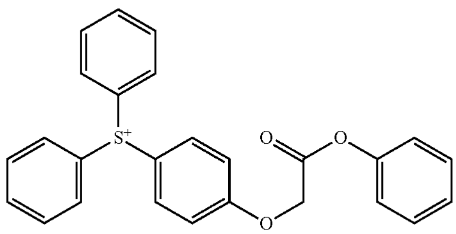
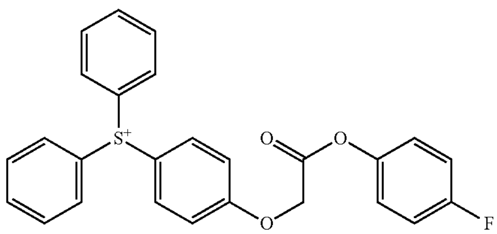
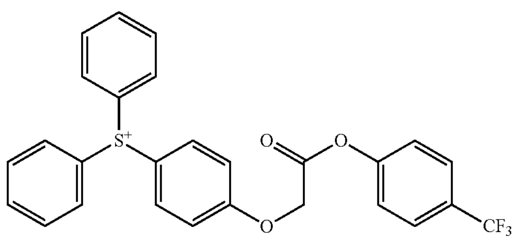
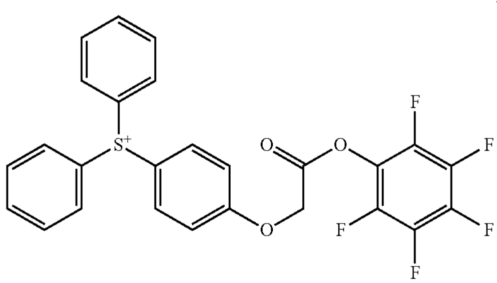
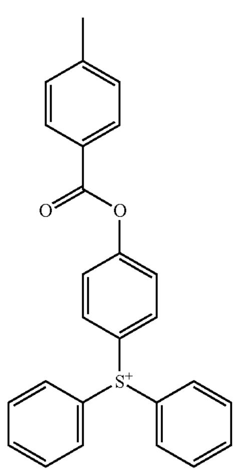
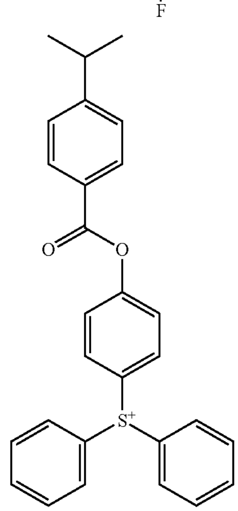
-continued
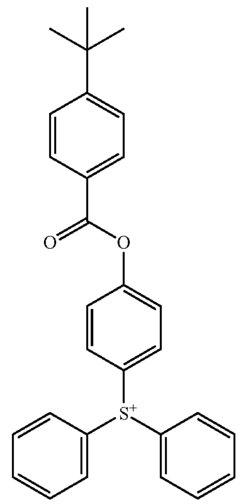
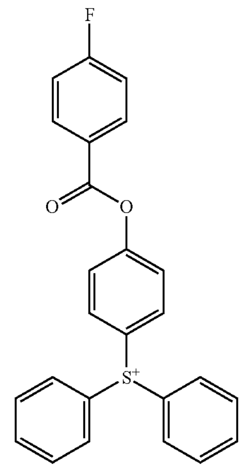
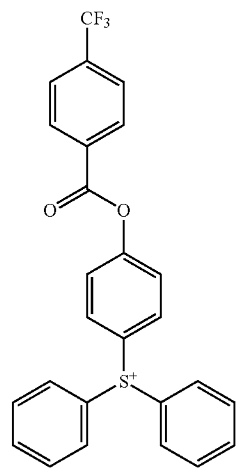
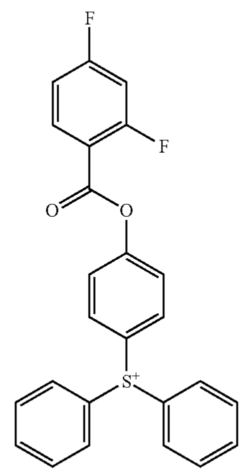
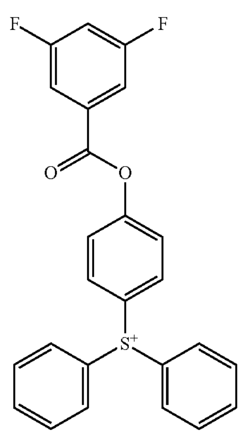
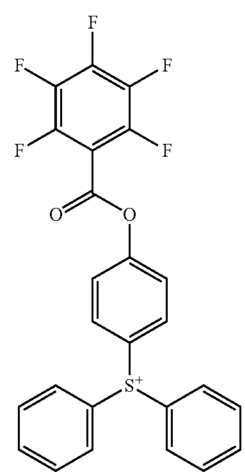
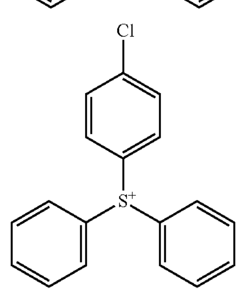
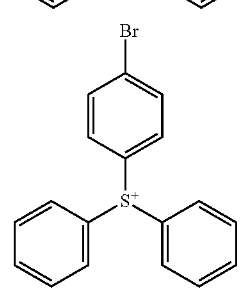

-continued
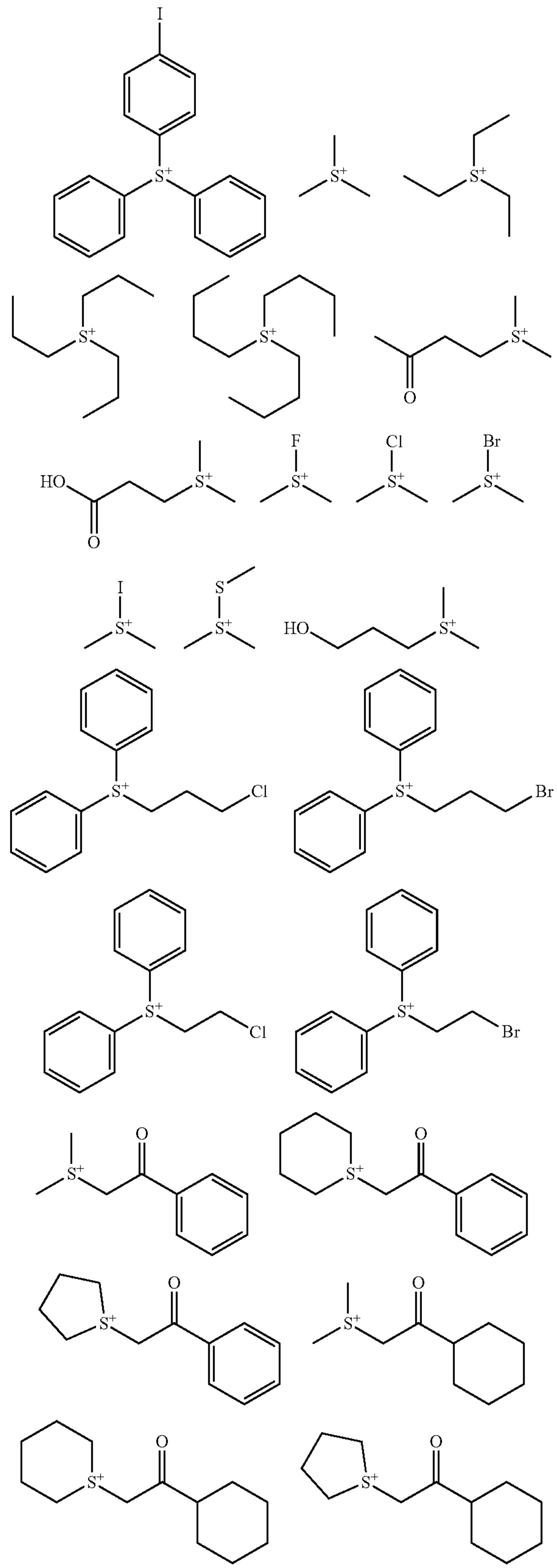
-continued
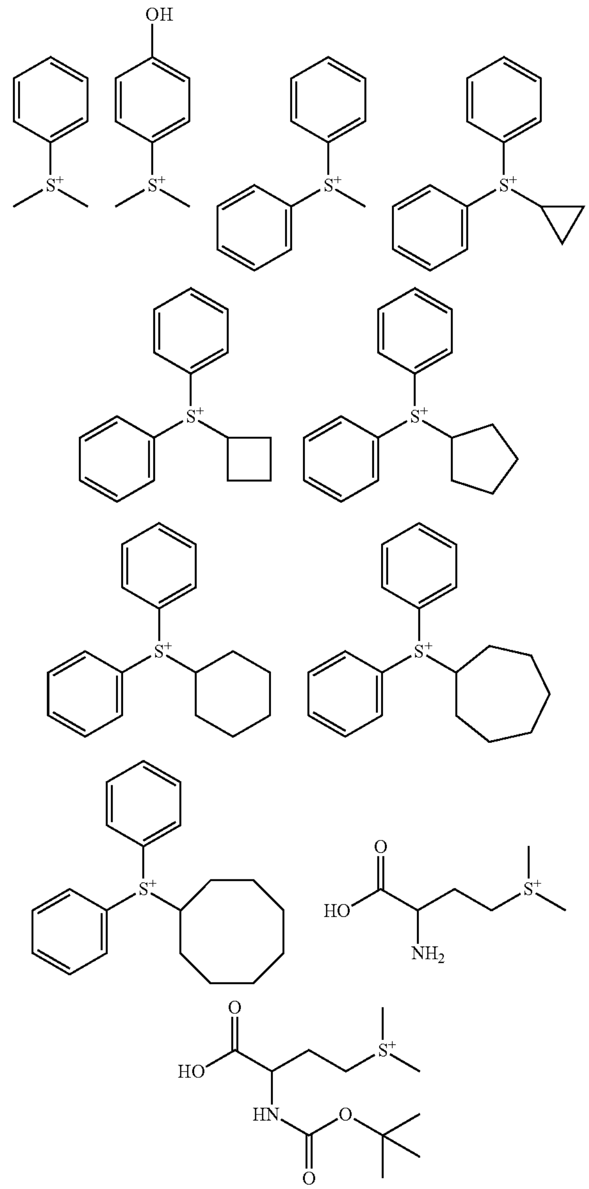
Examples of the cation in the iodonium salt having formula (1-2) are shown below, but not limited thereto.
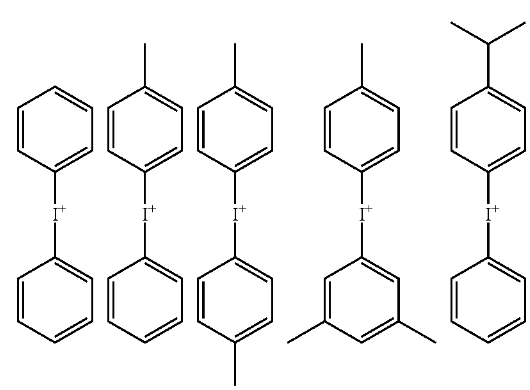

-continued
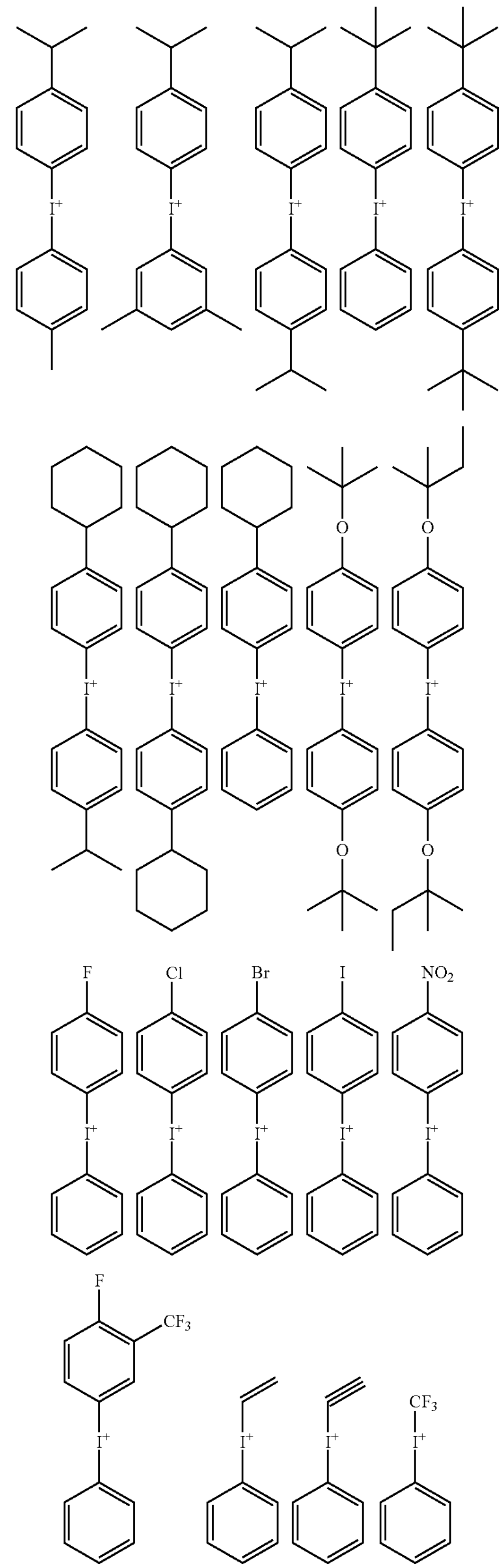
-continued
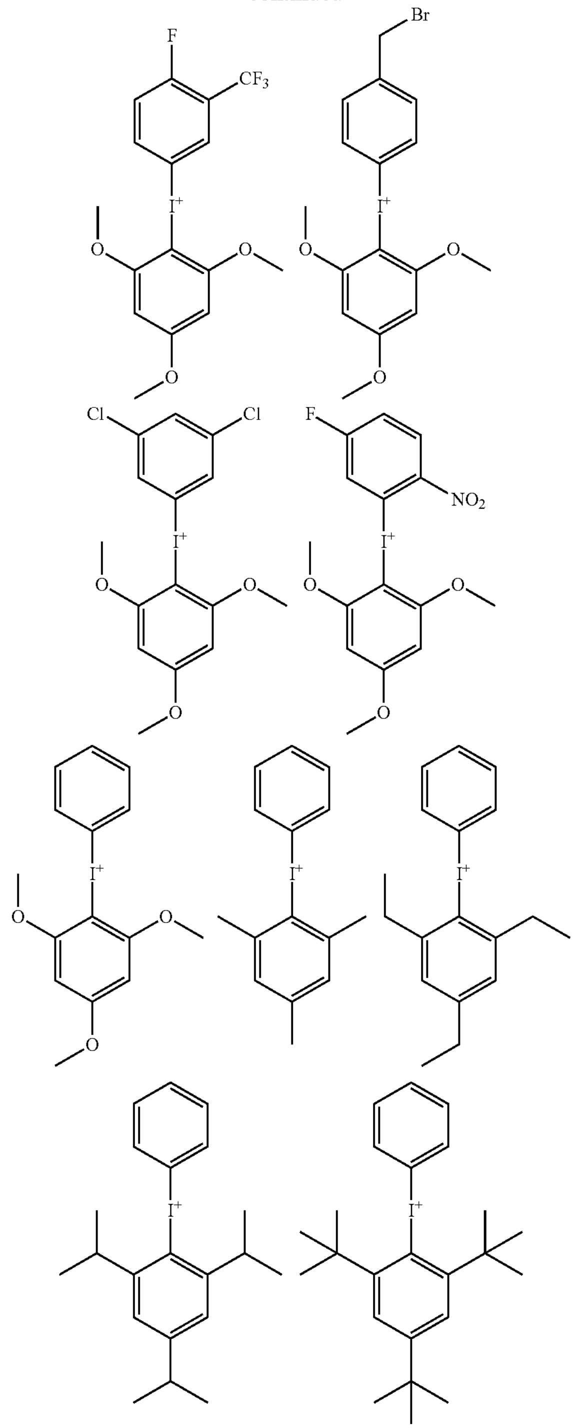
In the formulae (1-1) and (1-2), $Xa^-$ is an anion of the formula (1A), (1B), (1C) or (1D).
$$R^{fa}-CF_2-SO_3^- \tag{1A}$$
$$\begin{array}{l} R^{fb1}-CF_2-SO_2 \\ \qquad\qquad\qquad\quad N^- \\ R^{fb2}-CF_2-SO_2 \end{array} \tag{1B}$$

-continued (1C)

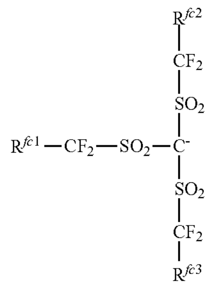

(1D)

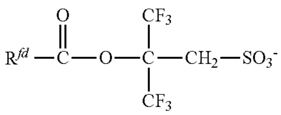

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified for the hydrocarbyl group represented by $R^{111}$ in the formula (1A') described below.

Of the anions of formula (1A), an anion having the formula (1A') is preferred.

(1A')

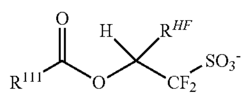

In the formula (1A'), $R^{HF}$ is hydrogen or trifluoromethyl, preferably trifluoromethyl. $R^{111}$ is a $C_1$-$C_{38}$ hydrocarbyl group which may contain a heteroatom. As the heteroatom, oxygen, nitrogen, sulfur and halogen atoms are preferred, with oxygen being most preferred. Of the hydrocarbyl groups represented by $R^{111}$, those groups of 6 to 30 carbon atoms are preferred from the aspect of achieving a high resolution in forming patterns of fine feature size.

The hydrocarbyl group may be saturated or unsaturated and straight, branched or cyclic. Examples thereof include $C_1$-$C_{38}$ alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, and icosanyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; $C_2$-$C_{38}$ unsaturated aliphatic hydrocarbyl groups such as allyl and 3-cyclohexenyl; $C_6$-$C_{38}$ aryl groups such as phenyl, 1-naphthyl, and 2-naphthyl; $C_7$-$C_{38}$ aralkyl groups such as benzyl and diphenylmethyl; and groups obtained from combination of the above-described groups.

In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride or haloalkyl moiety. Examples of the heteroatom-containing hydrocarbyl group include tetrahydrofuryl, methoxymethyl, ethoxymethyl, methylthiomethyl, acetamidemethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto. Herein Ac is an acetyl group.

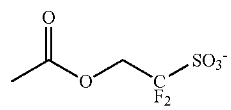

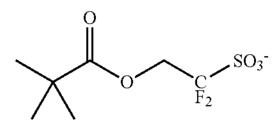

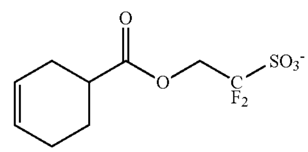

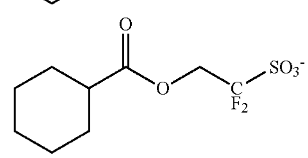

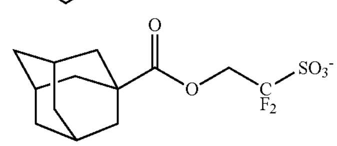

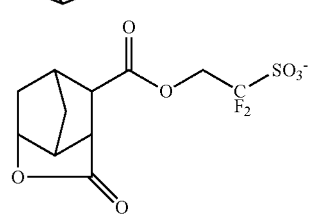

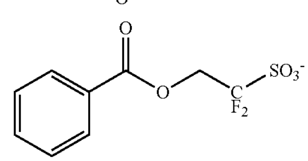

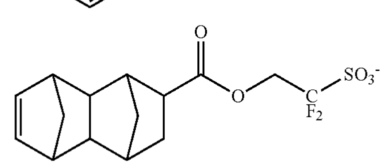

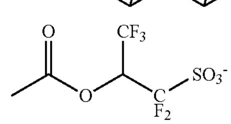

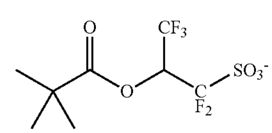

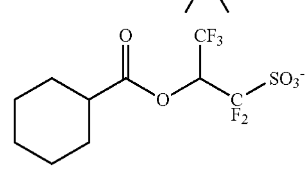

-continued
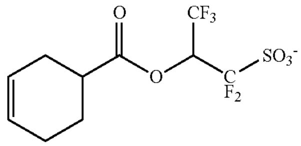
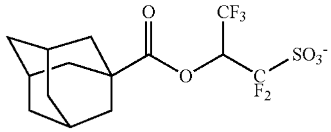
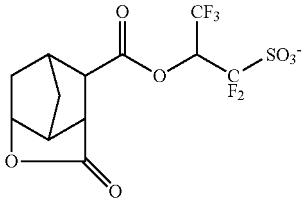
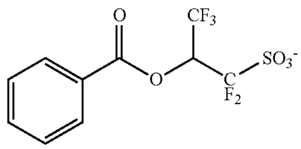
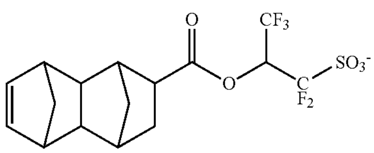
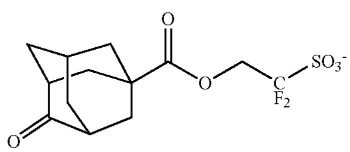
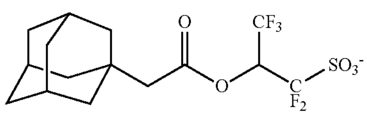
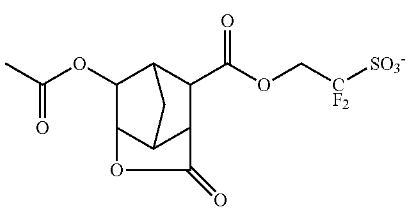
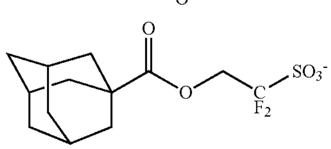
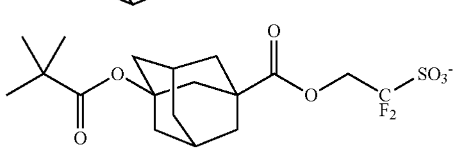
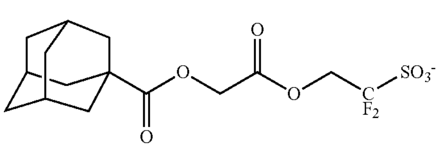
-continued
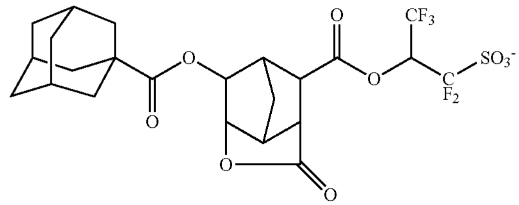
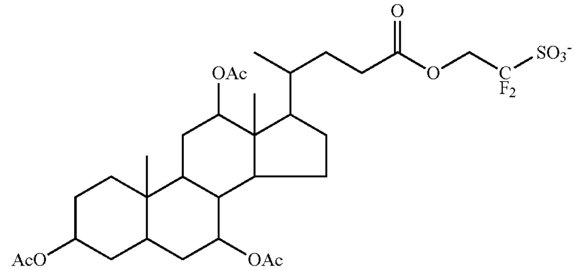
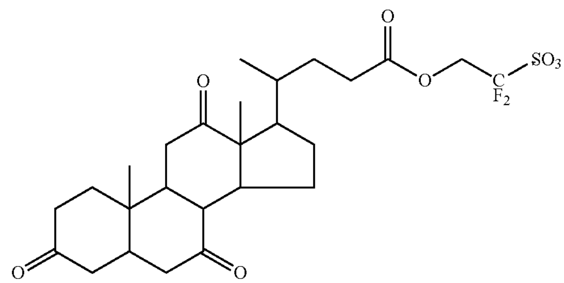
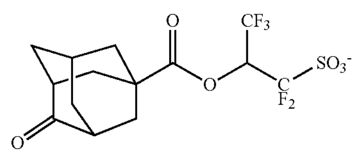
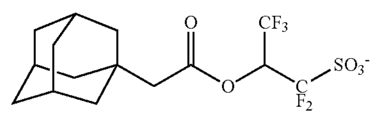
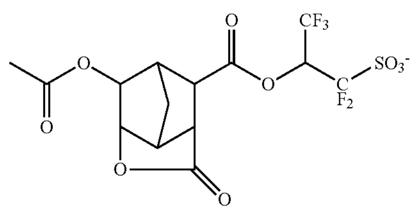
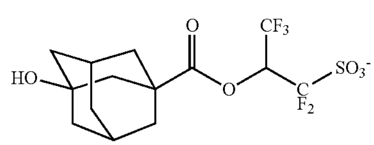
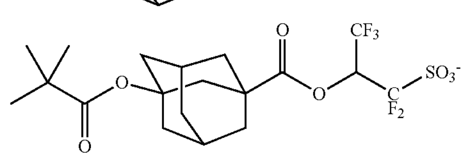
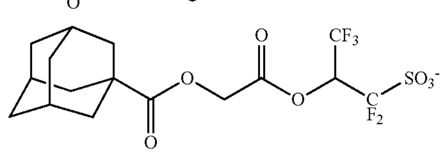

-continued

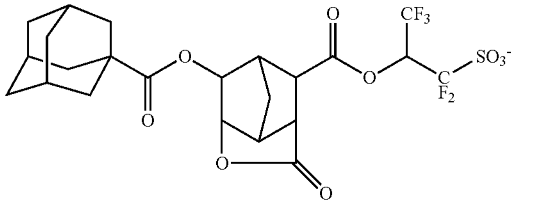

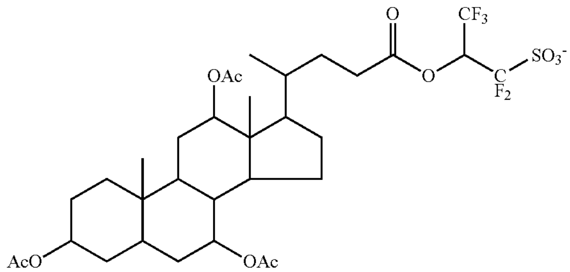

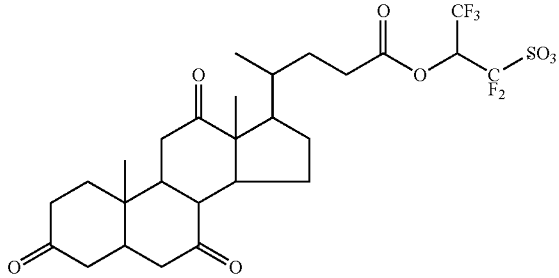

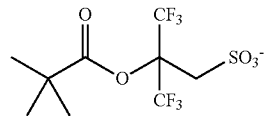

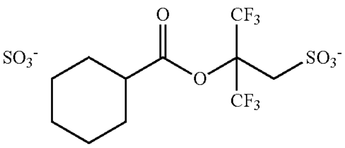

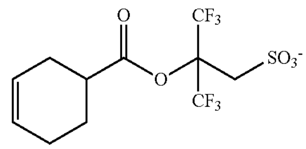

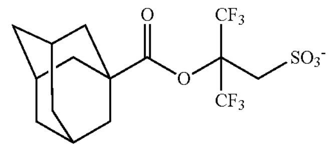

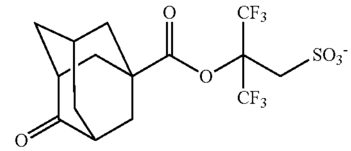

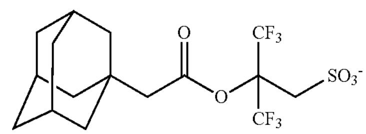

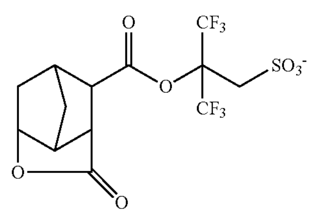

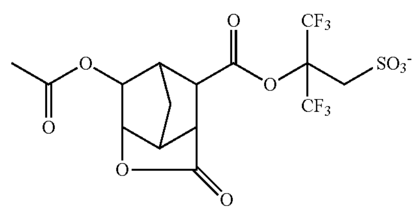

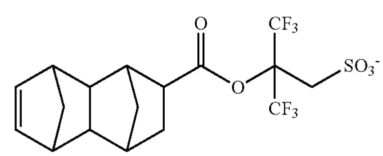

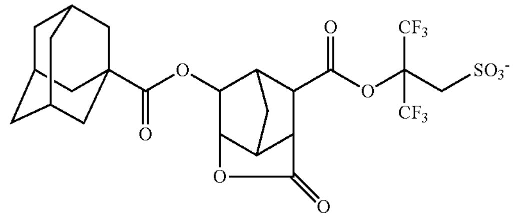

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group represented by $R^{111}$ in the formula (1A'). Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—N—$SO_2$—$CF_2$— to which they are attached. It is preferred that a combination of $R^{fb1}$ and $R^{fb2}$ be a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group represented by $R^{111}$ in the formula (1A'). Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred that a combination of $R^{fc1}$ and $R^{fc2}$ be a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic. Examples thereof are as exemplified for the hydrocarbyl group represented by $R^{111}$ in the formula (1A').

With respect to the synthesis of the sulfonium salt having an anion of formula (1D), reference may be made to JP-A 2010-215608 and JP-A 2014-133723.

Examples of the anion having formula (1 D) are shown below, but not limited thereto.

-continued

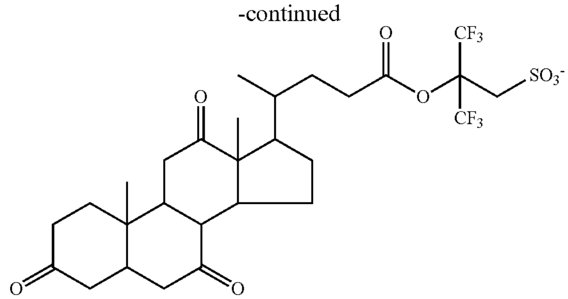

Notably, the compound having the anion of formula (1D) does not have fluorine at the α-position relative to the sulfo group, but has two trifluoromethyl groups at the β-position. For this reason, the compound has a sufficient acidity to sever the acid labile groups in the base polymer. Thus the compound is an effective PAG.

Another preferred PAG is a compound having the formula (2).

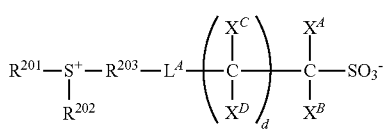

(2)

In the formula (2), $R^{201}$ and $R^{202}$ are each independently a halogen or a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Examples of the ring are as exemplified above as the ring that $R^{101}$ and $R^{102}$, taken together, form with the sulfur atom to which they are attached in the formula (1-1).

The hydrocarbyl groups $R^{201}$ and $R^{202}$ may be saturated or unsaturated and straight, branched or cyclic. Specific examples thereof include $C_1$-$C_{30}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and groups obtained from combination of the above-described groups. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl, and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene; and groups obtained from combination of the above-described groups. In these groups, some or all of the hydrogen atoms may be substituted by a moiety containing a heteroatom such as oxygen, sulfur, nitrogen, or halogen, or some carbon may be replaced by a moiety containing a heteroatom such as oxygen, sulfur, or nitrogen, so that the group may contain a hydroxyl, cyano, carbonyl, ether bond, ester bond, sulfonate bond, carbonate, lactone ring, sultone ring, carboxylic anhydride, or haloalkyl moiety. Of the heteroatoms, oxygen is preferred.

In formula (2), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

In the formula (2), d is an integer of 0 to 3.

Of the PAGs having formula (2), those having formula (2') are preferred.

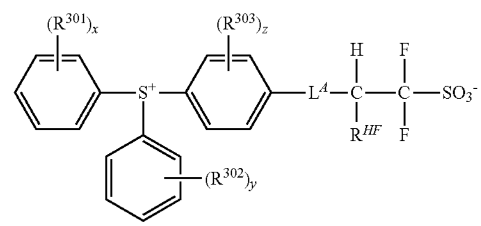

(2')

In formula (2'), $L^A$ is as defined above. $R^{HF}$ is hydrogen or trifluoromethyl, preferably trifluoromethyl. $R^{301}$, $R^{302}$, and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified for the hydrocarbyl group represented by $R^{111}$ in the formula (1A'). The subscripts x and y are each independently an integer of 0 to 5, and z is an integer of 0 to 4.

Examples of the PAG represented by the formula (2) are as exemplified for the PAG of the formula (2) in JP-A 2017-026980.

Of the foregoing PAGs, those having an anion of formula (1A') or (1D) are especially preferred because of reduced acid diffusion and high solubility in the resist solvent. Also those having an anion of formula (2') are especially preferred because of extremely reduced acid diffusion.

Also a sulfonium or iodonium salt having an iodized or brominated aromatic ring-containing anion may be used as the PAG. Suitable are sulfonium and iodonium salts having the formulae (3-1) and (3-2).

(3-1)

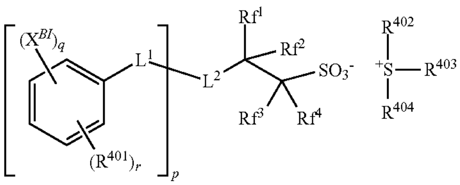

(3-2)

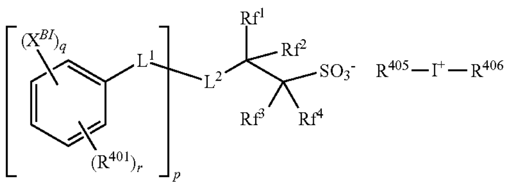

In the formulae (3-1) and (3-2), p is an integer of 1 to 3, q is an integer of 1 to 5, and r is an integer of 0 to 3, and $1 \le q+r \le 5$. Preferably, q is an integer of 1 to 3, more preferably 2 or 3 and r is an integer of 0 to 2.

$X^{BI}$ is iodine or bromine, and may be the same or different when p and/or q is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when p=1, or a $C_1$-$C_{20}$ (p+1)-valent linking group when p=2 or 3, the linking group optionally containing an oxygen, sulfur, or nitrogen atom.

$R^{401}$ is a hydroxyl group, a carboxyl group, fluorine, chlorine, bromine, an amino group, or a $C_1$-$C_{20}$ saturated hydrocarbyl, $C_1$-$C_{20}$ saturated hydrocarbyloxy, $C_2$-$C_{20}$ saturated hydrocarbylcarbonyl, $C_2$-$C_{10}$ saturated hydrocarbyloxycarbonyl, $C_2$-$C_{20}$ saturated hydrocarbylcarbonyloxy, or $C_1$-$C_{20}$ saturated hydrocarbylsulfonyloxy group which may contain fluorine, chlorine, bromine, a hydroxyl moiety, an amino moiety, or an ether bond, or —N($R^{401A}$)($R^{401B}$), —N($R^{401C}$)—C(═O)—$R^{401D}$, or —N($R^{401C}$)—C(═O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain a halogen, hydroxyl, $C_1$-$C_6$ saturated hydrocarbyloxy, $C_2$-$C_6$ saturated hydrocarbylcarbonyl, or $C_2$-$C_6$ saturated hydrocarbylcarbonyloxy moiety. $R^{401D}$ is a $C_1$-$C_{16}$ aliphatic hydrocarbyl, $C_6$-$C_{14}$ aryl, or $C_7$-$C_{15}$ aralkyl group which may contain halogen, hydroxyl, $C_1$-$C_6$ saturated hydrocarbyloxy, $C_2$-$C_6$ saturated hydrocarbylcarbonyl, or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be the same or different when p and/or r is 2 or more.

Of these, $R^{401}$ is preferably hydroxyl, —N($R^{401C}$)—C(═O)—$R^{401D}$, —N($R^{401C}$)—C(═O)—O—$R^{401D}$, fluorine, chlorine, bromine, methyl, or methoxy.

In formulae (3-1) and (3-2), $Rf^1$ to $Rf^4$ are each independently hydrogen, fluorine or trifluoromethyl, at least one of $Rf^1$ to $Rf^4$ is fluorine or trifluoromethyl, or $Rf^1$ and $Rf^2$, taken together, may form a carbonyl group. Preferably, both $Rf^9$ and $Rf^4$ are fluorine.

In the formulae (3-1) and (3-2), $R^{402}$ to $R^{406}$ are each independently a halogen or a $C_1$-$C_{20}$ hydrocarbyl group which may contain a heteroatom. The hydrocarbyl group may be saturated or unsaturated and straight, branched or cyclic. Examples thereof are as exemplified for the hydrocarbyl groups represented by $R^{101}$ to $R^{105}$ in the formulae (1-1) and (1-2). In these groups, some or all of the hydrogen atoms may be substituted by hydroxyl, carboxyl, halogen, cyano, nitro, mercapto, sultone, sulfone, or sulfonium salt-containing moieties, and some carbon may be replaced by an ether bond, ester bond, carbonyl moiety, amide bond, carbonate moiety or sulfonic acid ester bond. $R^{402}$ and $R^{403}$ may bond together to form a ring with the sulfur atom to which they are attached. Examples of the ring are as exemplified above as the ring that $R^{101}$ and $R^{102}$, taken together, form with the sulfur atom to which they are attached in the formula (1-1).

Examples of the cation in the sulfonium salt having formula (3-1) include those exemplified above as the cation in the sulfonium salt having formula (1-1). Examples of the cation in the iodonium salt having formula (3-2) include those exemplified above as the cation in the iodonium salt having formula (1-2).

Examples of the anion in the onium salts having formulae (3-1) and (3-2) are shown below, but not limited thereto. Herein $X^{BI}$ is as defined above.

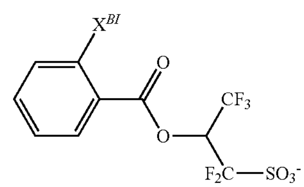

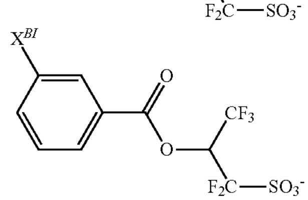

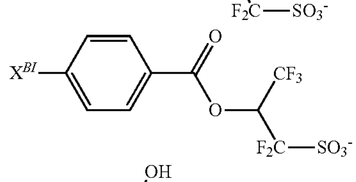

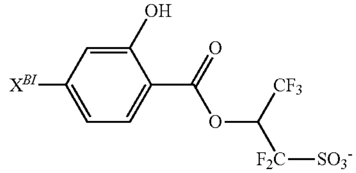

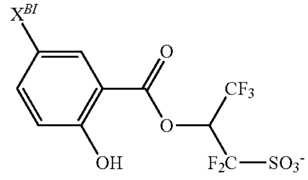

-continued
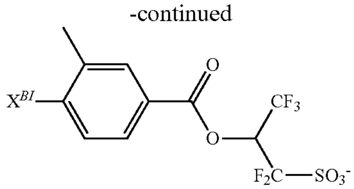
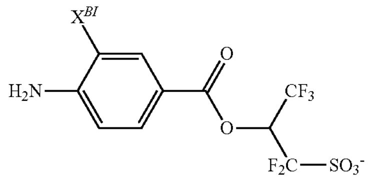
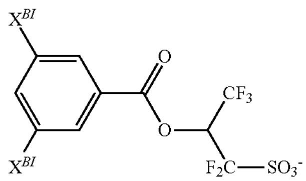
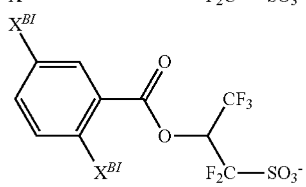
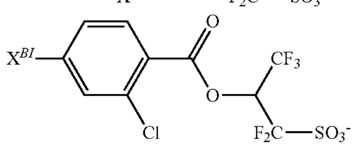
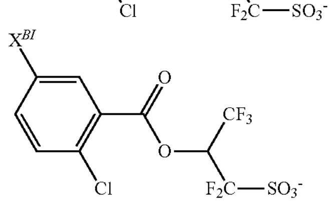
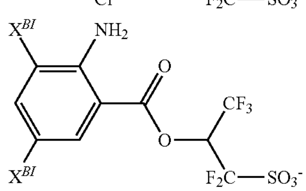
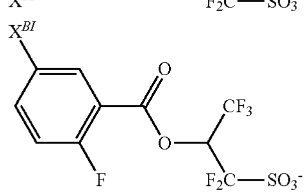
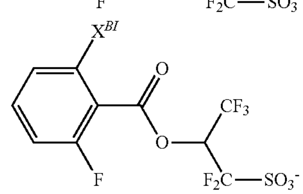
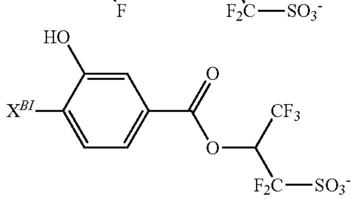
-continued
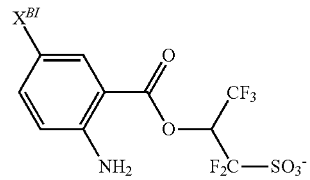
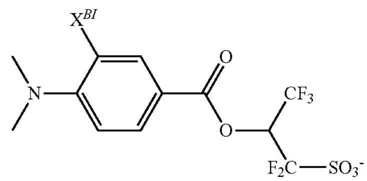
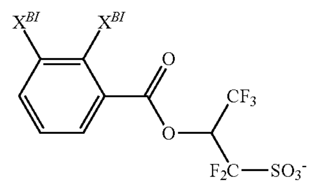
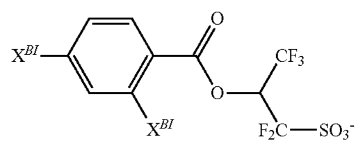
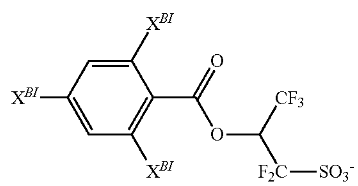
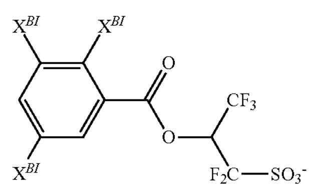
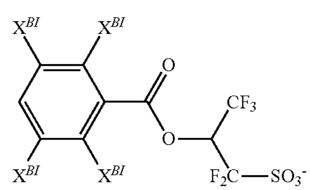
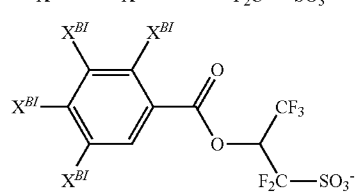
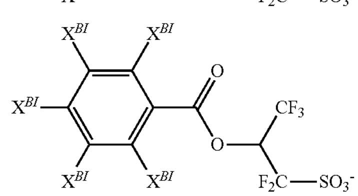

-continued
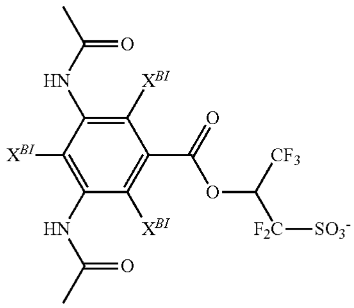
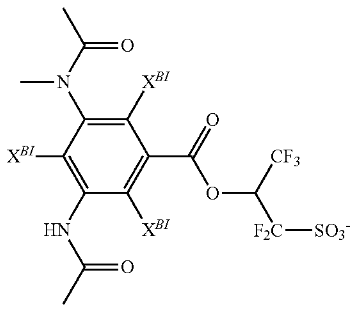
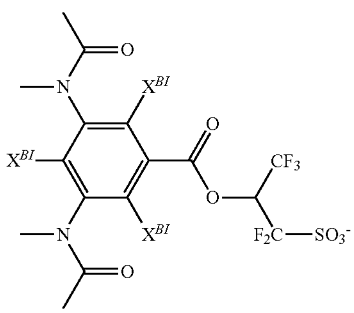
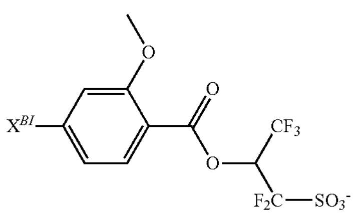
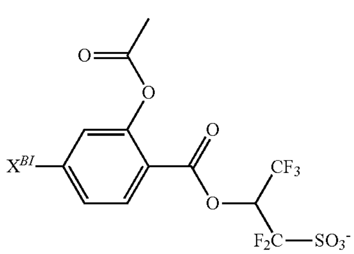
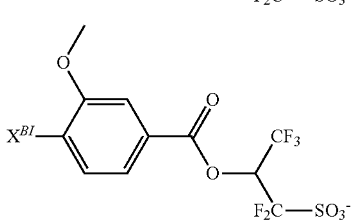
-continued
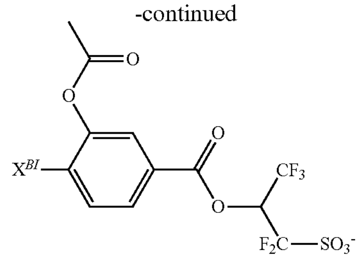
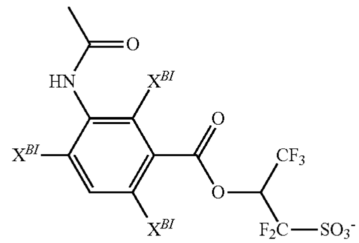
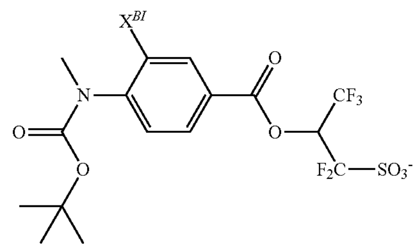
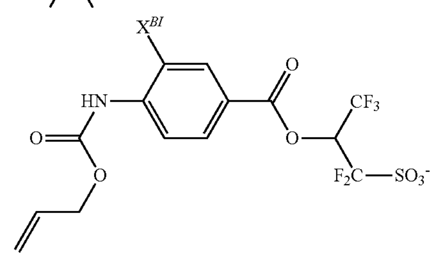
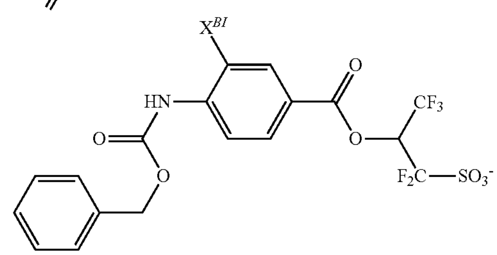
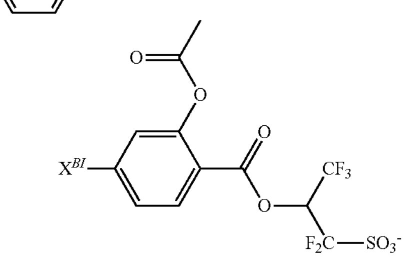
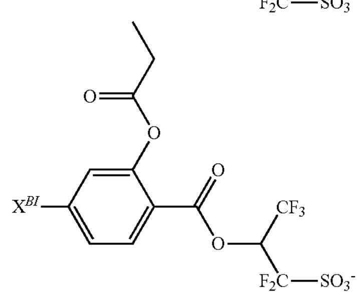

-continued
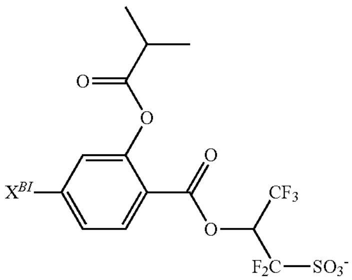
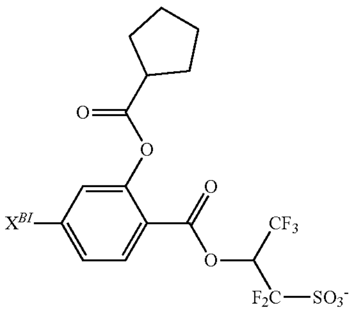
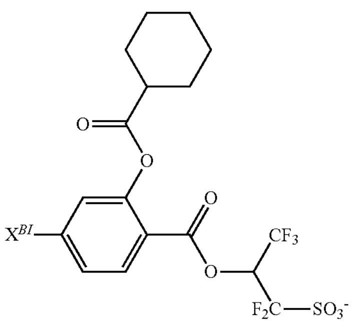
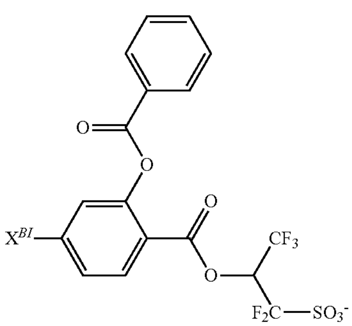
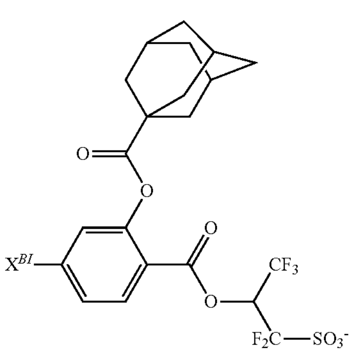
-continued
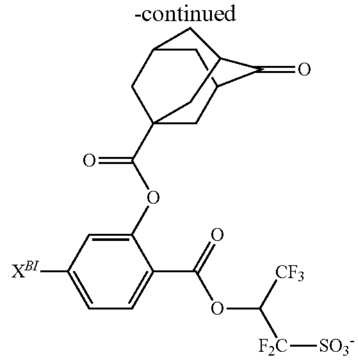
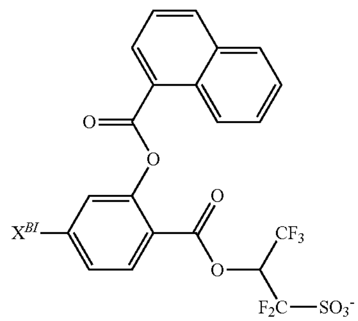
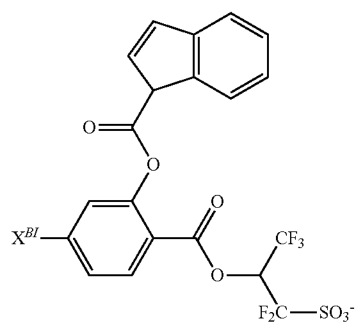
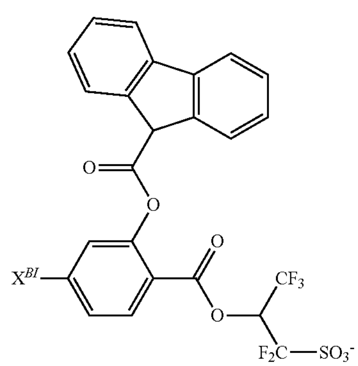
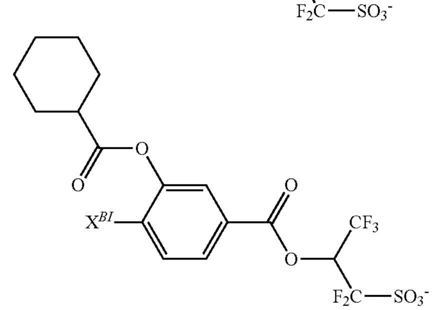

-continued
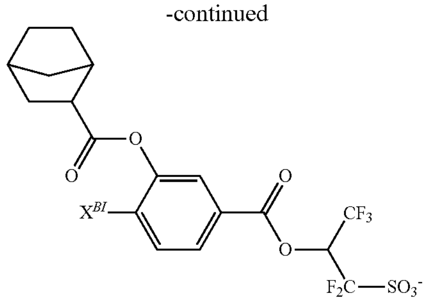
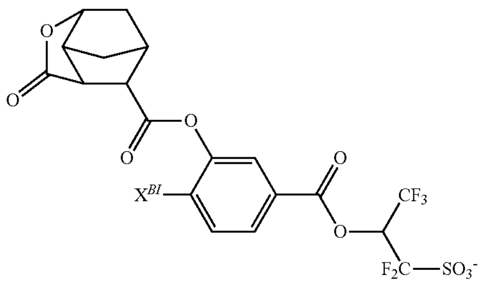
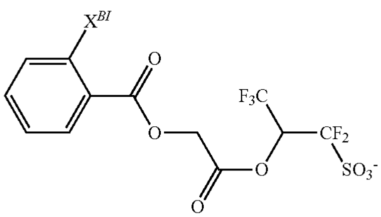
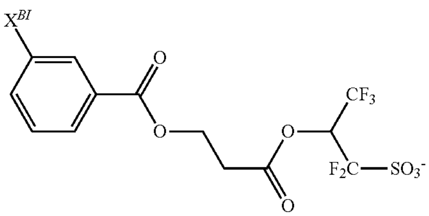
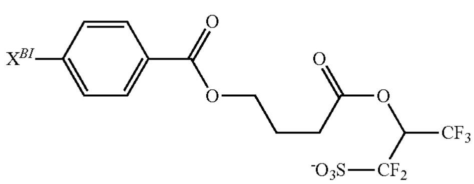
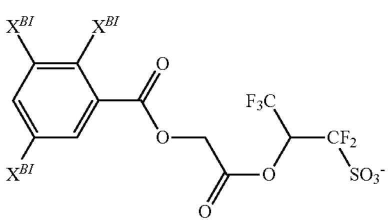
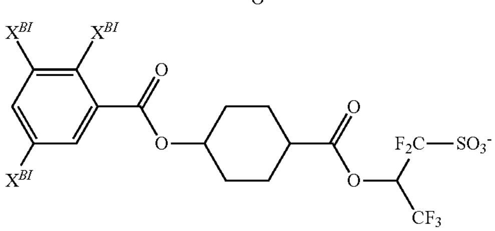
-continued
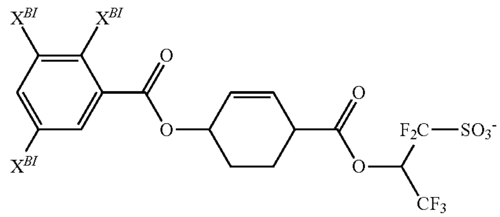
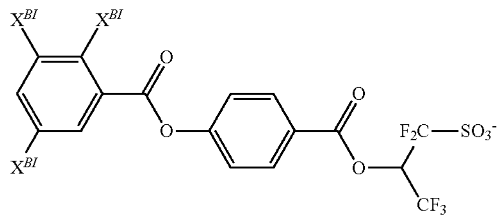
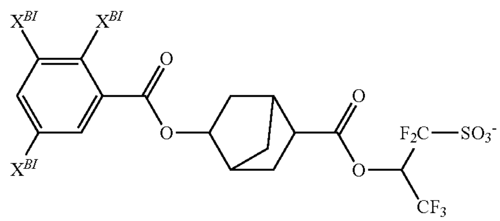
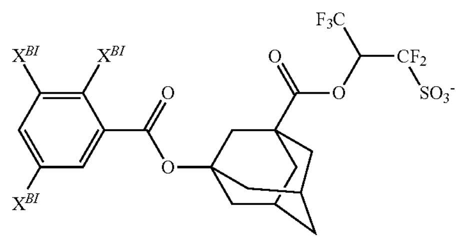
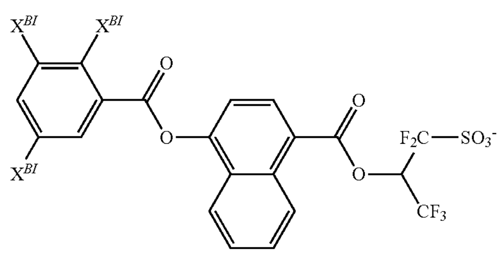
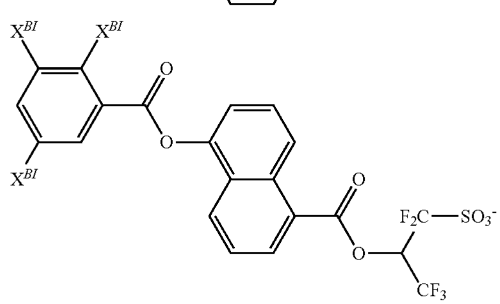
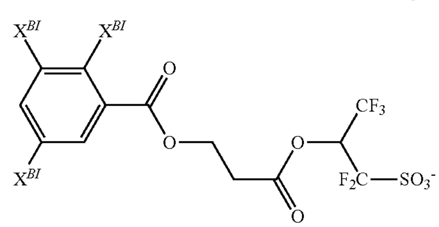

-continued
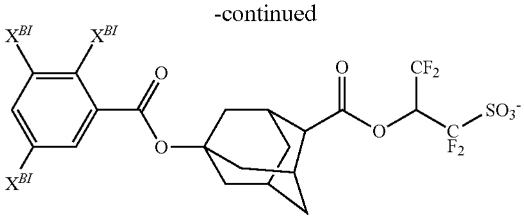
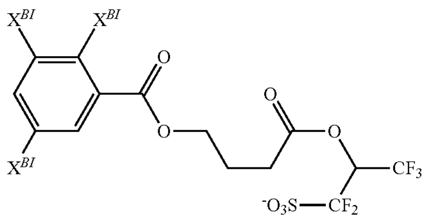
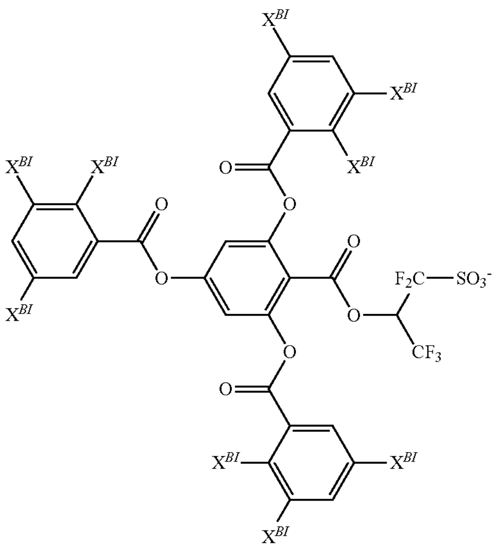
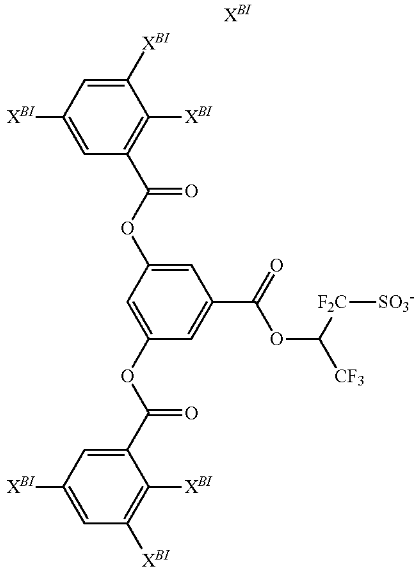
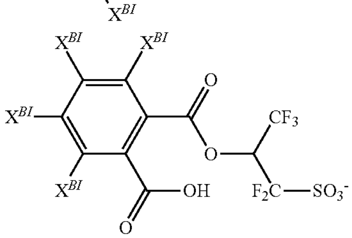
-continued
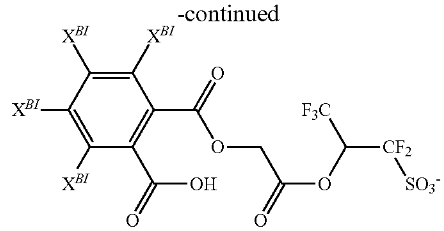
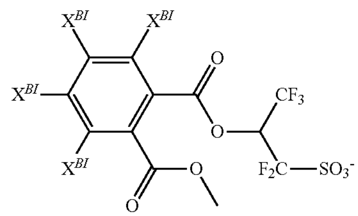
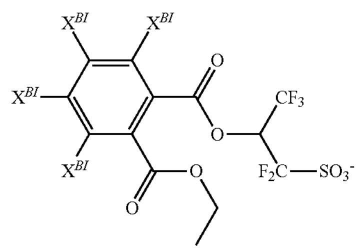
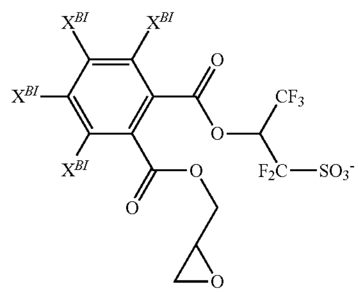
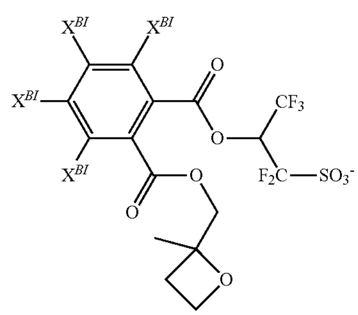
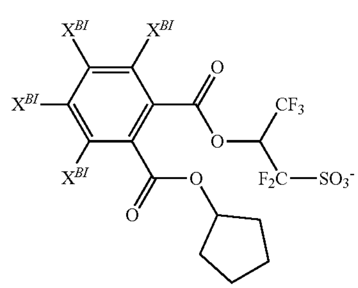

-continued
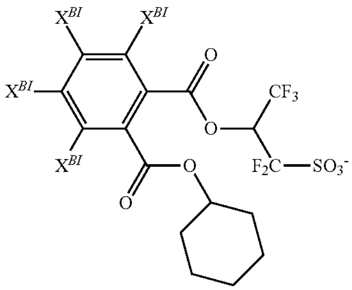
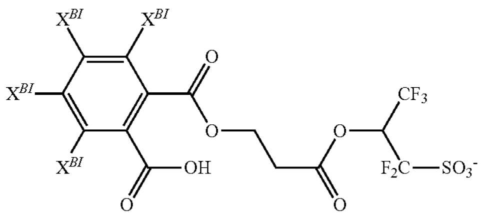
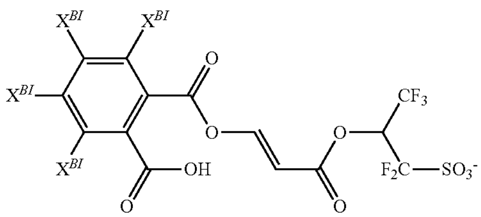
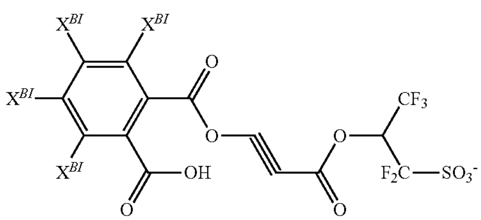
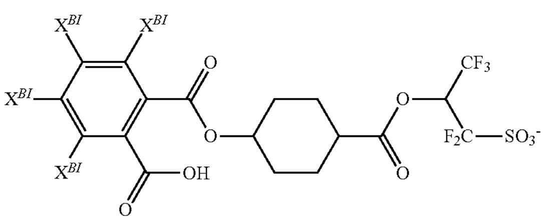
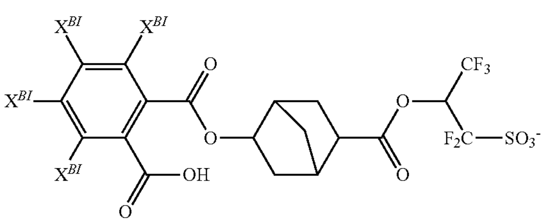
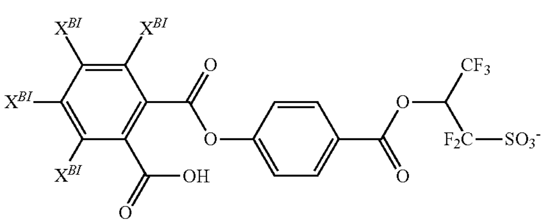
-continued
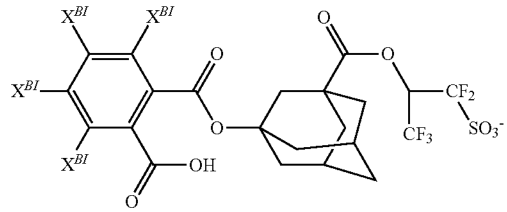
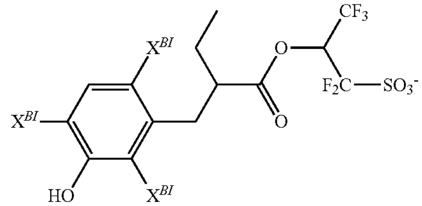
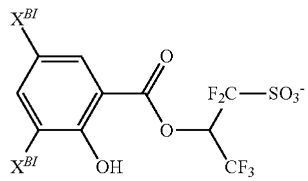
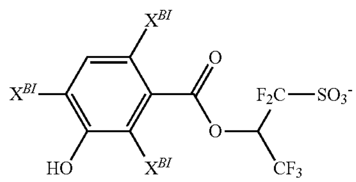
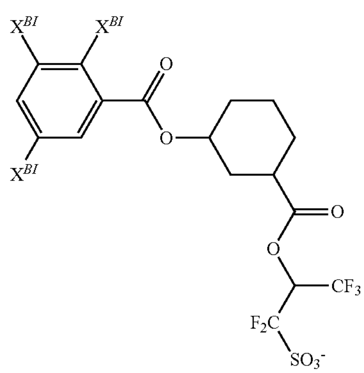
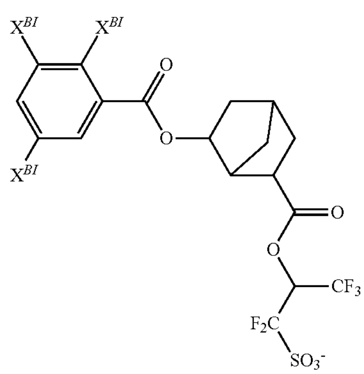

-continued
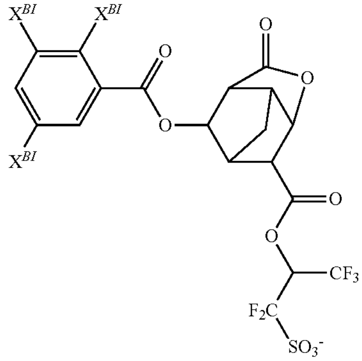
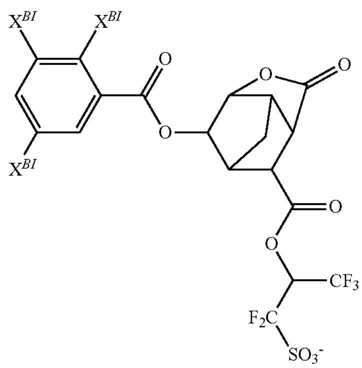
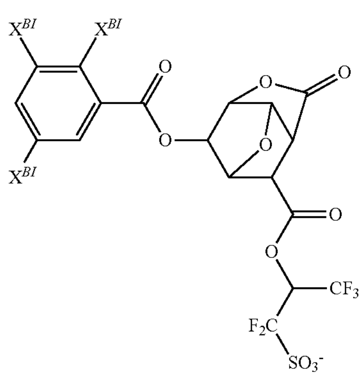
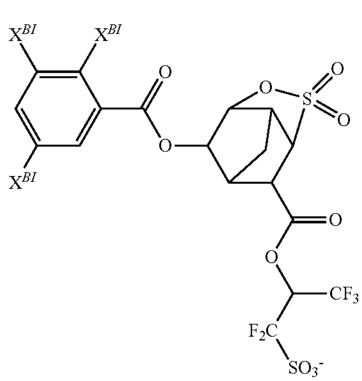
-continued
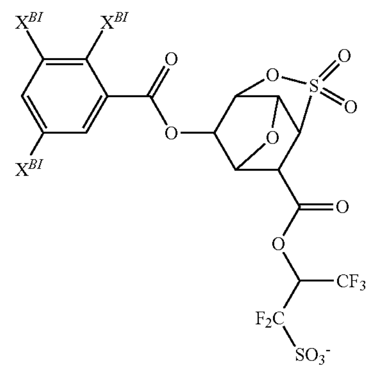
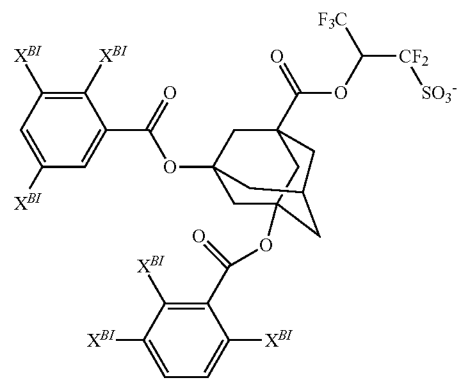
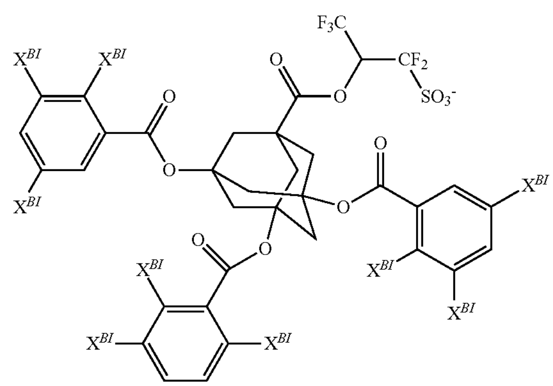
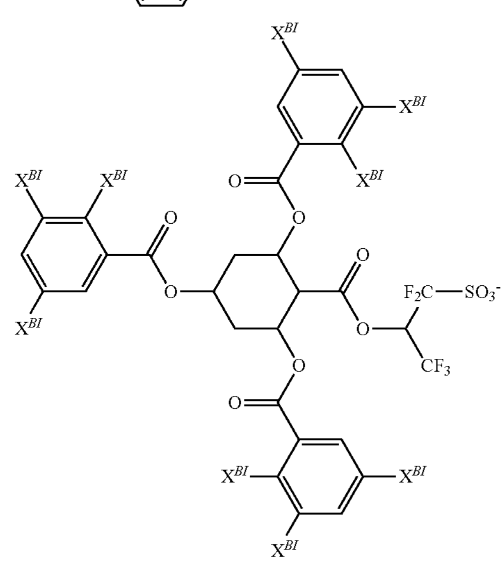

-continued
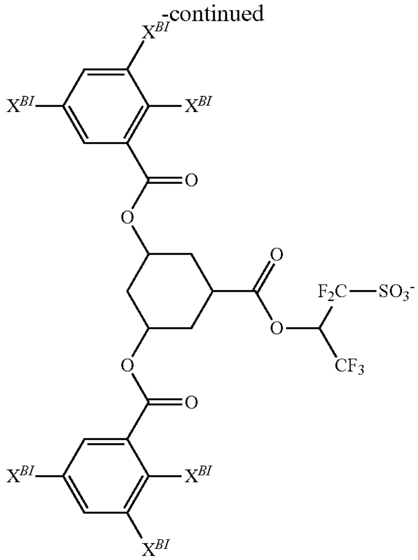
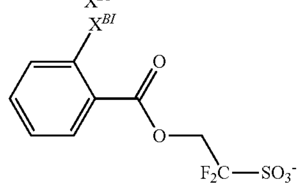
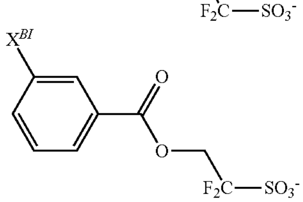
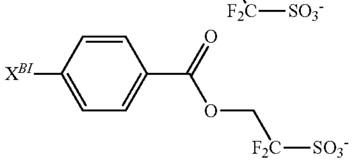
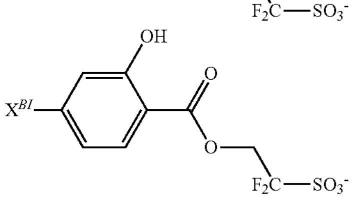
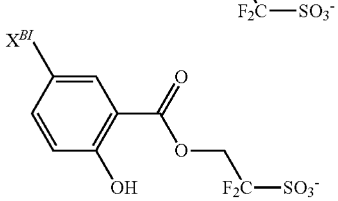
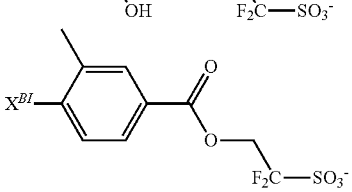
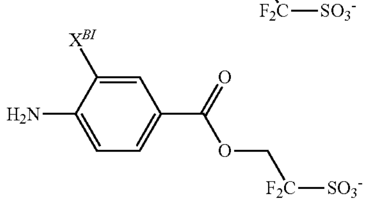
-continued
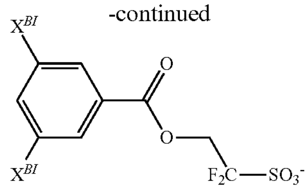
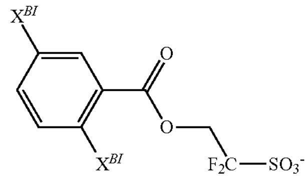
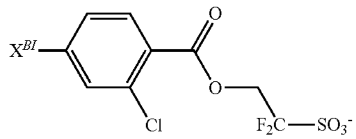
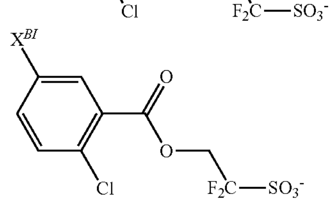
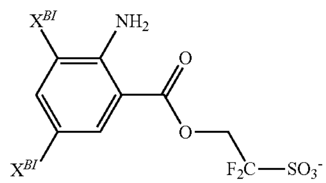
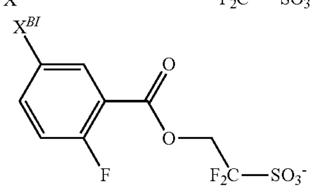
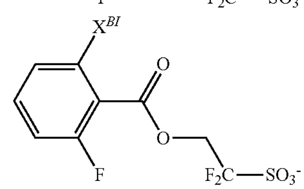
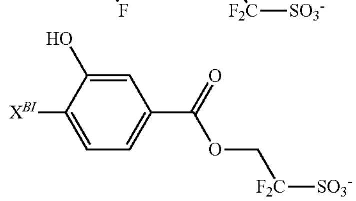
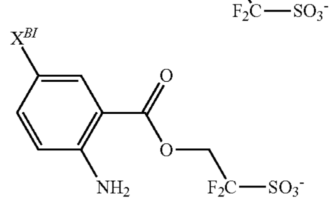
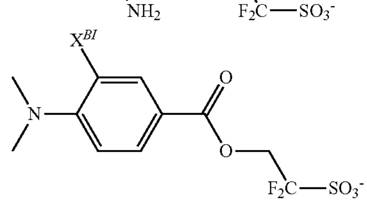

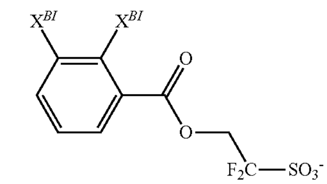
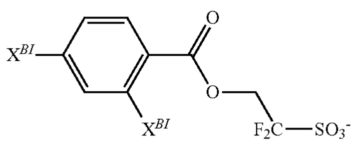
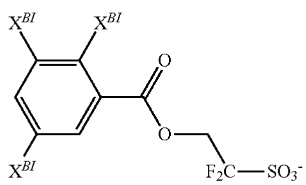
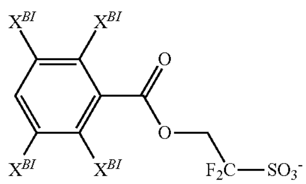
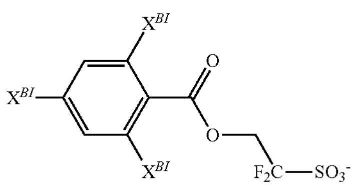
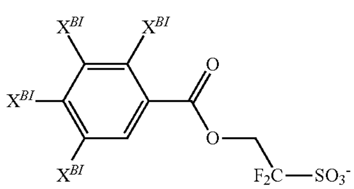
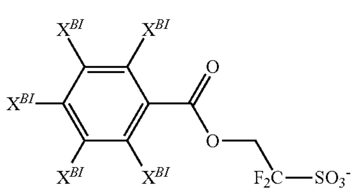
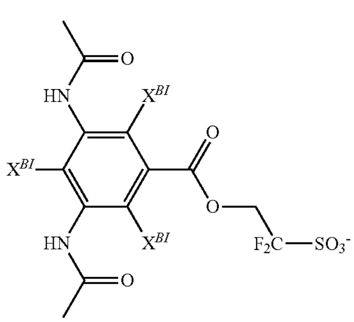
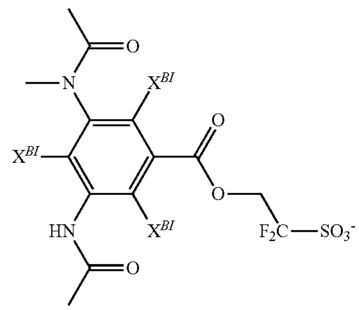
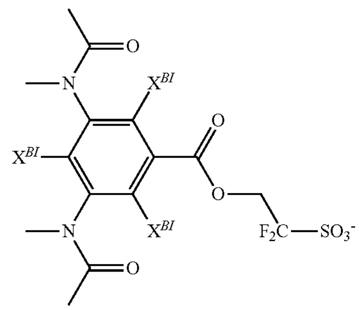
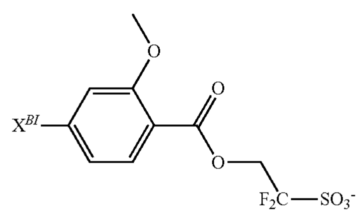
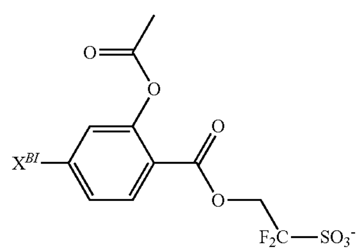
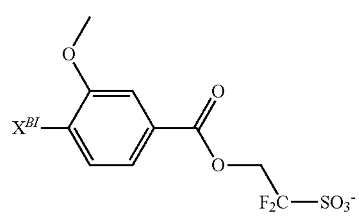
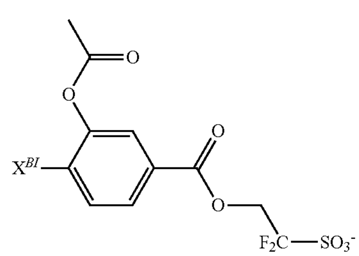

-continued
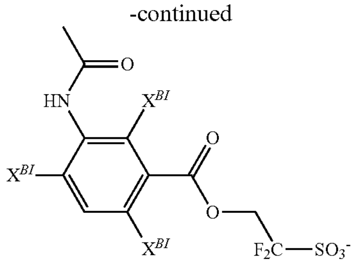
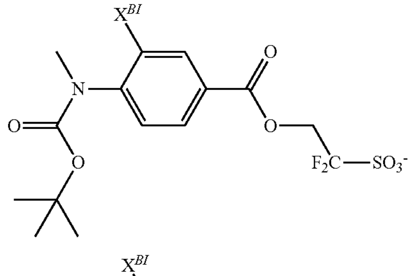
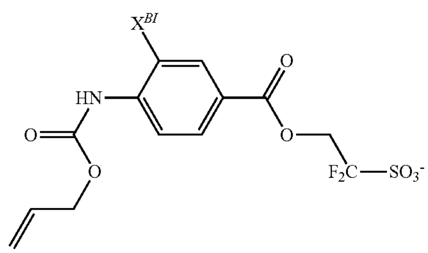
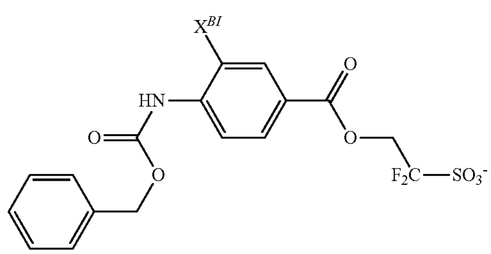
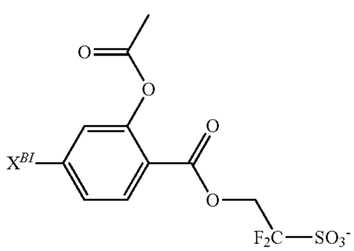
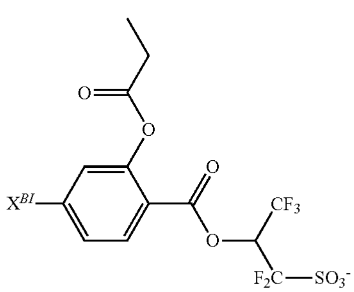
-continued
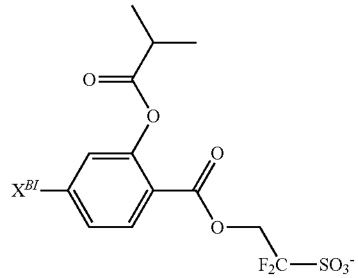
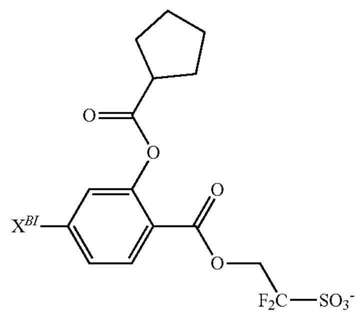
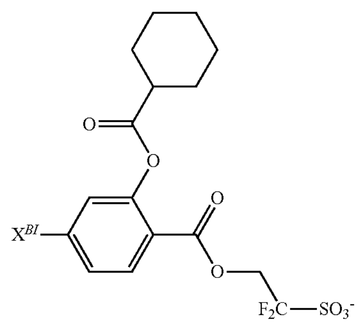
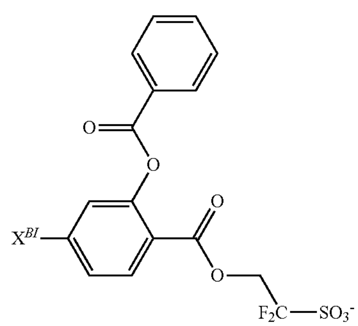
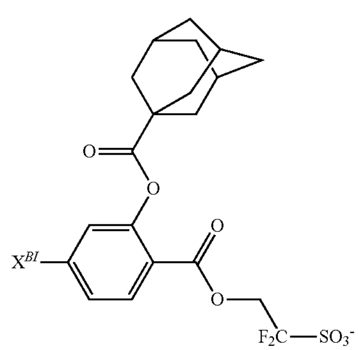

-continued
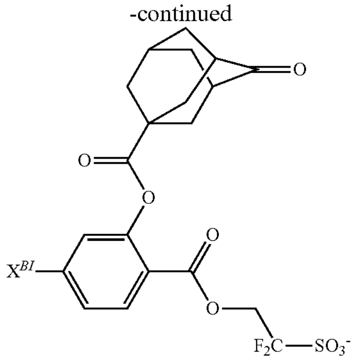
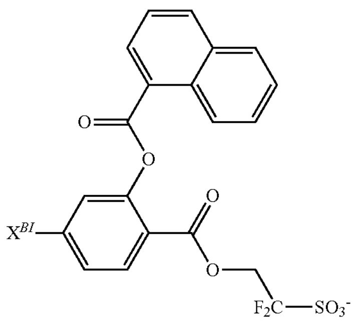
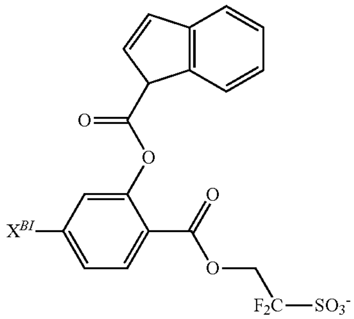
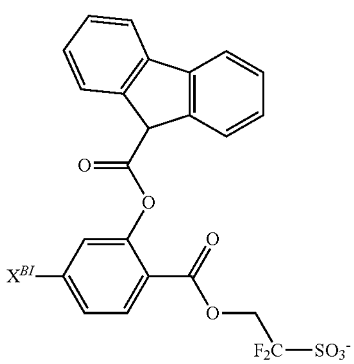
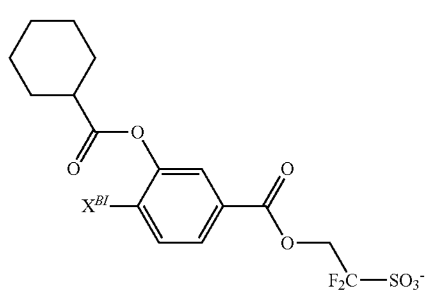
-continued
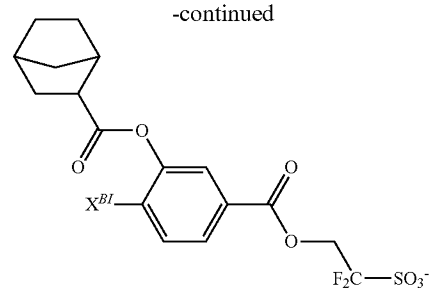
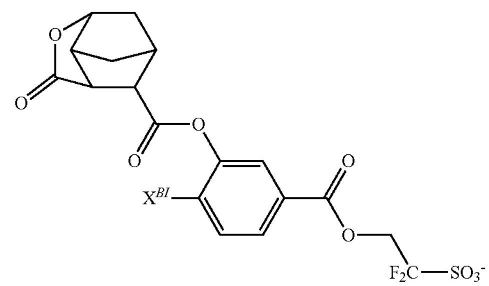
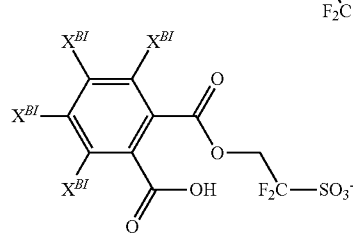
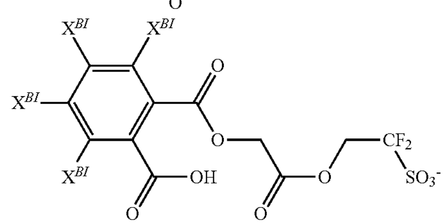
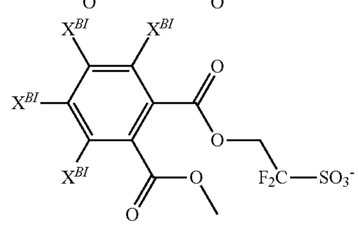
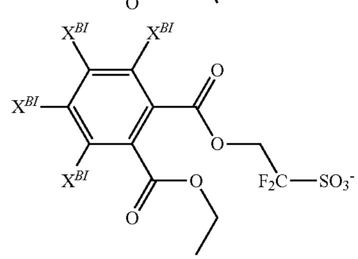
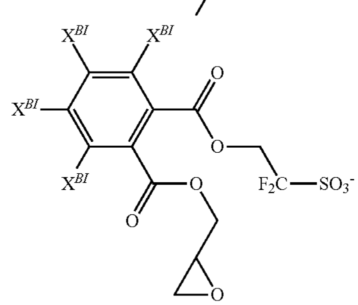

-continued
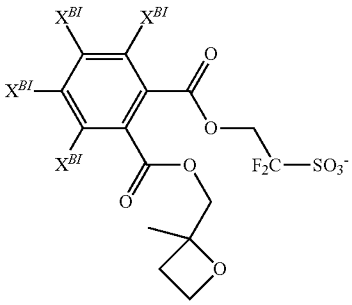
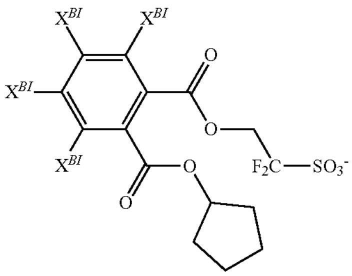
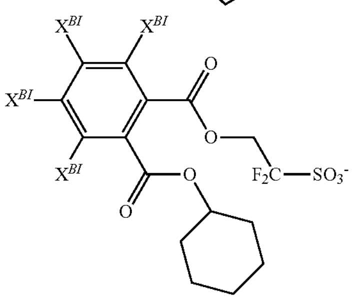
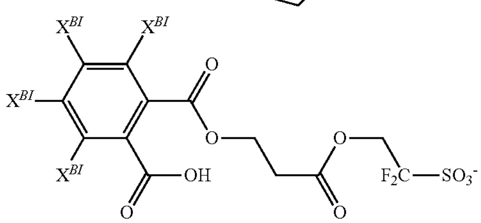
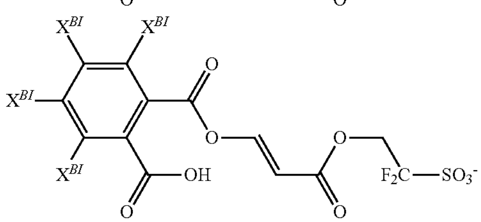
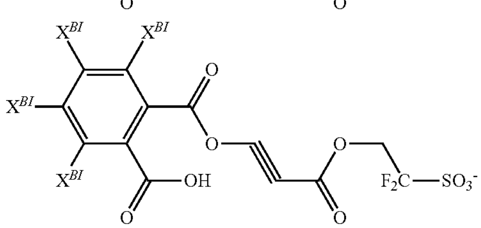
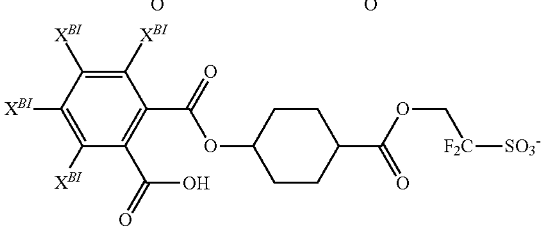
-continued
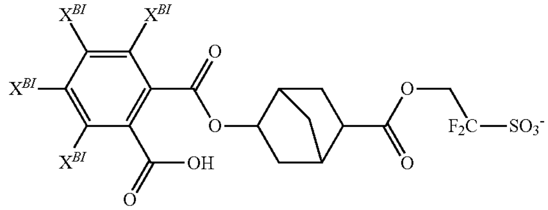
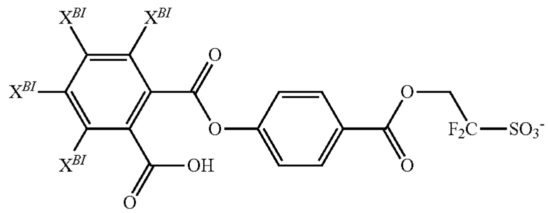
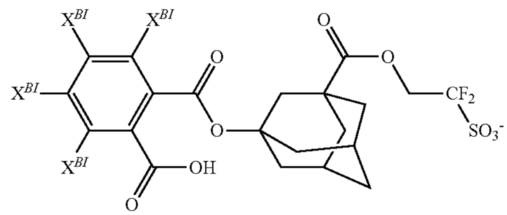
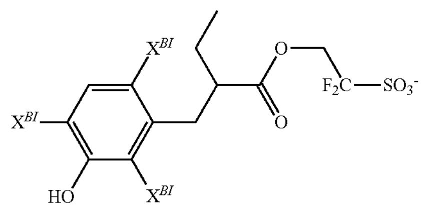
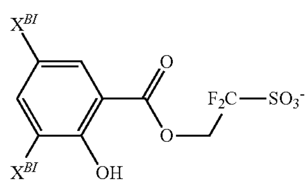
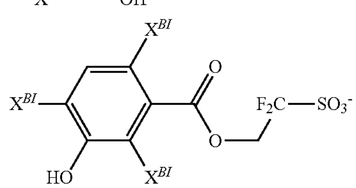
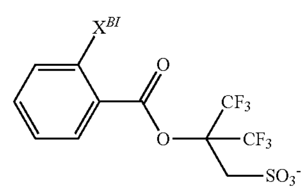
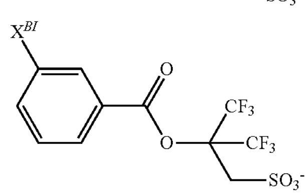
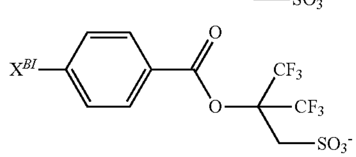

-continued
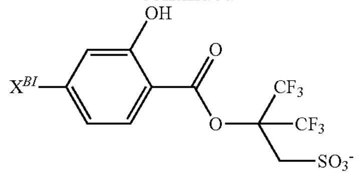
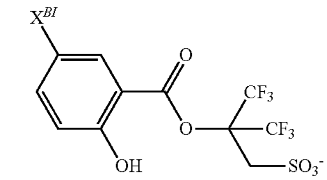
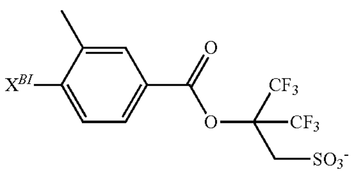
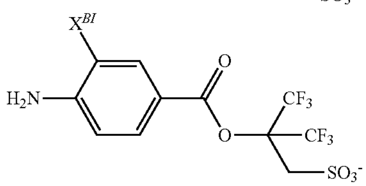
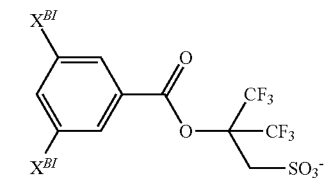
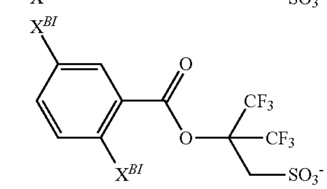
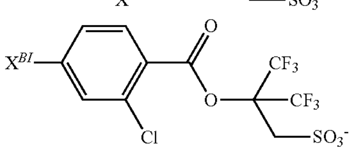
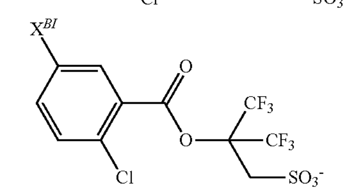
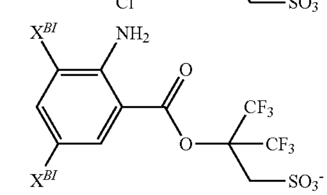
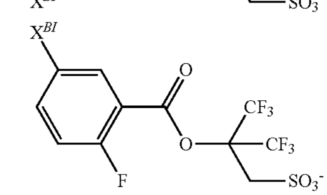
-continued
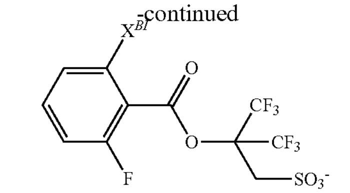
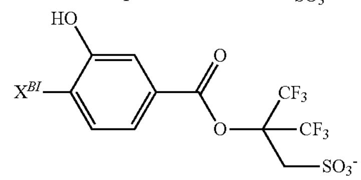
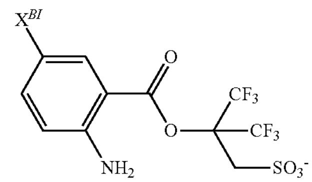
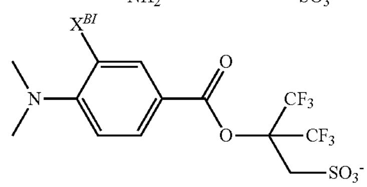
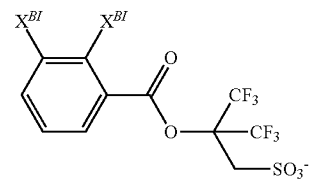
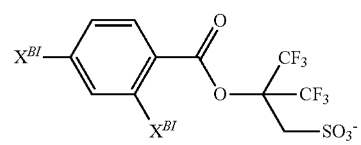
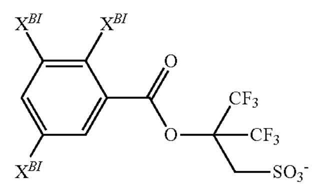
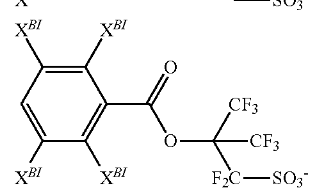
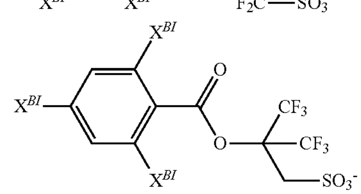
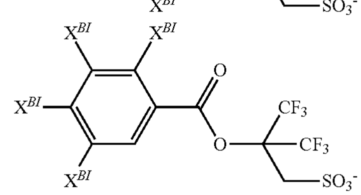

-continued
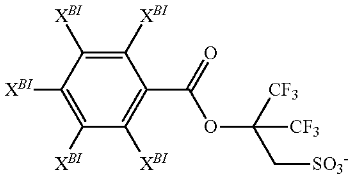
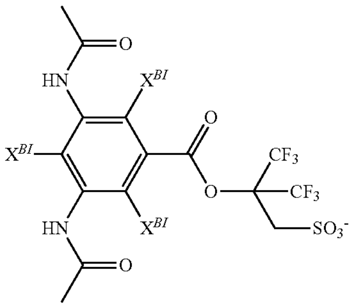
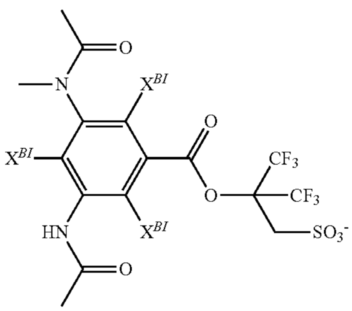
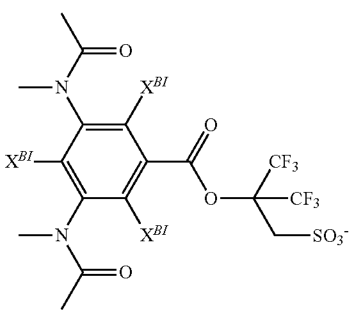
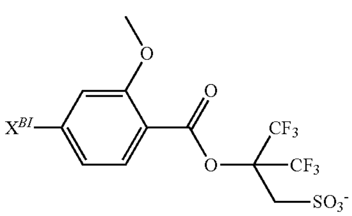
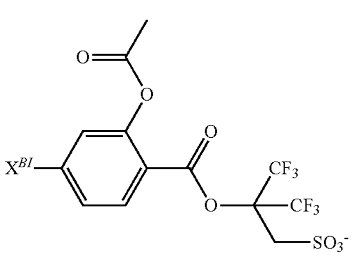
-continued
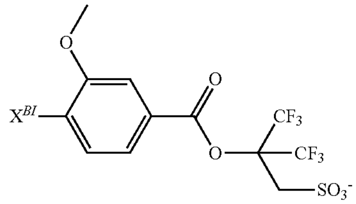
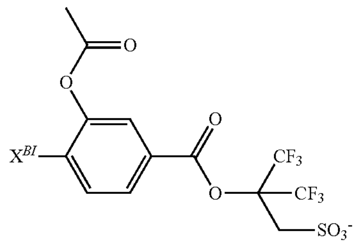
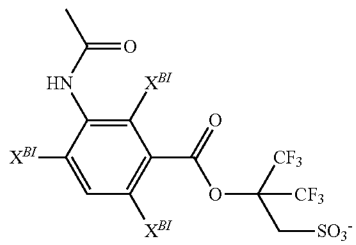
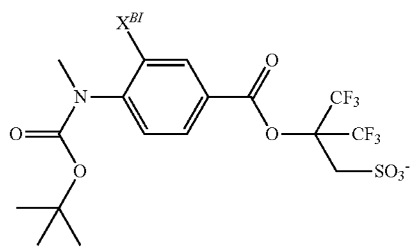
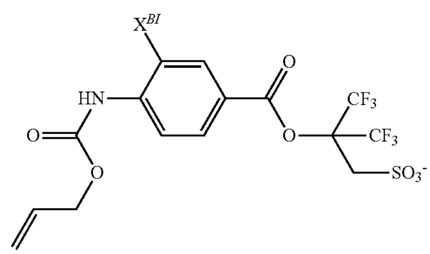
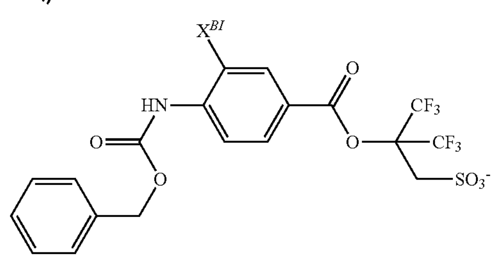
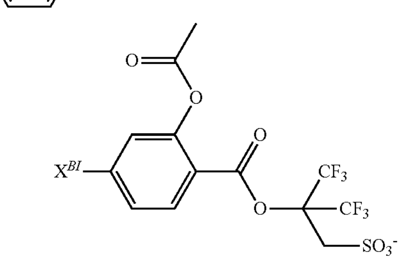

-continued
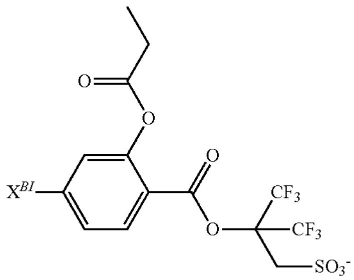
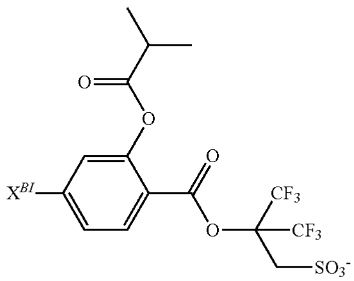
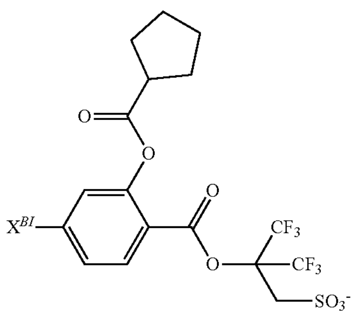
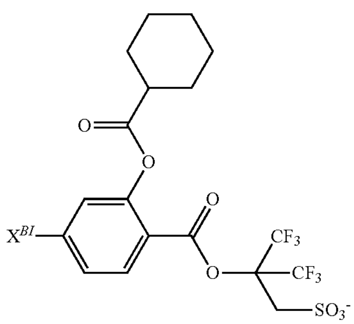
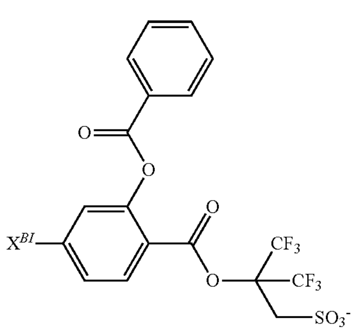
-continued
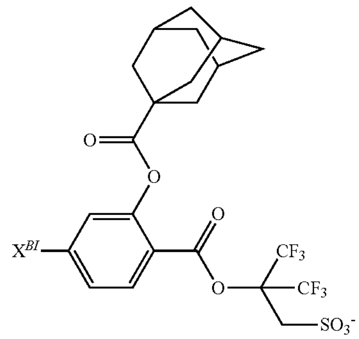
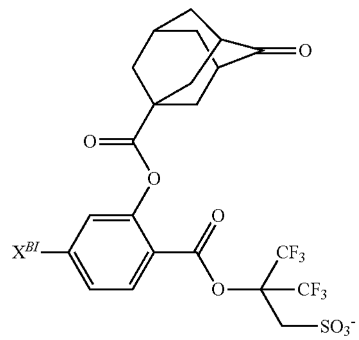
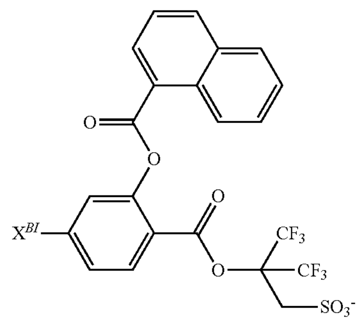
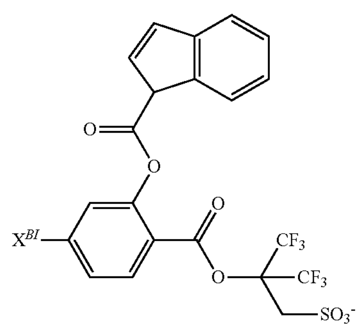
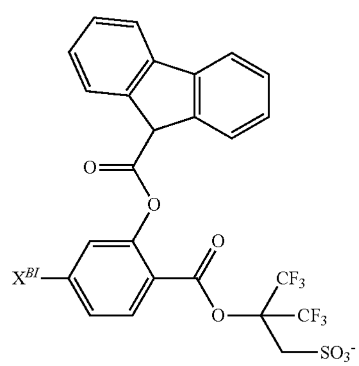

-continued
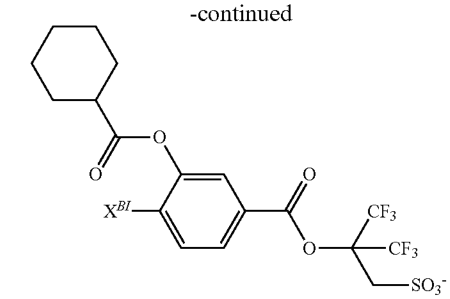
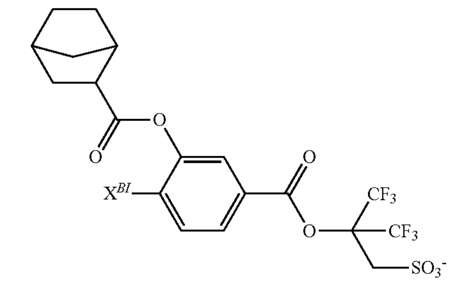
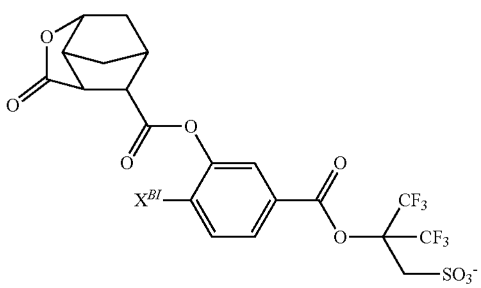
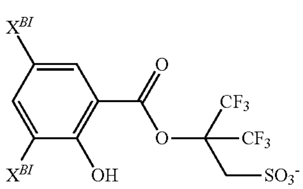
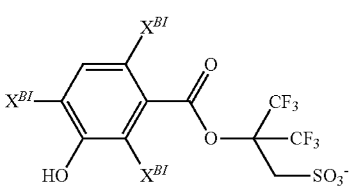
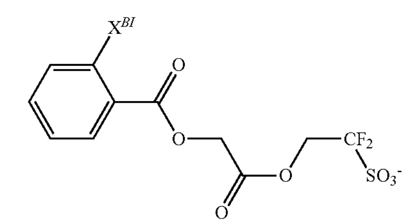
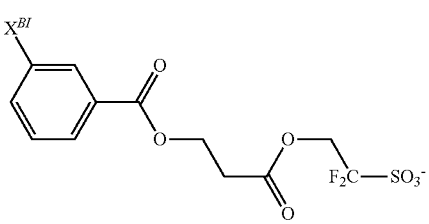
-continued
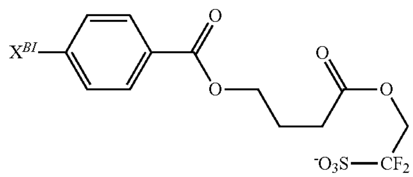
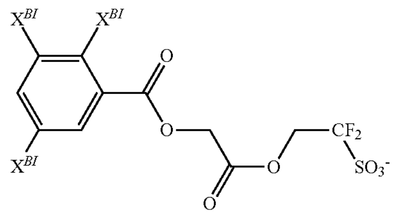
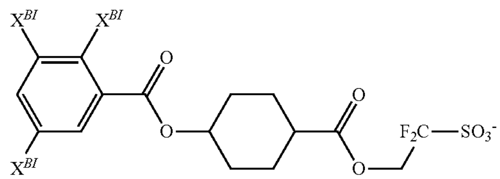
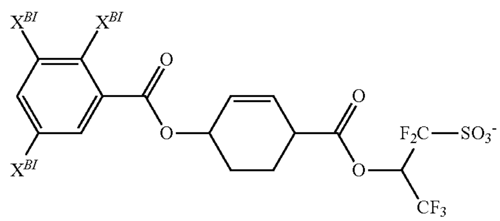
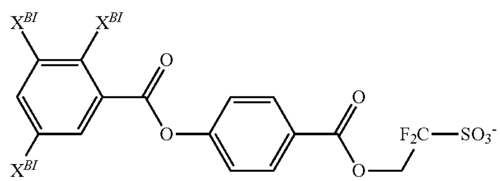
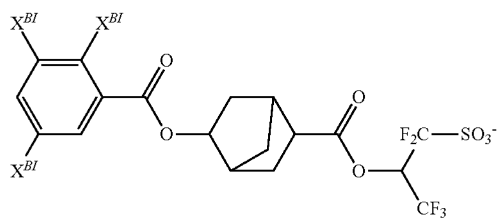
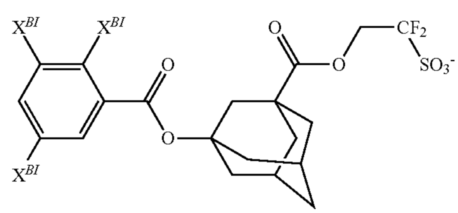
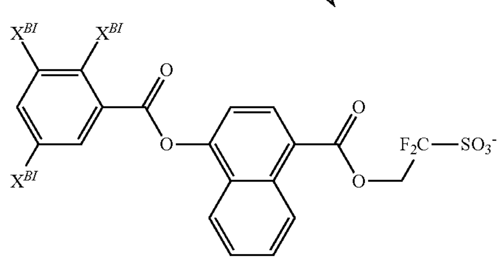

-continued
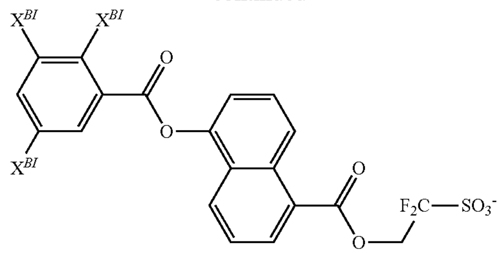
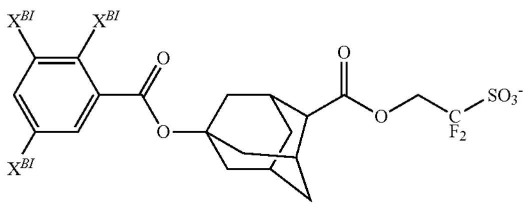
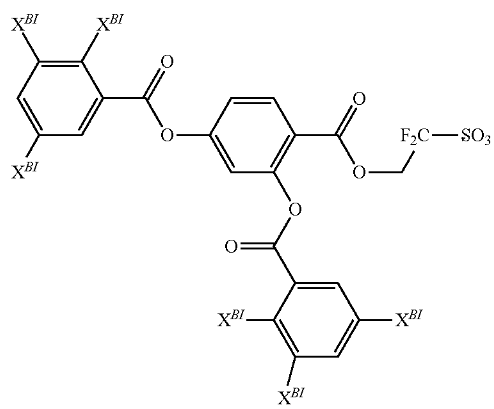
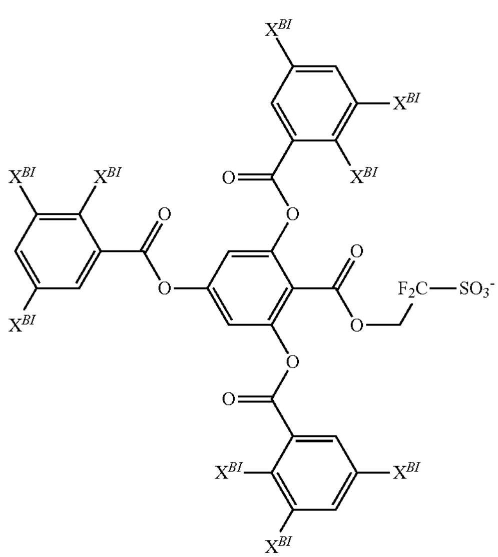
-continued
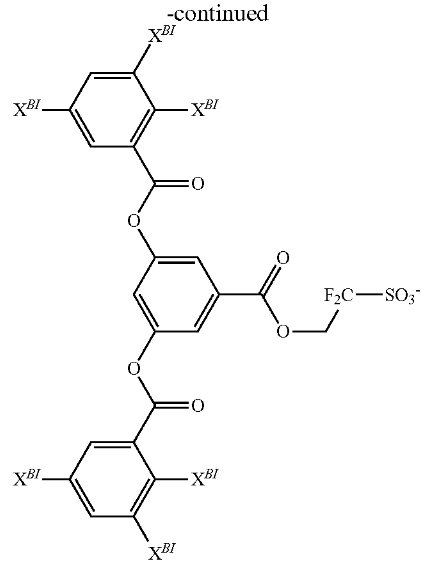
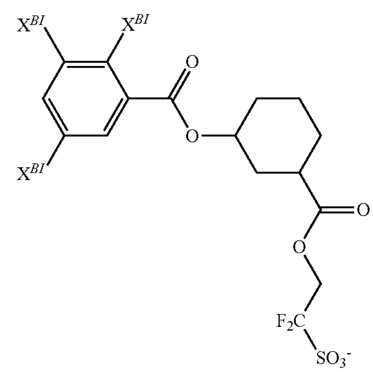
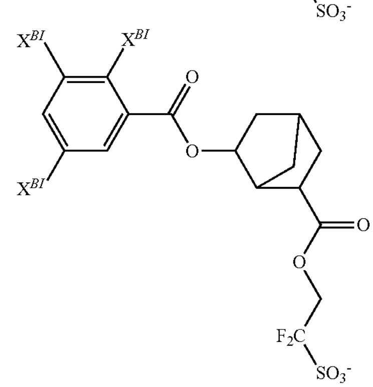
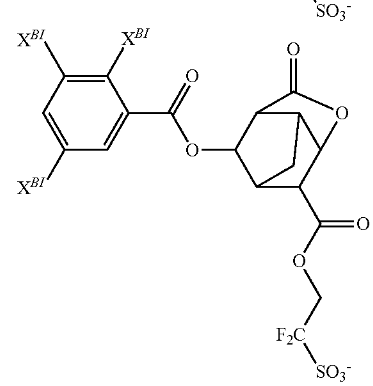

-continued
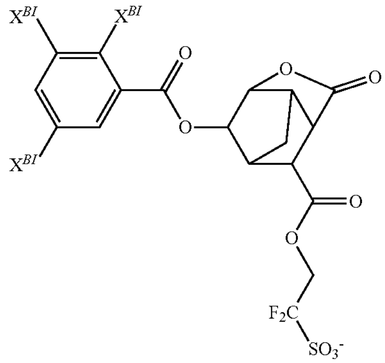
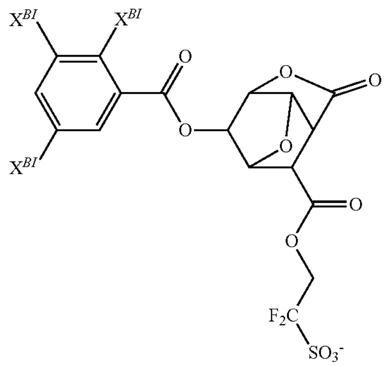
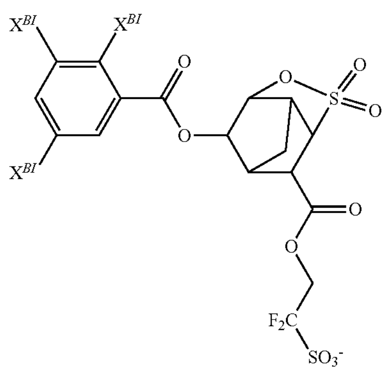
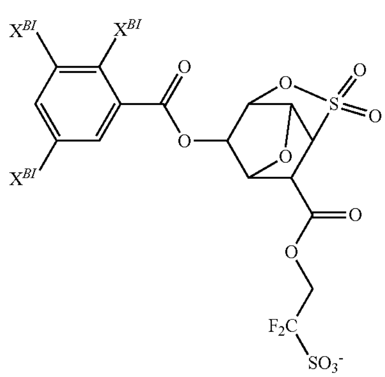
-continued
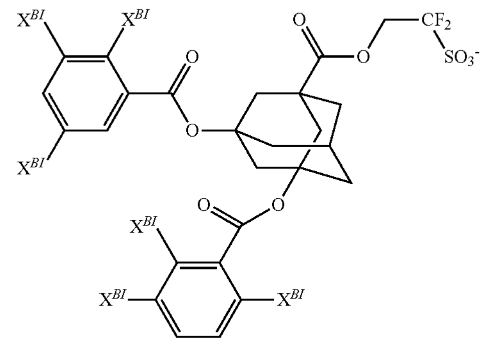
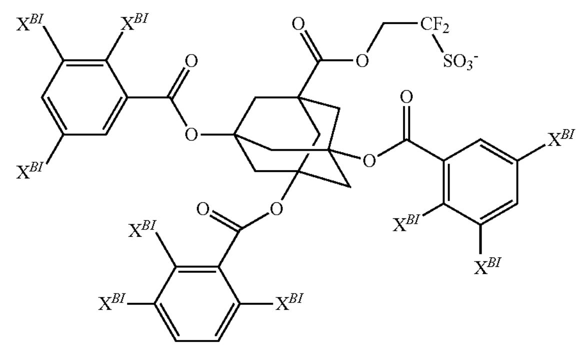
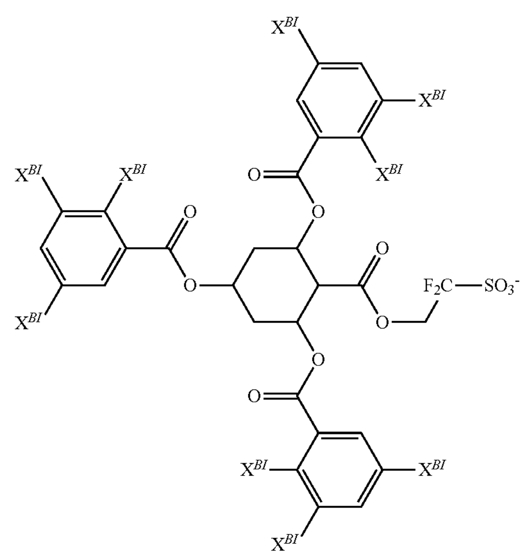

-continued
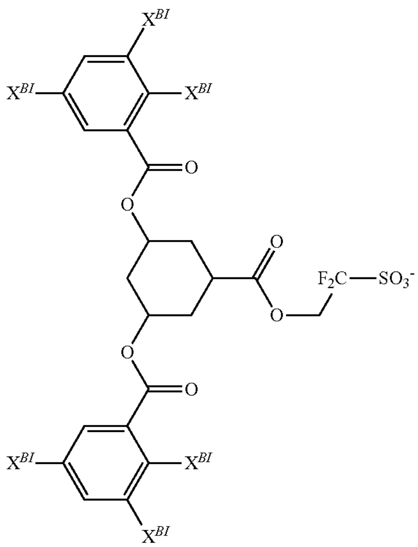
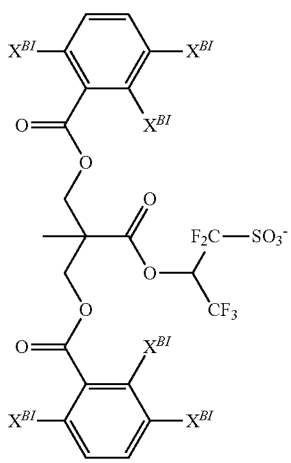
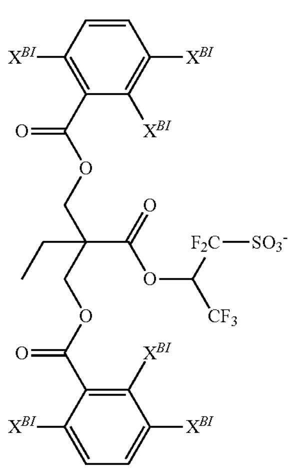
-continued
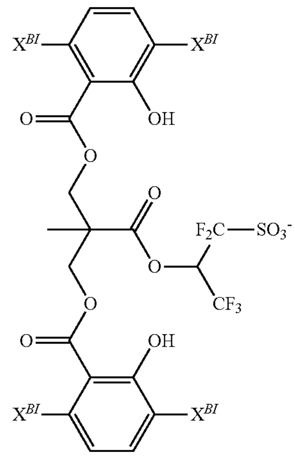
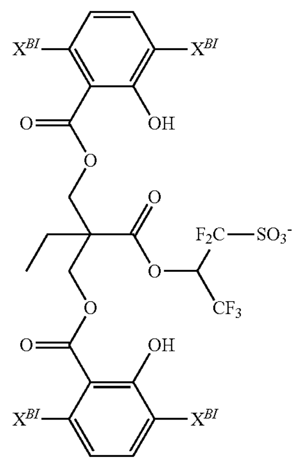
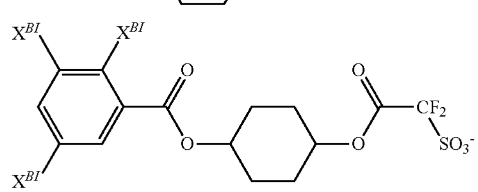
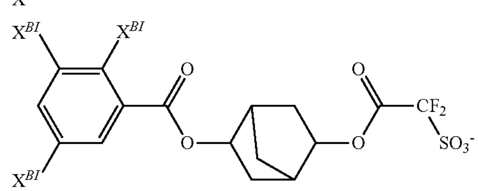
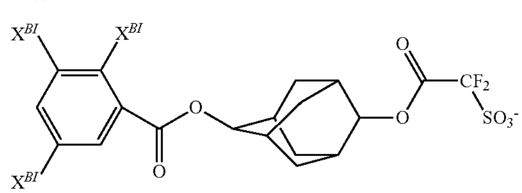
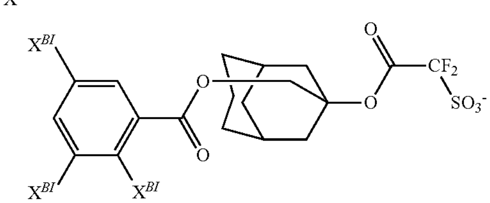

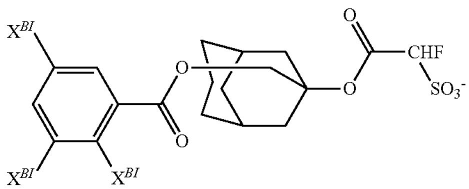
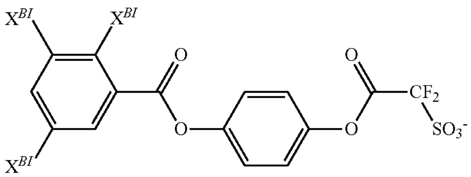
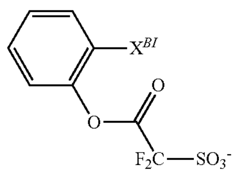
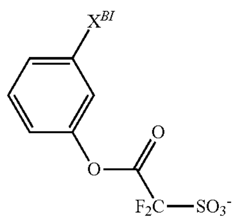
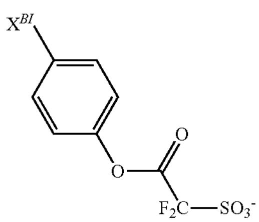
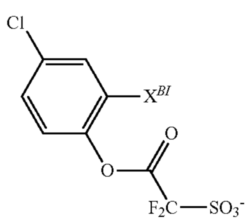
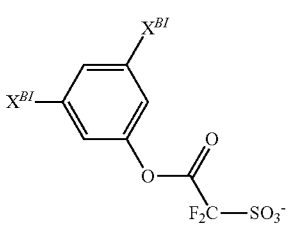
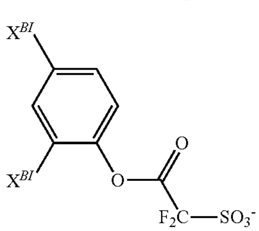
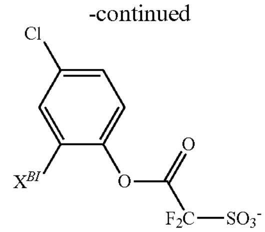
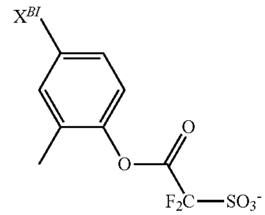
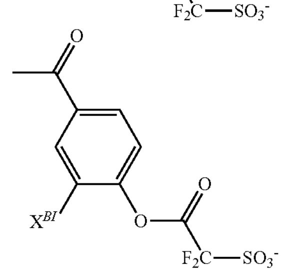
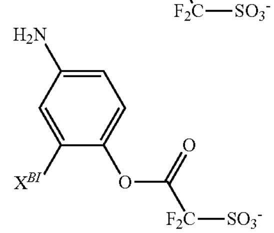
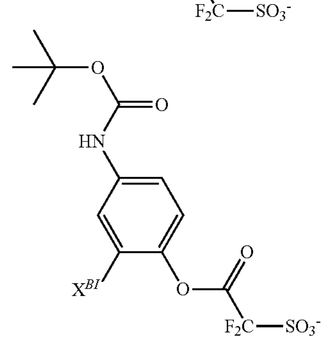
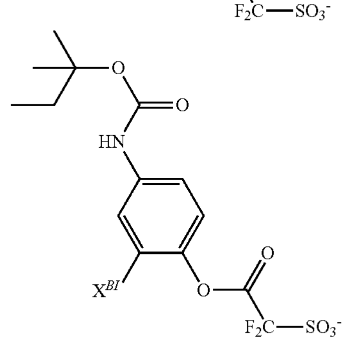
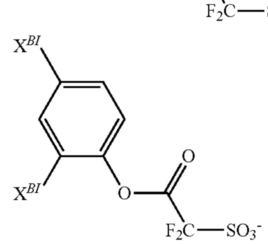

-continued
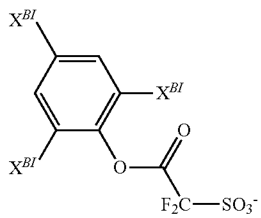
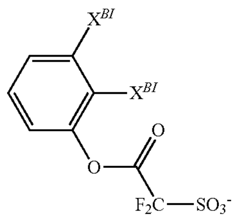
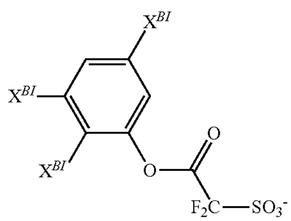
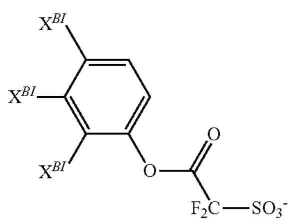
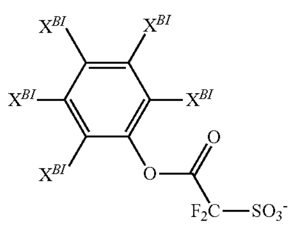
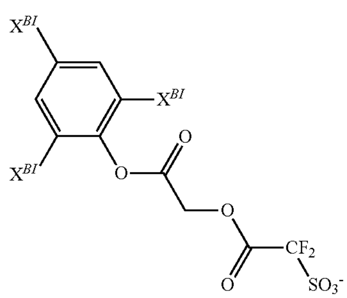
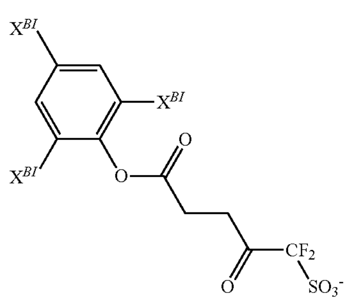
-continued
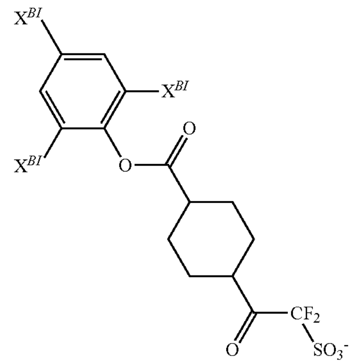
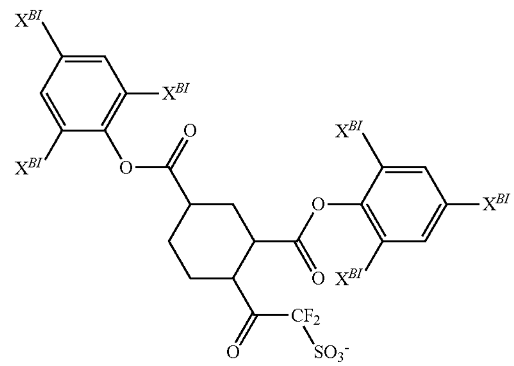
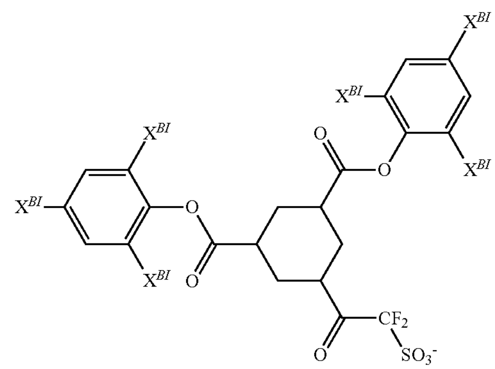
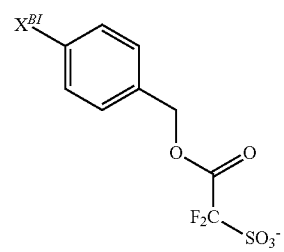
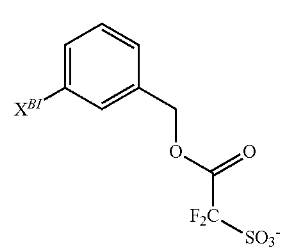

-continued
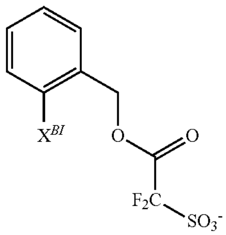
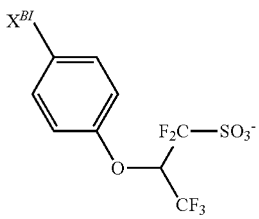
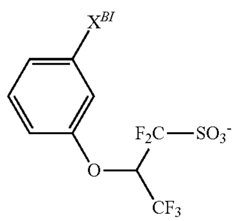
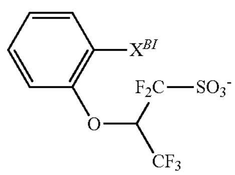
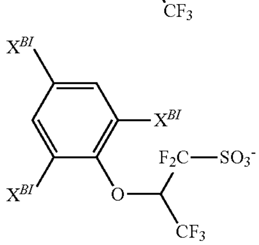
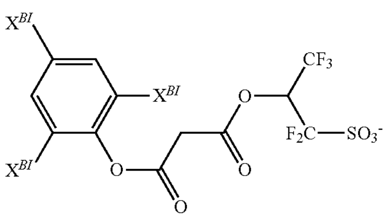
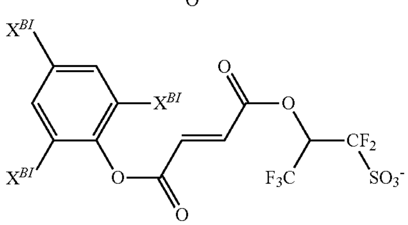
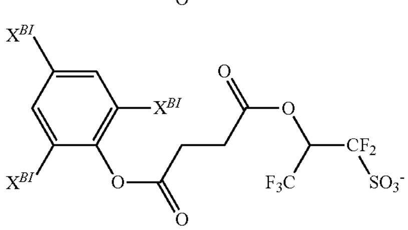
-continued
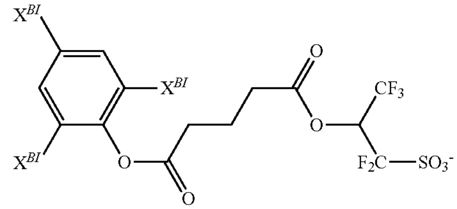
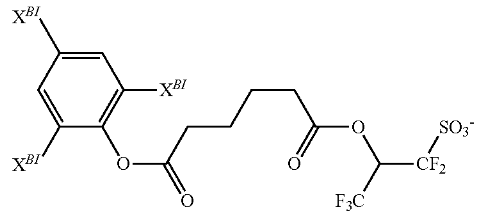
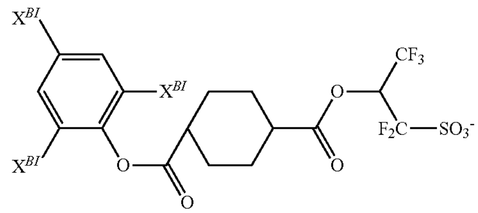
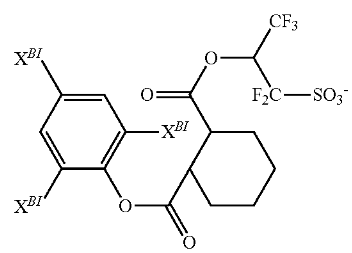
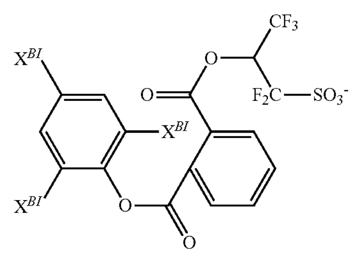
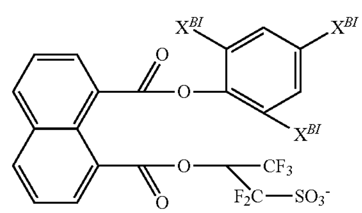
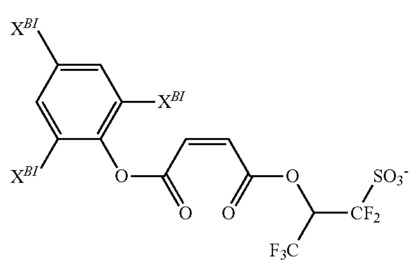

-continued
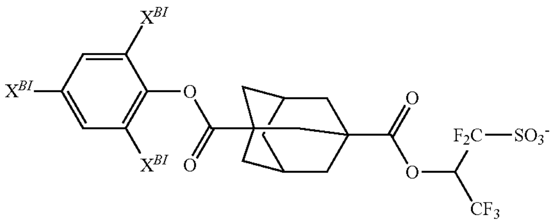
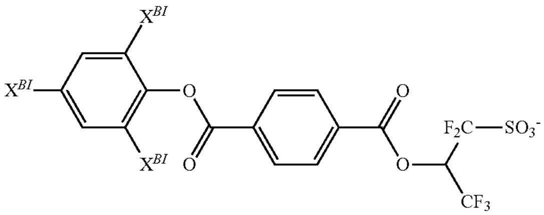
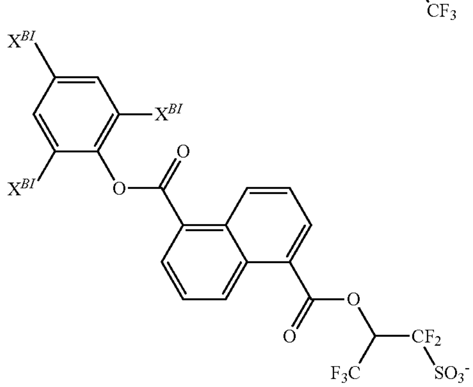
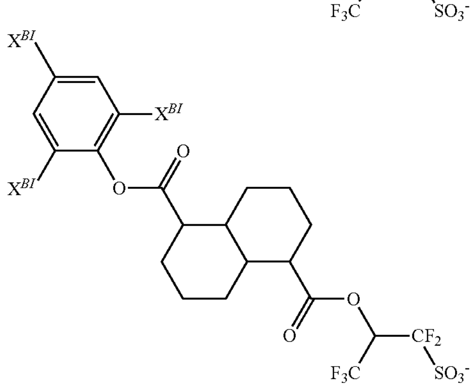
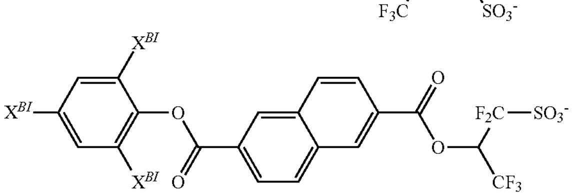
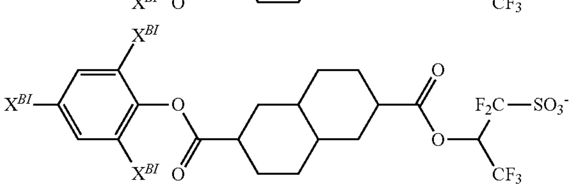
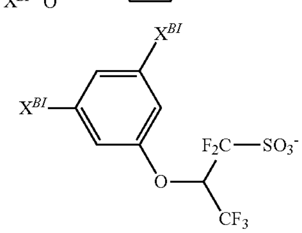
-continued
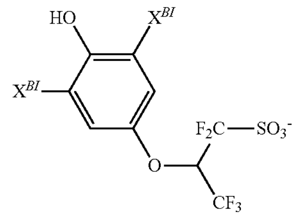
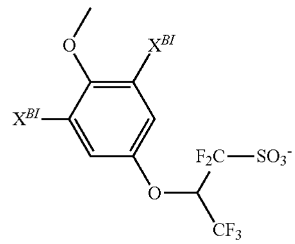
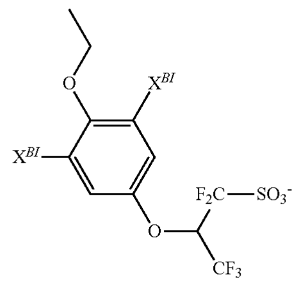
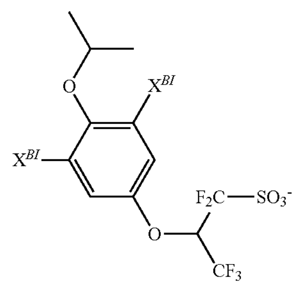
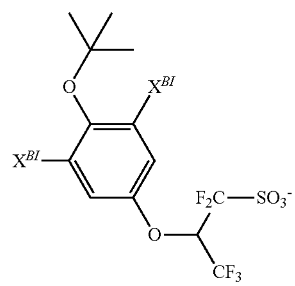
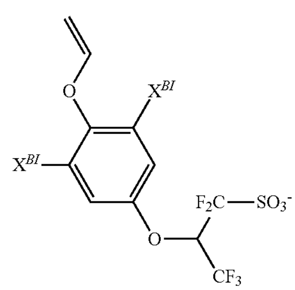

-continued
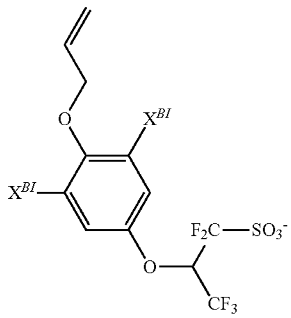
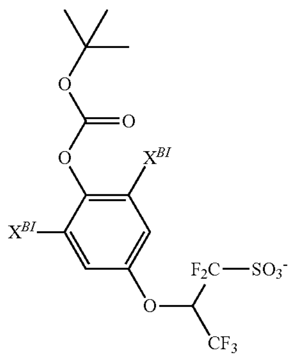
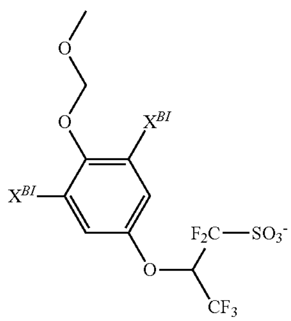
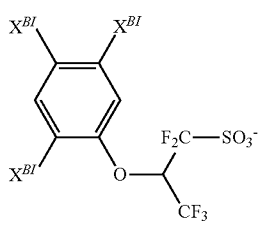
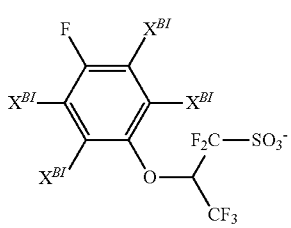
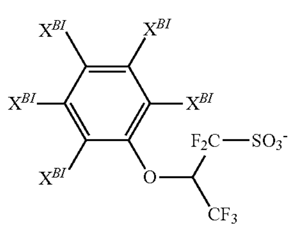
-continued
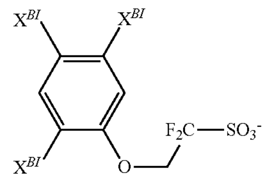
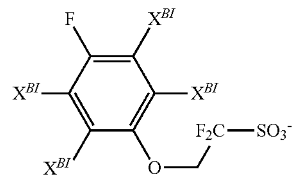
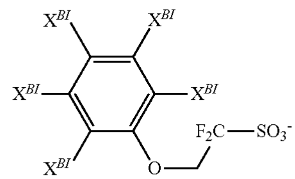
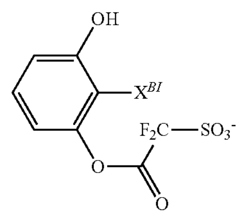
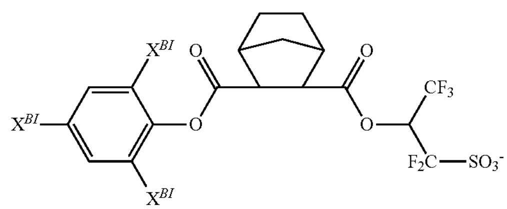
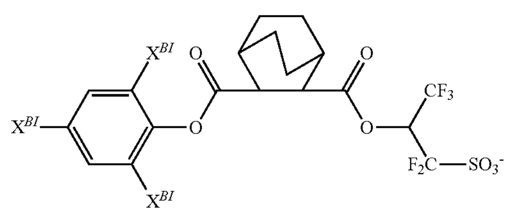
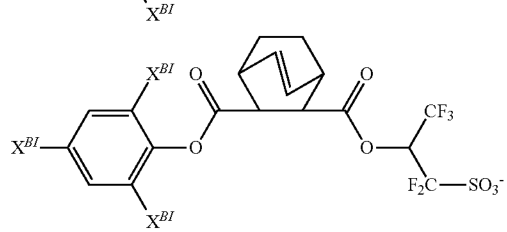
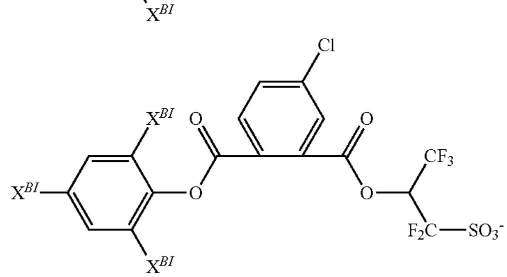

-continued
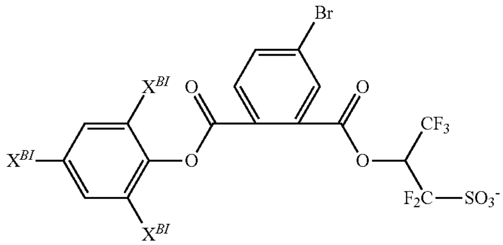
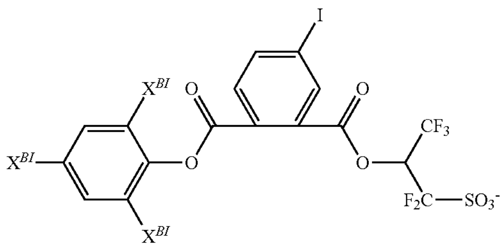
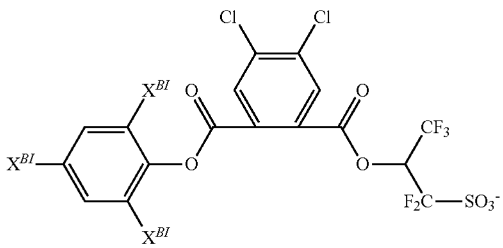
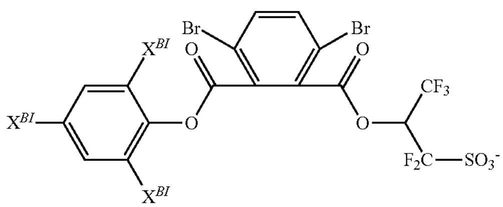
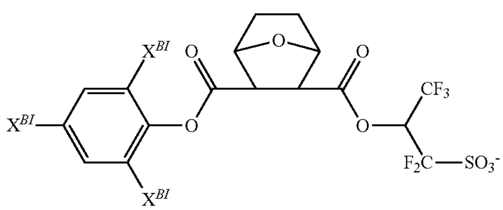
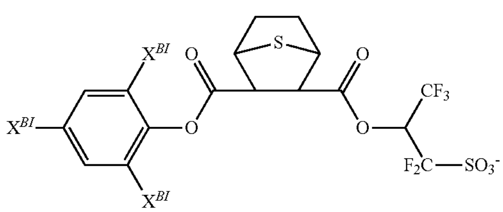
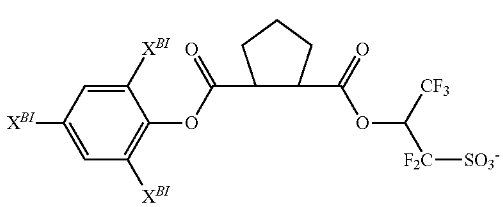
-continued
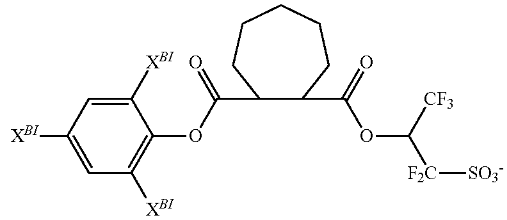
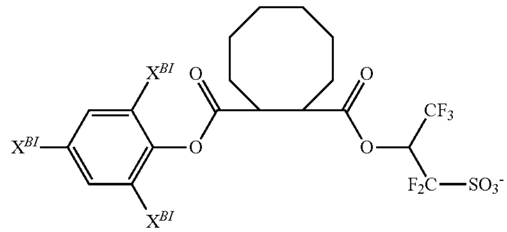
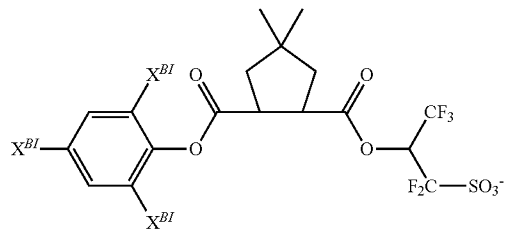
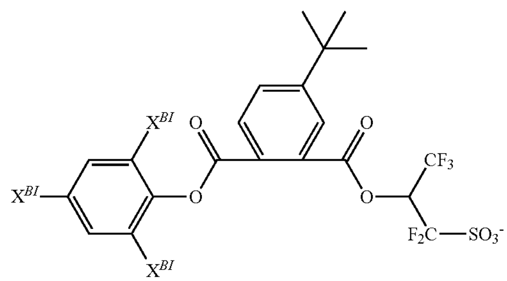
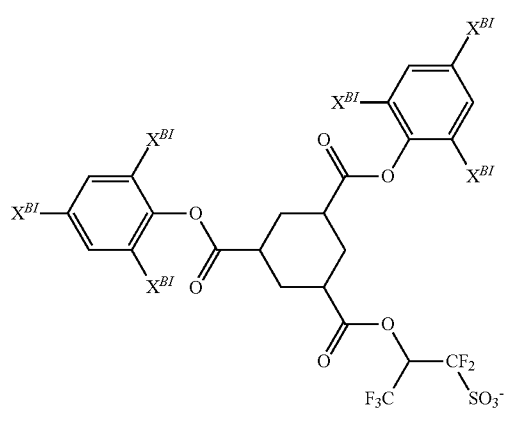

-continued
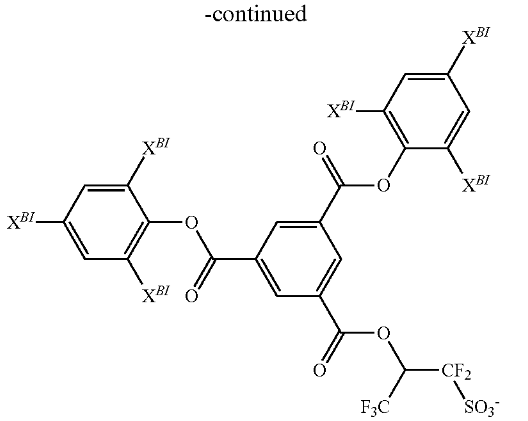
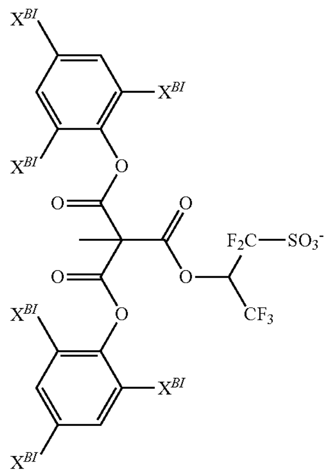
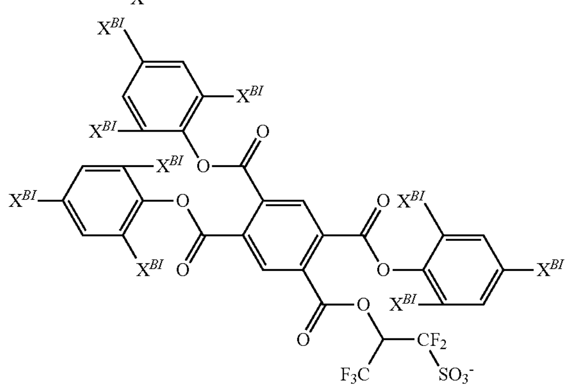
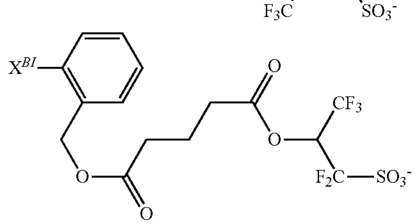
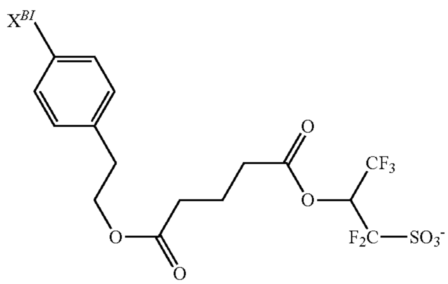
-continued
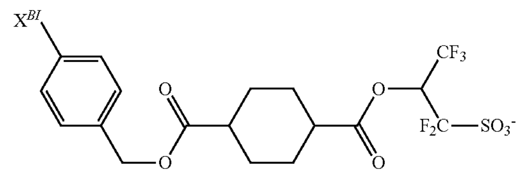
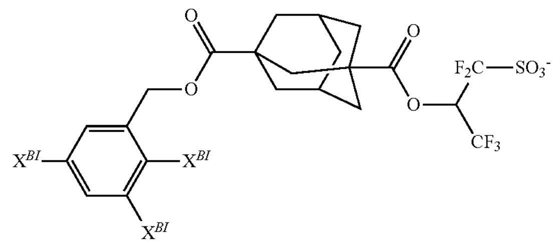
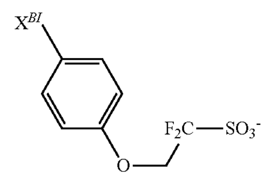
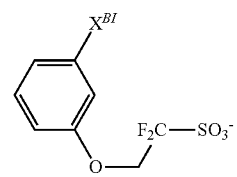
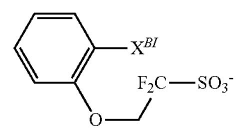
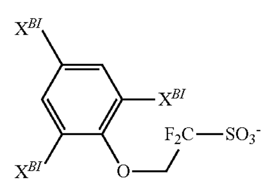
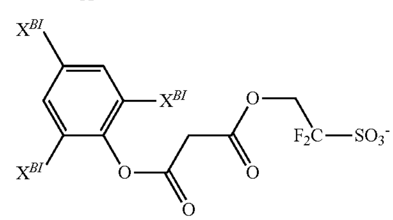
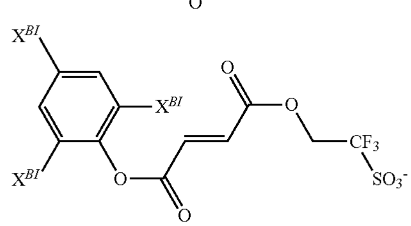
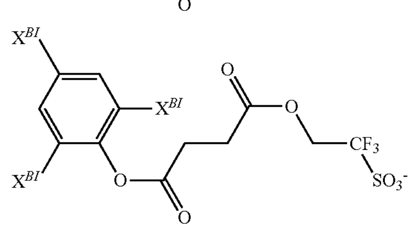

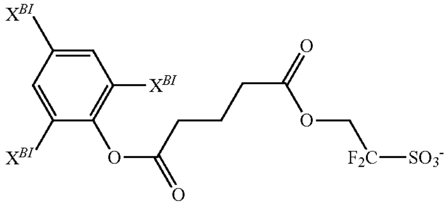
$X^{BI}$
$X^{BI}$
$X^{BI}$
O
O
O
O
$F_2C$—$SO_3^-$

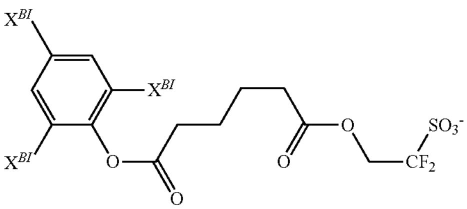
$X^{BI}$
$X^{BI}$
$X^{BI}$
O
O
O
O
$SO_3^-$
$CF_2$

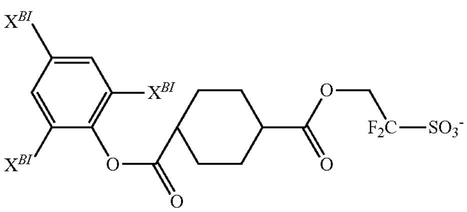
$X^{BI}$
$X^{BI}$
$X^{BI}$
O
O
O
O
$F_2C$—$SO_3^-$

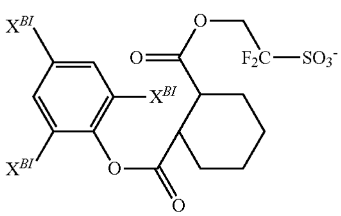
$X^{BI}$
$X^{BI}$
$X^{BI}$
O
O
O
O
$F_2C$—$SO_3^-$

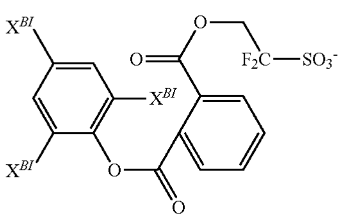
$X^{BI}$
$X^{BI}$
$X^{BI}$
O
O
O
O
$F_2C$—$SO_3^-$

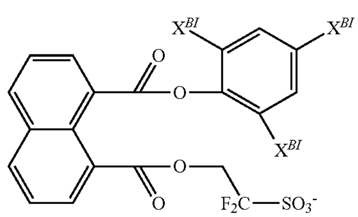
$X^{BI}$
$X^{BI}$
$X^{BI}$
O
O
O
O
$F_2C$—$SO_3^-$

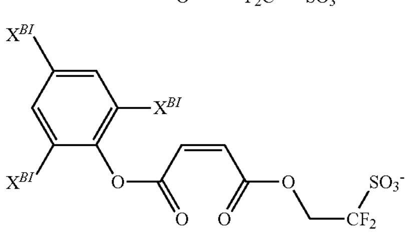
$X^{BI}$
$X^{BI}$
$X^{BI}$
O
O
O
O
$SO_3^-$
$CF_2$

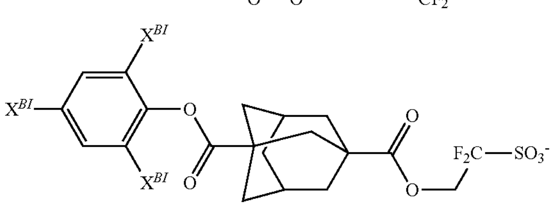
$X^{BI}$
$X^{BI}$
$X^{BI}$
O
O
O
O
$F_2C$—$SO_3^-$

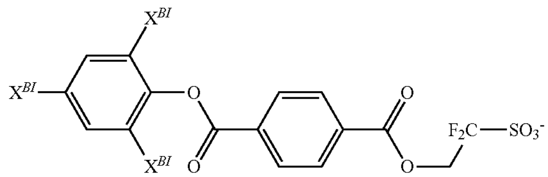
$X^{BI}$
$X^{BI}$
$X^{BI}$
O
O
O
O
$F_2C$—$SO_3^-$

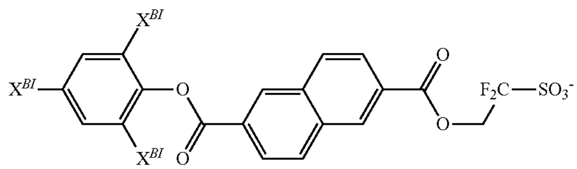
$X^{BI}$
$X^{BI}$
$X^{BI}$
O
O
O
O
$F_2C$—$SO_3^-$

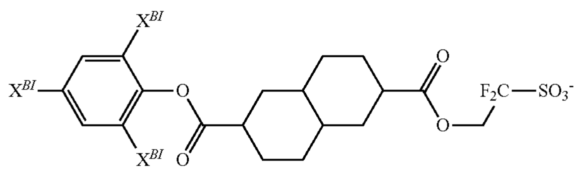
$X^{BI}$
$X^{BI}$
$X^{BI}$
O
O
O
O
$F_2C$—$SO_3^-$

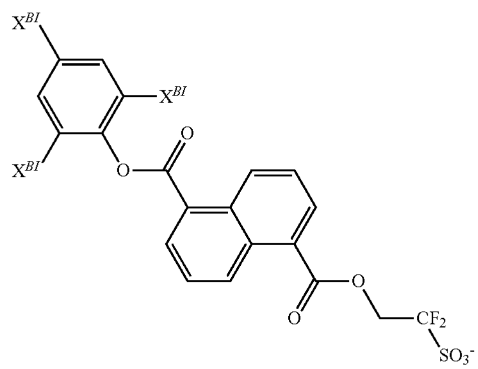
$X^{BI}$
$X^{BI}$
$X^{BI}$
O
O
O
O
$CF_2$
$SO_3^-$

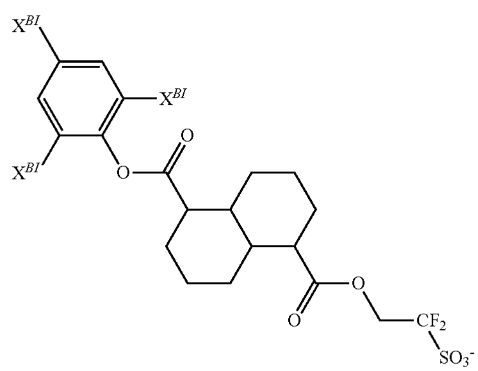
$X^{BI}$
$X^{BI}$
$X^{BI}$
O
O
O
O
$CF_2$
$SO_3^-$

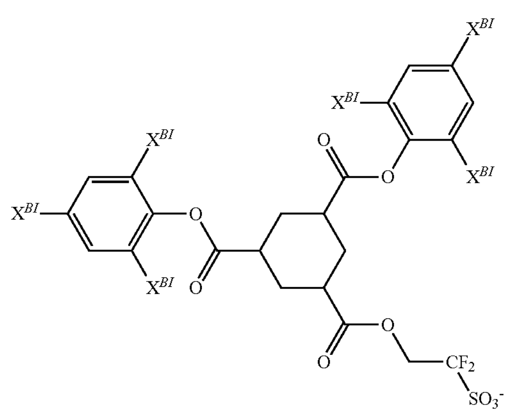
$X^{BI}$
$X^{BI}$
$X^{BI}$
$X^{BI}$
$X^{BI}$
$X^{BI}$
O
O
O
O
O
O
$CF_2$
$SO_3^-$ -continued
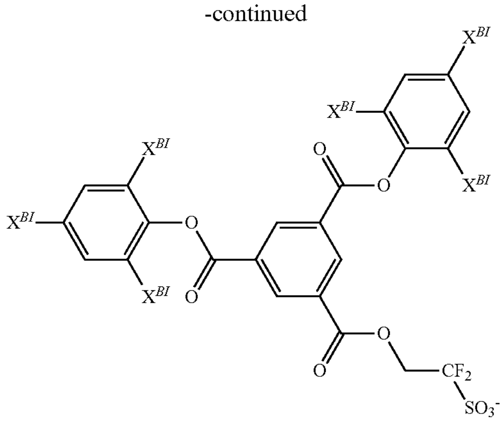
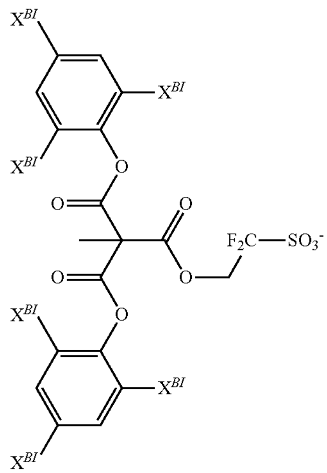
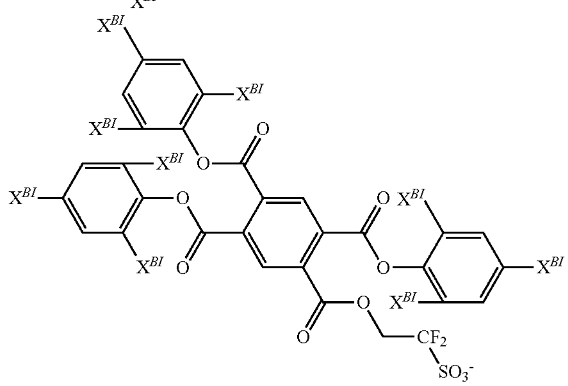
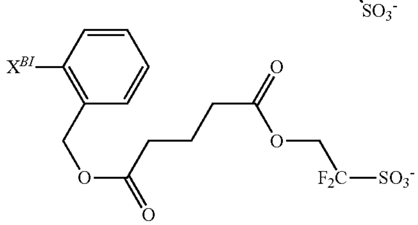
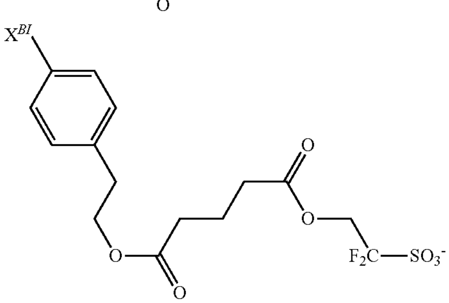
-continued
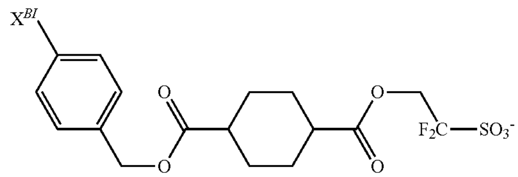
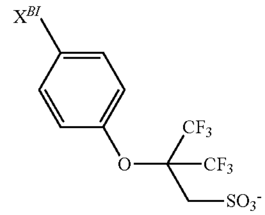
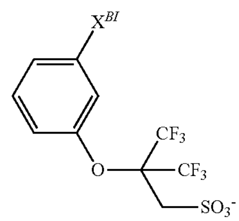
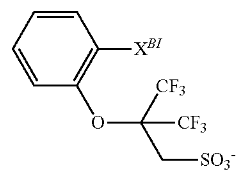
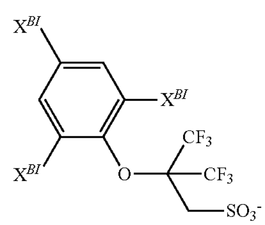
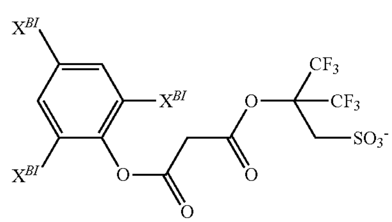
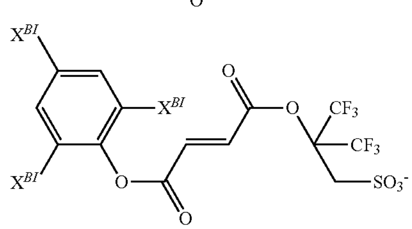
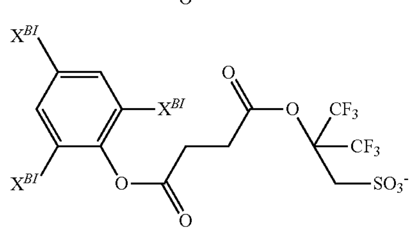

-continued
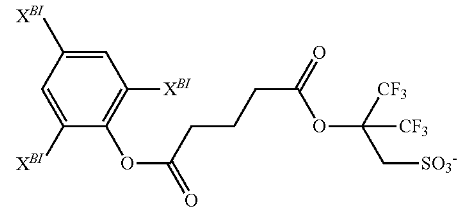
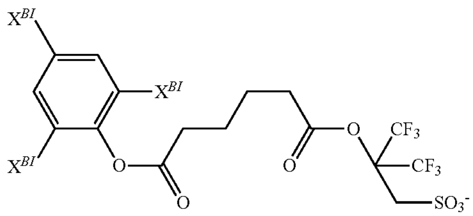
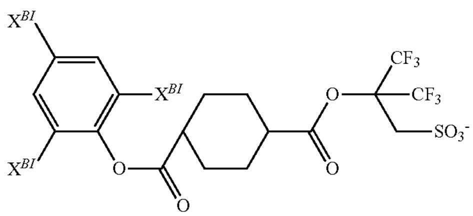
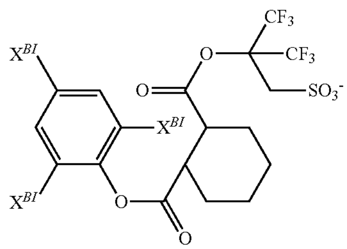
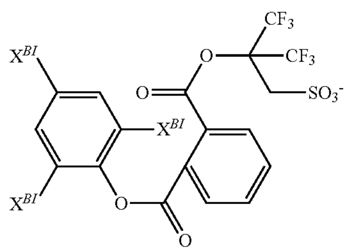
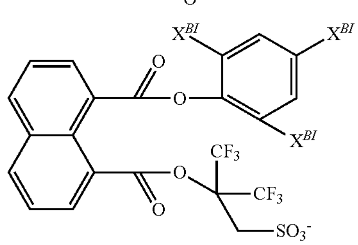
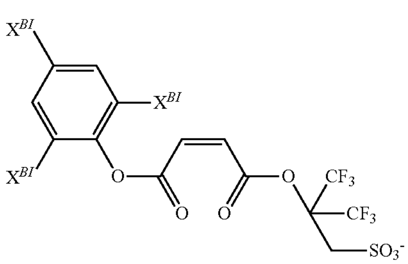
-continued
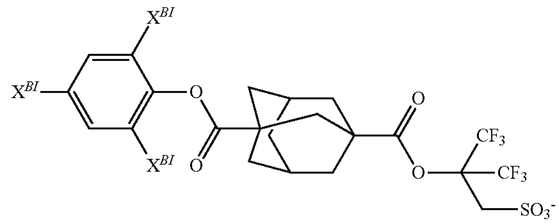
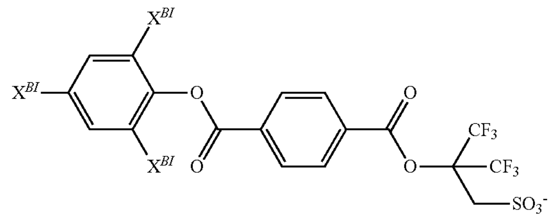
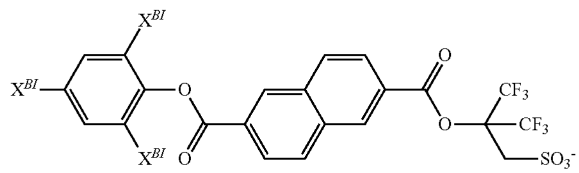
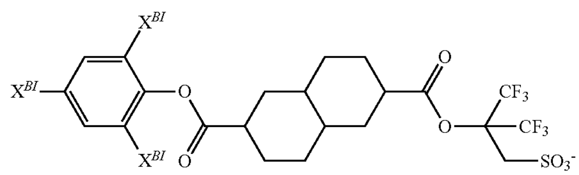
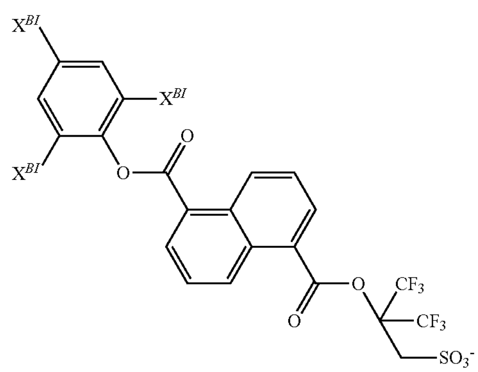
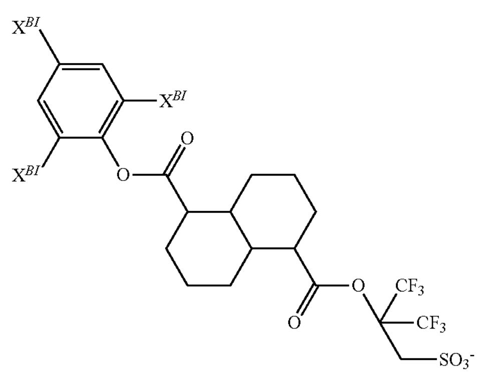

-continued

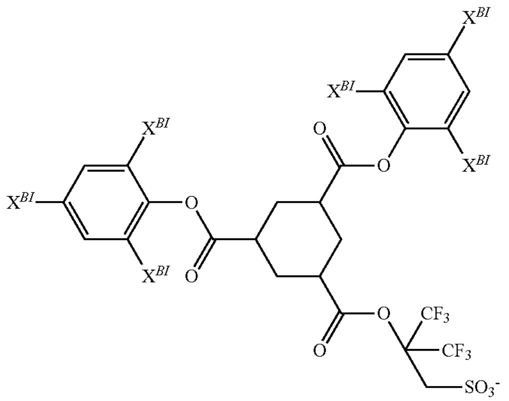

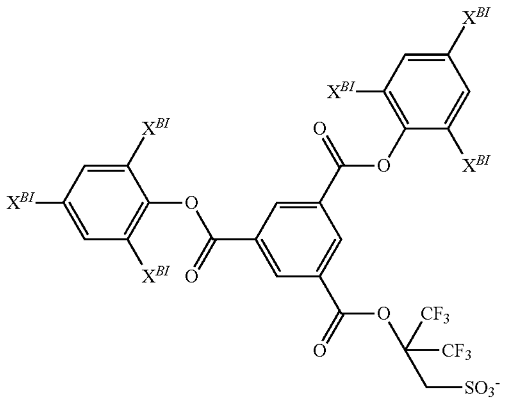

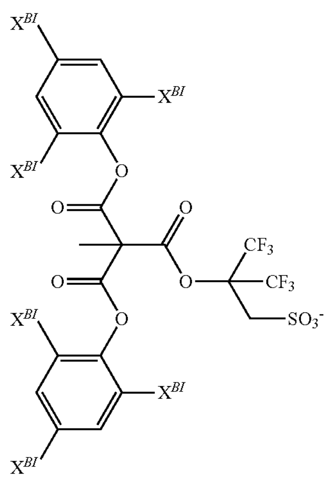

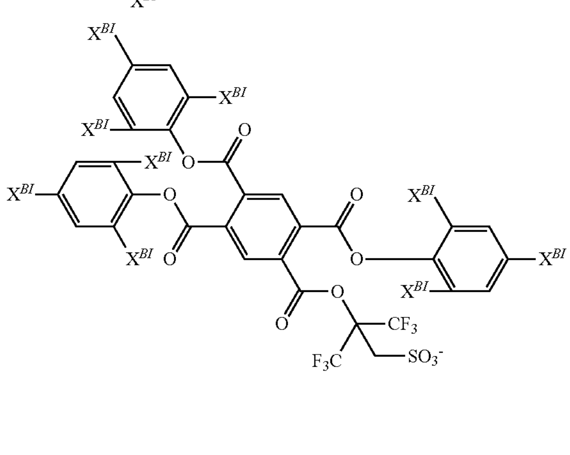

-continued

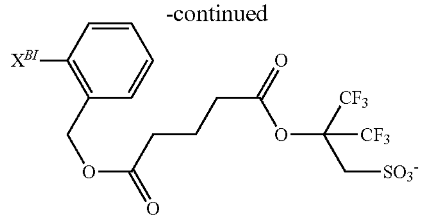

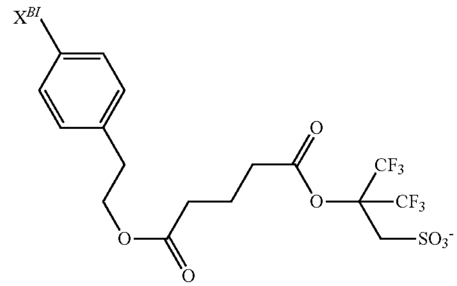

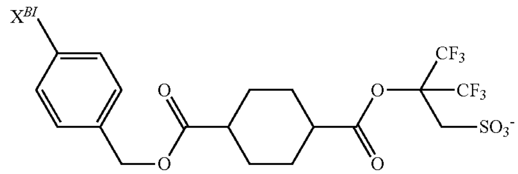

When used, the acid generator of addition type is preferably added in an amount of 0.1 to 50 parts, and more preferably 1 to 40 parts by weight per 100 parts by weight of the base polymer. The resist composition functions as a chemically amplified resist composition when the base polymer includes recurring units (f) and/or the resist composition contains the acid generator of addition type.

Organic Solvent

The resist composition may contain an organic solvent. The organic solvent used herein is not particularly limited as long as the foregoing and other components are soluble therein. Examples of the organic solvent are described in JP-A 2008-111103, paragraphs [0144]-[0145]. Exemplary solvents include ketones such as cyclohexanone, cyclopentanone, methyl-2-n-pentyl ketone, and 2-heptanone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone.

The organic solvent is preferably added in an amount of 100 to 10,000 parts, and more preferably 200 to 8,000 parts by weight per 100 parts by weight of the base polymer. The organic solvents may be used alone or in admixture.

Other Components

With the foregoing components, other components such as a quencher other than the salt compound having the formula (A) (hereinafter also referred to as the other quencher), a surfactant, a dissolution inhibitor, and a cross-linker may be blended in any desired combination to formulate a positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl group, ether bond, ester bond, lactone ring, cyano group, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts, and ammonium salts of sulfonic acids which are not fluorinated at $\alpha$-position as described in JP-A 2008-158339 and similar onium salts of carboxylic acid may also be used as the other quencher. While an $\alpha$-fluorinated sulfonic acid, an imide acid, and a methide acid are necessary to deprotect the acid labile group of carboxylic acid ester, an $\alpha$-non-fluorinated sulfonic acid and a carboxylic acid are released by salt exchange with an $\alpha$-non-fluorinated onium salt. An $\alpha$-non-fluorinated sulfonic acid and a carboxylic acid function as a quencher because they do not induce deprotection reaction.

Also useful are quenchers of polymer type as described in U.S. Pat. No. 7,598,016 (JP-A 2008-239918). The polymeric quencher segregates at the resist surface and thus enhances the rectangularity of resist pattern. When a protective film is applied as is often the case in the immersion lithography, the polymeric quencher is also effective for preventing a film thickness loss of resist pattern or rounding of pattern top.

In a case where the resist composition contains the other quencher, the other quencher is preferably added in an amount of 0 to 5 parts by weight, more preferably 0 to 4 parts by weight per 100 parts by weight of the base polymer. The other quencher may be used alone or in admixture.

Exemplary surfactants are described in JP-A 2008-111103, paragraphs [0165]-[0166]. Inclusion of a surfactant may improve or control the coating characteristics of the resist composition. In a case where the resist composition contains the surfactant, the surfactant is preferably added in an amount of 0.0001 to 10 parts by weight per 100 parts by weight of the base polymer. The surfactant may be used alone or in admixture.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In a case where the positive resist composition contains the dissolution inhibitor, the dissolution inhibitor is preferably added in an amount of 0 to 50 parts by weight, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of the epoxy compound include tris(2,3-epoxypropyl) isocyanurate, trimethylolmethane triglycidyl ether, trimethylolpropane triglycidyl ether, and triethylolethane triglycidyl ether.

Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof.

Examples of the guanamine compound include tetramethylol guanamine, tetramethoxymethyl guanamine, tetramethylol guanamine compounds having 1 to 4 methylol groups methoxymethylated and mixtures thereof tetramethoxyethyl guanamine, tetraacyloxyguanamine, tetramethylol guanamine compounds having 1 to 4 methylol groups acyloxymethylated and mixtures thereof.

Examples of the glycoluril compound include tetramethylol glycoluril, tetramethoxyglycoluril, tetramethoxymethyl glycolurid, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylolurea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate.

Suitable azide compounds include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In a case where the negative resist composition contains the crosslinker, the crosslinker is preferably added in an amount of 0.1 to 50 parts by weight, more preferably 1 to 40 parts by weight per 100 parts by weight of the base polymer. The crosslinker may be used alone or in admixture.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during post exposure bake (PEB), thus preventing any hole pattern opening failure after development. In a case where the resist composition contains the water repellency improver, the water repellency improver is preferably added in an amount of 0 to 20 parts by weight, more preferably 0.5 to 10 parts by weight per 100 parts by weight of the base polymer. The water repellency improver may be used alone or in admixture.

Also, an acetylene alcohol may be blended in the resist composition. Suitable acetylene alcohols are described in JP-A 2008-122932, paragraphs [0179]-[0182]. In a case where the resist composition contains the acetylene alcohol, the acetylene alcohol is preferably added in an amount of 0 to 5 parts by weight per 100 parts by weight of the base polymer. The acetylene alcohol may be used alone or in admixture.

Pattern Forming Process

The resist composition is used in the fabrication of various integrated circuits. Pattern formation using the resist composition may be performed by well-known lithography processes. The pattern forming process generally involves the steps of applying the resist composition onto a substrate to form a resist film thereon, exposing the resist film to high-energy radiation, and developing the exposed resist film in a developer.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The resulting resist film is generally 0.01 to 2 μm thick. The coating is prebaked on a hot plate preferably at 60 to 150° C. for 10 seconds to 30 minutes, more preferably at 80 to 120° C. for 30 seconds to 20 minutes to form a resist film.

Then the resist film is exposed to high-energy radiation. Examples of the high-energy radiation include ultraviolet (UV), deep-UV, EB, EUV of wavelength 3 to 15 nm, x-ray, soft x-ray, excimer laser radiation, γ-ray, and synchrotron radiation. When UV, deep-UV, EUV, x-ray, soft x-ray, excimer laser radiation, γ-ray, or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially EB or EUV.

After the exposure, the resist film may be baked (PEB) on a hotplate or in an oven preferably at 60 to 150° C. for 10 seconds to 30 minutes, more preferably at 80 to 120° C. for 30 seconds to 20 minutes.

After the exposure or PEB, the resist film is developed in a developer in the form of an alkali aqueous solution for 3 seconds to 3 minutes, preferably 5 seconds to 2 minutes by conventional techniques such as dip, puddle, and spray techniques thereby forming a desired pattern. A typical developer is a 0.1 to 10 wt %, preferably 2 to 5 wt % aqueous solution of tetramethylammonium hydroxide (TMAH), tetraethylammonium hydroxide, tetrapropylammonium hydroxide, or tetrabutylammonium hydroxide. In the case of positive resist, the resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a positive resist composition comprising a base polymer having an acid labile group is used for negative development to form a negative pattern via organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof. The solvents may be used alone or in admixture.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents.

Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether.

Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne.

Suitable aromatic solvents include toluene, xylene, ethylbenzene, isopropylbenzene, t-butylbenzene and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist film during bake, and the shrink agent may attach to the sidewall of the hole pattern. The bake is preferably at a temperature of 70 to 180° C., more preferably 80 to 170° C., preferably for a time of 10 to 300 seconds. The extra shrink agent is stripped and the hole pattern is shrunk.

EXAMPLES

Examples of the invention are given below by way of illustration and not by way of limitation.

Quenchers Q-1 to Q-40 used in resist compositions have the structure shown below.

Q-1

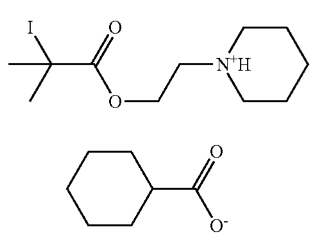

Q-2

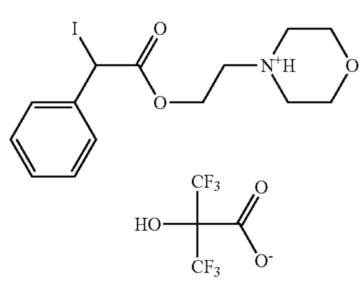

-continued

Q-3

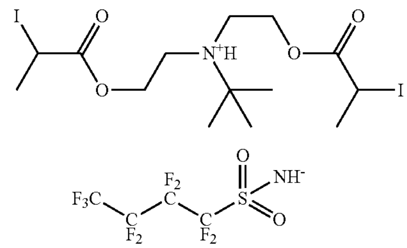

Q-4

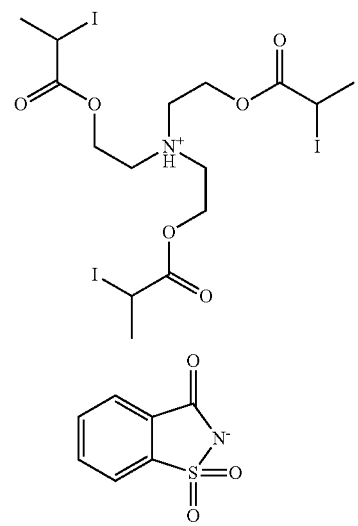

Q-5

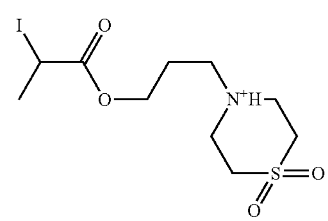

Q-6

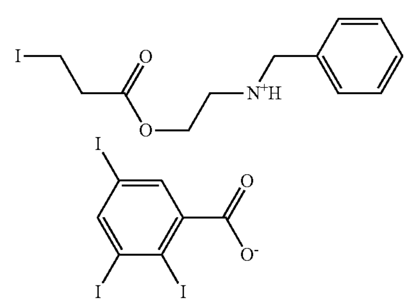

-continued
Q-7
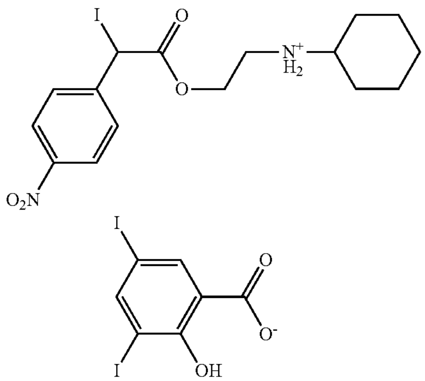
Q-8
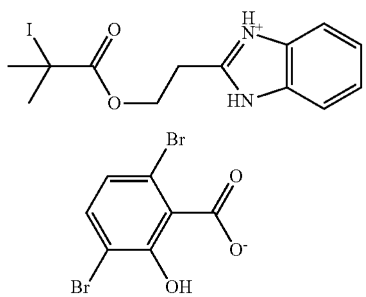
Q-9
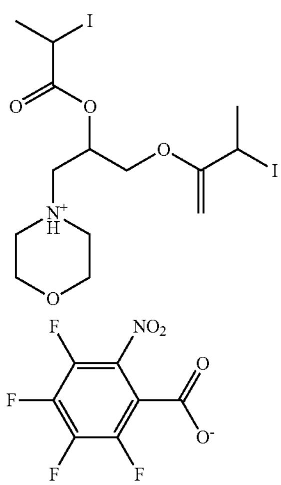
Q-10
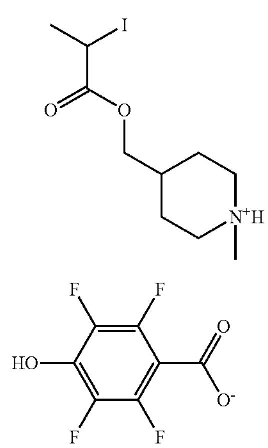
-continued
Q-11
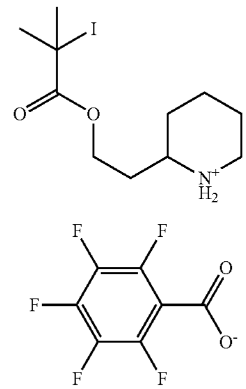
Q-12
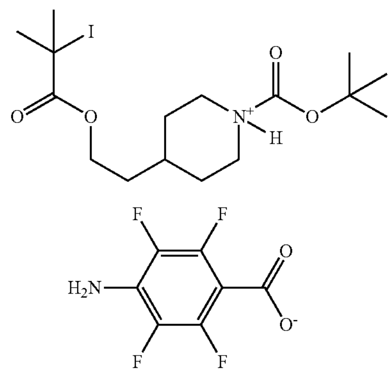
Q-13
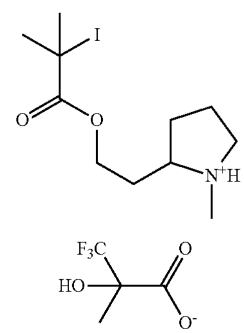
Q-14
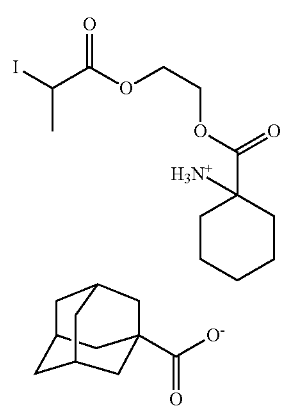

-continued
Q-15
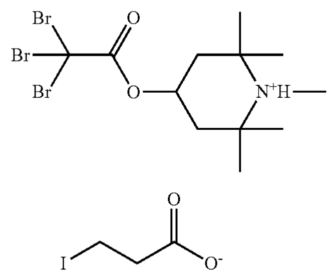
Q-16
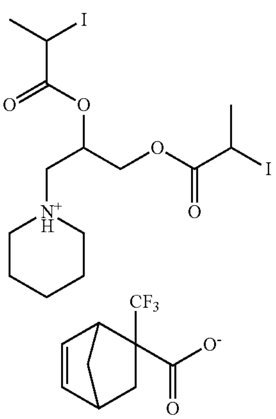
Q-17
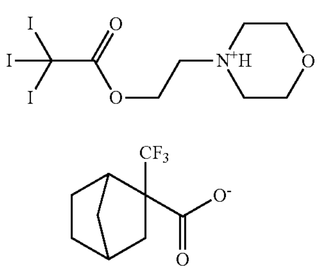
Q-18
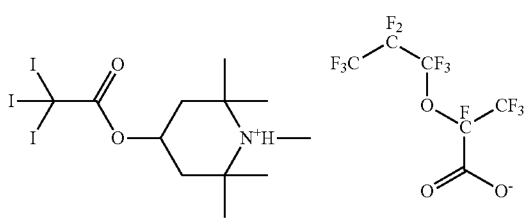
Q-19
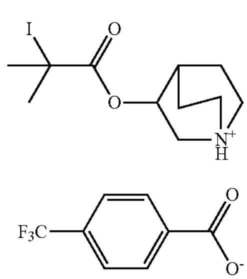
-continued
Q-20
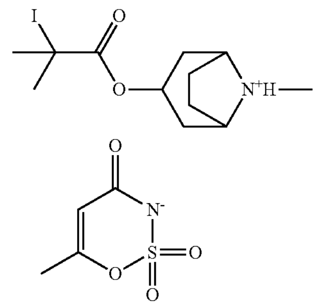
Q-21
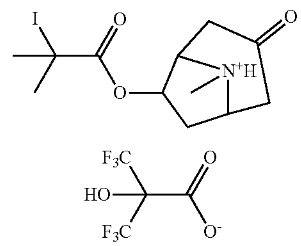
Q-22
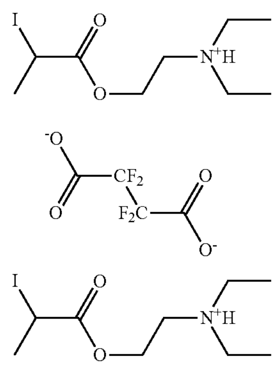
Q-23
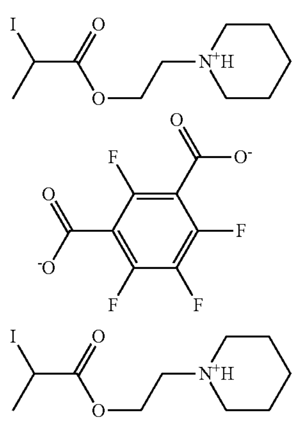

-continued
Q-24
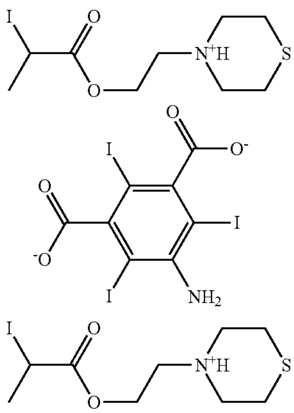
Q-25
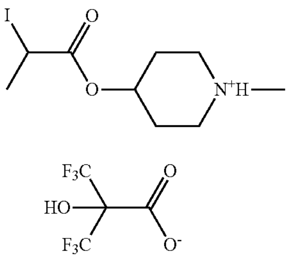
Q-26
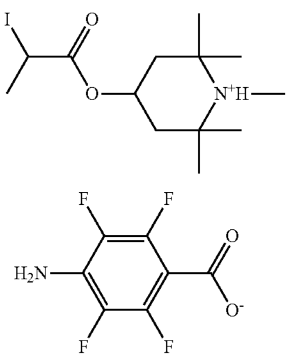
Q-27
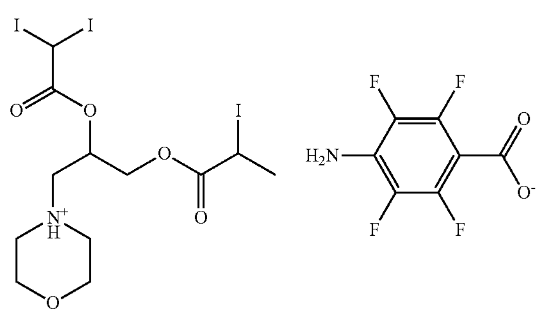
Q-28
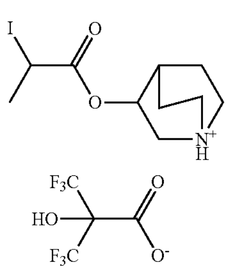
-continued
Q-29
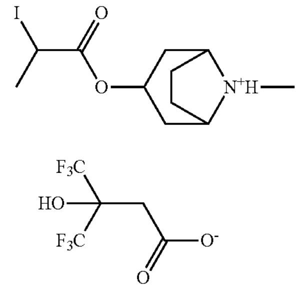
Q-30
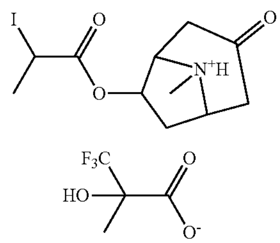
Q-31
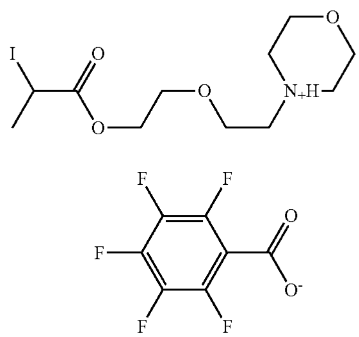
Q-32
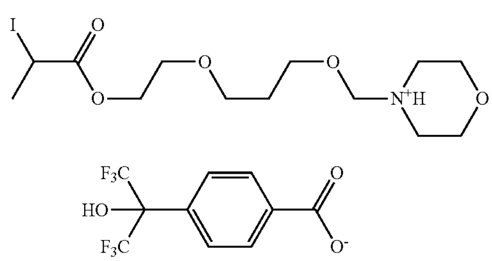
Q-33
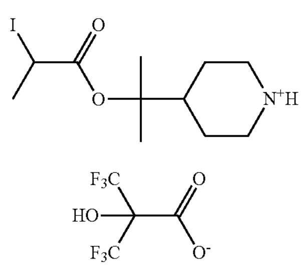

-continued

Q-34

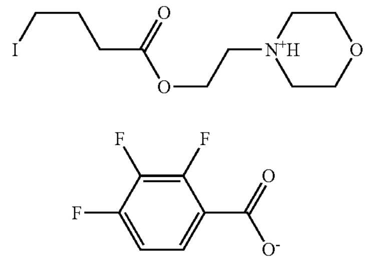

Q-35

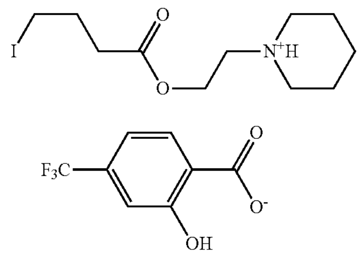

Q-36

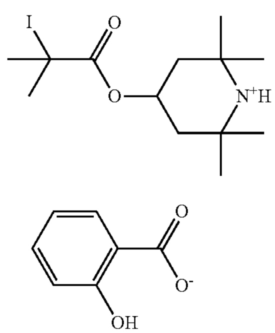

Q-37

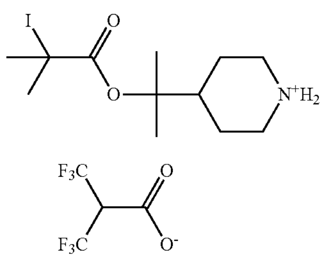

Q-38

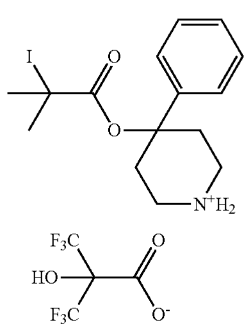

-continued

Q-39

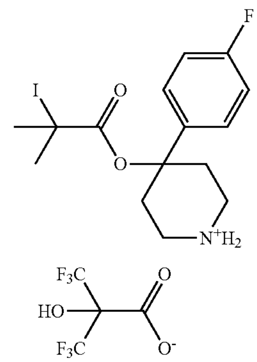

Q-40

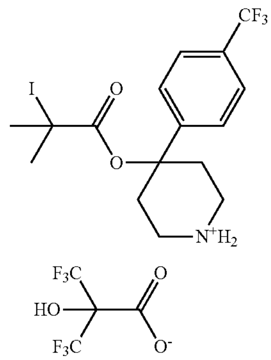

Synthesis Example

Synthesis of Base Polymers (P-1 to P-4)

Base polymers (P-1 to P-4) were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 4, were analyzed for composition by $^{1}$H-NMR spectroscopy, and for Mw and Mw/Mn by GPC versus polystyrene standards using THF solvent.

P-1

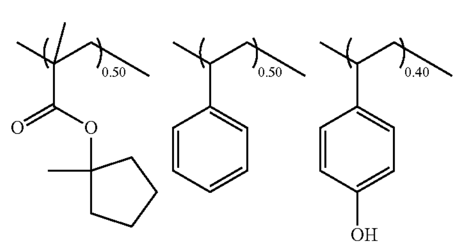

Mw = 8,600
Mw/Mn = 1.73

-continued

P-2

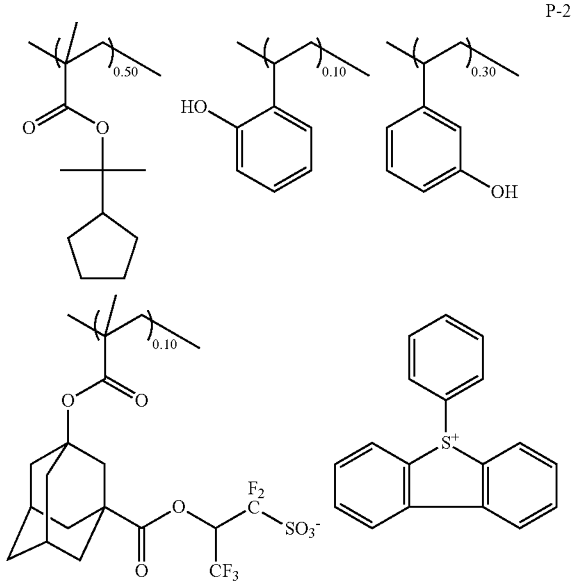

Mw = 8,900
Mw/Mn = 1.82

P-3

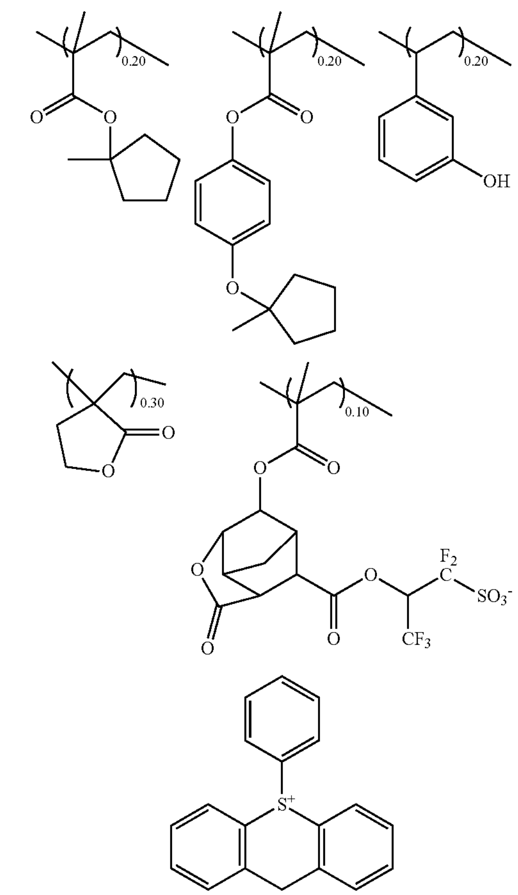

Mw = 7,900
Mw/Mn = 1.81

-continued

P-4

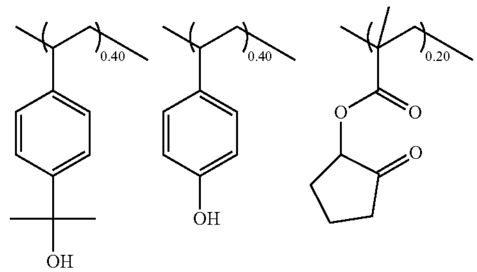

Mw = 6,900
Mw/Mn = 1.62

Examples 1 to 48 and Comparative Examples 1 to 3

(1) Preparation of Resist Compositions

Resist compositions were prepared by dissolving components in a solvent in accordance with the recipe shown in Tables 1 to 3, and filtering through a filter having a pore size of 0.2 μm. The solvent contained 100 ppm of surfactant PolyFox PF-636 (Omnova Solutions Inc.). The resist compositions of Examples 1 to 47 and Comparative Examples 1 and 2 were of positive tone, while the resist compositions of Example 48 and Comparative Example 3 were of negative tone.

The components in Tables 1 to 3 are as identified below.

Organic solvents: PGMEA (propylene glycol monomethyl ether acetate)

DAA (diacetone alcohol)

Acid generator: PAG-1 to PAG-5

PAG-1

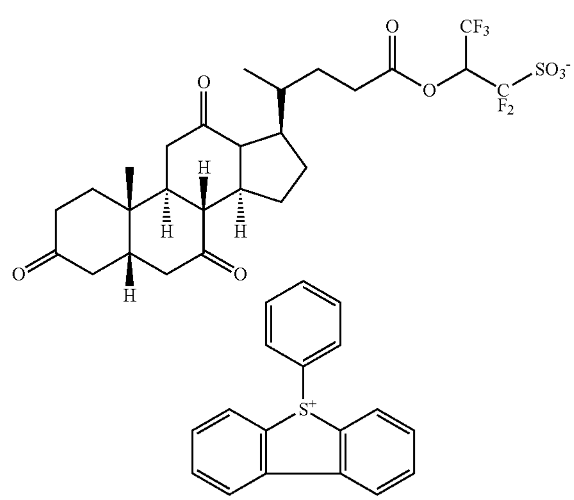

-continued

PAG-2

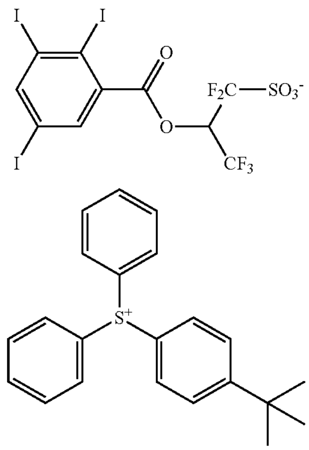

PAG-3

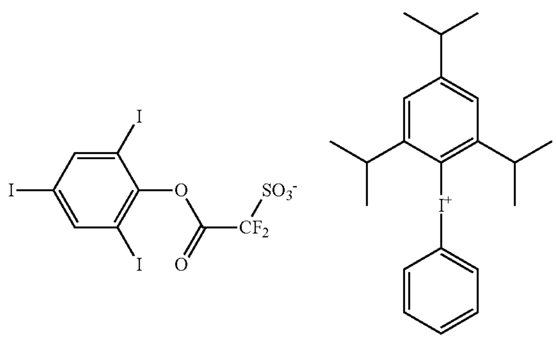

PAG-4

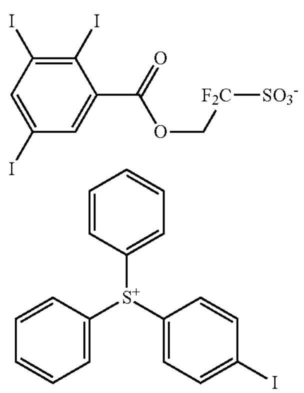

PAG-5

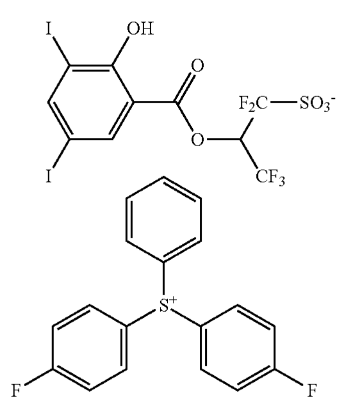

-continued

Blend quencher: bQ-1 to bQ-3 bQ-1

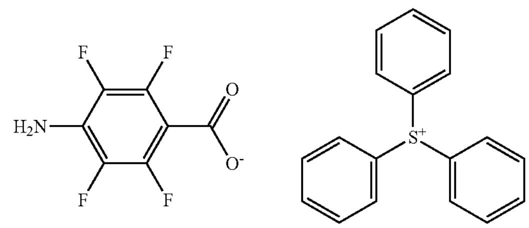

bQ-2

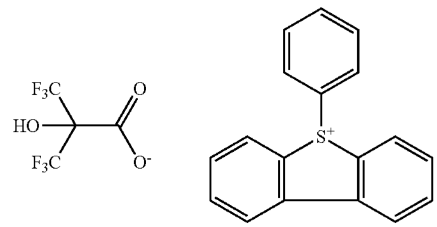

bQ-3

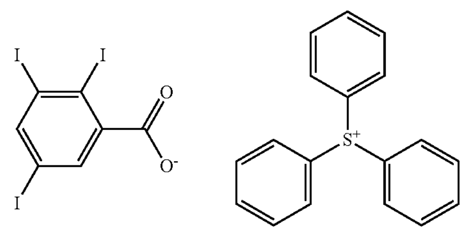

Comparison quencher: cQ-1, cQ-2 cQ-1

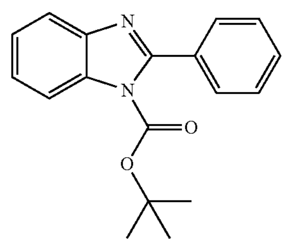

cQ-2

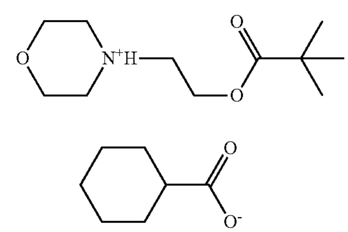

(2) EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed through a mask bearing a hole pattern at a pitch 46 nm (on-wafer size) and +20% bias. The resist film was baked (PEB) on a hotplate at the temperature shown in Tables 1 to 3 for 60 seconds and developed in a 2.38 wt % TMAH aqueous solution for 30 seconds to form a hole pattern having a size of 23 nm in Examples 1 to 47 and Comparative Examples 1 and 2 or a dot pattern having a size of 23 nm in Example 48 and Comparative Example 3.

The resist pattern was observed under CD-SEM (CG-5000. Hitachi High-Technologies Corp.). The exposure dose that provides a hole or dot pattern having a size of 23 nm is reported as sensitivity. The size of 50 holes or dots at that dose was measured, from which the standard deviation (σ) was calculated, and the value of three times of the standard deviation (3σ) was reported as the size variation (CDU).

The resist composition is shown in Tables 1 to 3 together with the sensitivity and CDU of EUV lithography.

TABLE 1

| Example | Polymer (pbw) | Acid generator (pbw) | Quencher (pbw) | Organic solvent (pbw) | PEB temp. (° C) | Sensitivity (mJ/cm$^2$) | CDU (nm) |
|---|---|---|---|---|---|---|---|
| 1 | P-1 (100) | PAG-1 (26.3) | Q-1 (4.53) | PGMEA (3,500) DAA (500) | 80 | 29 | 2.8 |
| 2 | P-1 (100) | PAG-2 (30.9) | Q-2 (5.87) | PGMEA (3,500) DAA (500) | 80 | 26 | 2.6 |
| 3 | P-1 (100) | PAG-2 (30.9) | Q-3 (8.24) | PGMEA (3,500) DAA (500) | 80 | 24 | 2.6 |
| 4 | P-1 (100) | PAG-2 (30.9) | Q-4 (8.78) | PGMEA (3,500) DAA (500) | 80 | 23 | 2.5 |
| 5 | P-1 (100) | PAG-2 (30.9) | Q-5 (5.03) | PGMEA (3,500) DAA (500) | 80 | 21 | 2.9 |
| 6 | P-1 (100) | PAG-2 (30.9) | Q-6 (8.32) | PGMEA (3,500) DAA (500) | 80 | 23 | 2.5 |
| 7 | P-1 (100) | PAG-2 (30.9) | Q-7 (8.22) | PGMEA (3,500) DAA (500) | 80 | 25 | 2.4 |
| 8 | P-1 (100) | PAG-2 (30.9) | Q-8 (6.54) | PGMEA (3,500) DAA (500) | 80 | 26 | 2.6 |
| 9 | P-1 (100) | PAG-2 (30.9) | Q-9 (7.64) | PGMEA (3,500) DAA (500) | 80 | 25 | 2.5 |
| 10 | P-1 (100) | PAG-2 (30.9) | Q-10 (5.20) | PGMEA (3,500) DAA (500) | 80 | 27 | 2.7 |
| 11 | P-1 (100) | PAG-2 (30.9) | Q-11 (5.36) | PGMEA (3,500) DAA (500) | 80 | 28 | 2.5 |
| 12 | P-1 (100) | PAG-3 (31.8) | Q-12 (6.33) | PGMEA (3,500) DAA (500) | 80 | 26 | 2.8 |
| 13 | P-1 (100) | PAG-4 (31.0) | Q-13 (6.48) | PGMEA (3,500) DAA (500) | 80 | 27 | 2.7 |
| 14 | P-1 (100) | PAG-5 (27.5) | Q-14 (5.48) | PGMEA (3,500) DAA (500) | 80 | 28 | 2.6 |
| 15 | P-1 (100) | PAG-2 (30.9) | Q-15 (6.45) | PGMEA (3,500) DAA (500) | 80 | 25 | 2.7 |
| 16 | P-1 (100) | PAG-2 (30.9) | Q-16 (7.28) | PGMEA (3,500) DAA (500) | 80 | 24 | 2.5 |
| 17 | P-1 (100) | PAG-2 (30.9) | Q-17 (7.58) | PGMEA (3,500) DAA (500) | 80 | 23 | 2.3 |
| 18 | P-1 (100) | PAG-2 (30.9) | Q-18 (9.20) | PGMEA (3,500) DAA (500) | 80 | 24 | 2.3 |
| 19 | P-1 (100) | PAG-2 (30.9) | Q-19 (5.12) | PGMEA (3,500) DAA (500) | 80 | 26 | 2.7 |
| 20 | P-1 (100) | PAG-2 (30.9) | Q-20 (4.99) | PGMEA (3,500) DAA (500) | 80 | 27 | 2.6 |
| 21 | P-1 (100) | PAG-2 (30.9) | Q-21 (5.62) | PGMEA (3,500) DAA (500) | 80 | 24 | 2.5 |
| 22 | P-1 (100) | — | Q-22 (3.94) | PGMEA (3,500) DAA (500) | 80 | 23 | 2.7 |
| 23 | P-1 (100) | — | Q-23 (4.30) | PGMEA (3,500) DAA (500) | 80 | 22 | 2.8 |
| 24 | P-1 (100) | — | Q-24 (6.08) | PGMEA (3,500) DAA (500) | 80 | 21 | 2.6 |
| 25 | P-1 (100) | — | Q-25 (5.09) | PGMEA (3,500) DAA (500) | 80 | 25 | 2.4 |

TABLE 2

| Example | Polymer (pbw) | Acid generator (pbw) | Quencher (pbw) | Organic solvent (pbw) | PEB temp. (° C) | Sensitivity (mJ/cm$^2$) | CDU (nm) |
|---|---|---|---|---|---|---|---|
| 26 | P-1 (100) | — | Q-26 (5.62) | PGMEA (3,500) DAA (500) | 80 | 24 | 2.4 |
| 27 | P-1 (100) | — | Q-27 (9.57) | PGMEA (3,500) DAA (500) | 80 | 23. | 2.2 |
| 28 | P-1 (100) | — | Q-28 (5.21) | PGMEA (3,500) DAA (500) | 80 | 27 | 2.4 |
| 29 | P-1 (100) | — | Q-29 (5.49) | PGMEA (3,500) DAA (500) | 80 | 26 | 2.5 |
| 30 | P-1 (100) | — | Q-30 (4.95) | PGMEA (3,500) DAA (500) | 80 | 27 | 2.6 |

TABLE 2-continued

| Example | Polymer (pbw) | Acid generator (pbw) | Quencher (pbw) | Organic solvent (pbw) | PEB temp. (° C) | Sensitivity (mJ/cm$^2$) | CDU (nm) |
|---|---|---|---|---|---|---|---|
| 31 | P-1 (100) | — | Q-31 (5.69) | PGMEA (3,500) DAA (500) | 80 | 26 | 2.4 |
| 32 | P-1 (100) | — | Q-32 (6.89) | PGMEA (3,500) DAA (500) | 80 | 25 | 2.4 |
| 33 | P-1 (100) | — | Q-33 (5.37) | PGMEA (3,500) DAA (500) | 80 | 24 | 2.3 |
| 34 | P-1 (100) | — | Q-34 (5.03) | PGMEA (3,500) DAA (500) | 80 | 26 | 2.6 |
| 35 | P-1 (100) | — | Q-35 (5.31) | PGMEA (3,500) DAA (500) | 80 | 25 | 2.7 |
| 36 | P-1 (100) | — | Q-36 (5.05) | PGMEA (3,500) DAA (500) | 80 | 27 | 2.6 |
| 37 | P-1 (100) | — | Q-37 (5.35) | PGMEA (3,500) DAA (500) | 80 | 27 | 2.7 |
| 38 | P-2 (100) | — | Q-4 (8.78) | PGMEA (3,500) DAA (500) | 90 | 24 | 2.2 |
| 39 | P-3 (100) | — | Q-4 (8.78) | PGMEA (3,500) DAA (500) | 90 | 25 | 2.3 |
| 40 | P-3 (100) | — | Q-4 (4.39) bQ-1 (2.36) | PGMEA (3,500) DAA (500) | 90 | 23 | 2.2 |
| 41 | P-3 (100) | — | Q-4 (4.39) bQ-2 (2.36) | PGMEA (3,500) DAA (500) | 90 | 24 | 2.1 |
| 42 | P-3 (100) | — | Q-4 (4.39) bQ-3 (3.81) | PGMEA (3,500) DAA (500) | 90 | 22 | 2.2 |
| 43 | P-3 (100) | PAG-2 (10.3) | Q-4 (8.78) | PGMEA (3,500) DAA (500) | 90 | 20 | 2.7 |
| 44 | P-3 (100) | PAG-4 (15) | Q-4 (8.78) | PGMEA (3,500) DAA (500) | 90 | 21 | 2.8 |
| 45 | P-3 (100) | — | Q-38 (2.93) bQ-1 (2.36) | PGMEA (3,500) DAA (500) | 90 | 25 | 2.3 |
| 46 | P-3 (100) | — | Q-39 (3.02) bQ-2 (2.36) | PGMEA (3,500) DAA (500) | 90 | 22 | 2.3 |
| 47 | P-3 (100) | — | Q-40 (3.27) bQ-3 (3.81) | PGMEA (3,500) DAA (500) | 90 | 21 | 2.4 |
| 48 | P-4 (100) | PAG-1 (20) | Q-4 (8.78) | PGMEA (3,500) DAA (500) | 120 | 29 | 3.3 |

TABLE 3

| Comparative Example | Polymer (pbw) | Acid generator (pbw) | Quencher (pbw) | Organic solvent (pbw) | PEB temp. (° C) | Sensitivity (mJ/cm$^2$) | CDU (nm) |
|---|---|---|---|---|---|---|---|
| 1 | P-1 (100) | PAG-1 (26.3) | cQ-1 (2.94) | PGMEA (3,500) DAA (500) | 90 | 35 | 3.5 |
| 2 | P-1 (100) | PAG-1 (26.3) | cQ-2 (3.41) | PGMEA (3,500) DAA (500) | 90 | 37 | 3.2 |
| 3 | P-4 (100) | PAG-1 (20) | cQ-1 (2.94) | PGMEA (3,500) DAA (500) | 120 | 38 | 4.9 |

It is demonstrated in Tables 1 to 3 that resist compositions comprising the salt compound having the formula (A) form patterns having a high sensitivity and reduced values of CDU.

Japanese Patent Application No. 2020-047897 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and a quencher containing a salt compound having the formula (A):

(A)

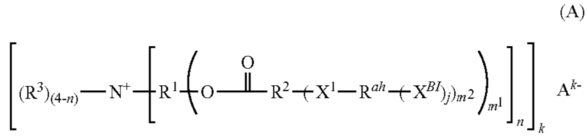

wherein $m^1$ is an integer of 1 or 2, $m^2$ is an integer of 1 to 3, n is an integer of 1 to 3, j is an integer of 1 to 3, k is an integer of 1 or 2, $X^{BI}$ is iodine or bromine, $R^{ah}$ is a $C_1$-$C_{20}$ (j+1)-valent aliphatic hydrocarbon group which may contain at least one selected from an ether bond, a carbonyl moiety, an ester bond, an amide bond, a sultone ring, a lactam ring, a carbonate moiety, a halogen other than iodine, a $C_6$-$C_{12}$ aryl moiety, a hydroxyl moiety, or a carboxyl moiety, $X^1$ is a single bond, an ether bond, an ester bond, an amide bond, a carbonyl group, or a carbonate group, $R^1$ is a single bond or a $C_1$-$C_{20}$ $(m^1+1)$-valent hydrocarbon group which may contain an ether bond, an ester bond, or a hydroxyl moiety, $R^2$ is a single bond or a $C_1$-$C_{20}$ $(m^2+1)$-valent hydrocarbon group which may contain at least one selected from an ether bond, a carbonyl moiety, an ester bond, an amide bond, a sultone ring, a lactam ring, a carbonate moiety, a halogen other than iodine, a hydroxyl moiety, or a carboxyl moiety, $R^3$ is hydrogen, a nitro group, a $C_1$-$C_{20}$ hydrocarbyl group, or a $C_2$-$C_{20}$ hydrocarbyloxycarbonyl group, the $C_1$-$C_{20}$ hydrocarbyl group or a hydrocarbyl moiety in the $C_2$-$C_{20}$ hydrocarbyloxycarbonyl group may contain at least one selected from a hydroxyl moiety, a carboxyl moiety, a thiol moiety, an ether bond, an ester bond, a sulfonyl moiety, a nitro moiety, a cyano moiety, a halogen, or an amino moiety, two $R^3$s in a case where n is 1, or $R^3$ and $R^1$ may bond together to form a ring with a nitrogen atom to which two $R^3$s or $R^3$ and $R^1$ are attached, the ring which may contain a double bond, oxygen, sulfur, or nitrogen, and $A^{k-}$ is a carboxylic acid anion, a sulfonimide anion free of fluorine, or a sulfonamide anion.

2. The resist composition of claim 1, further comprising an acid generator capable of generating a sulfonic acid, an imide acid, or a methide acid.

3. The resist composition of claim 1, further comprising an organic solvent.

4. The resist composition of claim 1, wherein the base polymer comprises recurring units having the formula (a1) or recurring units having the formula (a2):

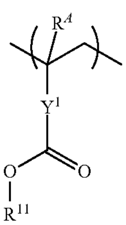

(a1)

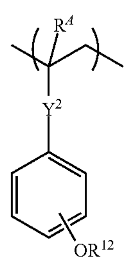

(a2)

wherein $R^A$ is each independently hydrogen or a methyl group, $R^{11}$ and $R^{12}$ are each independently an acid labile group, $Y^1$ is a single bond, a phenylene group, a naphthylene group, or a $C_1$-$C_{12}$ linking group containing at least one selected from an ester bond or a lactone ring, and $Y^2$ is a single bond or an ester bond.

5. The resist composition of claim 4 which is a chemically amplified positive resist composition.

6. The resist composition of claim 1, wherein the base polymer is free of an acid labile group.

7. The resist composition of claim 6 which is a chemically amplified negative resist composition.

8. The resist composition of claim 1, further comprising a surfactant.

9. The resist composition of claim 1, wherein the base polymer further comprises at least one type selected from recurring units having the formulae (f1) to (f3):

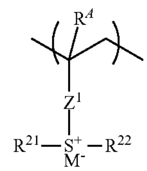

(f1)

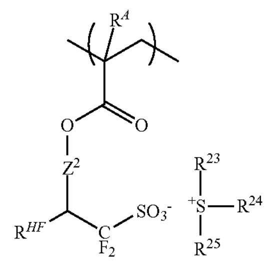

(f2)

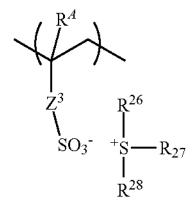

(f3)

wherein $R^A$ is each independently hydrogen or a methyl group, $Z^1$ is a single bond, a $C_1$-$C_6$ aliphatic hydrocarbylene group, a phenylene group, a naphthylene group, a $C_7$-$C_{18}$ combination thereof, —O—$Z^{11}$—, —C(═O)—O—$Z^{11}$—, or —C(═O)—NH—$Z^{11}$—, $Z^{11}$ is a $C_1$-$C_6$ aliphatic hydrocarbylene group, a phenylene group, a naphthylene group, or a $C_7$-$C_{18}$ combination thereof, which may contain a carbonyl moiety, an ester bond, an ether bond, or a hydroxyl moiety, $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ saturated hydrocarbylene group which may contain a carbonyl moiety, an ester bond, or an ether bond, $Z^3$ is a single bond, a methylene group, an ethylene group, a phenylene group, a fluorinated phenylene group, —O—$Z^{31}$—, —C(═O)—O—$Z^{31}$—, or —C(═O)—NH—$Z^{31}$—, $Z^{31}$ is a $C_1$-$C_6$ aliphatic hydrocarbylene group, a phenylene group, a fluorinated phenylene group, or a trifluoromethyl-substituted phenylene group, which may contain a carbonyl moiety, an ester bond, an ether bond, or a hydroxyl moiety, $R^{21}$ to $R^{28}$ are each independently a halogen or a $C_1$-$C_{20}$ hydrocarbyl group which may contain a heteroatom, a pair of $R^{23}$ and $R^{24}$ or $R^{26}$ and $R^{27}$ may bond together to form a ring with a sulfur atom to which the pair is attached, $R^{HF}$ is hydrogen or a trifluoromethyl group, and $M^-$ is a non-nucleophilic counter ion.

10. A pattern forming process comprising the steps of applying the resist composition of claim 1 onto a substrate to form a resist film thereon, exposing the resist film to high-energy radiation, and developing the exposed resist film in a developer.

11. The pattern forming process of claim 10, wherein the high-energy radiation is ArF excimer laser radiation of wavelength 193 nm or KrF excimer laser radiation of wavelength 248 nm.

12. The pattern forming process of claim 10, wherein the high-energy radiation is an electron beam or extreme ultraviolet light of wavelength 3 to 15 nm.

13. The resist composition of claim 1, wherein two $R^3$s in a case where n is 1, or $R^3$ and $R^1$ bond together to form the ring with the nitrogen atom to which the two $R^3$s or $R^3$ and $R^1$ are attached, the ring which may contain the double bond, oxygen, sulfur, or nitrogen.

14. The resist composition of claim 1, wherein the carboxylic acid anion has the formula (Aa-1) or (Aa-2), the sulfonimide anion free of fluorine has the formula (Ab), and the sulfonamide anion has the formula (Ac):

(Aa-1)

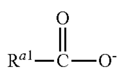

(Aa-2)

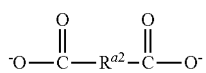

-continued (Ab)

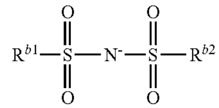

(Ac)

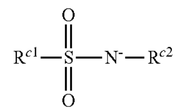

wherein $R^{a1}$ is hydrogen or a $C_1$-$C_{30}$ hydrocarbyl group which may contain a heteroatom, $R^{a2}$ is a single bond or a $C_1$-$C_{30}$ hydrocarbylene group which may contain a heteroatom, $R^{b1}$ and $R^{b2}$ are each independently a $C_1$-$C_{20}$ hydrocarbyl group which may contain a hydroxyl moiety, an ether bond, or an ester bond, $R^{b1}$ and $R^{b2}$ may bond together to form a ring, and $R^{c1}$ is fluorine, or a $C_1$-$C_{10}$ hydrocarbyl or $C_1$-$C_{10}$ fluorinated hydrocarbyl group which may contain a hydroxyl moiety, an ether bond, or an ester bond, $R^{c2}$ is hydrogen or a $C_1$-$C_{10}$ hydrocarbyl group which may contain a hydroxyl moiety, an ether bond, or an ester bond, and $R^{c1}$ and $R^{c2}$ may bond together to form a ring with the atom to which they are attached.

* * * * *